United States Patent
Shiraishi

(12) 
(10) Patent No.: US 6,677,601 B2
(45) Date of Patent: Jan. 13, 2004

(54) METHOD OF DETECTING POSITION OF MARK ON SUBSTRATE, POSITION DETECTION APPARATUS USING THIS METHOD, AND EXPOSURE APPARATUS USING THIS POSITION DETECTION APPARATUS

(75) Inventor: Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/840,133

(22) Filed: Apr. 24, 2001

(65) Prior Publication Data

US 2001/0030299 A1 Oct. 18, 2001

Related U.S. Application Data

(60) Division of application No. 09/388,352, filed on Sep. 1, 1999, now Pat. No. 6,242,754, which is a division of application No. 08/719,063, filed on Sep. 24, 1996, now Pat. No. 6,034,378, which is a continuation-in-part of application No. 08/593,935, filed on Jan. 30, 1996, now abandoned.

(30) Foreign Application Priority Data

| Feb. 1, 1995 | (JP) | 7-014870 |
| Mar. 22, 1995 | (JP) | 7-062714 |
| Apr. 14, 1995 | (JP) | 7-088985 |
| Sep. 25, 1995 | (JP) | 7-245800 |

(51) Int. Cl.[7] ............................................. G01N 21/86
(52) U.S. Cl. ............... 250/559.29; 250/548; 250/237 G
(58) Field of Search ................... 250/559.29, 237 G, 250/559.3, 548; 356/349, 399–401, 345; 355/53, 55

(56) References Cited

U.S. PATENT DOCUMENTS

| 4,355,892 A | 10/1982 | Mayer et al. ................. 355/77 |
| 4,710,026 A | 12/1987 | Magome et al. ............ 356/349 |
| 4,778,275 A | * 10/1988 | van den Brink et al. ... 356/150 |
| 4,798,962 A | 1/1989 | Matsumoto et al. ......... 250/548 |

(List continued on next page.)

FOREIGN PATENT DOCUMENTS

| JP | 61-208220 | 9/1986 |
| JP | 61-215905 | 9/1986 |
| JP | 2-227602 | 9/1990 |
| JP | 3-2504 | 1/1991 |
| JP | 3-3224 | 1/1991 |
| JP | 6-82215 | 3/1994 |
| JP | 6-302504 | 10/1994 |

OTHER PUBLICATIONS

J. Buckley et al., "Step and Scan: A Systems Overview of a New Lithography Tool", SPIE vol. 1088, Optical/Laser Microlithography II (1989), pp. 424–433.

*Primary Examiner*—Que T. Le
(74) *Attorney, Agent, or Firm*—Miles & Stockbridge P.C.

(57) ABSTRACT

In a method of detecting a position of a position detection grating mark formed with a small step structure on a surface of a flat object, an illumination light beam is irradiated on the grating mark at a predetermined incident angle. The illumination light beam includes a plurality of coherent beams having n ($n \geq 3$) different wavelengths $\lambda_1, \lambda_2, \lambda_3, \ldots, \lambda_n$. The n wavelengths are set to approximately satisfy the following relation within a range of about ±10%:

$$(1/\lambda_1 - 1/\lambda_2) - (1/\lambda_2 - 1/\lambda_3) = \ldots = (1/\lambda_{n-1} - 1/\lambda_n)$$

where the wavelengths have a condition $\lambda_1 < \lambda_2 < \lambda_3 \ldots < \lambda_n$. Photoelectric detection of a change in light amount of a diffracted light component generated from the grating mark in a specific direction is performed upon irradiation of the illumination light beam having the n wavelength components. The position of the grating mark is determined based on a signal obtained in the photoelectric detection. A position detection apparatus using the above method and an exposure apparatus using this position detection apparatus are also disclosed.

36 Claims, 53 Drawing Sheets

U.S. PATENT DOCUMENTS

| | | | |
|---|---|---|---|
| 4,828,392 A | 5/1989 | Nomura et al. | 356/401 |
| 4,901,109 A | 2/1990 | Mitome et al. | 355/68 |
| 4,962,318 A | 10/1990 | Nishi | 250/548 |
| 5,100,237 A | 3/1992 | Wittekoek et al. | 356/401 |
| 5,118,953 A | 6/1992 | Ota et al. | 250/548 |
| 5,151,754 A | 9/1992 | Ishibashi et al. | 250/548 |
| 5,160,849 A | 11/1992 | Ota et al. | 250/548 |
| 5,214,489 A | 5/1993 | Mizutani et al. | 356/363 |
| 5,477,309 A | 12/1995 | Ota et al. | 355/67 |
| 5,488,230 A | 1/1996 | Mizutani et al. | 350/548 |
| 5,489,986 A | 2/1996 | Magome et al. | 356/401 |
| 5,543,921 A | 8/1996 | Uzawa et al. | 250/548 |
| 5,559,601 A | 9/1996 | Gallatin et al. | 250/548 |
| 5,596,204 A | 1/1997 | Irie et al. | 250/548 |
| 5,754,300 A | 5/1998 | Magome et al. | 356/401 |
| 6,153,886 A | 11/2000 | Hagiwara et al. | 250/548 |

* cited by examiner

FIG. 17A
FIG. 17B
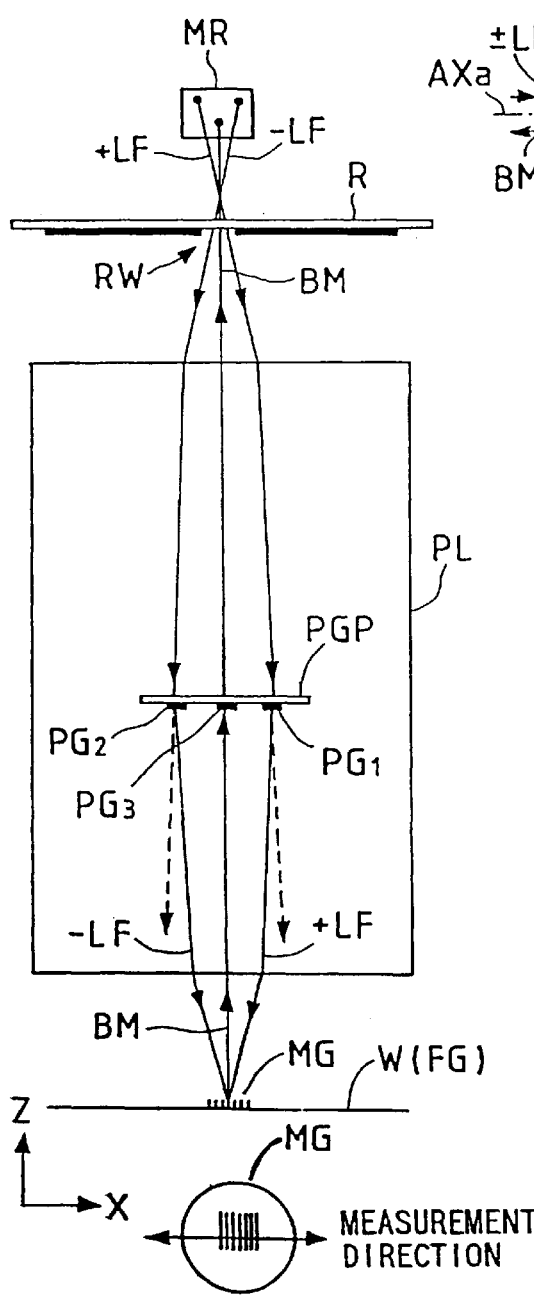
FIG. 17C
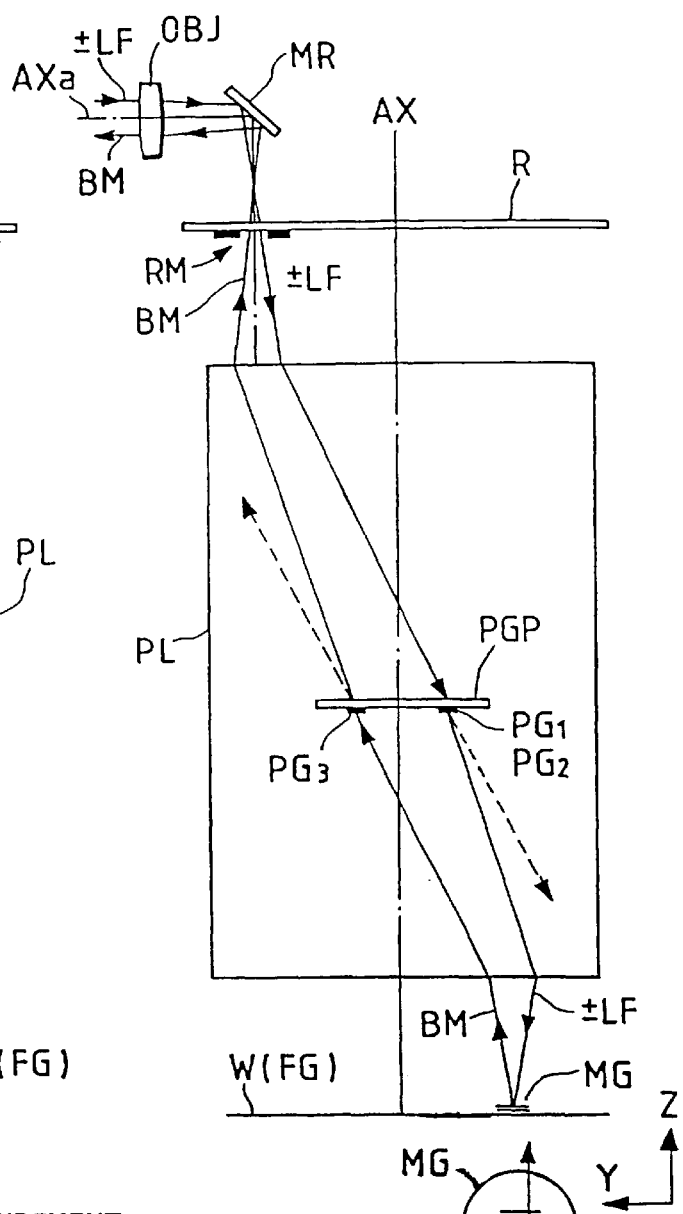
FIG. 17D

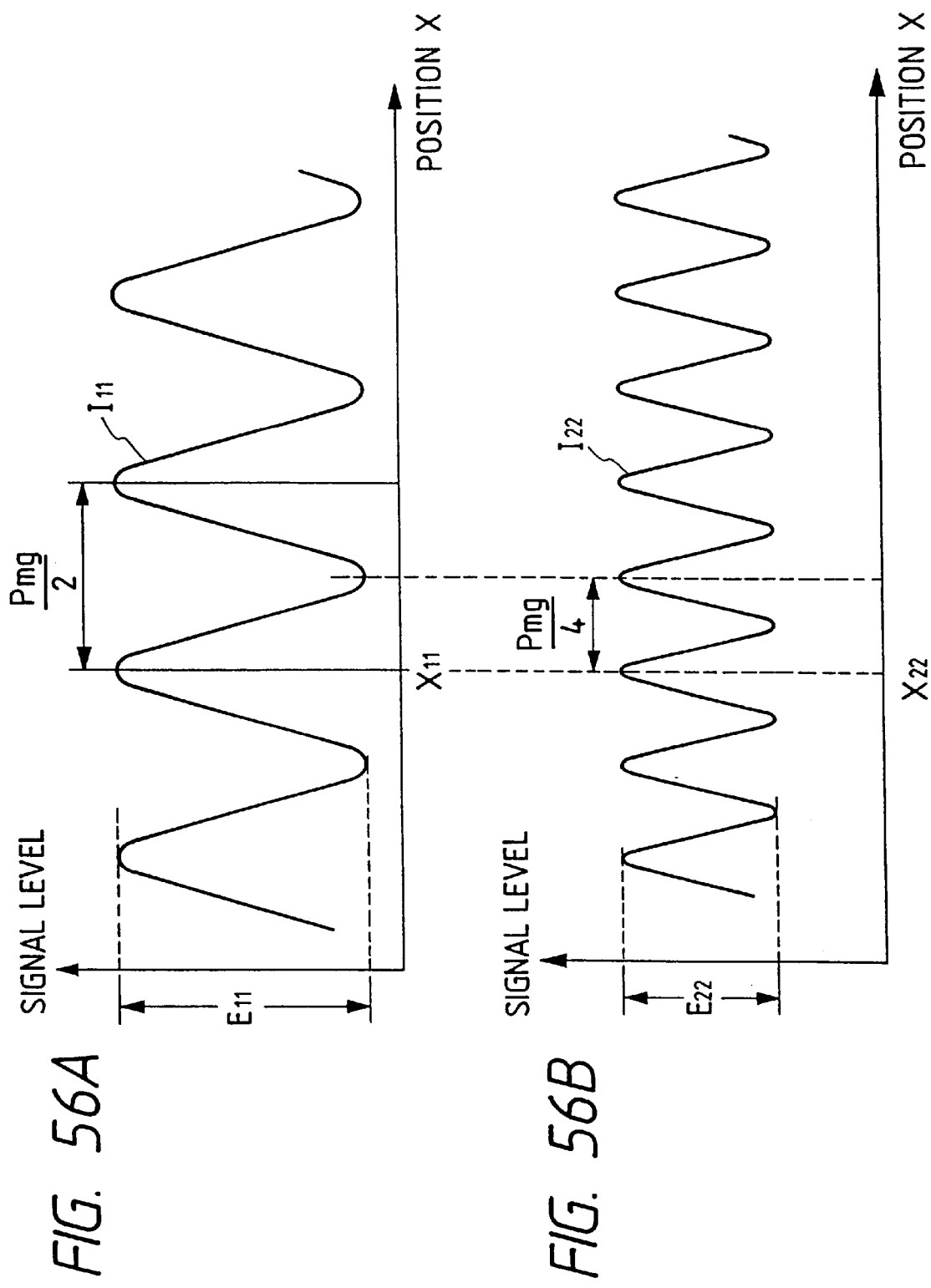

FIG. 59A
FIG. 59B
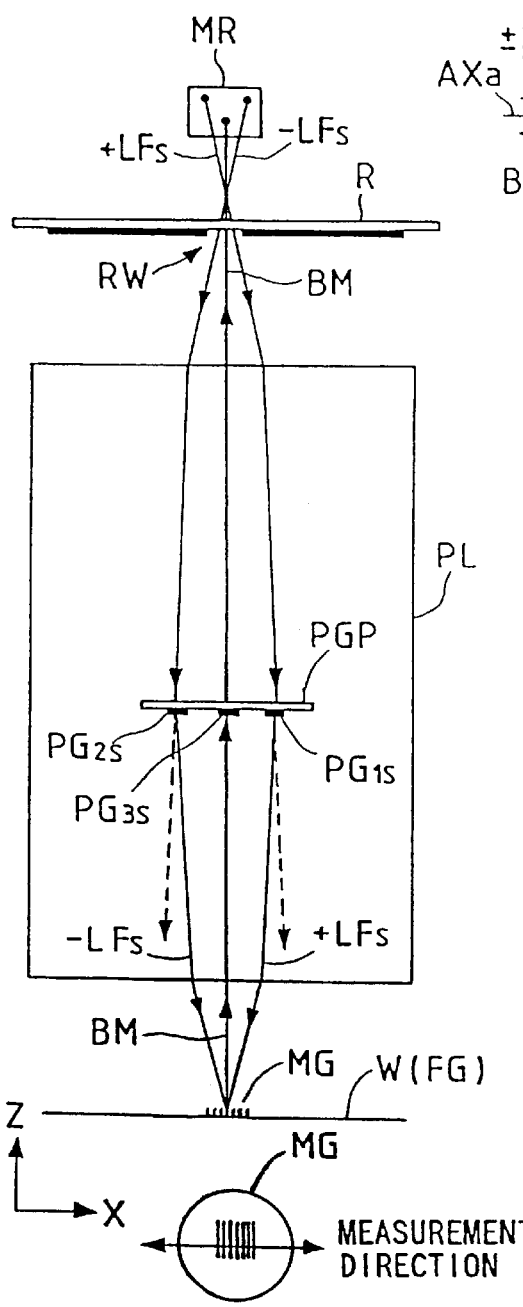
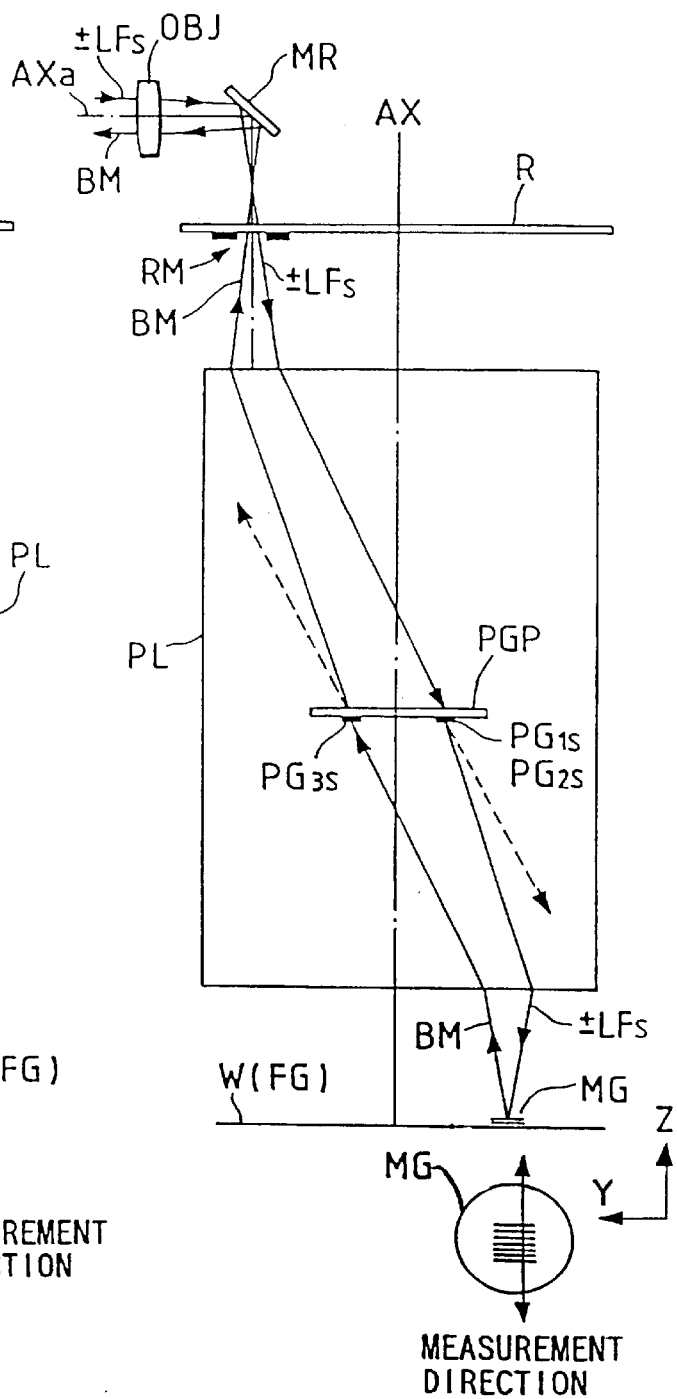
FIG. 59C
FIG. 59D

METHOD OF DETECTING POSITION OF MARK ON SUBSTRATE, POSITION DETECTION APPARATUS USING THIS METHOD, AND EXPOSURE APPARATUS USING THIS POSITION DETECTION APPARATUS

CROSS REFERENCE TO RELATED APPLICATIONS

This application is a division of application Ser. No. 09/388,352 filed Sep. 1, 1999, now U.S. Pat. No. 6,242,754, which is a division of Ser. No. 08/719,063 filed Sep. 24, 1996, now U.S. Pat. No. 6,034,378 issued Mar. 7, 2000, which is a continuation-in-part of Ser. No. 08/593,935 filed Jan. 30, 1996 (abandoned).

BACKGROUND OF THE INVENTION

1. Field of the Invention

The present invention relates to a technique for relative positioning between a mask pattern and a photosensitive substrate, which technique is applied to an exposure apparatus used in a photolithography process for exposing the mask pattern onto the photosensitive substrate in manufacturing, e.g., semiconductor elements and, more particularly, to a technique for detecting the mark pattern on the photosensitive substrate.

2. Related Background Art

In the photolithography process for manufacturing, e.g., semiconductor elements, liquid crystal display elements, or thin-film magnetic heads, an exposure apparatus is used to transfer an image of a photomask hereinafter) having a transfer pattern onto a photoresist-coated wafer (or a photosensitive substrate such as a glass plate) in accordance with a projection exposure method through a projection optical system or proximity exposure method.

In this exposure apparatus, positioning (alignment) between a reticle and a wafer must be performed with high precision prior to exposure. A position detection mark (alignment mark) obtained by exposure, transfer, and etching in the previous process is formed on the wafer. The accurate position of the wafer (i.e., a circuit pattern on the wafer) can be detected by detecting the position of this alignment mark.

In recent years, there has been proposed a method of forming a one-dimensional or two-dimensional grating mark on a wafer (or a reticle), projecting two coherent beams symmetrically inclined in the pitch direction on the grating mark, and causing two diffracted light components generated from the grating mark in the same direction to interfere with each other to detect the position and offset of the grating mark in the pitch direction, as disclosed in Japanese Patent Application Laid-open Nos. 61-208220 (corresponding U.S. Pat. No. 4,828,392; to be referred to as reference (A) hereinafter), 61-215905 (corresponding U.S. Pat. No. 4,710,026; to be referred to as reference (B) hereinafter), and the like. Reference (A) discloses a homodyne scheme in which two symmetrical coherent beams have the same frequency, while reference (B) discloses a heterodyne scheme in which a predetermined frequency difference is present between two symmetrical coherent beams.

Heterodyne schemes in which position detection devices of these schemes are applied to a TTR (Through-The-Reticle) alignment system and a TTL (Through-The-Lens) alignment scheme are proposed in Japanese Patent Application Laid-open Nos. 2-227602 (corresponding U.S. Ser. No. 483,820 filed on Feb. 23, 1990, now U.S. Pat. No. 5,489,968 issued Feb. 6, 1996; to be referred to as reference (C) hereinafter), 3-2504 (corresponding U.S. Pat. No. 5,118,953; to be referred to as reference (D) hereinafter), and the like. In the heterodyne schemes disclosed in these references (C) and (D), an He—Ne laser beam is simultaneously incident on two acousto-optic modulators (AOMs), and the AOMs are driven by high-frequency drive signals (one drive signal: 80 MHz; the other drive signal: 79.975 MHz) having a frequency difference of, e.g., about 25 kHz, thereby imparting the frequency difference of 25 kHz to diffracted beams emerging from these AOMs. These two diffracted beams serve as a pair of incident beams for irradiating a grating mark on a wafer or reticle at a predetermined crossing angle.

In the heterodyne scheme, the frequency difference (25 kHz) between the two incident beams is given as a reference AC signal, a phase difference between the reference AC signal and a signal obtained by photoelectrically detecting an interference light beam (beat light beam) of two diffracted light components generated from the grating mark is measured, and this phase difference is detected as a position offset (positional deviation) amount from the reference point in the pitch direction of the grating mark.

According to the heterodyne scheme described above, when the two incident beams for illuminating the grating mark have better monochromaticity, the detection precision in position offset, i.e., a resolution can increase. Position detection and positioning on the nanometer order can be performed. Excellent monochromaticity in the two incident beams indicates that the phase on the wavelength order between various diffracted light components generated by the grating mark tends to be sensitively changed by asymmetry of the grating marks, a resist layer, and the like.

An influence of the resist layer cannot be inevitably avoided in wafer alignment in an exposure apparatus. Unless a special technique for locally removing a resist from a mark portion is used, or unless an optical mark detection technique is given up, this problem is left unsolved.

A heterodyne scheme capable of reducing the influence of the resist layer and an influence of asymmetry in the sectional shape of the marks and allowing more accurate position detection is proposed in Japanese Patent Application Laid-open No. 6-82215 (corresponding U.S. Ser. No. 091,501 filed on Jul. 14, 1993; to be referred to as reference (E) hereafter). According to a technique disclosed in this reference (E), a plurality of beams having different wavelengths, or a white beam is used, and two diffracted beams obtained upon irradiation of the plurality of beams or the white beam on a stationary diffraction grating are incident on the first AOM. 0th-, +1st- and −1st-order beams diffracted by the first AOM are relayed to cross each other in the second AOM, thereby obtaining a pair of incident beams having the first wavelength and a pair of incident beams having the second wavelength. These two pairs of incident beams are simultaneously projected onto the grating mark on the wafer.

In this case, an interference beat light beam generated by the grating mark and photoelectrically converted include the first wavelength component and the second wavelength component. These components are photoelectrically detected in the form of a sum as a light amount on the light-receiving surface of a photoelectric element. For this reason, the mutual phase differences of the interference beat light beams of the respective wavelength components caused by the influence of the thin-film interference of the resist layers and the influence of asymmetry in the sectional shape of the marks can be averaged in terms of light intensity. Therefore, more accurate position detection can be performed.

Regardless of the homodyne and heterodyne schemes, a light source suitable for obtaining a multi-wavelength illumination light beam is generally selected from light sources having a high coherency and a sufficiently large light intensity, such as a gas laser light source or a semiconductor laser light source. For this reason, wavelengths selected for a multi-wavelength light beam in the conventional arrangement are determined such that the oscillation center frequency is shifted by an appropriate amount, e.g., 20 nm to 40 nm from practical light sources (e.g., laser light sources having excellent records of performance).

The surfaces of the grating marks on the wafer are coated with a resist layer having an almost predetermined thickness (e.g., about 0.5 $\mu$m to 1.5 $\mu$m). This thickness varies on a given central value. In addition, the thickness of the resist layer varies depending on the positions on the wafer. The sectional shape (small step differences of the grating grooves) of the grating marks slightly changes depending on the positions on the wafer in accordance with a wafer process. The total amplitude reflectance of the portion including the grating marks and the resist layer on their surfaces often greatly varies with respect to an illumination light beam which is converted as a multi-wavelength illumination light beam with a specific wavelength component.

Wavelength selection for forming a multi-wavelength illumination light beam cannot always be optimized so as to achieve high-precision position detection for a grating mark whose amplitude reflectance can greatly vary.

Assume that an illumination light beam used for position detection is formed into a beam having a plurality of wavelengths or a beam having a predetermined wavelength bandwidth, and that interference light beams including a plurality wavelength components generated by the grating mark are simultaneously received by a single photoelectric element. In this case, if the illumination light beam includes a high-intensity wavelength component, the interference light beam from the grating mark is increased at this wavelength component, thus often posing a problem to obtain an averaging effect. In addition, even if the intensities of the wavelength components in the illumination light beam are identical to each other, large differences may occur for the wavelength components of the interference light beam from the grating mark depending on the surface state (e.g., the irregularity in thickness of the resist and the degree of asymmetry of the grating marks) on the photosensitive substrate such as a wafer.

Even if an interference light beam having a plurality of wavelength components generated by the grating mark is received by a single photoelectric element, high precision of position detection cannot always be obtained depending on the surface state of the substrate.

A heterodyne system in which the influence of a resist layer and the influence by the deformation of the shape (such as the asymmetry of the cross-sectional shape) of a grating mark are reduced to thereby make more accurate position detection possible is also proposed by U.S. Pat. No. 5,160,849 (H).

In this publication (H), there is disclosed a technique of finding a first position offset amount of the grating mark measured on the basis of the photoelectric signal of the interference beat light of ±1st-order diffracted lights created perpendicularly from a grating beam and a second position offset amount of the grating mark measured on the basis of 0-order diffracted light and ±2nd-order diffracted lights created from the grating beam, and selecting one of the two positional deviation amounts.

Also in a position detecting system of the homodyne type, as disclosed in Japanese Patent Application Laid-open No. 61-208220 (I), there is proposed an attempt to know the asymmetry of a diffraction grating by comparing the magnitudes of the light intensities of a plurality of high-order diffracted lights created from a diffraction grating on a substrate.

However, in the system of the publication (I) wherein as in the prior art, a variation in the distribution by the each of the intensities of high-order diffracted lights created from a grating mark by the application of an illuminating beam of a single wavelength is presumed, a number of data bases for making various conditions such as the optical non-uniformity of a resist layer covering the grating mark and the asymmetry of the cross-sectional structure of the grating mark and the variation in the distribution of the intensities of the high-order diffracted lights correspond to each other become necessary.

Also, in the system as disclosed in the publication (H) wherein one of the first position offset amount measured on the basis of the coherent light of 1st-order diffracted components from the grating mark and the position offset amount measured on the basis of the coherent lights of 0-order and 2nd-order diffracted components, there has been the problem that the deterioration of the position offset detection accuracy by the optical non-uniformity of the resist layer and the influence of the asymmetry of the cross-sectional structure of the grating mark cannot be synthetically suppressed (the improvement in the accuracy becomes limited).

Also, in connection with the technique of the publication (H), it would occur to mind to average the measured first position offset amount and second position offset amount with weight given thereto in conformity with the intensities (the degrees of modulation) of the respective interference lights, but it may sometimes be impossible to attain an improvement in accuracy simply by the averaging having added thereto the simple weight conforming to the degrees of modulation of the interference lights from the grating mark on a wafer. This is considered to be caused by the fact that the amplitude reflectance of the surface portion of the wafer including the grating mark for the illuminating beam changes variously for each wafer and at each location (shot area) on the wafer.

SUMMARY OF THE INVENTION

It is, therefore, an object of the present invention to provide a position detection method and apparatus almost free from the influence of a surface state of a periodic grating pattern (grating marks) formed on a substrate such as a wafer.

It is another object of the present invention to provide a position detection method and apparatus capable of adaptively changing the time coherence of a multi-wavelength illumination light beam with changes in sectional shape (e.g., a groove depth) of grating marks and thickness of a resist when an illumination light beam for detecting the grating mark on a substrate is formed as a multi-wavelength light beam using coherent beams having relatively narrow spectral widths radiated from a plurality of light sources.

It is still another object of the present invention to provide a projection exposure apparatus capable of generating an incoherent multi-wavelength illumination light beam using a plurality of coherent light sources and using this illumination light beam for alignment of grating marks on a photosensitive substrate.

It is still another object of the present invention to solve the conventional problems in photoelectric detection described above and to provide a position detection method or apparatus almost free from the influence of a surface state of a substrate such as a wafer.

It is still another object of the present invention to provide a position detection method or apparatus almost free from the influence of a light intensity difference between wavelength components even if a grating pattern (mark) is illuminated with an illumination light beam including a plurality of wavelength components.

It is still another object of the present invention to provide a high-precision positioning (alignment) apparatus which reduces a grating pattern position measurement error depending on the state of a substrate surface when the position of a grating pattern is to be measured upon irradiation of the illumination light beam having a plurality of wavelength components on the substrate.

Further, the present invention has as an object thereof to provide a position detecting method or apparatus which is hardly affected by the asymmetry (a variation in the amplitude reflectance) of the cross-sectional structure of a grating pattern (mark) even when the grating pattern is illuminated with an illuminating light beam of a single wavelength.

Furthermore, the present invention has as an object thereof to provide a highly accurate alignment apparatus which is reduced in the position measurement error of a grating pattern depending on the state of the surface of a substrate when the position of the grating pattern is measured by the use of an illuminating light beam of a single wavelength.

In order to achieve the above objects of the present invention, the present invention is applied to a method or apparatus in which a pair of coherent light beams are incident on a position detection grating mark (MG) at incident angles symmetrical, with respect to the pitch direction of grating marks, the grating mark (MG) being formed with a small step difference structure on the surface of a plate-like object (W) such as a semiconductor wafer or glass plate, and the position of the grating mark in the periodic direction of grating marks is detected on the basis of signals obtained by photoelectrically detecting changes in light amounts of diffracted light components from the grating mark in specific directions.

According to the present invention, coherent light beams (±LF) for symmetrically irradiating a grating mark are formed into n pairs of light beams (±$D_{1n}$) having n (n=3 or more) different wavelengths $\lambda_1, \lambda_2, \lambda_3, \ldots, \lambda_n$, and when the magnitudes of the wavelengths satisfy $\lambda_1 < \lambda_2 < \lambda_3, \ldots, < \lambda_n$, the n wavelengths or a plurality of coherent light sources (LS1, LS2, LS3) are selected to approximately satisfy the following relation within the range of about ±10%:

$$(1/\lambda_1 - 1/\lambda_2) = (1/\lambda_2 - 1/\lambda_3) = \ldots = (1/\lambda_{n-1} - 1/\lambda_n)$$

In a preferable arrangement of the present invention, the two light beams constituting a pair of multi-wavelength coherent light beams are heterodyned to have a predetermined frequency difference between them. A light beam obtained by intensity-modulating, with a beat frequency, a mutual interference light beam of two first-order diffracted light components generated from the grating mark (MG) in a direction perpendicular to the grating pitch direction is photoelectrically detected.

In a preferred application of the present invention, a multi-wavelength position detection apparatus is incorporated in a projection exposure apparatus as a TTR, TTL, or off-axial alignment means (mark detection means).

In order to solve the problem on photoelectric detection, the present invention is applied to a method of projecting an illumination light beam on a diffraction grating (MG) formed on a substrate (a wafer W or a fiducial mark plate FG) subjected to position detection, and photoelectrically detecting diffracted light components from the diffraction grating (MG), thereby detecting the position of the substrate. First, (a) illumination beams (e.g., beams ±$D_{11}$ and ±$D_{22}$ diffracted by a reference grating RG) having different wavelength components ($\lambda_1$ and $\lambda_2$) are projected on the diffraction grating (MG) to generate a plurality of diffracted beams having the respective wavelength components from the diffraction grating (MG); and (b) a first interference beam formed by interference between two diffracted beams having an order difference (+1st and −1st orders; or 0th and 2nd orders) and having a first wavelength component ($\lambda_1$) of the plurality of generated diffracted beams is received by a first photoelectric element, and a second interference beam formed by interference between two diffracted beams having an order difference (+1st and −1st orders; or 0th and 2nd orders) and having a second wavelength component ($\lambda_2$) of the plurality of generated diffracted beams is received by a second photoelectric element. Subsequently, (c) first position information ($\Delta\lambda X_1$) associated with the periodic direction of the diffraction grating is calculated by a circuit unit ($CU_3$) on the basis of a photoelectric signal ($I_{m1}$) from the first photoelectric element, and second position information ($\Delta X_2$) associated with the periodic direction of the diffraction grating (MG) is calculated by a circuit unit ($CU_4$) on the basis of a photoelectric signal ($I_{m2}$) from the second photoelectric element. Finally, (d) the weighted mean of the first position information and the second position information is calculated by a circuit unit ($CU_5$) by changing weighting factors in accordance with the amplitude value of the photoelectric signal from the first photoelectric element and the amplitude value of the photoelectric signal from the second photoelectric element, thereby confirming the position of the substrate on which the diffraction grating is formed.

Positioning, i.e., position measurement marks formed on the surface of a wafer or the like are generally formed on the surface with a small step difference. However, these marks have slight asymmetry depending on the wafer process such as etching and sputtering in the semiconductor processing or a coating irregularity in the photoresist layer. This asymmetry causes degradation of accuracy of mark position detection.

In the interference alignment method of photoelectrically detecting the mutual interference light beam of the two diffracted light components generated by the grating mark and utilizing the resultant photoelectric signal, the asymmetry of the grating marks causes asymmetry of the amplitude reflectances of the marks themselves, resulting in degradation of position detection precision. More specifically, if a difference occurs in the depths of the bottoms of the grooves of the lines constituting the grating marks or the thickness of the resist layer locally varies, the absolute values and phases of the amplitude reflectances of the marks themselves become asymmetrical in accordance with the changes in depth of the bottom of the groove and thickness of the resist. As a result, the intensity and phase of the positive-order diffracted light component generated from the grating mark in the right direction relative to the zero order light are different from those of the negative-order diffracted light component generated in the left direction relative to the zero order light. In this case, the intensity difference does not almost cause degradation of position detection precision, but the change in phase greatly affects the position detection precision.

The simulation results of position detection precision in the heterodyne scheme using an illumination light beam having a single wavelength as in the conventional case will be described with reference to FIGS. 1 and 2. This simulation is performed under an assumption that two coherent incident beams having a predetermined frequency difference are irradiated from two symmetrical directions on a grating mark MG on a wafer covered with a resist layer PR, as shown in FIG. 2, and the results are obtained by observing the state (e.g., an amplitude and a phase) of a mutual interference beam, i.e., an interference beat light beam, of the ±1st-order diffracted light components generated from the grating mark MG in a direction perpendicular to the surface of the grating mark MG while the wavelength is changed.

FIG. 2 illustrates a one-dimensional grating MG on a wafer or the like which is assumed in the simulation and the enlarged section of a grating portion with the resist layer PR coated on the surface of the grating. In this case, a pitch Pmg of the grating MG was set to be 8 $\mu$m, a duty was set to be 1:1, the step difference (depth) $T_2$ of a groove was set to be 0.7 $\mu$m, and an asymmetry of 0.1% having a taper (inclination) $\Delta S$ in the pitch direction was set in the bottom portion of the grating MG. A thickness $T_1$ of the resist layer PR which covered the grating MG from the surface of the top portion of the grating MG was set to be 0.9 $\mu$m, and a recess amount $\Delta T$ on the resist layer surface corresponding to the position of each bottom portion of the grating MG was set to be $\Delta T \cong 0.3\ T_2$ (0.21 $\mu$m). The grating structure shown in FIG. 2 is called a grating having an asymmetrical amplitude reflectance.

FIG. 1 is a graph obtained when a wavelength $\lambda$ ($\mu$m) of an illumination light beam or an interference light beam obtained by synthesizing ±1st-order diffracted light components is plotted along the abscissa, and the relative amplitude of a change (AC component) of a signal corresponding to a change in light amount of the interference light beam and a position detection error amount ($\mu$m) are plotted along the ordinate. In the simulation results shown in FIG. 1, the conditions for the grating mark structure and the resist layer in FIG. 2 were set such that the wavelength $\lambda$ for outputting the zero AC component, i.e., only the DC component of the photoelectric signal corresponding to the interference light beam received by the heterodyne scheme was 0.663 $\mu$m as the wavelength of the He—Ne laser.

As can be apparent from the above description, when a laser beam having a wavelength of 0.663 $\mu$m is used, it is found that the mark position detection error near (about ±20 nm) this wavelength becomes very large. This is natural in the heterodyne scheme. If the AC component corresponding to the beat frequency is not included in a photoelectric signal subjected to phase difference measurement, the phase difference measurement is impossible. This is also true for homodyne position detection under the same conditions as described above for the grating mark structure and the resist layer.

The amplitude reflectance of the grating mark itself also greatly varies depending not only on the depth of the mark and the thickness of the resist but also the wavelength components of an illumination light beam. For this reason, the variation in amplitude reflectance of the grating mark is dependent on time coherence of the illumination light beam.

According to the first aspect of the invention for solving the problem on the illumination light beam side, to reduce the temporal coherence of the illumination light beam within a practical range with respect to the actual step difference structure of the marks and the actual state of the thickness of the resist layer and to obtain an incoherent illumination light beam, an assumption is given such that a plurality of coherent light beams having three or more different center wavelengths $\lambda_1$, $\lambda_2$, and $\lambda_3$, . . . , $\lambda_n$ are used to obtain multi-wavelength light beams.

According to the first aspect, as the basic condition for incoherence, when sets of coherent light beams adjacent to each other in the order of wavelengths are taken into consideration, the respective wavelengths are determined such that a difference between wave number values (1/wavelength) of two light beams obtained for each set falls within the error range of about ±10%.

The temporal coherence of a multi-wavelength illumination light beam obtained using three coherent light beams (the wavelength widths are very narrow) having center wavelengths $\lambda_1$=0.633 $\mu$m, $\lambda_2$=0.690 $\mu$m, and $\lambda_3$=0.760 $\mu$m, respectively is simulated. The results are shown in FIG. 3. The thickness ($\mu$m) of a resist layer formed on a silicon substrate is plotted along the abscissa of FIG. 3, while the reflectance obtained as an intensity sum of reflected light components having a wavelength generated by the silicon substrate upon irradiation of a multi-wavelength illumination light beam is plotted along the ordinate of FIG. 3. The amplitudes of reflectance variations with changes in resist thickness represent the temporal coherence of the illumination light beam. This temporal coherence can also be obtained by Fourier transform of the spectral distribution of the illumination light beam.

According to the simulation results in FIG. 3, the variation amplitudes of the reflectances are found to be small and the temporal coherence is also found to be small when the resist thicknesses (or mark step differences) fall within the range of 0.5 $\mu$m to 1.7 $\mu$m. That is, an almost incoherent state is obtained. In this manner, the coherence can be reduced within the range of specific optical thicknesses and small step differences (i.e., the resist thicknesses fall within the range of 0.5 $\mu$m to 1.7 $\mu$m) because the basic conditions representing the relations of the wavelengths used to form a multi-wavelength light beam are satisfied within a deviation of ±10%.

More specifically, if the wavelengths $\lambda_1$, $\lambda_2$, and $\lambda_3$ are given as 0.663 $\mu$m of the He—Ne laser beam, 0.690 $\mu$m of the beam of a commercially available semiconductor laser, and 0.760 $\mu$m of the beam of another commercially available semiconductor laser, respectively, the following relations are established:

$$\Delta\lambda_{12}=1/\lambda_1-1/\lambda_2=0.1305$$

$$\Delta\lambda_{23}=1/\lambda_2-1/\lambda_3=0.1335$$

and their deviation is given as $\Delta\lambda_{23}/\Delta\lambda_{12}$=1.023 (an error of 2.3%). When a multi-wavelength illumination light beam is obtained from three light beams having wavelengths falling outside the above ranges, it is difficult to obtain a good incoherent state with a small variation amplitude of the reflectance within a specific range.

Condition $\Delta\lambda_{12} \cong \Delta\lambda_{23} \ldots \cong \Delta\lambda_{(n-1)n}$ (±10%) defined in the first aspect is satisfied to obtain an almost incoherent state within a practical range. For this reason, even if the resist thickness or the depth of the mark step difference slightly changes within the incoherent range (e.g., 0.5 µm to 1.7 µm), the mark detection position obtained by photoelectrically detecting a multi-wavelength interference light beam obtained from the ±1st-order diffracted light components generated from the mark rarely varies by the averaging effect of the multi-wavelength light beam obtained using beam having three or more wavelengths.

When a multi-wavelength light beam is obtained from coherent light beams having three or more wavelengths satisfying the conditions defined by the first aspect, the influence of asymmetry caused by variations in mark step difference and resist thickness is almost eliminated, and good position detection precision can be always maintained.

As previously described, the amplitude reflectance of the grating mark itself greatly varies depending not only on the mark depth and resist thickness but also the wavelengths of the illumination light beam (detection light beam). The detection light beam has a plurality of wavelengths (broad band), the amplitude reflectances of the mark itself are different in units of wavelength components, and position detection results are different accordingly. When the amplitude reflectances of the mark itself are assumed under various mark conditions, the position detection precision can be simulated.

The second aspect of the invention is based on the simulation results obtained as follows. Assume that a grating mark is to be irradiated with an illumination light beam having only a specific wavelength, and that diffracted light components generated by this grating mark are to be photoelectrically detected. If the intensity (i.e., the amplitude of a level change in signal during relative scanning between the illumination light beam and the grating mark) of a photoelectric signal becomes extremely low, the position detection precision is also degraded. According to the simulation results, in the second aspect, even under the grating mark condition that use of an illumination light beam having a single wavelength causes an extreme reduction in amplitude of a photoelectric signal, an averaged mean of the position detection results for each of the wavelengths using an illumination light beam having another wavelength is obtained to prevent extreme degradation of the position detection precision.

Even under the conditions shown in FIG. 1 or 2, when a semiconductor laser generates an illumination beam having a wavelength λ of 0.670 µm or 0.725 µm, the mark position detection error can be sufficiently reduced. Judging from this fact, it is effect to use two-color illumination beams having different wavelengths, such as an He—Ne laser and a semiconductor laser and give an attention (selection or weighting) to a mark position (position offset amount) detected upon beam irradiation having a wavelength which conducts a large amplitude in the detected signal (AC component).

Alternatively, another method is also available in which only an interference light beam of two 1st-order diffracted light components propagating in one specific direction is not detected, but an interference light beam of the 0th- and 2nd-order diffracted light components propagating in another direction is photoelectrically detected, and the mark position determined on the basis of the photoelectric signal is taken into consideration. FIG. 4 shows generation of 0th-, ±1st-, and ±2nd-order diffracted light components under the beam incident conditions that two irradiation beams ±$L_1$ having a wavelength $\lambda_1$ and two irradiation beams ±$L_2$ having a wavelength $\lambda_2$ are incident on a diffraction grating mark MG, and interference fringes having a pitch Pif and the same intensity distribution on the grating mark MG at the wavelengths $\lambda_1$ and $\lambda_2$ when the pitch Pmg of the grating mark satisfies relation Pmg=2Pif.

In FIG. 4, an interference beam BM of the 1st-order diffracted components ±$D_{1n}$ propagating in a direction perpendicular to the surface of the grating mark MG has wavelengths $\lambda_1$ and $\lambda_2$. The 0th-order diffracted component (normal reflected light component) derived from the beams ±$L_1$ has an incident angle slightly different from that of the beams ±$L_2$. For this reason, four beams ±$D_{01}$ and ±$D_{02}$ corresponding to the beams ±$L_1$ and ±$L_2$ propagate in different directions. The first suffix in $D_{01}$ and $D_{02}$ indicates the diffraction order, and the second suffix indicates the wavelength ($\lambda_1$ or $\lambda_2$).

The 2nd-order diffracted light component −$D_{21}$ generated upon irradiation of the beam +$L_1$ propagates in a direction opposite to that of the optical path of the beam +$L_1$ and interferes with the 0th-order diffracted light component +$D_{01}$ of the beam −$L_1$. Similarly, the remaining 2nd-order diffracted light components +$D_{21}$, −$D_{22}$, +$D_{22}$ propagate in the same direction as that of the corresponding 0th-order diffracted light components −$D_{01}$, +$D_{02}$, and −$D_{02}$. The intensities of the interference light beams between these 0th- and 2nd-order diffracted light components change in accordance with relative changes between the grating MG and the interference fringes as in the interference beam BM of the ±1st-order diffracted light components.

Assume only the wavelength $\lambda_1$. The 1st-order component (i.e., the interference beam BM of the 1st-order diffracted light components ±$D_{11}$) is photoelectrically detected to obtain the mark position (or position offset). At the same time, two 2nd-order components (i.e., the interference light beam of the 0th-order diffracted light component +$D_{01}$ and the 2nd-order diffracted light component −$D_{21}$, and the interference light beam of the 0th-order diffracted light component −$D_{01}$ and the 2nd-order diffracted light component +$D_{21}$) are photoelectrically detected. A value obtained by averaging the mark positions respectively obtained using the signals having these two 2nd-order components is defined as the position of the mark. The mark position detected using the 1st-order component or the mark position detected using the 2nd-order components is selected in accordance with the magnitude between the average of the amplitude values of the 1st-order component signals and the average of the amplitudes of the 2nd-order component signals. Alternatively, a weighted mean is obtained.

As described above, the order of the diffracted light components used for mark detection is changed because the directions of the diffracted light components generated by the grating MG are different depending on the order. Even if the amplitude of the change in intensity of an interference light beam of a given order component propagating in a given direction becomes small to degrade the detection precision, the amplitude of the change in intensity of an interference light beam of another order propagating in another direction does not become small, thereby preventing degradation of the detection precision.

This can also be confirmed from the simulation results shown in FIGS. 5A and 5B. FIGS. 5A and 5B are simulation graphs showing the relationships between the amplitudes of changes in signals (AC components) and the position detection errors using the step difference $T_2$ of the grating MG in FIG. 2 as a parameter when the He—Ne laser generates an irradiation beam having a wavelength of 0.633 µm. In these graphs, pitch Pmg=8 µm, duty=1:1, taper amount (ratio) ΔS=0.1%, and the thickness $T_1$ of the resist layer PR on the top surface is set to be 1.15 µm. FIG. 5A shows the simulation for the interference beam BM of the 1st-order diffracted light components (1st-order diffracted light components $\pm D_{11}$), while FIG. 5B shows the simulation for the 2nd-order (0th-order diffracted light components $\pm D_{01}$ and 2nd-order diffracted light components $\pm D_{21}$) interference beams.

As can be understood from FIGS. 5A and 5B, the amplitude components of the signals obtained by photoelectrically detecting the interference light beams of the 1st- and 2nd-order diffracted light components greatly change with a small change in the shape (step difference $T_2$) of the grating mark. For example, in FIG. 5A, when the grating step difference $T_2$ is 0.86 $\mu$m, the amplitude of the change in intensity of the 1st-order diffracted components becomes very small, and the position detection error is abruptly increased accordingly. However, in FIG. 5B, when the step difference $T_2$ is 0.86 $\mu$m, the change in intensity of the 2nd-order interference light beam is relatively large, and degradation of the position detection error is small. Note that the amplitudes of changes in signals in FIGS. 5A and 5B are expressed as relative values, but the scales in FIGS. 5A and 5B are the same.

When an algorithm using both grating mark position detection using the interference light beam of the 1st-order diffracted light components and grating mark position detection using the interference light beam of the 2nd-order diffracted light components and employing one of the results, a weighted mean of the detection positions (or positional offsets) obtained from the illumination light beam having a plurality of wavelength components may be preferably obtained using the wavelength dependence, as can be apparent from the simulation in FIG. 1.

The detection light has a plurality of wavelengths, and the pieces of mark position information obtained in units of wavelength components are averaged to perform higher-precision position detection than the conventional case. As shown in FIG. 1, according to the simulation results, when the amplitude of a change (AC component) of a light amount signal of a diffracted light beam (interference light beam) having a given wavelength is small, a probability of degrading the position detection precision using the diffracted light beam having this wavelength is high. In detecting diffracted light beams (interference light beams) of a plurality of wavelength components, the mark positions detected in units of wavelength components are weighted with small weighting factors for small amplitudes of changes in signals, and large weighting factors for large amplitudes of changes in signals. The weighted components are then averaged. With this operation, the detection result of the mark position using a diffracted light component having a wavelength component having a high probability of a large error is automatically weighted with a small weighting factor. Therefore, the precision of the final mark position detection result can be maintained to a certain degree.

In detecting a 2nd-order (an interference light beam of the 0th- and 2nd-order diffracted light beams) signal, in order to individually obtain the mark positions using the signals photoelectrically detected in units of wavelength components, the failure in detection of the mark positions caused by the canceling effect of the respective wavelengths (to be described later) at the time of reception of the diffracted light beams (interference light beams) can be prevented.

According to the present invention, the incident beams of the respective wavelengths are irradiated while being sequentially switched one by one in grating mark detection. For this reason, a photoelectric element for photoelectrically detecting an interference light beam of the 1st-order diffracted light components and a photoelectric element for photoelectrically detecting an interference light beam of the 2nd-order diffracted light components need not be prepared for a plurality of sets. In addition, a wavelength selection means for discriminating the interference light beams in units of wavelength components can be omitted.

In order to solve the problem when the position of the grating pattern is measured by the use of an illuminating light beam, the present invention premises that the position or the position offset amount of a substrate on which a one-dimensional or two-dimensional diffraction grating-like pattern is formed is detected by the use of a coherent illuminating beam (light of a single wavelength). Further, the present invention is constructed so as to be also applicable to a position detecting apparatus of any of the conventional homodyne type and the conventional heterodyne type by some improvement. So, as an example, the epitome of the invention of an apparatus (method) for projecting two illuminating beams onto a grating pattern at symmetrical angles of incidence to thereby detect the position of the grating mark will hereinafter be described with reference to FIGS. 49 and 52.

First, in the present invention, provision is made of beam applying means (LS, TBO, AP, G1, G2) for applying two coherent illuminating beams (+LF, −LF) to a diffraction grating-like grating pattern (MG) formed on a substrate (W) of which the position is to be detected, at symmetrical angles of incidence. Provision is further made of a first photoelectric detector (DT1) for receiving a first interference beam (BM) obtained by the interference between two diffracted lights (±1st-order diffracted lights) travelling in a first direction (vertical direction) from the grating pattern (MG), and second photoelectric detectors (DT2a, DT2b) for receiving second interference beams (BmO2, Bm2O) obtained by the difference between two diffracted lights (0-order and 1st-order diffracted lights) travelling in a second direction differing from the first direction from the grating pattern (MG).

Further, by scanning means such as a stage (WST) for moving the substrate (W) or an optical system TBO for creating two beams which provides a predetermined frequency difference between the two illuminating beams, the grating pattern (MG) is controlled so as to be relatively scanned by an interference fringe produced by the two illuminating beams (+LF, −LF).

As shown in FIG. 52, provision is also made of weight coefficient calculating means (amplitude ratio detection circuit 58) for calculating a first weight coefficient (C11) conforming to the ratio between the amplitude value of a first photoelectric signal (Im1) outputted from the first photoelectric detector (DT1) during the relative scanning and the substantially ideal amplitude value of the first photoelectric signal, and calculating a second weight coefficient (C22) conforming to the ratio between the amplitude value of second photoelectric signals (ImO2, Im2O) outputted from the second photoelectric detectors (DT2a, DT2b) and the substantially ideal amplitude of the second photoelectric signals.

Provision is further made of position calculating means (detection circuit 56) for calculating first position information ($\Delta X11$) for specifying the position of the grating pattern (MG) on the basis of the relation between a level change in the first photoelectric signal and a position which provides the reference of the relative scanning (or the reference in terms of time) and calculating second position information ($\Delta X22$) for specifying the position of the grating pattern (MG) on the basis of the relation between a change in the level of the second photoelectric signals and a position which provides the reference of the relative scanning (or the reference in terms of time), and weighted mean calculating means (60) for weight-averaging the first position information and the second position by the first weight coefficient and the second weight coefficient and determining the most apparently certain position ($\Delta X$) of the grating pattern (MG).

BRIEF DESCRIPTION OF THE DRAWINGS

FIGS. 17A–17D are views showing an arrangement of a projection exposure apparatus to which the position detection apparatus of the present invention is applied according to the fifth embodiment of the present invention;

FIGS. 56A and 56B are graphs showing the states of the waveforms of respective signals processed by the signal processing system of FIG. 55;

FIGS. 59A–59D show the construction of a TTR alignment system in FIG. 58; and

DETAILED DESCRIPTION OF THE PREFERRED EMBODIMENTS

Figure 6:
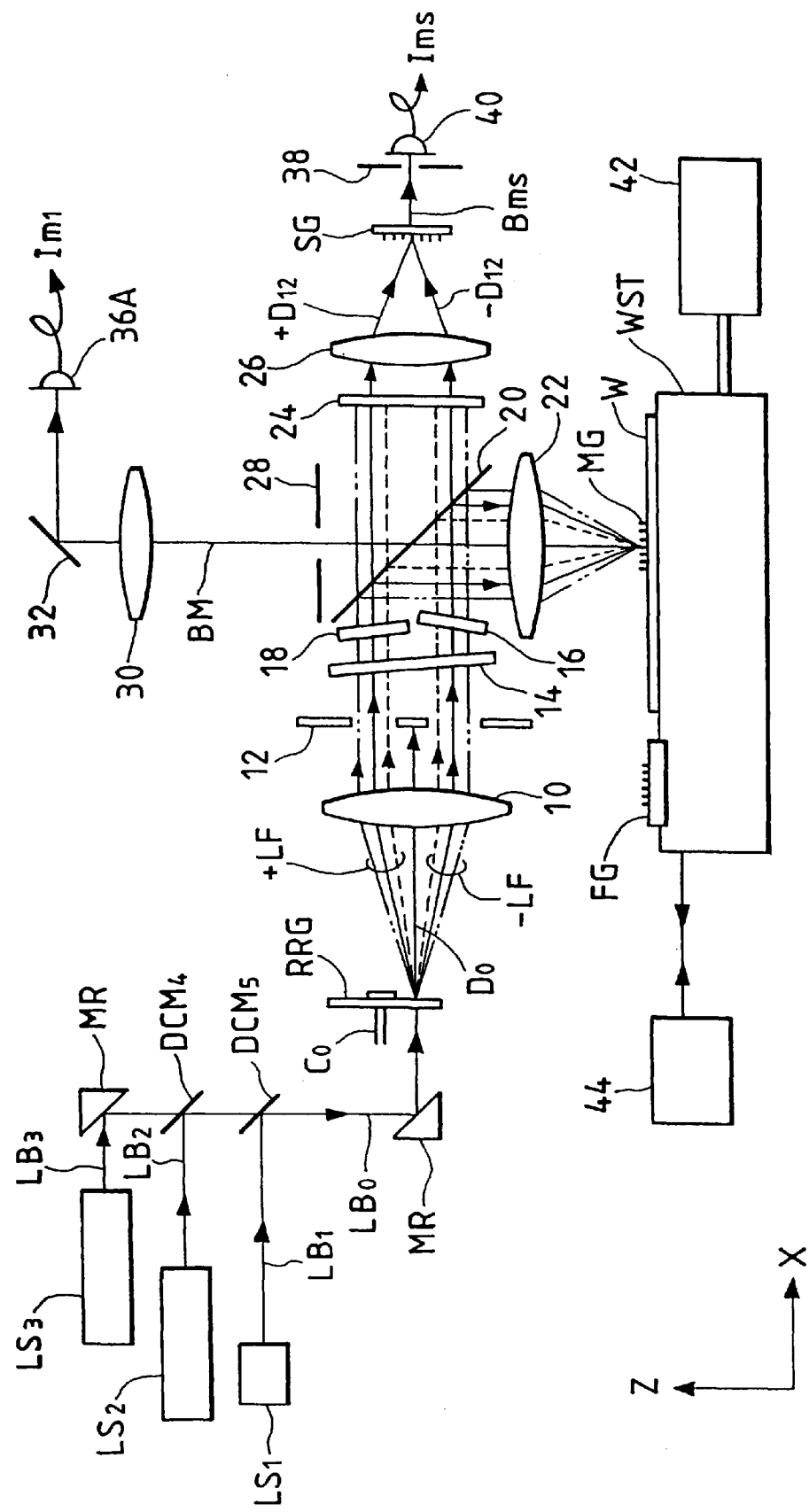
FIG. 6 is a view showing the arrangement of a position detection apparatus according to the first embodiment of the present invention.

The first embodiment of the present invention will be described with reference to FIGS. 6 and 7 and exemplifies a position detection apparatus using a heterodyne scheme. Referring to FIG. 6, three laser light sources $LS_1$, $LS_2$, and $LS_3$ generate laser beams $LB_1$, $LB_2$, and $LB_3$ having different wavelengths $\lambda_1$, $\lambda_2$, and $\lambda_3$, respectively. For example, the laser light source $LS_1$ is an He—Ne laser light source of $\lambda_1=0.633$ μm, the light source $LS_2$ is a semiconductor laser light source of $\lambda_2=0.690$ μm, and the light source $LS_3$ is a semiconductor laser light source of $\lambda_3=0.760$ μm. The wavelength relationship is given as $\lambda_1<\lambda_2<\lambda_3$.

All these laser light sources are commercially available laser light sources. In consideration of heat dissipation of laser tubes and compactness, if all three light sources are to be constituted by semiconductor laser light sources, a beam from a semiconductor laser light source having an oscillation wavelength of 1.20 μm is incident on a second-harmonic generator (SHG) to form a beam having a wavelength $\lambda_1=0.600$ μm. This beam may be used in place of the beam $LB_1$ from the He—Ne laser light source $LS_1$ in FIG. 6. At this time, the light source $LS_2$ in FIG. 6 is a semiconductor laser light source having a wavelength $\lambda_2=0.640$ μm, and the light source $LS_3$ is a semiconductor laser light source having a wavelength $\lambda_3=0.690$ μm.

In this case, the following relations are established:

$$\Delta\lambda_{12}=1/\lambda_1-1/\lambda_2=0.1042$$

$$\Delta\lambda_{23}=1/\lambda_2-1/\lambda_3=0.1132$$

so that $\Delta\lambda_{23}/\Delta\lambda_{12}=1.087$ (an error of 8.7%) can be established, thereby satisfying the conditions defined by the present invention within the range of ±10%.

Figure 3:
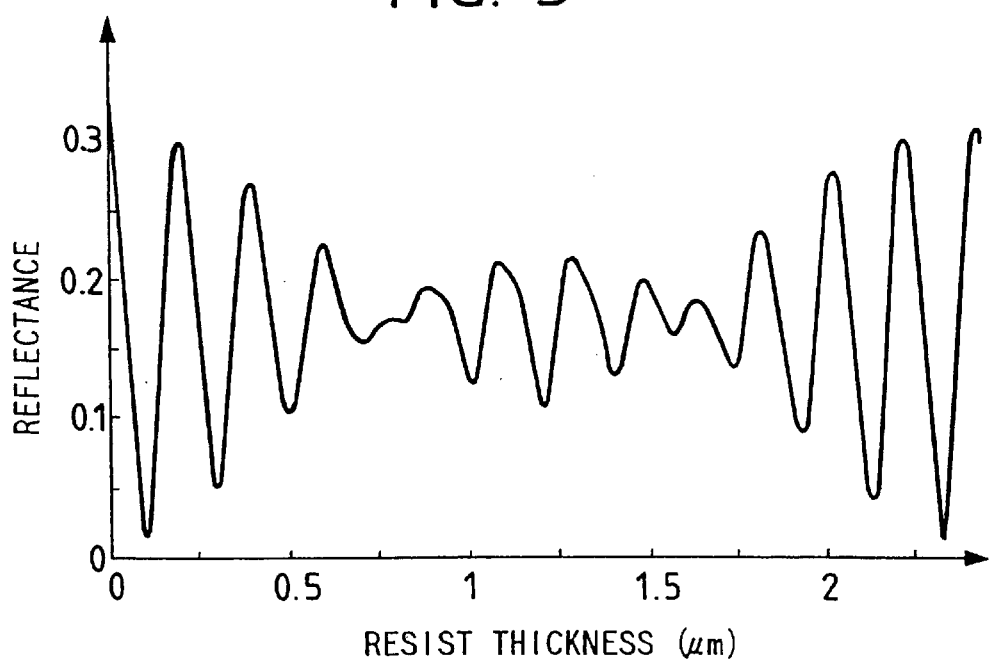
FIG. 3 is a graph showing the simulation results of changes in reflectance of a substrate with a resist under multi-wavelength conditions determined by the present invention.
Figure 8:
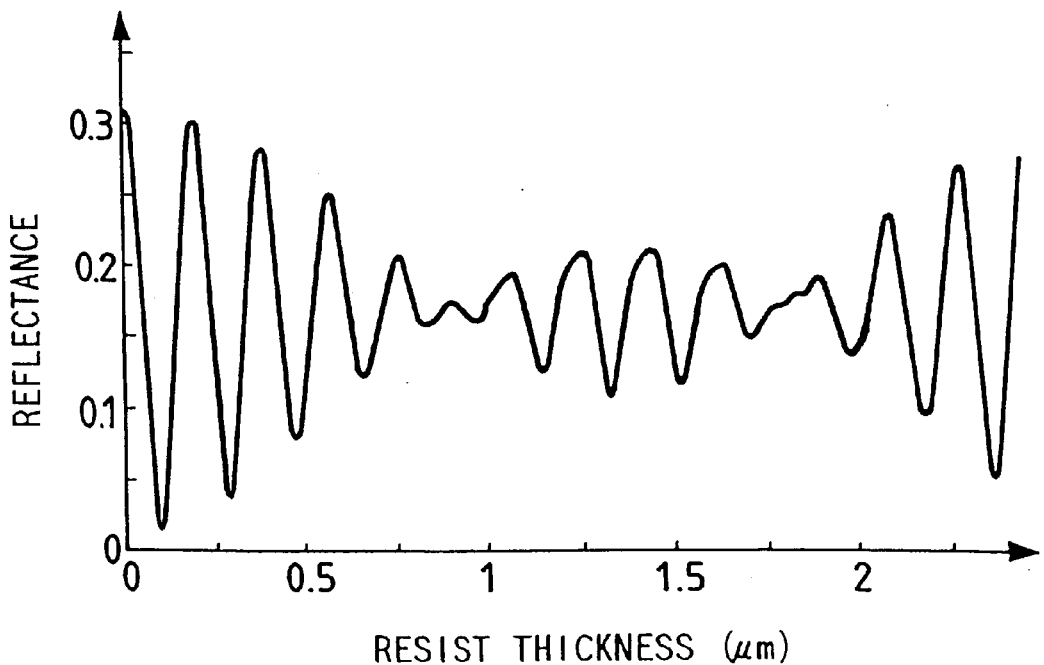
FIG. 8 is a graph showing the simulation results of changes in reflectance of a substrate with a resist when the combination of wavelengths set in FIG. 3 is changed to another combination while the multi-wavelength conditions determined by the present invention are kept unchanged.

The state of temporal coherence at this time is shown as the simulation results in FIG. 8 as in the previous drawing. As can be understood from the graph of FIG. 8, the three wavelengths are shifted to the short-wavelength side as a whole as compared with the case in FIG. 3. The incoherent region is shifted to a range (0.7 μm to 2.0 μm) in which the resist thickness (or mark step difference) increases. However, in this range (0.7 μm to 2.0 μm), the variation in reflectance is very small. As in FIG. 3, an incoherent arrangement can be properly obtained.

Referring back to FIG. 6, the three beams $LB_1$, $LB_2$, and $LB_3$ are synthesized into one beam $LB_0$ through a mirror MR and dichroic mirrors $DCM_4$ and $DCM_5$. The beam $LB_0$ is reflected by the mirror MR and incident on a rotary radial grating plate RRG. This rotary grating plate RRG is rotated about a rotation axis $C_0$ at a high constant angular velocity in one direction. This grating plate RRG serves as a frequency modulator (frequency shifter) for changing the frequencies of the diffracted light beams of the respective orders in accordance with the angular velocity.

Figure 7:
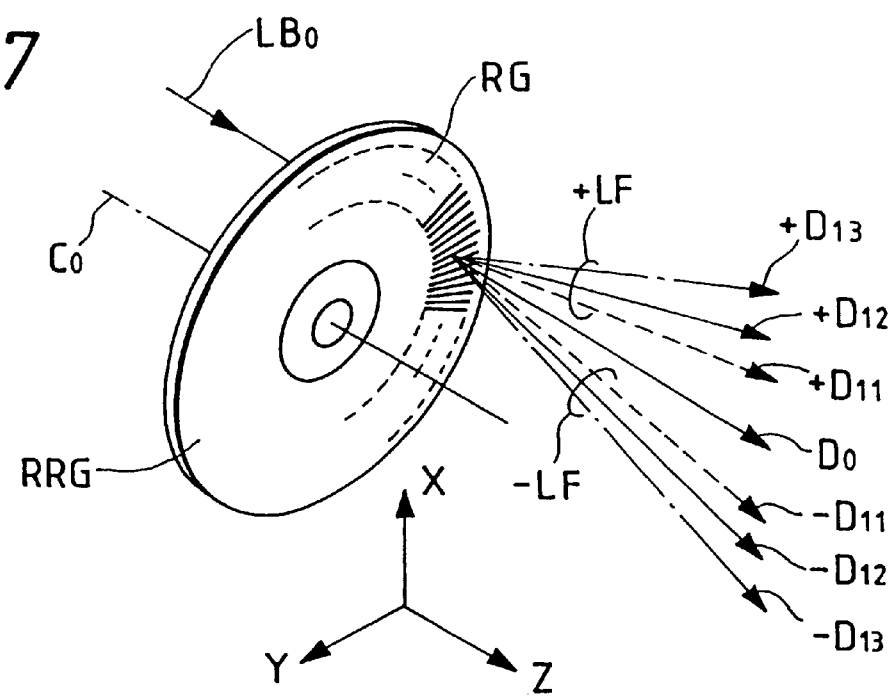
FIG. 7 is a perspective view showing the detailed structure of a rotary radial grating plate in FIG. 6 and the generated states of diffracted light components.

FIG. 7 is an enlarged perspective view of the rotary radial grating plate RRG. The rotation axis $C_0$ is set parallel to the Z-axis of the X-Y-Z coordinate system. A transmission phase diffraction grating RG is formed on the circular grating plate RRG in the angular range of 360°. When the beam $LB_o$ is vertically incident on the grating RG of the grating plate RRG, various diffracted light components in addition to a 0th-order diffracted light component $D_0$ are generated. In this embodiment, the heterodyne scheme is realized using the ±1st-order diffracted light components. For this reason, only the ±1st-order diffracted light components from the grating plate RRG are illustrated in FIGS. 6 and 7.

First-order diffracted beams $\pm D_{11}$ generated from the beam $LB_1$ having the wavelength $\lambda_1$, 1st-order diffracted beams $\pm D_{12}$ generated from the beam $LB_2$ having the wavelength $\lambda_2$, and 1st-order diffracted beams $\pm D_{13}$ generated from the beam $LB_3$ having the wavelength $\lambda_3$ are generated from the grating RG of the rotary grating plate RRG. A diffraction angle θn of the 1st-order diffracted beam for each wavelength is represented as follows:

$$\sin \theta_n = \lambda_n / Prg$$

where n is the number of wavelengths, and Prg is the pitch of the grating RG.

Each 1st-order diffracted beam is subjected to a predetermined frequency shift Δf regardless of the wavelengths. If a velocity at which the grating RG of the grating plate RRG crosses the beam $LB_0$ is defined as V, Δf=V/Prg is obtained. A +1st-order diffracted beam has a frequency higher than the frequency of the 0th-order diffracted light component by Δf, while a −1st-order diffracted beam has a frequency lower than the frequency of the 0th-order diffracted light component by Δf. Therefore, the rotary radial grating plate RRG serves as a frequency shifter.

As shown in FIG. 6, incident beams ±LF consisting of the 1st-order diffracted beams $\pm D_{1n}$ (n=1, 2, 3) having the three wavelength components and the 0th-order diffracted light component $D_0$ are converted by a collimator lens 10 such that their principal rays are parallel to each other. These beams reach a beam selection member 12. The beam selection member 12 serves as a spatial filter located on the so-called Fourier transform plane. The beam selection member 12 shields the 0th-order diffracted light component $D_0$ and passes the incident beams ±LF derived from the 1st-order diffracted light components $\pm D_{1n}$.

The incident beams ±LF then reach a beam splitter (half mirror) 20 through adjustment optical systems 14, 16, and 18 constituted by plane-parallel glass members whose inclination amounts are variable. The adjustment optical system 14 has a function of shifting the incident beams ±LF with respect to the optical axis of the lens 10 while the distance between the incident beams +LF and −LF in the Fourier space is kept unchanged. The adjustment optical systems 16 and 18 have functions of individually adjusting the incident beams +LF and −LF with respect to the optical axis. The incident beams ±LF are split into two beams by the beam splitter 20. One pair of the two beams is incident on an objective lens 22 serving as an irradiation optical system, while only the 1st-order diffracted beams having a specific wavelength in the incident beams ±LF, i.e., only the 1st-order diffracted beams $\pm D_{12}$ having the wavelength $\lambda_2$ of the other beam are selected and incident on a condenser lens (Fourier transform lens) 26 through a filter 24.

The incident beams ±LF incident on the objective lens are collimated into parallel beams which are then simultaneously irradiated on the grating MG on a wafer W at different angles. Interference fringes formed by the interference of the incident beams $\pm D_{11}$ having the wavelength $\Delta_1$, interference fringes formed by the interference of the incident beams $\pm D_{12}$ having the wavelength $\lambda_2$, and interference fringes formed by the interference of the incident beams $\pm D_{13}$ having the wavelength $\lambda_3$ are superposed on each other and appear on the grating MG at the same pitch and the same phase. The interference fringes are observed as if they are moving on the grating MG at a constant speed in one direction because of the frequency difference 2Δf between the incident beams +LF and −LF. This moving speed is proportional to the velocity V of the grating RG of the rotary radial grating plate RRG.

As can be apparent from FIG. 6, the surface (grating MG) of the wafer W and the radial grating plate RRG are located conjugate to each other (imaging relationship) by a composite optical system of the collimator lens 10 and the objective lens 22. For this reason, the images obtained by the ±1st-order diffracted light components on the grating RG of the radial grating plate RRG are formed in a size corresponding to the magnification factor of the composite optical system on the grating MG of the wafer W. The diffraction images (interference intensity distribution) projected on the wafer W are formed ½ of the pitch of the grating RG because the 0th-order diffracted light component $D_0$ is shielded. The pitch Pif of the interference fringes on the wafer W is ½ of the pitch Pmg of the grating MG.

With the above arrangement, incident angles $\Phi_n$ (n is the number of wavelengths; 1, 2, 3) of the incident beams $\pm D_{11}$, $\pm D_{12}$, and $\pm D_{13}$ of the respective wavelength components irradiated onto the grating mark MG of the wafer W upon emergence from the objective lens 22 are defined as follows:

$$\sin \Phi_n = \pm \lambda_n / Pmg$$

When this relation is satisfied, the 1st-order diffracted light components are generated vertically from the grating MG upon irradiation of the incident beams ±LF. More specifically, an interference beam BM is obtained by interfering the 1st-order diffracted light components vertically generated upon irradiation of the incident beam +LF and the 1st-order diffracted light components vertically generated upon irradiation of the incident beam −LF. This interference beam BM is a beat light beam intensity-modulated with the frequency 2Δf. In this manner, to generate the ±1st-order diffracted light beams (interference beam BM) in the same direction, distances $DL_n$ of the incident beams ±LF of the respective wavelengths on the Fourier transform plane from the optical axis are defined as follows from the different viewpoint:

$$DL_n = F_0 \cdot \sin \Phi_n = \pm F_0 \cdot \lambda_n / Pmg \ (n=1, 2, 3)$$

where $F_0$ is the focal length of the objective lens 22 and Φn is the incident angle of each wavelength component of each incident beam. The distance $DL_n$ for each wavelength can be adjusted by appropriately setting the pitch of the grating RG of the rotary radial grating plate RRG and the focal length of the collimator lens 10.

The interference fringes formed on the wafer W are imaged as a diffraction image of the grating RG of the radial grating plate RRG. In principle, if the pitch of the interference fringes obtained by one of the wavelength components having the three wavelengths $\lambda_1$, $\lambda_2$, and $\lambda_3$ is an integer multiple of the pitch of the grating mark MG, the pitches of the interference fringes for the remaining wavelength components have the same relationship. The interference fringes obtained in units of wavelength components must perfectly match and be free from phase offsets and position offsets.

In practice, however, the interference fringes obtained in units of wavelength components are subjected to position offsets, phase offsets, and pitch offsets in accordance with the degree of chromatic aberration of the optical systems such as the objective lens 22 and the collimator lens 10.

To correct these offsets, the adjustment optical systems 14, 16, and 18 in FIG. 6 are used. These optical system 14, 16, and 18 are constituted by plane-parallel glass members. When a material having a large color dispersion is used as the material of these optical systems, the position and phase offsets of the interference fringes formed on the wafer in units of wavelength components can be slightly changed. Alternatively, a plane-parallel glass member having a small color dispersion may be combined with a plane-parallel glass member having a large color dispersion to constitute the adjustment optical systems 14, 16, and 18. In this case, the inclination of the plane-parallel glass member having the large color dispersion is adjusted to correct the relationship between the interference fringes for each wavelength component. An error in the overall inclination of the incident beams ±LF on the wafer, which is caused by the above inclination adjustment, can be corrected by inclination adjustment by the plane-parallel glass member having the small color dispersion.

The interference beam BM vertically generated by the interference fringes from the illuminated grating MG reaches the spatial filter 28 through the objective lens 22 and the beam splitter 20. This spatial filter 28 is located at or near the Fourier transform plane associated with the objective lens 22. In this embodiment, the spatial filter 28 has an aperture for passing only the interference beam MB (±1st-order diffracted light components). The interference beam MB passing through the spatial filter 28 is converted into a parallel beam by a lens system (inverse Fourier transform lens) 30. The parallel beam is reflected by a mirror 32 and received by a photoelectric element 36A.

This photoelectric element 36A simultaneously receives the interference beam BM including three wavelengths $\lambda_1$, $\lambda_2$, and $\lambda_3$. This interference beam BM is intensity-modulated with the beat frequency $2\Delta f$. For this reason, a photoelectric signal $I_{m1}$ from the photoelectric element 36A has an AC waveform whose level sinusoidally changes at the same frequency as the beat frequency $2\Delta f$ while the interference beam BM from the grating mark GM is present.

On the other hand, the 1st-order beams $\pm D_{12}$ selected by the wavelength selection filter 24 and incident on the condenser lens 26 are superposed on each other and irradiated on a transmission reference grating SG. In this case, the reference grating SG is located conjugate to the rotary radial grating plate RRG with respect to the composite optical system of the collimator lens 10 and the condenser lens 26. For this reason, one-dimensional interference fringes are formed on the reference grating SG by the two-beam interference of the 1st-order beams $\pm D_{12}$. These interference fringes move at a speed corresponding to the beat frequency $2\Delta f$.

When the pitch of the reference grating SG and the pitch of the corresponding interference fringes are appropriately set, the ±1st-order diffracted light components generated from the reference grating SG propagate as an interference beam $B_{ms}$ in the same direction, passes through a spatial filter 38, and is received by a photoelectric element 40. A photoelectric signal $I_{ms}$ from this photoelectric element 40 has a waveform whose level sinusoidally changes at the same frequency as the beat frequency $2\Delta f$. This signal $I_{ms}$ serves as a reference signal in the heterodyne scheme.

In the above arrangement, the reference grating SG is formed such that a chromium layer is deposited on a glass plate and etched to alternately form transparent and light-shielding lines. For this reason, an almost ideal grating, i.e., a grating having symmetrical amplitude transmittances, almost free from at least asymmetry as in the grating mark MG on the wafer W and the problem posed by the resist layer is formed. The pair of incident beams irradiated on the reference grating SG may be incident beams having one of the wavelengths $\lambda_1$, $\lambda_2$, and $\lambda_3$ so as to obtain a sufficiently high precision. On the contrary, it is available that all the three 1st-order diffracted beams $\pm D_{11}$, $\pm D_{12}$, and $\pm D_{13}$ included in the incident beams ±LF may be simultaneously incident on the reference grating SG, thereby forming multi-color interference fringes as in the grating mark MG on the wafer.

As described above, the multi-color interference fringes are formed on the reference grating SG, and the interference beam $B_{ms}$ generated from this interference grating SG is separated in units of wavelengths and photoelectrically detected. A reference signal corresponding to the wavelength $\lambda_1$, a reference signal corresponding to the wavelength $\lambda_2$, and a reference signal corresponding to the wavelength $\lambda_3$ can be individually obtained, so that position measurement of the grating mark MG can be performed in units of wavelengths. Even if the interference fringes formed on the wafer W by three wavelength components are offset (phase offset) by a predetermined amount, the offset amount can be measured in advance. This technique will be described in detail later.

The wafer W shown in FIG. 6 is placed on a wafer stage WST two-dimensionally moved within a plane (X-Y plane) perpendicular to the optical axis of the objective lens 22. The two-dimensional movement on the stage WST is performed by a drive source 42 including a drive motor. This driving may be based on a scheme for rotating a feed screw by a motor or a scheme for directly moving the stage itself by a linear motor. In addition, the coordinate position of the stage WST is sequentially measured by a laser interferometer 44. The measurement values of the laser interferometer 44 are used for feedback control for the drive source 42.

A fiducial mark plate FG is formed on part of the wafer stage WST. A reflection intensity grating (the pitch is equal to that of the grating MG on the wafer) having a line-and-space pattern with a chromium layer on the surface of quartz glass is formed on the mark plate FG. For this reason, unlike the phase grating such as the grating mark MG formed by corrugations on the wafer W, the intensity grating is characterized in that no asymmetry is present and the diffraction efficiency does not depend on the wavelength of the illumination light beam (detection light beam), i.e., in that the amplitude reflectance does not have asymmetry. In addition, the reflectance of the chromium layer rarely changes in the wavelength band (generally 0.5 $\mu$m to 0.8 $\mu$m) of the position detection illumination light beam.

In the arrangement shown in FIG. 6, semiconductor lasers are used as the light sources. In this case, it is preferable that an astigmatism removal shaping optical system (i.e., a plurality of inclined plane-parallel glass members) be arranged between each semiconductor laser ($LS_2$ and $LS_3$) and each of the dichroic mirrors $DCM_4$ and $DCM_5$, and the diameters of the beam components of one synthesized beam $LB_0$ be equal to each other in units of wavelength components. In addition, it is preferable that a beam shaping optical system for aligning the diameters of the wavelength components of the synthesized beam LBO be arranged.

For the sake of descriptive simplicity, the rotary radial grating plate RRG is used as the frequency shifter in FIG. 6. However, two acousto-optic modulators (AOMs) may be used, or a first Zeeman laser light source for oscillating a laser beam having a center frequency $\lambda_1$ and a second Zeeman laser source for oscillating a laser beam having a center frequency $\lambda_2$ may be used as light sources. In use of a Zeeman laser, it generally oscillates two laser beams whose polarization directions are complementary, and a frequency difference of several hundreds kHz to several MHz is given between these two laser beams. The beat frequency of an interference beam to be photoelectrically detected is increased to a degree corresponding to the frequency difference. The photoelectric elements 36A and 40 must be constituted by PIN photodiodes or photomultipliers having a high response speed.

Various dichroic mirrors shown in FIG. 6 may be replaced with dispersion elements such as prisms. In this case, one prism has the same function as the set of two dichroic mirrors $DCM_4$ and $DCM_5$.

An arrangement of a position detection/control circuit suitable for the apparatus shown in FIG. 6 will be described with reference to FIG. 9. In the heterodyne scheme in FIG. 6, while the interference beam BM is generated from the grating mark MG on the wafer W and the fiducial mark plate FG, the signals $I_{m1}$ and $I_{ms}$ from the photoelectric elements 36A and 40 have sinusoidal AC waveforms shown in FIGS. 10A and 10B.

Figure 10A:
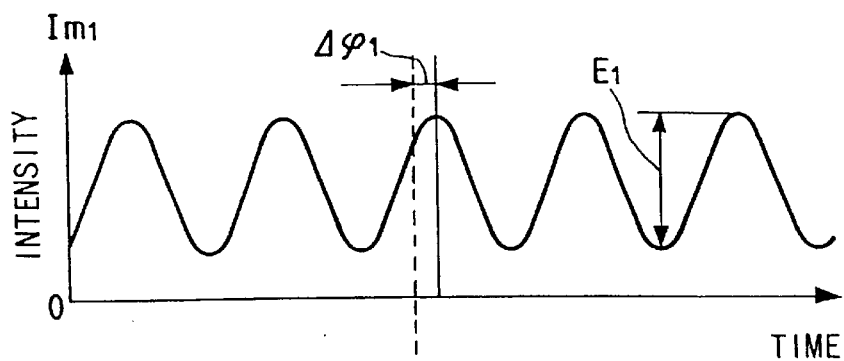
FIGS. 10A and 10B are charts showing the waveforms of two photoelectric signals to be processed in the signal processing circuit shown in FIG. 9.
Figure 10B:
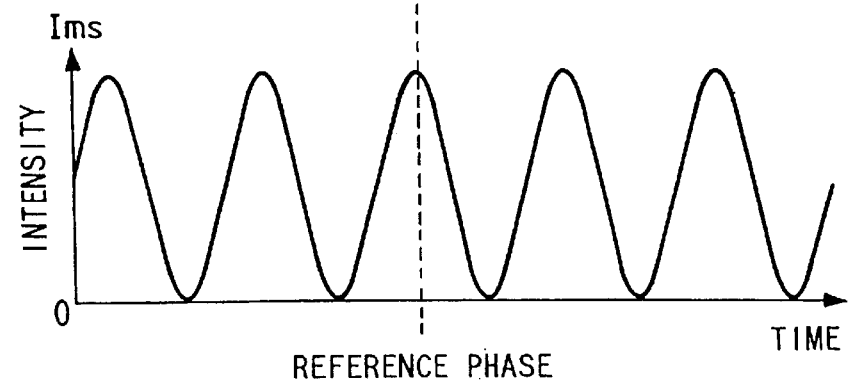

FIG. 10B shows a time change in intensity of the signal $I_{ms}$ serving as a reference signal, while FIG. 10A shows a time change in intensity of the signal $I_{m1}$ upon reception of the interference beam BM from the grating mark MG on the wafer W. Assuming the phase of the signal $I_{ms}$ as a reference, the phase of the signal $I_{m1}$ is offset from the signal $I_{ms}$ by $-\Delta\psi_1$. Let $E_1$ be the amplitude (peak-to-peak value of the AC component) of the signal $I_{m1}$.

Figure 9:
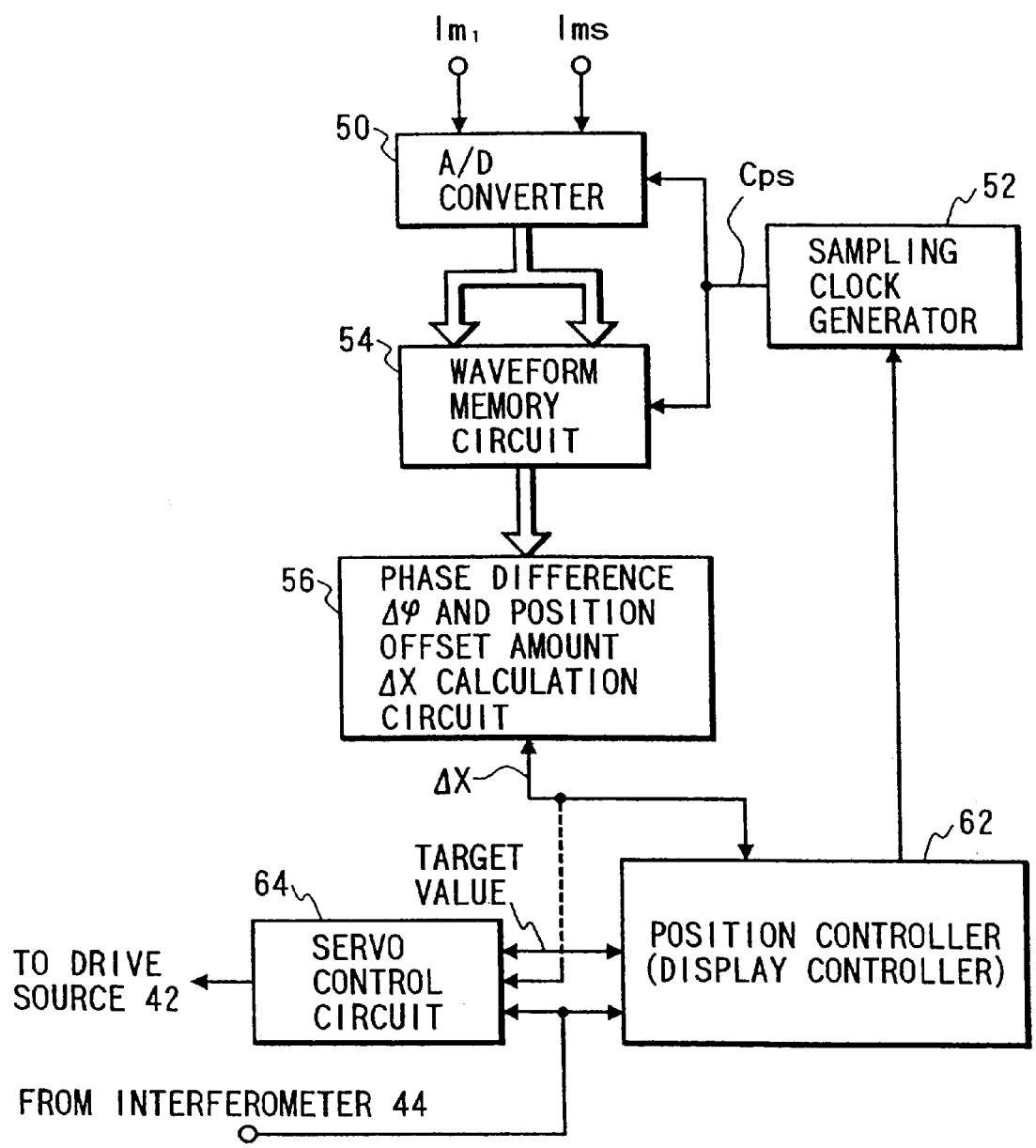
FIG. 9 is a block diagram showing the arrangement of a signal processing circuit applied to the apparatus shown in FIG. 6.

In the circuit block shown in FIG. 9, the signals $I_{m1}$ and $I_{ms}$ are input to an analog-to-digital conversion (A/D converter) circuit unit 50. The instantaneous intensity levels of the input signals are converted into digital values in response to a clock signal (pulse) $C_{ps}$ from a sampling clock generator 52. The frequency of the clock signal $C_{ps}$ is set much higher than the beat frequency of the signals $I_{m1}$ and $I_{ms}$. The clock signal $C_{ps}$ is also sent to a waveform memory circuit or circuit unit 54 and is used to update the memory address in storing the digital values (data) from the A/D converter 50.

In the waveform memory circuit unit 54, the two waveform data shown in FIGS. 10A and 10B are digitally sampled for the predetermined periods (e.g., 10 periods) of the signals $I_{m1}$ and $I_{ms}$. At this time, since the two signals $I_{m1}$ and $I_{ms}$ are simultaneously sampled by the common clock signal $C_{ps}$, the waveform data in the waveform memory circuit unit 54 are not offset along the time axis. Note that when the rotary radial grating plate RRG is used, the clock signal $C_{ps}$ has a frequency of about ten and several kHz because the several kHz are the upper limit of the beat frequency. As in reference (E) (Japanese Patent Application Laid-open No. 6-82215), when the frequency shifter constituted by the two AOMs arranged in tandem with each other is used, the beat frequency is determined by twice the difference between the frequencies of the high-frequency modulation signals applied to the respective AOMs and can be relatively freely determined.

The waveform data in the memory circuit unit 54 are loaded in a phase difference $\Delta\psi$ and position offset amount $\Delta X$ calculation circuit or circuit unit 56, so that the phase difference $\Delta\psi_1$ shown in FIGS. 10A and 10B is calculated by a digital arithmetic operation (Fourier integration). If the pitch Pmg of the grating mark MG of the wafer W and the pitch Pif of the interference fringes formed thereon satisfy relation Pmg=2Pif, one period of each waveform in FIGS. 10A and 10B corresponds to Pmg/2.

Phase measurement is generally performed within the range of ±180°. The calculation circuit unit 56 converts the calculated phase difference $\Delta\psi_1$ into a position offset amount $\Delta X$ within the range of ±Pmg/4 in accordance with the conversion formula $\Delta X = Pmg \cdot \Delta\psi_1/4\pi$. This offset amount $\Delta X$ represents an offset of the grating mark MG with respect to the reference grating SG within the range of ±Pmg/4. Assuming that the resolution of the phase difference measurement is given as about 0.2°, the resolution of the offset amount is about (0.2/180)Pmg/4. If the pitch Pmg is set to be 4 μm, a practical range of 0.002 μm (2 nm) is obtained.

The resultant offset amount $\Delta X$ is an offset of the grating mark MG with respect to the reference grating SG in the pitch direction, and the offset amount data is sent to a position controller (display controller) 62 and to a servo control circuit or circuit unit 64 if the wafer W is aligned (positioned) in real time.

This servo control circuit unit 64 has two functions. One function is to perform feedback control for the drive source 42 until the offset amount $\Delta X$ reaches a predetermined value (direct servo mode). To perform this function, the A/D converter 50, the memory circuit unit 54, and the calculation circuit unit 56 are repeatedly operated to calculate the offset amount $\Delta X$ every very short period of time (e.g, several msec.)

The other function of the servo control circuit unit 64 is a function of moving the wafer stage WST on the basis of a measurement value from the laser interferometer 44 (interferometer servo mode). This function is used to position the grating of the fiducial mark plate FG on the stage WST or the grating mark MG on the wafer W immediately below the objective lens 22, or position an arbitrary point on the wafer W immediately below the objective lens 22 with reference to the detected position of the grating mark MG.

In the interferometer servo mode, target position information of the wafer stage WST is output from the position controller 62 to the servo control circuit unit 64. The control circuit unit 64 performs feedback control of the drive source 42 such that a difference between the target position and the current position of the stage WST which is read by the laser interferometer 44 falls within a predetermined allowable range (e.g., ±0.4 μm).

When the direct servo mode is set following the interferometer servo mode, the servo enable range of the direct servo mode is ±Pmg/4 with respect to the pitch Pmg of the grating mark MG. If the detection value is larger than the upper limit of this range, positioning is performed while an offset corresponding to ½ a pitch of the grating mark MG is left uncorrected. The positioning allowable range of the stage WST in the interferometer servo mode need not be steadily set to be ±0.04 μm, but may be switched to the allowable range of ±[(Pmg/4)−α] when the grating mark MG (or the fiducial mark plate FG) is to be detected.

For example, if the allowable range is set to be about ±0.5 μm at the pitch Pmg of 4 μm, the positioning servo operation can be performed with less strict precision than that for the normal allowable range (±0.04 μm), thereby shortening the tracing time. When the difference falls within the less strict allowable range (±0.05 μm), the direct servo mode is set to perform high-precision positioning (alignment) at a higher speed.

In addition to the servo mode switching instruction, the position controller 62 also has a function of displaying the coordinate position of the grating mark MG and the calculated offset amount $\Delta X$.

The position detection apparatus and its method according to the first embodiment of the present invention have been described above. A grating mark formed on a semiconductor wafer for alignment during photolithography process is formed as a relatively low step mark having a relatively small step difference when the heterodyne (or homodyne) interference mark detection method is employed.

In the interference mark detection method, a mark itself is constituted as a pattern of 10 to 20 lines and spaces. A diffracted light component generated by the entire line-and-space pattern is photoelectrically detected. Even if a grating mark has a small step difference, mark position detection can be performed on the basis of a sufficiently large detection light amount.

Figure 1:
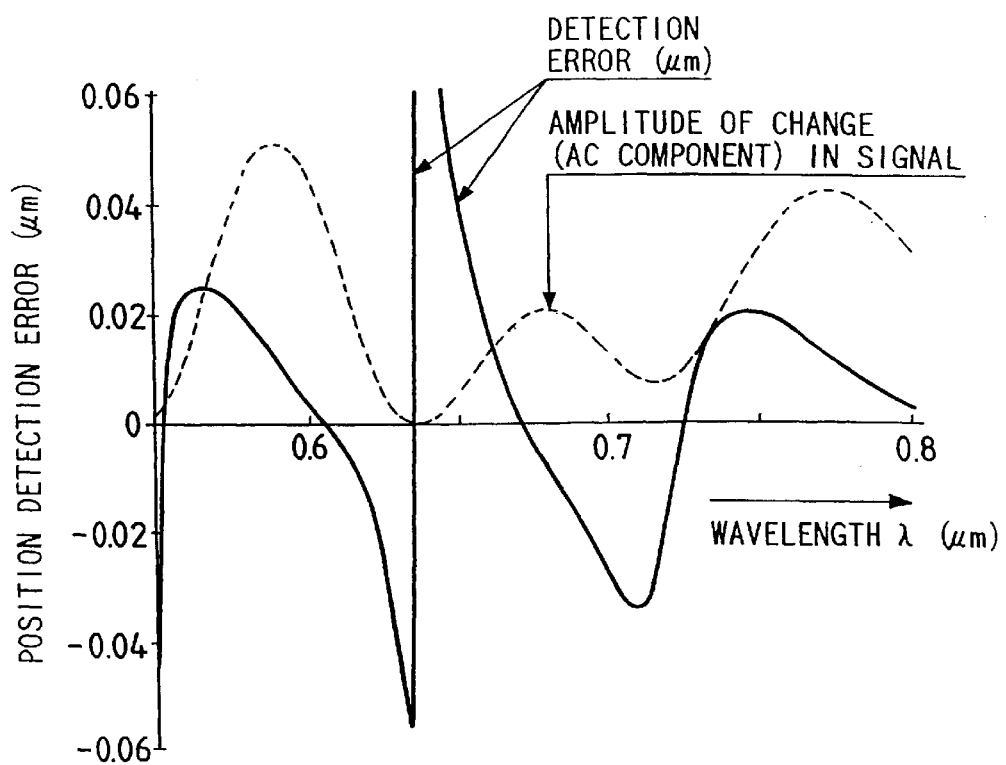
FIG. 1 is a graph showing the simulation results of wavelength dependence of position detection errors when a conventional interference mark position detection apparatus employing a single wavelength is used.
Figure 11:
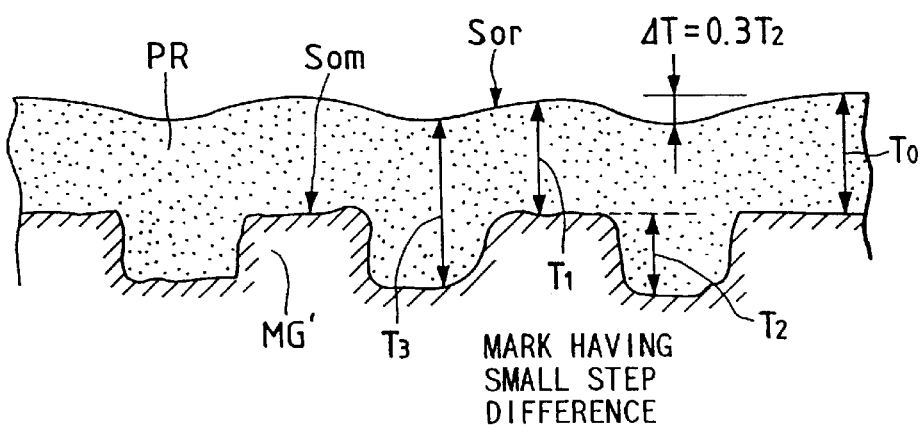
FIG. 11 is a partial sectional view illustrating the sectional structure between a grating mark having a small step difference formed on a semiconductor wafer and a resist layer covering the surface of the mark.

FIG. 11 is an enlarged view showing part of the sectional structure of a grating mark MG' having a small step difference in the pitch direction. The step difference of the grating mark MG' is a step difference $T_2$ between a mark surface Som and the bottom surface of the grating groove. Note that the model used in the simulation in FIG. 1 is the grating mark MG having the sectional structure shown in FIG. 2. The assumed step difference $T_2$ was 0.7 μm. On the other hand, the mark having a, small step difference has a step difference $T_2$ of 0.5 μm or less in FIG. 11. This does not almost cause asymmetry during wafer processing. For this reason, the variation in amplitude reflectance which is caused by at least asymmetry can be minimized, thereby contributing to the improvement of the precision in mark position detection.

An average thickness (target coating thickness) To (or $T_1$) of the resist layer PR in FIG. 11 generally falls within the range of 0.7 μm to 1.2 μm. For this reason, the change range of $T_1$ to $T_3$ of the substantial resist thicknesses in use of the grating mark MG' having a small step difference satisfies $T_3 \cong T_2 + (T_1 - \Delta T) = T_1 + 0.72 T_2$, provided that a resist layer surface Sor in the groove portion of the grating is recessed by $\Delta T = 0.3 T_2$. Therefore, the step difference $T_2$ of the grating mark MG' is set to be 0.5 μm, and the change range of $T_1$ to $T_3$ falls within the range of 0.7 μm to 1.55 μm.

As can be apparent from the simulation results in FIG. 8, this range perfectly matches the incoherent range of the multi-wavelength illumination light beams (±LF) obtained from the three wavelengths $\lambda_1$, $\lambda_2$ and $\lambda_3$.

In this embodiment, even if the grating mark has a small step difference to almost eliminate asymmetry in the grating mark structure, the influence (variation in amplitude reflectance) of the resist layer which poses the subsequent problem can also be reduced.

Figure 12:
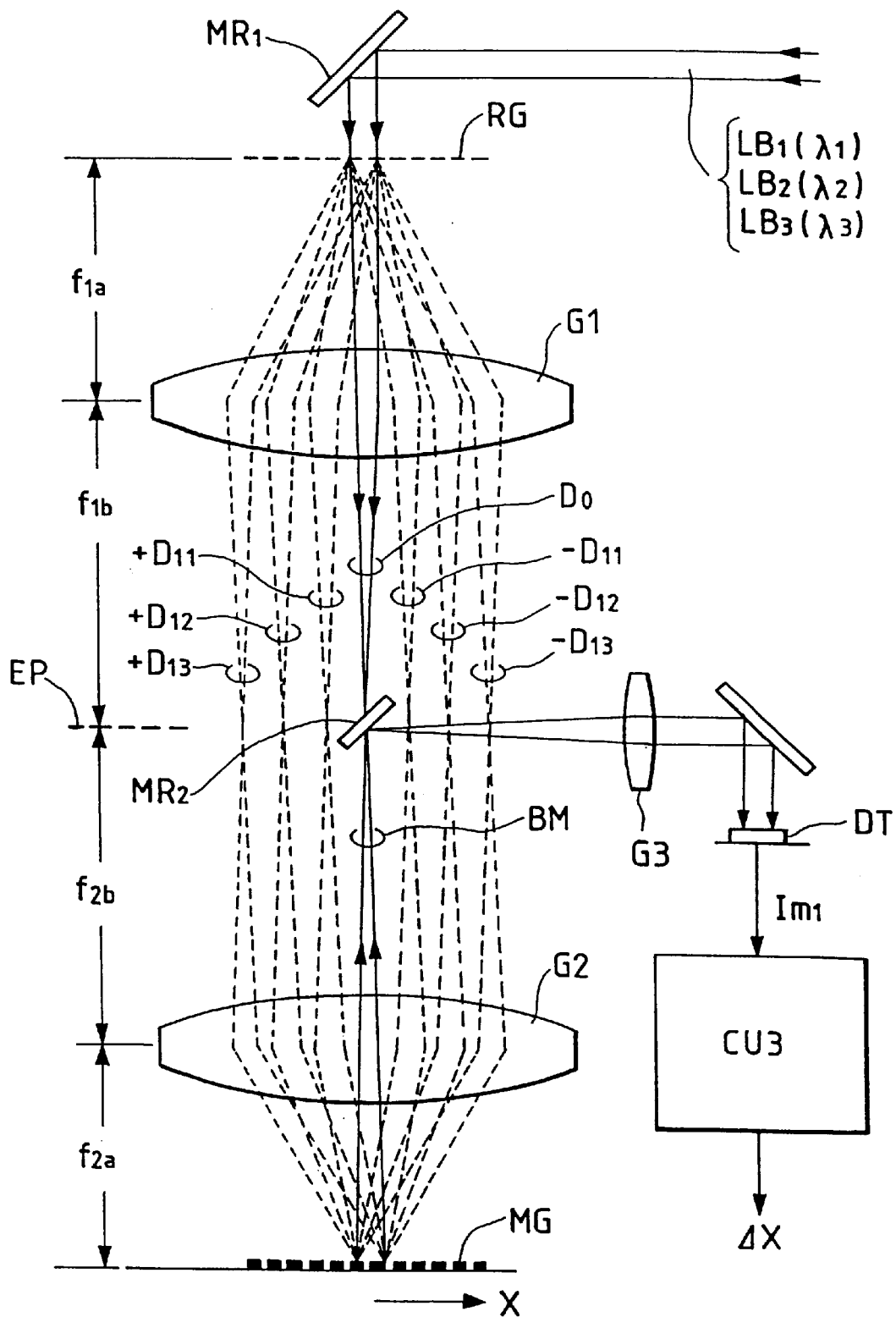
FIG. 12 is a view showing the arrangement of a position detection apparatus according to the second embodiment of the present invention.

FIG. 12 shows the arrangement of a position detection apparatus according to the second embodiment of the present invention. In this case, a relative position offset amount between two diffraction grating marks RG and MG in the pitch direction (X direction) is measured by the homodyne scheme. Beams $LB_1$, $LB_2$, and $LB_3$ as the illumination light beams are emitted from laser light sources $LS_1$, $LS_2$, and $LS_3$ (FIG. 6) having different wavelengths $\lambda_1$, $\lambda_2$, and $\lambda_3$, synthesized coaxially as parallel beams, and vertically irradiated on the grating mark RG through a mirror MR1.

A plurality of diffracted light components are generated upon irradiation of the beams $LB_1$, $LB_2$, and $LB_3$ (parallel light beams) from the grating mark RG. When the grating mark RG is a one-dimensional transmission grating having a duty of 1:1, and its pitch direction is the horizontal direction on the drawing surface in FIG. 12, these diffracted light components (diffracted beams) are deflected on the drawing surface of FIG. 12 at a predetermined diffraction angle.

As the diffracted beams in FIG. 12, 1st-order diffracted beams $+D_{11}$ and $-D_{11}$ generated from the beam $LB_1$ having the wavelength $\lambda_1$, 1st-order diffracted beams $+D_{12}$ and $-D_{12}$ generated from the beam $LB_2$ having the wavelength $\lambda_2$, 1st-order diffracted beams $+D_{13}$ and $-D_{13}$, and a 0th-order diffracted beam $D_0$ are illustrated. Diffracted light beams of higher order are also generated from the beams $LB_1$, $LB_2$, and $LB_3$, but only the 1st-order diffracted beams are illustrated for the sake of descriptive simplicity.

Each diffracted beam is incident on an imaging optical system (i.e., a projection exposure optical system and a mark detection alignment optical system) divided into a front-group lens system G1 and a rear-group lens system G2. The grating mark RG is located at the position of a front focal length f1a of the front-group lens system G1. When the position of a rear focal length f1b of the front-group lens system G1 almost coincides with the position of a front focal length f2b of the rear-group lens system G2 to form a Fourier transform plane (pupil plane) EP, the 1st-order diffracted beams cross (imaging) at the position of a rear focal length f2a of the rear-group lens system G2. Assume that the chromatic aberration of the imaging optical system consisting of the lens systems G1 and G2 is corrected for the three wavelengths $\lambda_1$, $\lambda_2$, and $\lambda_3$. As shown in FIG. 12, a small mirror MR2 is fixed at the center of the Fourier transform plane EP. The 0th-order diffracted beam $D_0$ from the grating RG is shielded by this mirror MR2 and is prevented from being incident on the rear-group lens system G2. When the respective 1st-order diffracted beams emerge from the grating mark RG, they are parallel beams as in the beams $LB_1$, $LB_2$, and $LB_3$ but are converged as beam waists at the position-of the Fourier transform plane EP by the behavior of the front-group lens system G1.

A diffraction angle $\theta_1$ (i.e., an angle with respect to the 0th-order diffracted beam $D_0$) of the 1st-order diffracted beams $\pm D_{11}$ generated by the beam $LB_1$ having the wavelength $\lambda_1$, a diffraction angle $\theta_2$ of the 1st-order diffracted beams $\pm D_{12}$ generated by the beam. $LB_2$ having the wavelength $\lambda_2$, and a diffraction angle $\theta_3$ of the 1st-order diffracted beams $\pm D_{13}$ generated by the beam $LB_3$ having the wavelength $\lambda_3$ are defined as follows:

$$\sin \theta_1 = \lambda_1 / Prg \quad (1)$$

$$\sin \theta_2 = \lambda_2 / Prg \quad (2)$$

$$\sin \theta_3 = \lambda_3 / Prg \quad (3)$$

If $\lambda_1 < \lambda_2 < \lambda_3$, then $\theta_1 < \theta_2 < \theta_3$. As shown in FIG. 12, on the Fourier transform plane EP, the 1st-order diffracted beams $\pm D_{11}$ pass inside the 1st-order diffracted beams $\pm D_{12}$ (on the side of 0th-order diffracted beam), while the 1st-order diffracted beams $\pm D_{12}$ pass inside the side of 1st-order diffracted beams $\pm D_{13}$ (on the 1st-order diffracted beams $\pm D_{11}$).

The respective 1st-order diffracted beams are superposed as parallel beams on the reflection grating us mark MG formed by corrugations on a wafer W through the rear-group lens system G2. In this case, the pitch direction of the grating mark MG coincides with the X direction. One-dimensional interference fringes having the wavelength $\lambda_1$ (the pitch direction is the X direction) are generated by two-beam interference of the 1st-order diffracted beams $\pm D_{11}$, one-dimensional interference fringes having the wavelength $\lambda_2$ (the pitch is X direction) are formed by two-beam interference of the 1st-order diffracted beams $\pm D_{12}$, and one-dimensional interference fringes having the wavelength $\lambda_3$ (the pitch direction is the X direction) are formed by two-beam interference of the 1st-order diffracted beams $\pm D_{13}$.

At this time, since the light beam having the wavelength $\lambda_1$, the light beam having the wavelength $\lambda_2$, and the light beam having the wavelength $\lambda_3$ are different wavelengths each other, the 1st-order diffracted beams $\pm D_{11}$, $\pm D_{12}$, and $\pm D_{13}$ are not interfered with each other. It is important that the interference fringes having the wavelengths $\lambda_1$, $\lambda_2$, and $\lambda_3$ generated by the 1st-order diffracted beams $\pm D_{11}$, $\pm D_{12}$, and $\pm D_{13}$ appear as one set of interference fringes having the same intensity distribution pitch.

An intensity distribution pitch Pif of the interference fringes is determined by a pitch Prg of the grating mark RG and a magnification factor M of the imaging optical system (G1 and G2) and is defined as Pif=M·Prg/2. For example, when the pitch Prg is set to be 4 μm, and the magnification factor M is ¼ (the pattern size of the grating RG is reduced into ¼ on the grating mark MG side), the pitch Pif of the interference fringes becomes 0.5 μm. If the pitch Pmg of the grating MG to be measured is given as Pmg=2Pif, i.e., Pmg=M·Prg, then rediffracted light components of the respective wavelengths are generated from the grating mark MG, by the each 1st-order diffracted beams $\pm D_{1n}$ as the incident light beams.

For example, one rediffracted light component generated by the grating mark MG upon irradiation of the 1st-order diffracted beam $+D_{11}$ as the incident beam is the $-1$st-order diffracted light component (wavelength $\lambda_1$) vertically propagating from the grating mark MG. One rediffracted light component generated from the grating mark MG upon irradiation of the 1st-order diffracted beam $-D_{11}$ as the incident beam is the +1st-order diffracted light component (wavelength $\lambda_1$) vertically propagating from the grating mark MG. The +1st-order diffracted light components of the wavelength $\lambda_1$ vertically propagating from the grating mark MG have an interference intensity corresponding to the mutual phase states, serve as an interference beam BM, and reach a mirror MR2.

Similarly, rediffracted light components are generated from the grating mark MG upon irradiation of the 1st-order diffracted beams $\pm D_{12}$ and $\pm D_{13}$ as the incident beams. The $-1$st-order diffracted light component of the wavelength $\lambda_2$ (wavelength $\lambda_3$) generated from the grating mark MG upon irradiation of the 1st-order diffracted beam $+D_{12}$ ($+D_{13}$) propagates in a direction perpendicular to the grating mark. The +1st-order diffracted light component of the wavelength $\lambda_2$ (wavelength $\lambda_3$) generated from the grating mark MG upon irradiation of the 1st-order diffracted beam $-D_{12}$ ($-D_{13}$) propagates in a direction perpendicular to the grating MG. The +1st-order diffracted light components of the wavelengths $\lambda_2$ and $\lambda_3$ propagating in the direction perpendicular to the grating mark MG also have an interference intensity corresponding to the mutual phase states, serve as the interference beam BM, and reach the mirror MR2.

Therefor the interference beam BM coaxially includes an interference beam $B_{m1}$ having the wavelength $\lambda_1$, an interference beam $B_{m2}$ having the wavelength $\lambda_2$, and an interference beam $B_{m3}$ having the wavelength $\lambda_3$.

The interference beam BM is reflected by the mirror MR2 and reaches a photoelectric element DT through a lens system G3 constituting a photoelectric detection system. The interference beams $B_{m1}$, $B_{m2}$, and $B_{m3}$ of the respective wavelengths in the interference beam BM are simultaneously received by the photoelectric element DT. The photoelectric element DT outputs a photoelectric signal $I_{m1}$ having the level corresponding to the intensity of the interference beam BM to a circuit unit $CU_3$.

The circuit unit $CU_3$ is arranged as in the signal processing circuit shown in FIG. 9. However, since the homodyne scheme is employed, the second grating mark MG, i.e., a stage WST on which the wafer W is placed ;Ls slightly moved in the pitch direction with respect to the interference fringes in mark position detection. A change in level (waveform) of the signal $I_{m1}$ output from the photoelectric element DT in mark position detection is changed and measured in correspondence with the movement position of the stage. Note that the incident beams $\pm D_{1n}$ may be moved without changing the crossing angle of the pair of incident beams $\pm D_{1n}$ so as to move the interference fringes along the pitch direction.

The signal processing circuit of this embodiment can be realized by changing the circuit arrangement in FIG. 9 as follows. A position measurement pulse signal output from an interferometer shown in FIG. 6 is supplied to an A/D converter 50 and a waveform memory circuit unit 54 in place of a sampling pulse $C_{ps}$ in the circuit block shown in FIG. 9. The signal $I_{m1}$ from the photoelectric element DT is waveform-sampled with the pulse signal (e.g., one pulse for 0.02-μm movement of the stage WST) from the interferometer 44. Note that a reference signal $I_{ms}$ need not be processed, unlike in the processing circuit in FIG. 9 because the second embodiment employs the homodyne scheme.

The circuit unit $CU_3$ in FIG. 12 has the same arrangement as that of the A/D converter 50, a waveform memory circuit 54, and a calculation circuit 56 in FIG. 9. However, a method of calculating a position offset amount ΔX in the calculation circuit 56 is different from that in the heterodyne scheme. That is, in the homodyne scheme, the sinusoidal sampling waveform stored in the waveform memory circuit 54 is not a function of time, but a function of position. The waveform itself represents the relative positional relationship in the grating mark MG.

Since the homodyne scheme is employed in this embodiment, the intensity of the interference beam BM changes in accordance with a change in relative position between the grating marks RG and MG in the X direction. If the grating marks RG and MG are kept stopped in a given state, the levels of the signals $I_{m1}$ continuously have predetermined values. The grating mark MG and the interference fringes generated by the grating mark RG on the grating mark MG are scanned relative to each other by a predetermined amount (the distance of the pitch Pif or more of the interference fringes) in the X direction, and the peak value and the bottom value during the sinusoidal change in level of the signal $I_{m1}$ generated during scanning are sampled by the circuit unit $CU_3$. An amplitude value is specified from the difference between the peak and bottom values, and then the mark position offset amount ΔX is calculated.

Figure 13A:
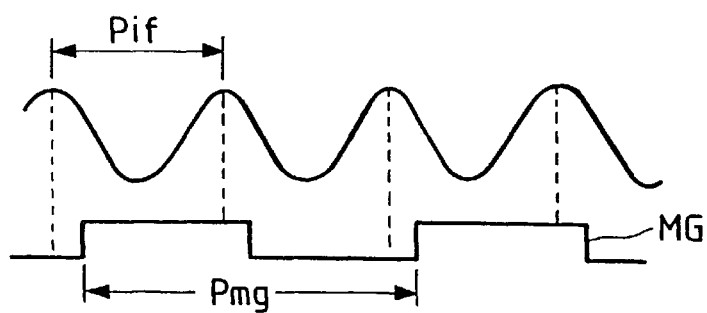
FIGS. 13A to 13D are views illustrating the position detection states of a grating mark by the apparatus shown in FIG. 12 and the changes in photoelectric signals.
Figure 13B:
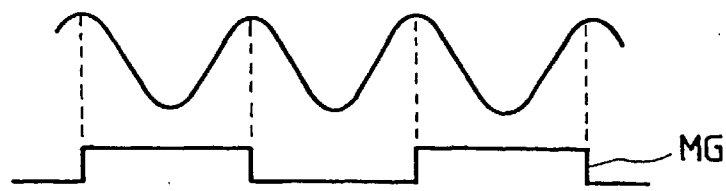
Figure 13C:
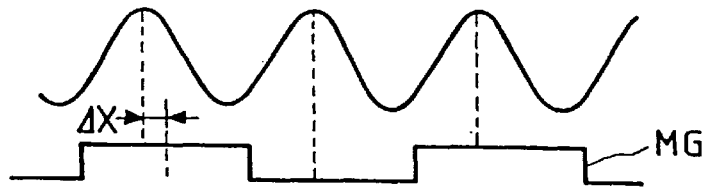
Figure 13D:
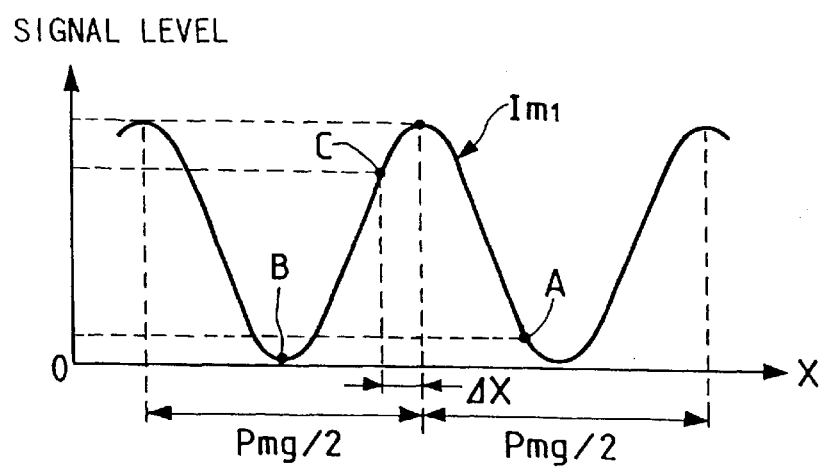

A change in the signal $I_{m1}$ with a change in positional relationship between the interference fringes and the grating mark MG will be described with reference to FIGS. 13A to 13D. In FIGS. 13A, 13B, and 13C, the interference fringes having the pitch Pif have a good sinusoidal intensity distribution due to two-beam interference and are set to be Pmg=2Pif with respect to the pitch Pmg of the grating mark MG. When the interference fringes are moved in the right direction with respect to the grating MG in an order shown in FIGS. 13A, 13B, and 13C, the level of the signal $I_{m1}$ sinusoidally changes, as shown in FIG. 13D. As shown in FIG. 13B, at a position where each peak of the interference fringes overlaps the each step edge of the grating mark MG, the signal $I_{m1}$ has a bottom level, as indicated by a point B. The level at a point A in FIG. 13D represents the positional relationship in FIG. 13A, and the level at a point C represents the positional relationship in FIG. 13C.

As described above, the level of the signal $I_{m1}$ periodically changes every time the interference fringes and the grating mark MG are moved by Pmg/2 in the X direction. For this reason, unless the interference fringes and the grating mark MG are slightly moved preliminarily, the peak and bottom levels of the detected signal $I_{m1}$ cannot be obtained. For this reason, the changes in level of the signal $I_{m1}$ during the relative movement between the interference fringes and the grating mark MG by a distance about 5 to 10 times the pitch of the grating MG are stored in the waveform memory circuit 54 in the circuit unit $CU_3$.

In the circuit unit $CU_3$, the signal waveform stored in the waveform memory circuit 54 is arithmetically processed by the calculation circuit 56 to obtain an X-direction position offset amount $\Delta X$ between the interference fringes and the grating mark MG on the basis of the amplitude of the signal $I_{m1}$ and a conversion formula $F(I_{m1})$. This position offset amount $\Delta X$ is obtained as a value within the range of $\pm Pmg/4$ using the peak or bottom point of the signal $I_{m1}$ in FIG. 13D as a reference (origin).

The function (or formula) $F(I_{m1})$ is a sine or cosine function because the signals $I_{m1}$ is sinusoidal. A radian $\psi_1$ satisfying the following condition:

$$(E_{p1}+E_{b1})/2+[(E_{p1}-E_{b1})\sin\psi_1]/2=e1$$

where $E_{p1}$ is the peak level of the signal $I_{m1}$, $E_{b1}$ is its bottom level, and e1 is the level of the signal $I_{m1}$ at a position to be detected, and a substitution of the radian $\psi_1$ into the following conversion formula yields the offset amount $\Delta X$ from the reference point:

$$\Delta X = Pmg\cdot\psi/4\pi$$

The calculated offset amount $\Delta X$ is the position offset amount of the grating MG to be finally obtained with respect to the grating RG.

In the above embodiment, in irradiating the grating marks RG and MG with the multi-wavelength illumination beam having the beams $LB_1$, $LB_2$, and $LB_3$ having three different wavelengths at a predetermined light intensity ratio, the center wavelengths $\lambda_1$, $\lambda_2$, and $\lambda_3$ of the three beams satisfy relation $1/\lambda_1-1/\lambda_2=1/\lambda_2-1/\lambda_3$ ($\pm 10\%$) The position detection results having a higher reliability can be obtained with an effect of the multi-wavelength interference beam BM to be photoelectrically detected. In the optical arrangement in FIG. 12, assume that the grating RG serves as a grating mark on the mask, that the grating MG serves as a mark on the wafer, and that the imaging systems G1 and G2 are projection lenses for projecting the mask pattern on the wafer. In this case, an alignment device in the projection exposure apparatus can be realized.

Figure 14:
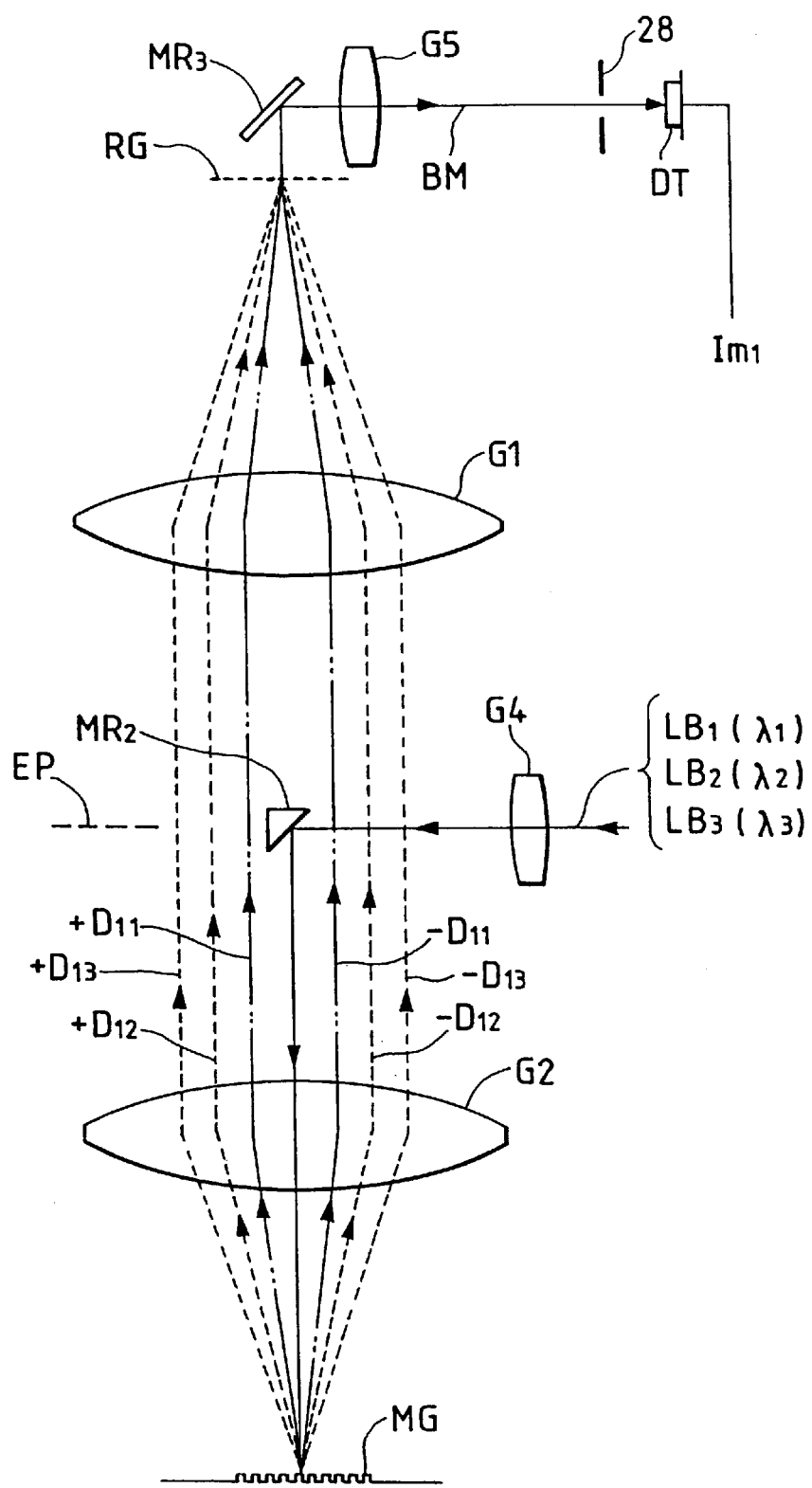
FIG. 14 is a view showing the arrangement of a position detection apparatus according to the third embodiment of the present invention.

FIG. 14 shows the&gchematic arrangement according to the third embodiment. The same reference numerals as in FIG. 12 denote the same members and beams in FIG. 14. In the third embodiment, three illumination beams $LB_1$, $LB_2$, and $LB_3$ are incident on a small mirror MR2 located at the center of a Fourier transform plane EP of an imaging optical system (G1 and G2) through a lens system G4. The beams $LB_1$, $LB_2$, and $LB_3$ deflected by this small mirror MR2 are converted into parallel beams through a rear-group lens system G2, and are vertically irradiated on a grating mark MG.

First-order diffracted beams $\pm D_{11}$ of a wavelength $\lambda_1$, 1st-order diffracted beams $\pm D_{12}$ of a wavelength $\lambda_2$, and 1st-order diffracted beams $\pm D_{13}$ of a wavelength $\lambda_3$, all of which are diffracted by the grating mark MG, and crossed (imaged) on a grating RG through the lens systems G1 and G2. Since the grating RG is of a transmission type, the $\pm$1st-order diffracted light components of all the rediffracted light components generated by the grating RG upon irradiation of the 1st-order diffracted beams $\pm D_{11}$ serve as an interference beam $B_{m1}$ (including BM), and this beam propagates in a direction opposite to the imaging optical systems and perpendicular to the grating RG. The interference beam $B_{m1}$ reaches a spatial filter 28 through a mirror MR3 and a lens system G5. The spatial filter 28 removes unnecessary diffracted components, and the resultant beam is received by a photoelectric element DT.

The $\pm$1st-order diffracted light components of the rediffracted light components generated by the grating RG upon irradiation of the 1st-order diffracted beams $\pm D_{12}$ and $\pm D_{13}$ having the wavelengths $\lambda_2$ and $\lambda_3$ are converted into interference beams $B_{m2}$ and $B_{m3}$ (including BM) which then vertically propagate from the grating RG. These beams are received by the photoelectric element DT through the mirror MR3, the lens system G5, and the spatial filter 28. These interference beams $B_{m1}$, $B_{m2}$, and $B_{m3}$ are coaxially generated as one interference beam BM. However, since separate light sources are arranged for generating the respective beams, the interference beams $B_{m1,\ Bm2}$, and $B_{m3}$ will not interfere with each other.

This embodiment has a relationship between beam incidence and reception which is reverse to that in FIG. 12. This arrangement can be applied to an apparatus in which the grating mark MG is formed on a semiconductor wafer, the grating mark RG is formed on a reticle (mask), and the lens systems G1 and G2 are reduction projection lenses for projecting and exposing the reticle pattern, as disclosed in Japanese Patent Application Laid-open No. 3-3223 (corresponding U.S. Pat. No. 5,100,237; to be referred to as reference (F) hereinafter).

In the apparatus disclosed in reference (F), a small lens for deflecting 1st-ordered diffracted beams by a small amount is arranged on a pupil plane EP of a projection lens to correct the chromatic aberration generated by the projection lens. When the embodiment of FIG. 14 is applied to this apparatus, a small lens (e.g., flint glass having a large color dispersion) for optimally correcting the respective 1st-order diffracted beams $\pm D_{11}$, $\pm D_{12}$, and $\pm D_{13}$ (three pairs of illumination beams for forming two-beam light) having small wavelength differences. In the third embodiment, the illumination beams $LB_1$, $LB_2$, and $LB_3$ are directly incident on, e.g., the grating mark MG on the wafer. For this reason, the intensities of the 1st-ordered diffracted beams $\pm D_{11}$, $\pm D_{12}$, and $D_{13}$ generated from the grating mark MG can be set higher than the intensities of the diffracted beam (interference beam BM) generated by the grating mark MG in FIG. 12 as a whole.

When a fiducial mark plate FG having a chromium surface having a known reflectance is fixed on a wafer stage WST, this mark plate FG can be used for measuring various baseline amounts and focus states. The baseline amount basically means an actually measured value for determining the relative positional relationship between the projection point of the center of a mask (reticle) mounted in the projection exposure apparatus and the detection center point in each of the various alignment systems.

Figure 15:
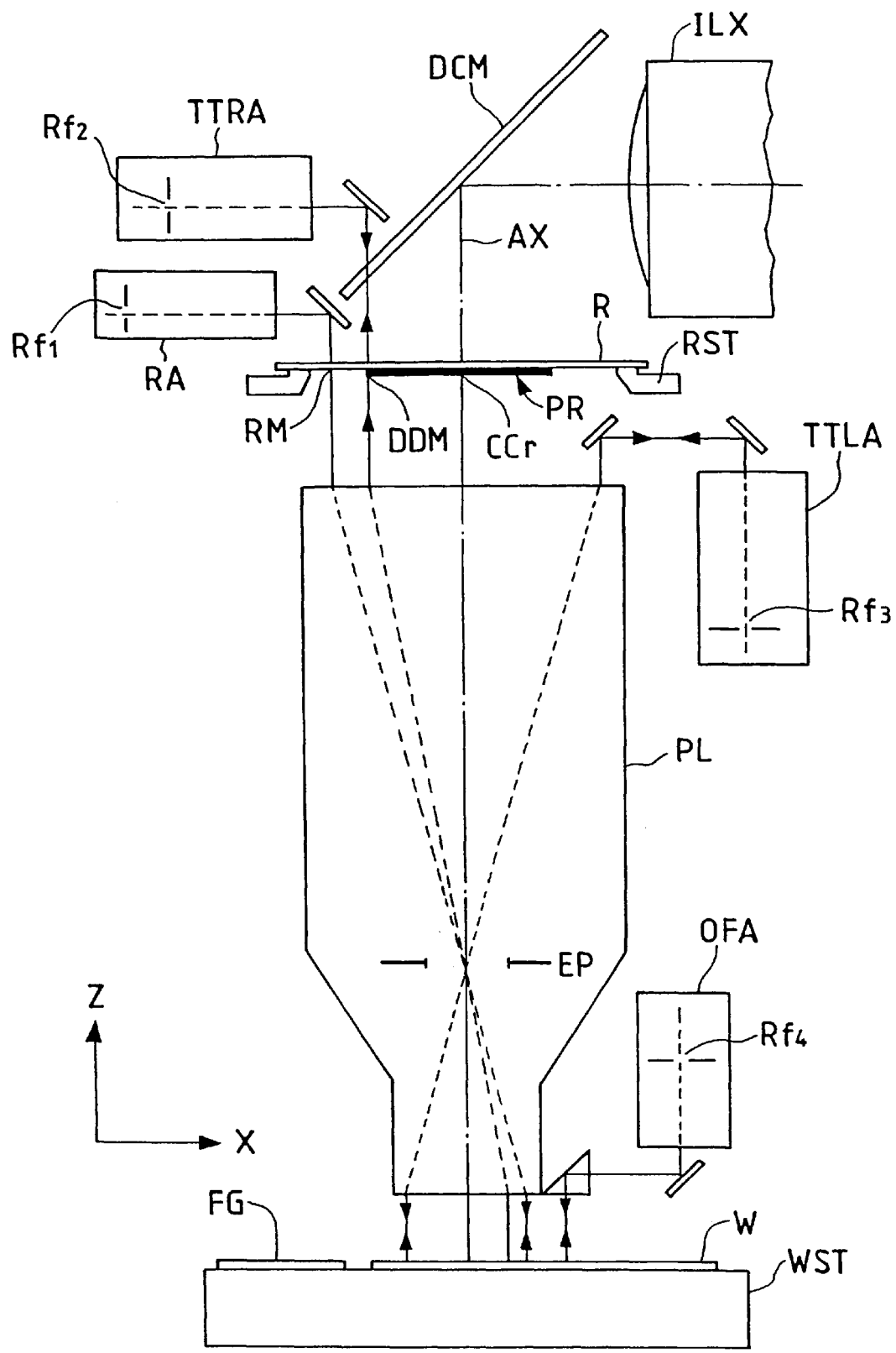
FIG. 15 is a view showing the arrangement of a projection exposure apparatus to which the position detection apparatus of the present invention is applied according to the fourth embodiment of the present invention.

FIG. 15 shows the schematic arrangement of an alignment system in a projection exposure apparatus which requires baseline amount measurement as the fourth embodiment of the present invention. A reticle R is chucked on a reticle stage RST by vacuum suction and is uniformly irradiated with an ultraviolet ray (e.g., i-line or excimer laser beam) emitted from an exposure illumination system ILX through a dichroic mirror DCM. The pattern image of the reticle R is projected and exposed in a predetermined shot region on the wafer W through a one-to-one or reduction projection optical system PL.

Referring to FIG. 15, marks detectable by an alignment system TTRA of a through-the-reticle (TTR) scheme, marks detectable by an alignment system TTLA of a through-the-lens (TTL) scheme, and marks detectable by an alignment system OFA of an off-axial scheme fixed outside the projection optical system PL are formed on the surface of the fiducial mark plate FG on the wafer stage WST.

Some of these marks are commonly used. An alignment system RA and the alignment systems TTRA, TTLA, and OFA have detection center points $R_{f1}$, $R_{f2}$, $R_{f3}$, and $R_{f4}$ serving as direct or indirect references in mark detection.

When the position detection apparatus shown in FIG. 6 is applied to each alignment system, the detection center points $R_{f1}$, $R_{f2}$, $R_{f3}$, and $R_{f4}$ are defined by a reference grating SG. In the reticle alignment system RA, when a reticle alignment mark (grating pattern) RM in the peripheral portion of the reticle R and a corresponding grating mark on the fiducial mark plate FG are-irradiated with illumination light having the same wavelength as that of the illumination light for projecting and exposing a pattern PR, and these two marks finely move the reticle stage RST so that the two marks have a predetermined positional relationship, the detection center point $R_{f1}$ need not be used.

This also applies to the alignment system TTRA. When the corresponding mark on the fiducial mark plate FG or the mark on the wafer, and a die-by-die (D/D) alignment mark formed in the peripheral portion of the pattern PR of the reticle R are imaged, and a position offset between these two mark images is detected, the detection center point $R_{f2}$ need not be defined.

The baseline amounts indicate the X-Y positional relationship between the projection point (substantially coinciding to an optical axis AX) of a center CCr of the reticle R on the wafer and the projection points of the detection center points $R_{f1}$, $R_{f2}$, $R_{f3}$, and $R_{f4}$ on the wafer. This positional relationship can be obtained by causing the alignment systems RA, TTRA, TTLA, and OFA to detect the position offset amounts between the corresponding marks on the fiducial mark plate FG and the projection points of the detection center points $R_{f1}$ to $R_{f4}$, and at the same time causing a laser interferometer 44 (see FIG. 6) to detect the corresponding coordinate position of the wafer stage WST.

When multi-wavelength incident beams ±LF are used, the pitches and the relative phases,; in the pitch direction, of the interference fringes generated on the wafer upon radiation of incident beams of the respective wavelength components are slightly different from each other (e.g., about 0.05 μm). Such a small offset can be eliminated to be ideally zero by the fine adjustment operation. Such time-consuming adjustment is not practical because a drift occurs over time. Instead, a calibration function of actually measuring the offsets in relative position (phase) for each wavelength component of the multi-wavelength interference fringes, i.e., the color offset of the interference fringes is preferably incorporated. This function will be described in detail later.

The pupil plane EP in the projection optical system PL shown in FIG. 15 is identical to the Fourier transform plane EP shown in FIG. 12. The optical axes of objective lenses arranged in the alignment systems RA, TTRA, and TTLA for detecting objects (the mark on the wafer W and the mark of the fiducial mark plate FG) on the wafer stage WST through the projection optical system PL are almost parallel to the optical axis AX on the wafer stage WST side.

When the reticle side of the projection optical system PL as well as its wafer side is set telecentric (FIG. 15), the optical axes of the objective lenses of the alignment systems are set parallel to the optical axis AX of the projection optical system PL. The extended lines of the optical axes of the objective lenses pass the center (a portion through which the optical axis AX passes) of the pupil plane EP of the projection optical system PL. The effective radius of the pupil plane EP corresponds to the numerical aperture (NA) which determines the resolving power (minimum resolution line width) of the projection lens PL. A projection lens having NA=about 0.5 to 0.7 is being developed at present.

Figure 16:
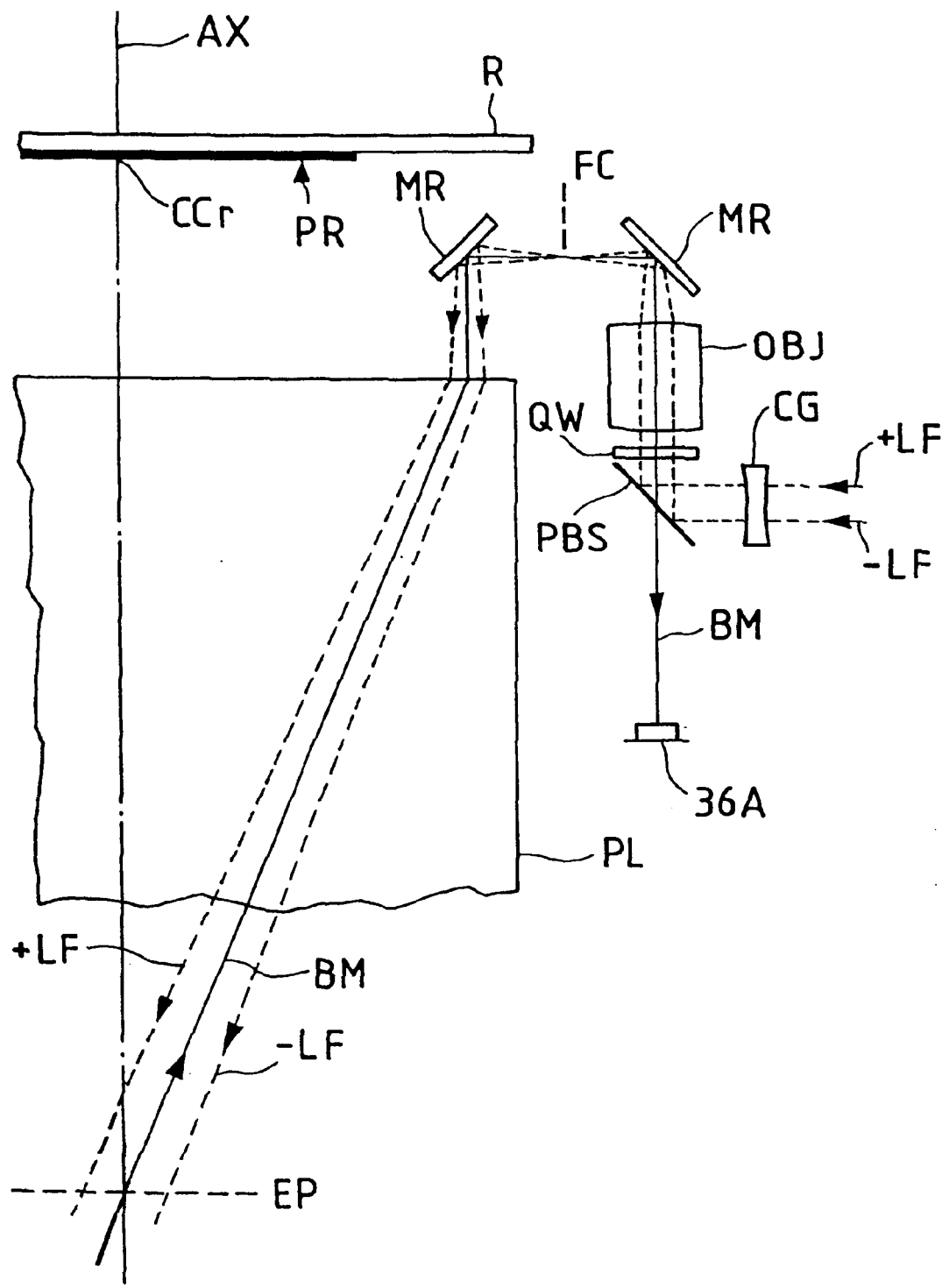
FIG. 16 is a view showing the arrangement of part of a TTL alignment system in FIG. 15.

FIG. 16 shows the main part of the alignment system TTLA of all the alignment systems shown in FIG. 15. The pair of multi-color incident beams ±LF (corresponding to the beam +LF and the beam −LF in FIG. 6) for detecting the grating mark MG on the wafer or the fiducial mark plate FG are incident on the projection lens PL through a correction optical system CG, a polarizing beam splitter PBS (functionally corresponding to the half mirror 20 in FIG. 4), a λ/4 plate QW, an-objective-lens OBJ (corresponding to the objective lens 22 in FIG. 6) and two mirrors MR.

In this case, a plane FC conjugate to the surface of the wafer W is formed between the two mirrors MR. The pair of beams ±LF cross on this plane FC. The beams ±LF are relayed by the projection lens PL and also cross on the wafer, thereby irradiating the grating mark MG.

In this embodiment, the beams ±LF incident on the polarizing beam splitter PBS are linearly polarized beams, and the incident beam efficiently reflected by the polarizing beam splitter PBS is converted into a circularly polarized beam rotated in one direction upon passing through the λ/4 plate QW. The beam then irradiates the grating mark MG on the wafer through the objective lens OBJ and the projection lens PL.

The interference beam BM vertically generated from the grating mark MG passes substantially through the center of the pupil plane EP of the projection lens PL and reaches the polarizing beam splitter PBS through the two mirrors MR, the objective lens OBJ, and the λ/4 plate QW. At this time, the interference beam BM is a linearly polarized beam in a direction perpendicular to the polarization direction of the incident beam, efficiently passes through the polarizing beam splitter PBS, and reaches a photoelectric element 36A.

In this alignment system TTLA, when the incident beams ±LF include a plurality of wavelength components (these components are separated from each other by about 30 nm to 40 nm), the crossing region of the beams ±LF irradiated on the wafer is shifted in the Z direction or the X and Y directions due to the influence of the chromatic aberration (on-axial factor and magnification factor) or the influence-of the chromatic aberration of the objective lens OBJ. The correction optical system CG for correcting the errors generated in accordance with the chromatic aberrations is arranged in the optical path of the incident beams ±LF. This correction optical system CG comprises a convex lens, a concave lens, a combination thereof, oar a plane-parallel glass member. Alternatively, the correction optical system CG may be constituted by adjustment optical systems 14, 16, and 18 shown in FIG. 6.

In the alignment system TTRA in FIG. 15, a D/D alignment mark DDM on the reticle R serves as a diffraction grating. When a relative position offset between the mark DDM and the corresponding grating mark MG on the wafer W is to be detected in accordance with the heterodyne scheme shown in FIG. 4, the influences of the chromatic aberration of on-axial and the chromatic aberration of magnification are reduced as disclosed in Japanese Patent Application Laid-open No. 6-302504 (corresponding U.S. Ser.

No.198,077 filed on Feb. 17, 1994; to be referred,to as reference (G) hereinafter). A transparent plane-parallel correction plate PGP is arranged on the pupil plane EP of the projection lens PL, and a transparent phase grating (corrugated lines are obtained by etching on the surface of the correction plate PGP at a predetermined pitch) is formed on the correction plate PGP at only the position where the incident beams (±LF) and the interference beam (BM) pass.

FIGS. 17A–17D show the arrangement of a projection exposure apparatus in which such a correction plate PGP is incorporated in part of an alignment system TTRA according to the fifth embodiment. FIG. 17A shows the optical path of incident beams ±LF and an interference beam BM in detecting a grating mark MG having a pitch in the X direction (measurement direction) along the X-Z plane, while FIG. 17B shows this optical path along the Y-Z plane perpendicular to the X-Z plane.

The pair of incident beams ±LF are decentered from an optical axis AXa and emerge from an objective lens OBJ (corresponding to the objective lens 22 in FIG. 6) of an alignment system TTRA. The beams are reflected by a mirror MR and incident on a projection lens PL through a window RW around the pattern region of a reticle R. The pair of incident beams ±LF are multi-wavelength beams. When viewed along the X-Z plane, the beams pass though the window RW with symmetrical inclinations, as shown in FIG. 17A. The beams are inclined with respect to the optical axis AXa of the objective lens OBJ when viewed along the Y-Z plane, as shown in FIG. 17B.

The pair of incident beams ±LF pass through phase diffraction gratings (to be referred to as phase gratings hereinafter) PG1 and PG2 on the correction plate PGP located on the pupil plane EP of the projection lens PL. At this time, the incident beams ±LF are inclined by the phase gratings PG1 and PG2 by a predetermined amount in predetermined directions as indicated by broken lines and emerge from the projection lens PL. The incident beams ±LF are irradiated on the grating mark MG on a wafer W at the symmetrical incident angles when viewed along the X-Z plane, as shown in FIG. 17A. When viewed along the Y-Z plane, the beams are slightly inclined in the Y direction and incident on the grating mark MG.

The interference beam BM generated from the grating mark while being slightly inclined in the Y direction is incident on the projection lens PL again and passes through the pupil plane EP at a position different from those of the phase gratings PG1 and PG2. A phase grating PG3 for inclining the interference beam BM by a predetermined amount in a predetermined direction, as indicated from the broken line to the solid line in FIG. 17B, is arranged at the above position. Therefore, the optical path of the interference beam BM is corrected to pass through the projection lens PL and to be directed toward the window RW of the reticle R.

Figure 4:
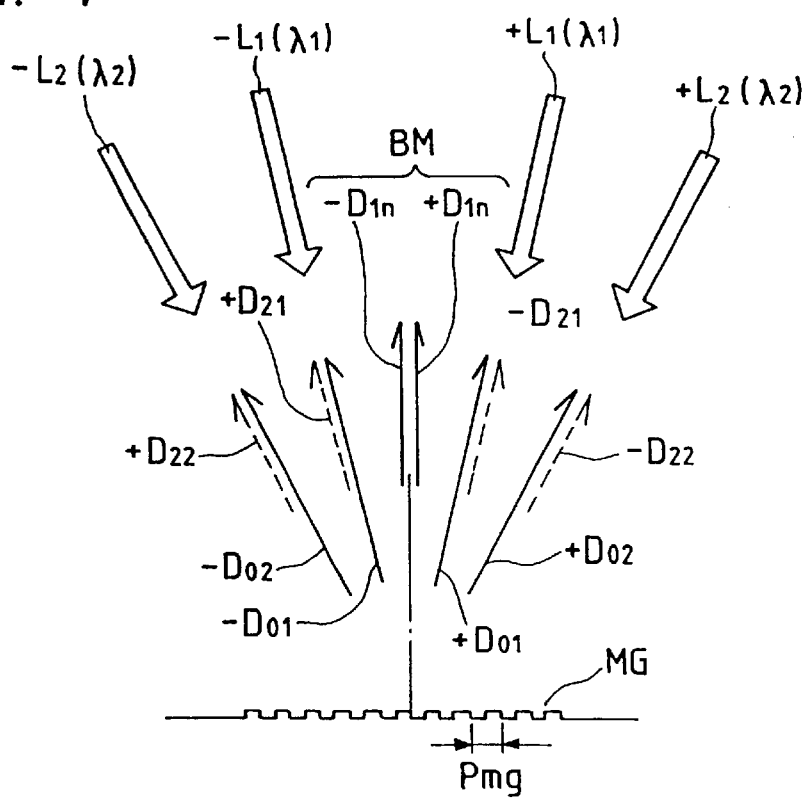
FIG. 4 is a view showing the state of diffracted light components of the respective orders generated by the grating mark upon irradiation of light beams having a plurality of wavelengths.

The interference beam BM passing through the window RW is directed toward the light reception system as in FIG. 4 through the mirror MR and the objective lens OBJ. At this time, the interference beam BM passes through the window RW of the reticle R while being slightly inclined in the non-measurement direction with respect to the optical axis AXa of the objective lens OBJ.

When this correction plate PGP and the multi-wavelength incident beams ±LF are used, the respective wavelength components of the incident beams ±LF are located lightly offset from each other on the correction plate PGP in the X direction. For this reason, the phase gratings PG1 and PG2 are also formed in a large size corresponding to the offsets of the wavelength components in the X direction. Such use of the correction plate PGP is also possible for an alignment system TTLA shown in FIG. 16. For example, in an exposure apparatus using a projection lens (a combination of a reflecting element and a refractive lens can be used) in which quartz or fluorite is used as a refractive lens material and an ultraviolet ray (e.g., an excimer laser beam) having a wavelength of 180 nm to 300 nm is used as exposure light, the chromatic aberrations for the wavelengths of beams from the He—Ne laser and a semiconductor laser are very large. A wafer conjugate plane FC shown in FIG. 16 is separated from the projection lens by several tens cm. For this reason, the correction plate PGP is used such that the wafer conjugate plane FC on which the incident beams ±LF cross comes close to the projection lens.

As described above, the multi-wavelength beams +LF and −LF pass through the incident phase gratings PG1 and PG2 on the correction plate PGP. At this time, it is difficult to optimize the grating structure of the phase gratings PG1 and PG2 for all the wavelength components to be used. For this reason, the grating structure of the phase gratings PG1 and PG2 is optimized for specific wavelength components. Adjustment optical members are preferably arranged in the incident optical path (generally on the light source side from the objective lens OBJ) of the incident beams ±LF to compensate for only the directional and positional differences, in advance, caused by differences in diffraction behaviors acting on the respective wavelength components of the incident beams in the phase gratings PG1 and PG2.

More specifically, it is important to adjust the positions of adjustment optical systems 14, 16, and 18 or the position of a correction lens CG in FIG. 16 so as not to cause extreme position and pitch offsets., in units of wavelength components, of the interference fringes formed on the grating mark MG of the wafer W (or the fiducial mark plate FG) upon interference of the pair of incident beams ±LF.

The sixth embodiment of the present invention will be described with reference to FIG. 18. In this embodiment, the polarization directions of a pair of incident beams +LF and −LF for irradiating a measurement (alignment) grating mark MG on a wafer W through an objective lens 22 are set complementary. More specifically, if the incident beams +LF and −LF are linearly polarized beams, their polarization directions are set to be perpendicular to each other. However, if the incident beams +LF and −LF are circularly polarized beams, they are set to be polarized beams having reverse rotational directions. For this reason, the two incident beams ±LF do not interfere with each other, and ±1st-order polarized light components BM of wavelengths $\lambda_1$, $\lambda_2$, and $\lambda_3$ vertically generated from the grating mark MG do not interfere with each other. When the ±1st-order diffracted light components BM are to be photoelectrically detected through the objective lens 22 and a small mirror MR2, a polarizing beam splitter PBS serving as an analyzer is used. In this manner, the ±1st-order polarized: components BM passing through the polarizing beam splitter PBS interfere with each other and serve as a first interference beam $B_{p1}$. The ±1st-order diffracted light components BM reflected by the polarizing beam splitter PBS interfere with each other and serve as a second interference beam $B_{p2}$.

These interference beams $B_{p1}$ and $B_{p2}$ are complementary. In the heterodyne scheme, the interference beams are sinusoidally intensity-modulated in accordance with the beat frequency. The intensity modulation phases of the interference beams $B_{p1}$ and $B_{p2}$ are different by accurately 180°.

Figure 18:
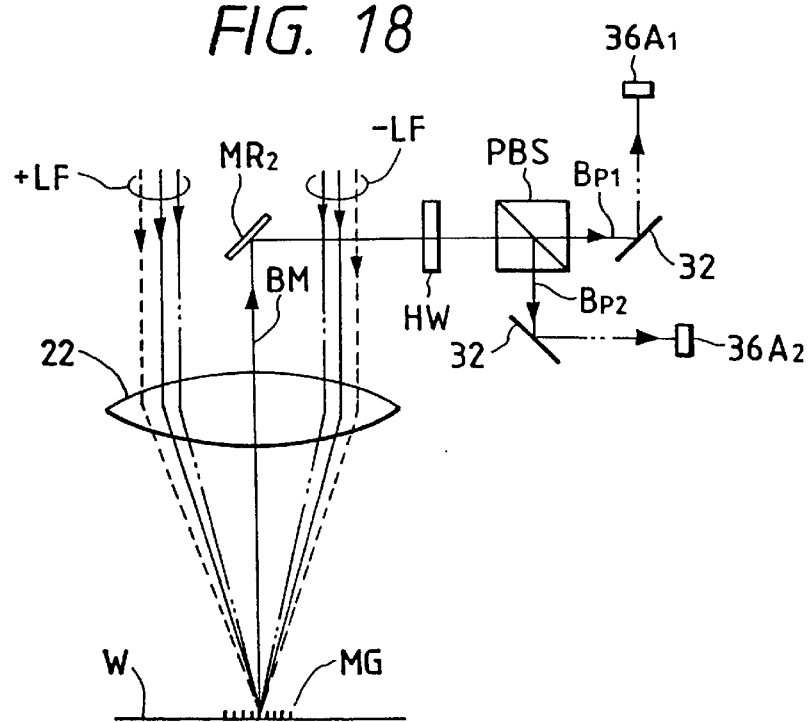
FIG. 18 is a view showing the arrangement of part of a position detection apparatus according to the sixth embodiment of the present invention.

When the linear polarization directions of the incident beams ±LF and the ±1st-order diffracted light component BM which are perpendicular to each other are different (rotated) from the polarization separation direction of the polarizing beam splitter PBS, a λ/2 plate HW shown in FIG. 18 is arranged to correct the linear polarization directions of the ±1st-order diffracted light beams EM. For this reason, when the linear polarization directions of the +1st-order diffracted light components BM which are perpendicular to each other coincide with the polarization separation direction of the polarizing beam splitter PBS from the beginning, or when the incident beams +LF and −LF are circularly polarized beams having opposite rotational directions, the λ/2 plate HW need not be used. In this embodiment, the interference beam $B_{p1}$ is received by a photoelectric element $36A_1$ through a mirror 32, and the interference beam $B_{p2}$ is received by a photoelectric element $36A_2$ through another mirror 32. In addition, output signals $I_{a1}$ and $I_{a2}$ from the photoelectric elements $36A_1$ and $36A_2$ are subtracted by a differential amplifier, thereby obtaining a photoelectric signal $I_{m1}$.

The differential amplifier is used as described above because the output signal from the photoelectric element $36A_1$ has a phase opposite (a difference of 180°) to that of the output signal from the photoelectric element $36A_2$. An in-phase noise component (common-mode noise) included in both the outputs is canceled by the above subtraction. A substantial S/N ratio of the signal $I_{m1}$ can be increased.

It is preferable that at least an on-axial chromatic aberration of the various chromatic aberrations be corrected for the objective lens 22 shown in FIG. 18 of this embodiment or in FIG. 6, or an objective lens OBJ shown in FIG. 16 to some extent. If the bandwidth of wavelengths $\lambda_1$, $\lambda_2$, and $\lambda_3$ to be used is 100 nm or less, such an on-axial chromatic aberration can be corrected to some extent by selecting proper materials for a plurality of lens elements constituting the objective lens 22 or combining lens elements having different refractive indices and different dispersion ratios. This chromatic aberration need not be perfectly corrected in the objective lenses 22 and OBJ. The chromatic aberration can be corrected by adjustment optical systems 14, 16, and 18 shown in FIG. 6 or a correction optical system CG shown in FIG. 16.

The seventh embodiment of the present invention will be described with reference to FIG. 19. This embodiment discloses a position detection apparatus added with the following new function. A multi-wavelength interference beam BM (±1st-order diffracted light components) generated from a grating mark MG on a wafer W or a fiducial plate FG is photoelectrically detected in units of wavelength components, and offset amounts caused by the colors of the interference fringes in units of wavelengths generated by two-beam interference are automatically measured.

Figure 19:
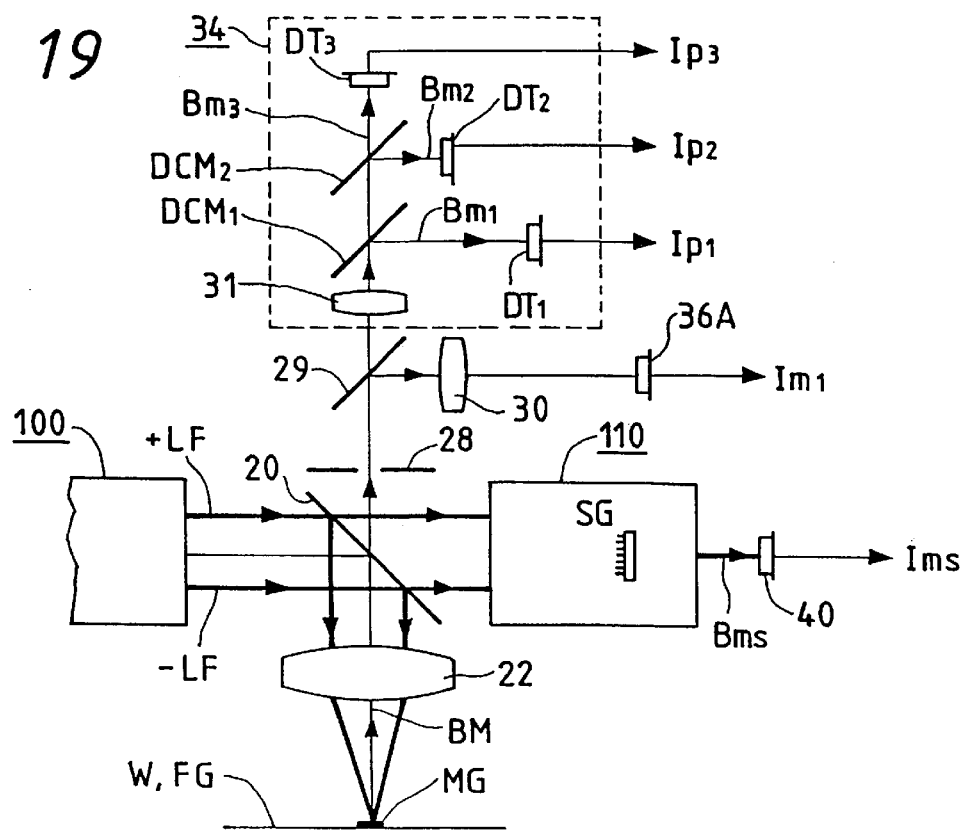
FIG. 19 is a view showing the arrangement of a position detection apparatus according to the seventh embodiment, in which spectral detection systems for receiving interference beams are arranged in units of wavelength components.

The arrangement of this embodiment shown in FIG. 19 is part of the arrangement in FIG. 6. More specifically, the arrangement in FIG. 19 is obtained by changing a photoelectric detection system for detecting an interference beam BM from the grating mark MG. The same reference numerals as in FIG. 6 denote the same parts in FIG. 19. An incident system 100 in FIG. 19 includes light sources $LS_1$, $LS_2$, and $LS_3$, a mirror MR, dichroic mirrors $DCM_4$ and $DCM_5$, a radial grating plate RRG serving as a frequency shifter, a lens 10, a spatial filter 12, and adjustment optical systems 14, 16, and 18. The incident system 100 in FIG. 19 emits a pair of incident beams +LF and −LF.

The incident beams ±LF having wavelengths $\lambda_1$, $\lambda_2$, and $\lambda_3$ are partially reflected by a half mirror 20 and incident on an objective lens 22. The remaining part of the beams is incident on a reference light reception system 110. The reference light reception system 110 comprises a wavelength selection filter 24, a lens 26, a reference grating SG, and a spatial filter 38 in FIG. 6. The reference light reception system 110 guides a reference light beam $B_{ms}$ to a photoelectric element 40.

When the grating MG on the wafer W is irradiated with the incident beams ±LF through the objective lens 22, the interference beam BM of the ±1st-order diffracted light components is vertically generated from the grating MG. At the same time, interference beams of the 0th- and 2nd-order diffracted light components are generated in a direction opposite to the traveling direction of each incident beam. These interference beams pass through the objective lens 22, the half mirror 20, and reach a spatial filter 28 located on the spatial filter 28 of the objective lens 22. Only the interference beam BM of the ±1st-ordered diffracted light components is selectively transmitted through the spatial filter 28 and is split into two beams by a beam splitter 29.

The interference beam BM reflected by this beam splitter 29 is received by a photoelectric element 36A through a lens system 30 as in FIG. 6. The interference beam BM passing through the beam splitter 29 is incident on a spectral detection system 34. The spectral detection system 34 comprises a dichroic mirror $DCM_1$ for reflecting only an interference beam $B_{m1}$ of the wavelength $\lambda_1$ from the interference beam BM condensed by a lens system 31 and guiding the reflected beam to a photoelectric element $DT_1$, and a dichroic mirror $DCM_2$ for reflecting only an interference beam $B_{m2}$ of interference beams $B_{m2}$ (wavelength $\lambda_2$) and $B_{m3}$ (wavelength $\lambda_3$) passing through the dichroic mirror $DCM_1$ and guiding the reflected interference beam $B_{m2}$ to a photoelectric element $DT_2$, and transmitting only the interference beam $B_{m3}$ and guiding the transmitted beam $B_{m3}$ to a photoelectric element $DT_3$.

Figure 20:
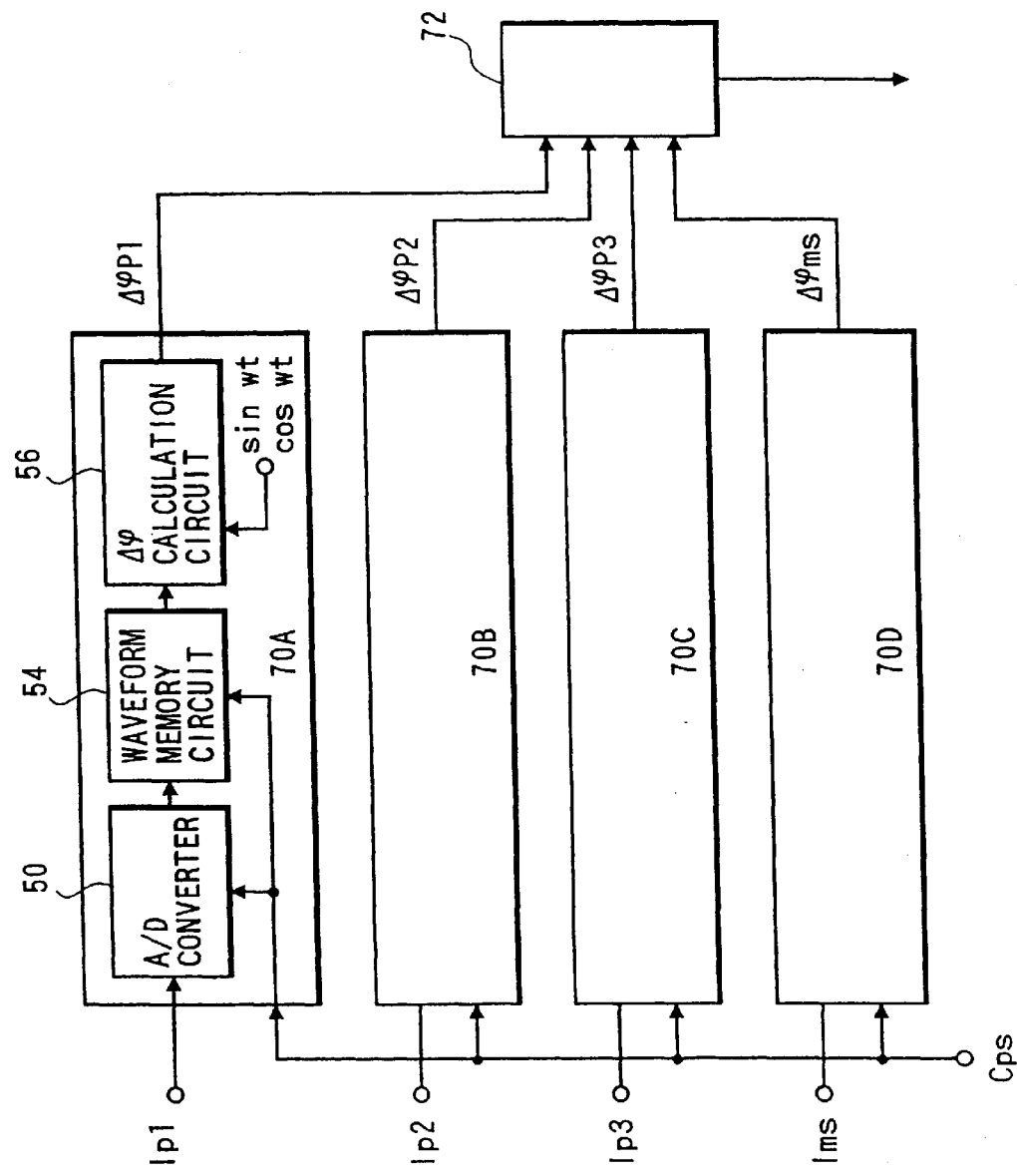
FIG. 20 is a block diagram showing the arrangement of a signal processing circuit applied to the apparatus shown in FIG. 19.

The photoelectric elements $DT_1$, $DT_2$, and $DT_3$ output photoelectric signals $I_{p1}$, $I_{p2}$, and $I_{p3}$ whose levels sinusoidally change with a beat frequency 2Δf. These photoelectric signals $I_{pn}$ (n=1, 2, 3) are input to signal processing circuits 70A, 70B, 70C, and 70D shown in FIG. 20 together with a photoelectric signal $I_{ms}$ from the photoelectric element 40 which receives the reference light beam $B_{ms}$. Each signal processing circuit includes an A/D-converter 50, a waveform memory circuit 54, and a calculation circuit 56 shown in FIG. 6 and calculates a phase offset Δψ for each photoelectric signal. The phase offset Δψ information of each calculated photoelectric signal is processed by a computer in a phase offset calculation circuit 72 to obtain a small position offset amount between the interference fringes for the respective wavelength components, i.e., the mutual offset amounts associated with the respective interference fringes in the pitch direction.

With this arrangement, the A/D converters 50 and the waveform memory circuits 54 in the signal processing circuits 70A to 70D digitally sample the waveforms of the respective photoelectric signals at the same timing in response to a clock pulse $C_{ps}$ from a common sampling clock generator 52 (FIG. 6). The calculation circuits 56 in the signal processing circuits 70A to 70D perform Fourier integration on the basis of prestored sine wave data sinx ωt and prestored cosine wave data cos ωt to calculate phase differences $\Delta\psi_{p1}$, $\Delta\psi_{p2}$, $\Delta\psi_{p3}$, and $\Delta\psi_{ms}$ with reference to the data sin ωt (or cos ωt) of the respective photoelectric signals $I_{p1}$, $I_{p2}$, $I_{p3}$, and $I_{ms}$. Note that the angular velocity ω of the sine or cos wave data is defined as ω=2π(2Δf) in association of the beat frequency 2Δf.

The position offset calculation circuit 72 calculates position offset amounts $\Delta X_1$, $\Delta X_2$, and $\Delta X_3$ of the grating mark MG in units of wavelengths on the basis of the phase differences $\Delta\psi_{p1}$, $\Delta\psi_{p2}$, $\Delta\psi_{p3}$, and $\Delta\psi_{ms}$).

$$\Delta X_1 = k(\Delta\psi_{ms} - \Delta\psi_{p1})$$

$$\Delta X_2 = k(\Delta\psi_{ms} - \Delta\psi_{p2})$$

$$\Delta X_3 = k(\Delta\psi_{ms} - \Delta\psi_{p3})$$

for $k = \pm P_{mg}/4\pi$

The resultant position offset amounts must be almost equal to values when the grating mark MG on the fiducial plate FG shown in FIG. 6 or 15 is detected. If a difference is present between the position offset amounts $\Delta X_1$, $\Delta X_2$, and $\Delta X_3$, it indicates that offsets are present between the interference fringes for the respective wavelengths in the pitch direction. For this reason, the grating mark MG on the fiducial plate FG is often detected prior to the alignment of the wafer W to confirm the mutual offsets between the interference fringes for the respective wavelengths. If the mutual offsets are larger than the upper limit of the allowable range, the adjustment optical systems 14, 16, and 18 in FIG. 6 and part of a correction optical system CG in FIG. 16 are finely moved to set the mutual offsets to fall within the allowable range.

In this embodiment, the interference fringes generated by the two multi-wavelength beams can be always maintained to be free from the mutual offsets, thereby reducing the error in detecting the grating mark on the wafer W.

In the first to seventh embodiments, three or more illumination beams from a plurality of highly coherent light sources are synthesized to obtain a multi-wavelength illumination light beam and detect a periodic pattern such as a grating mark upon irradiation of this illumination light beam. In this case, the wavelengths of the three or more illumination beams for obtaining the multi-wavelength illumination beam are set such that difference values of wave numbers $(1/\lambda_n)$ between any two adjacent illumination beams along the wavelength axis fall within the allowable range of ±10%. Therefore, even if highly coherent light sources are used, a highly incoherent arrangement can be achieved.

For this reason, position detection of a grating mark or the like can be performed with a higher precision than the conventional case. In addition, the position detection apparatus illustrated in each embodiment described above is applicable not only to the projection exposure apparatus, but also to various alignment systems in proximity exposure apparatuses.

Each embodiment associated with photoelectric processing in a multi-wavelength alignment system in association with the second aspect of the present application will be described below.

Figure 21:
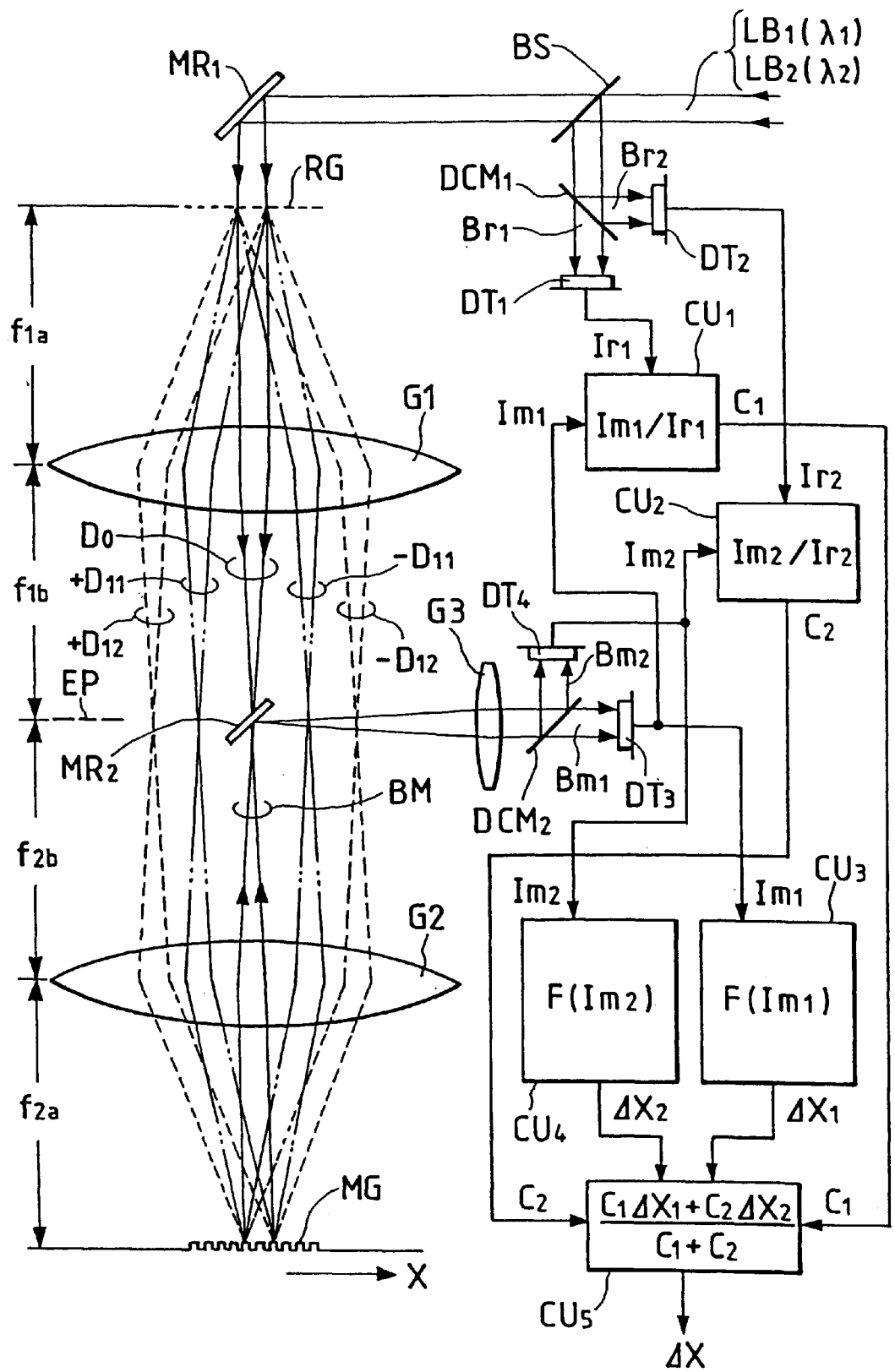
FIG. 21 is a view showing the arrangement of a position detection apparatus according to the eighth embodiment of the present invention.

FIG. 21 shows the arrangement of a position detection apparatus according to the eighth embodiment of the present invention. This arrangement is basically similar to that in FIG. 12. The eighth embodiment exemplifies homodyne measurement of a relative position offset between two diffraction gratings RG and MG in the pitch direction (X direction). Beams $LB_1$ and $LB_2$ serving as illumination light beams are emitted from different laser light sources at different wavelengths $\lambda_1$ and $\lambda_2$. These beams are coaxially synthesized, and the resultant beam is vertically irradiated on the grating RG through a beam splitter BS and a mirror MR1. The beam splitter BS divides the part (about several %) of the amplitudes of the beams $LB_1$ and $LB_2$ and guides them to photoelectric elements $DT_1$ and $DT_2$ through a dichroic mirror $DCM_1$. The dichroic mirror $DCM_1$ transmits 90% or more of the beam $LB_1$ having the wavelength $\lambda_1$ and guides it to the photoelectric element $DT_1$, and at the same time reflects 90% or more of the beam $LB_2$ having the wavelength $\lambda_2$ and guides it to the photoelectric element $DT_2$. The photoelectric elements $DT_1$ and $DT_2$ output a signal $I_{r1}$ representing the intensity value of the received beam having the wavelength $\lambda_1$ and a signal $I_{r2}$ representing the intensity value of the received beam having the wavelength $\lambda_2$.

A plurality of diffracted light components are generated from the grating RG upon irradiation of the beams $LB_1$ and $LB_2$ (parallel beams). If the grating RG is a one-dimensional transmission grating having a duty of 1:1, and its pitch direction is the horizontal direction on the drawing surface in FIG. 21, these diffracted light components (diffracted beams) are deflected at predetermined diffraction angles within the drawing surface in FIG. 21.

FIG. 21 shows 1st-order diffracted beams $+D_{11}$ and $-D_{11}$ generated by the beam $LB_1$ having the wavelength $\lambda_1$, 1st-order diffracted beams $+D_{12}$ and $-D_{12}$ generated by the beam $LB_2$ having the wavelength $\lambda_2$, and a 0th-order diffracted beam $D_0$. Other diffracted components of higher order are also generated for the beams $LB_1$ and $LB_2$. For the sake of descriptive simplicity, only the 1st-order diffracted beams are illustrated.

Each diffracted beam is incident on an imaging optical system divided into the front-group lens system G1 and the rear-group lens system G2. When the grating RG is located at the position of a front focal length f1a of the front-group lens system G1, and the position of a rear focal length f1b of the front-group lens system G1 coincides with the position of a front focal length f2b of the rear-group lens system G2 to form a Fourier transform plane EP, the respective 1st-order diffracted beams cross (imaging) at the position of a rear focal length f2a of the rear-group lens system G2. Note that the chromatic aberrations of the lens systems G1 and G2 have been corrected.

As shown in FIG. 21, a small mirror MR2 is fixed at the center of the Fourier transform plane (pupil plane) EP. The 0th-order beam $D_0$ from the grating RG is shielded by this mirror MR2 and prevented from being incident on the rear-group lens system G2. Each 1st-order diffracted beam emerges from the grating RG, it is a parallel beam as in the beams $LB_1$ and $LB_2$. However, each 1st-order diffracted beam is converged as a beam waist at the position of the Fourier transform plane EP by the behavior of the front-group lens system G1.

If the pitch of the grating RG is defined as Prg, a diffraction angle $\theta_1$ (an angle with respect to the 0th-order diffracted beam) of the 1st-order diffracted beams $\pm D_{11}$ generated by the beam $LB_1$ having the wavelength $\lambda_1$ and a diffraction angle $\theta_2$ of the 1st-order diffracted beams $\pm D_{12}$ generated by the beam $LB_2$ having the wavelength $\lambda_2$ are given by the following equations:

$$\sin\theta_1 = \lambda_1/Prg \quad (5)$$

$$\sin\theta_2 = \lambda_2/Prg \quad (6)$$

In this case, if $\lambda_1 < \lambda_2$, then $\theta_1 < \theta_2$ is established. On the Fourier transform plane EP, the 1st-order diffracted beams $\pm D_{11}$ pass inside (on the 0th-order beam $D_0$ side) the 1st-order diffracted beams $\pm D_{12}$.

The respective 1st-order diffracted beams are converted into parallel beams and superposed on each other on the reflection grating MG formed by corrugations on the object side through the rear-group lens G2. At this time, the pitch direction of the grating MG coincides with the X direction.

One-dimensional interference fringes of the wavelength $\lambda_1$ (the pitch direction is the X direction) are generated by two-beam interference of the 1st-order diffracted beams $\pm D_{11}$, and one-dimensional interference fringes of the wavelength $\lambda_2$ (the pitch direction is the X direction) are generated by two-beam interference of the 1st-order diffracted beams $\pm D_{12}$. At this time, since the light beam having the wavelength $\lambda_1$ and the light beam having the wavelength $\lambda_2$ have different wavelengths, no interference occurs between the 1st-order diffracted beams $\pm D_{11}$ and $\pm D_{12}$. It is important that the interference fringes having the wavelengths $\lambda_1$ and $\lambda_2$ generated by the 1st-order diffracted beams $\pm D_{11}$ and $\pm D_{12}$ appear as one set of interference fringes having the same intensity distribution pitch.

An intensity distribution pitch Pif of the interference fringes is determined by the pitch Prg of the grating mark RG and a magnification factor M of the imaging optical system (G1 and G2) and is defined as Pif=M·Prg/2. For example, when the pitch Prg is set to be 4 μm, and the magnification factor M is ¼ (the pattern size of the grating RG is reduced into ¼ on the grating mark MG side), the pitch Pif of the interference fringes becomes 0.5 μm. If the pitch Pmg of the grating MG to be measured is given as Pmg=2Pif, i.e., Pmg=M·Prg, rediffracted light components are generated from the grating MG using the 1st-order diffracted beams $\pm D_{11}$ as the incident beams. For example, one rediffracted light component generated by the grating mark MG upon irradiation of the 1st-order diffracted beam $+D_{11}$ as the incident beam is the $-1$st-order diffracted light component (wavelength $\lambda_1$) vertically propagating from the grating mark MG. One rediffracted light component generated from the grating mark MG upon irradiation of the 1st-order diffracted beam $-D_{11}$ as the incident beam is the $+1$st-order diffracted light component (wavelength $\lambda_1$) vertically propagating from the grating mark MG. The $\pm 1$st-order diffracted light components of the wavelength $\lambda_1$ vertically propagating from the grating mark MG have an interference intensity corresponding to the mutual phase states, serve as an interference beam BM, and reach the mirror MR2.

Similarly, rediffracted light components are generated from the grating mark MG upon irradiation of the 1st-order diffracted beams $\pm D_{12}$ as the incident beams. The $-1$st-order diffracted light component of (wavelength $\lambda_2$) generated from the grating mark MG upon irradiation of the 1st-order diffracted beam $+D_{12}$ propagates in a direction perpendicular to the grating mark. The $+1$st-order diffracted light component (wavelength $\lambda_2$) generated from the grating mark MG upon irradiation of the 1st-order diffracted beam $-D_{12}$ propagates in a direction perpendicular to the grating MG. The $\pm 1$st-order diffracted light components of the wavelength $\lambda_2$ propagating in the direction perpendicular to the grating mark MG also have an interference intensity corresponding to the mutual phase states, serve as an interference beam MB, and reach the mirror MR2. The interference beam BM coaxially includes an interference beam $B_{m1}$ having the wavelength $\lambda_1$ and an interference beam $B_{m2}$ having the wavelength $\lambda_2$.

The interference beam BM is reflected by the mirror MR2 and reaches photoelectric elements $DT_3$ and $DT_3$ through a lens system G3 constituting a photoelectric detection system, and a dichroic mirror $DCM_2$. This dichroic mirror $DCM_2$ divides the wavelengths $\lambda_1$ and $\lambda_2$ and is substantially identical to the dichroic mirror $DCM_1$. The interference beam $B_{m1}$ having the wavelength $\lambda_1$ in the interference beam BM is received by the photoelectric element $DT_3$, while the interference beam $B_{m2}$ having the wavelength $\lambda_2$ in the interference beam MB is received by the photoelectric element $DT_4$.

The photoelectric element $DT_3$ outputs a photoelectric signal $I_{m1}$ having a level corresponding to the intensity of the interference beam $B_{m1}$ to circuit units $CU_1$ and $CU_3$. The photoelectric element $DT_4$ outputs a photoelectric signal $I_{m2}$ having a level corresponding to the intensity of the interference beam $B_{m2}$ to circuit units $CU_2$ and $CU_4$. The circuit unit $CU_1$ calculates a ratio $C_1$ of the amplitude value of the photoelectric signal $I_{m1}$ to that of the signal $I_{r1}$ from the photoelectric element $DT_1$ in accordance with a calculation of $I_{m1}/I_{r1}$. The circuit unit $CU_2$ calculates a ratio $C_2$ of the amplitude value of the photoelectric signal $I_{m2}$ to that of the signal $I_{r2}$ from the photoelectric element $DT_2$ in accordance with a calculation of $I_{m2}/I_{r2}$. The ratios $C_1$ and $C_2$ are output to a circuit unit $CU_5$ for calculating a weighted mean (to be described later).

Since the homodyne scheme is employed in this embodiment, the intensities of the interference beams $B_{m1}$ and $B_{m2}$ change in accordance with relative changes in positions of the gratings RG and MG in the X direction. If the gratings RG and MG are kept stopped, the levels of the signals $I_{m1}$ and $I_{m2}$ continuously have predetermined values. The grating mark MG and the interference fringes generated by the grating mark RG on the grating mark MG are scanned relative to each other by a predetermined amount (the pitch Pif or more of the interference fringes) in the X direction, and the peak values and the bottom values during the sinusoidal changes in levels of the signals $I_{m1}$ and $I_{m2}$ generated during scanning are sampled. The difference values between the peak and bottom values are used for arithmetic operations in the circuit units $CU_1$ and $CU_2$.

Figure 22A:
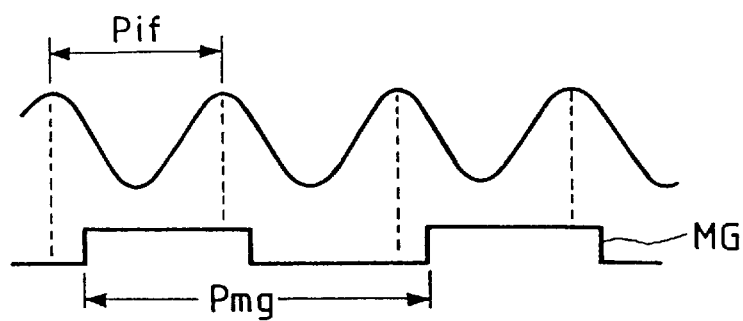
FIGS. 22A to 22D are views showing changes in relative positional relationship between interference fringes and a grating, and changes in levels of detection signals.
Figure 22B:
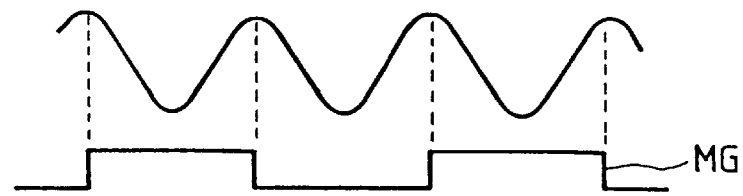
Figure 22C:
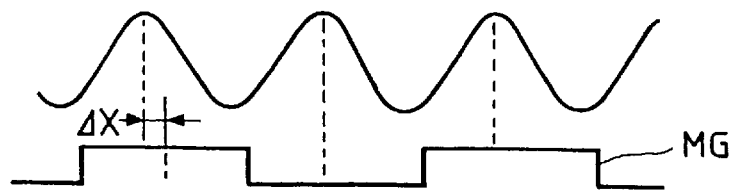
Figure 22D:
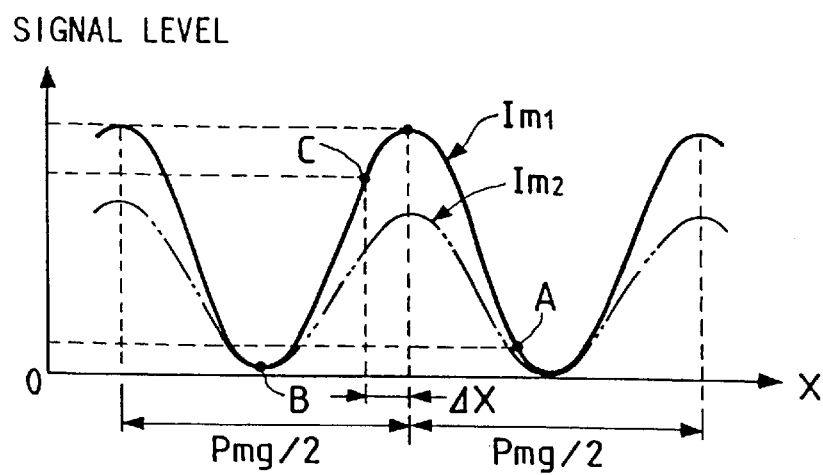

The level change in the signal $I_{1m}$ (this also applies to the signal $I_{m2}$) corresponding to the change in positional relationship between the interference fringes and the grating MG will be described with reference to FIGS. 22A to 22D. FIGS. 22A, 22B, and 22C are identical to FIGS. 13A, 13B, and 13C. The interference fringes having the pitch Pif have a good sinusoidal intensity distribution due to two-beam interference and are set to be Pmg=2Pif with respect to the pitch Pmg of the grating mark MG. When the interference fringes are moved in the right direction with respect to the grating MG in an order shown in FIGS. 22A, 22B, and 22C, the level of the signal $I_{m1}$ sinusoidally changes, as shown in FIG. 22D. As shown in FIG. 22B, at a position where each peak of the interference fringes overlaps the each step edge of the grating mark MG, the signal $I_{m1}$ has a bottom level, as indicated by a point B. The level at a point A in FIG. 22D represents the positional relationship in FIG. 22A, and the level at a point C represents the positional relationship in FIG. 22C.

As described above, the level of the signal $I_{m1}$ periodically changes every time the interference fringes and the grating mark MG are moved by Pmg/2 in the X direction. For this reason, unless the interference fringes and the grating mark MG are slightly moved preliminarily, the peak and bottom levels of the detected signal $I_{m1}$ cannot be obtained. This is also true for the signal $I_{m2}$. Since the signal $I_{m2}$ represents the intensity of the interference beam $B_{m2}$ of the $\pm 1$st-order diffracted light components, the phase of the signal $I_{m2}$ is not extremely offset from that of the signal $I_{m1}$ (an offset of about several % may occur depending on the resist interference and mark asymmetry), although the level of the signal $I_{m2}$ greatly differs from that of the signal $I_{m1}$, as indicated by an imaginary line in FIG. 22D. For this reason, at an arbitrary positional relationship that the interference fringes and the grating MG are kept stopped, even if the levels of the signals $I_{m1}$ and $I_{m2}$ are sampled, the ratios $C_1$ and $C_2$ can be theoretically calculated by the circuit units $CU_1$ and $CU_2$. However, as can be apparent from FIG. 22D, the signals $I_{m1}$ and $I_{m2}$ can be advantageously sampled at their peak points in favor of reduction in various noise components and improvement of detection precision.

As shown in FIG. 21, the circuit units $CU_3$ and $CU_4$ calculate X-direction position offset amounts $\Delta X_1$ and $\Delta X_2$ between the interference fringes and the grating MG on the basis of the amplitude values of the signals $I_{m1}$ and $I_{m2}$ and preset functions or conversion formulas $F(I_{m1})$ and $F(I_{m2})$. These position offset values $\Delta X_1$ and $\Delta X_2$ are obtained as values within the range of $\pm Pmg/4$ using the peak or bottom values of the signals $I_{m1}$ and $I_{m2}$ as the references (origins).

The functions (or formulas) $F(I_{m1})$ and $F(I_{m2})$ are sine or cosine functions because the signals $I_{m1}$ and $I_{m2}$ are sinusoidal. A radian $\psi_1$ is calculated to satisfy the following condition:

$$(E_{p1}+E_{b1})/2+[(E_{p1}-E_{b1})\sin\psi_1]/2=e1$$

where $E_{p1}$ is the peak level of the signal $I_{m1}$, $E_{b1}$ is its bottom level, and e1 is the level of the signal $I_{m1}$ at a position to be detected, and a substitution of the radian $\psi_1$ into the following conversion formula yields the offset amount $\Delta X_1$ from the reference point:

$$\Delta X = Pmg \cdot \psi / 4\pi \tag{7}$$

The calculated offset amounts $\Delta X_1$ and $\Delta X_2$ are supplied to the circuit unit $CU_5$ for calculating the weighted mean, and the following arithmetic operation is performed using the ratios $C_1$ and $C_2$ as the weighting factors.

$$\Delta X = (C_1 \cdot \Delta X_1 + C_2 \cdot \Delta X_2)/(C_1+C_2) \tag{8}$$

The resultant offset amount $\Delta X$ is the final position offset value of the grating MG with respect to the grating RG.

As can be apparent from the above formula, a larger weighting factor is used for the measurement result of the position offset value using an interference beam of a higher intensity in all the interference beams BM. As described above, in this embodiment, the beams $LB_1$ and $LB_2$ having different wavelength components are used to irradiate the gratings RG and MG, and the interference beam BM to be received is photoelectrically detected in units of wavelengths. The position offset results respectively obtained using the interference beams $B_{m1}$ and $B_{m2}$ for the respective wavelengths are subjected to the weighted mean calculation in accordance with the amplitudes of the received light beams of the respective wavelengths. Therefore, a higher-precision position detection result can be obtained.

The algorithm of the signal processing systems (circuit units $CU_1$ to $CU_5$) shown in FIG. 21 is commonly used in the remaining embodiments. If changes and improvements are made to realize the functions of the respective circuit units, they will be described. In the optical arrangement shown in FIG. 21, if the grating RG is a grating mark on a mask, the grating MG is a mark on a wafer, and the imaging systems G1 and G2 are projection lenses for projecting the mask pattern on the wafer, an alignment device in a projection exposure apparatus can be realized.

Figure 23:
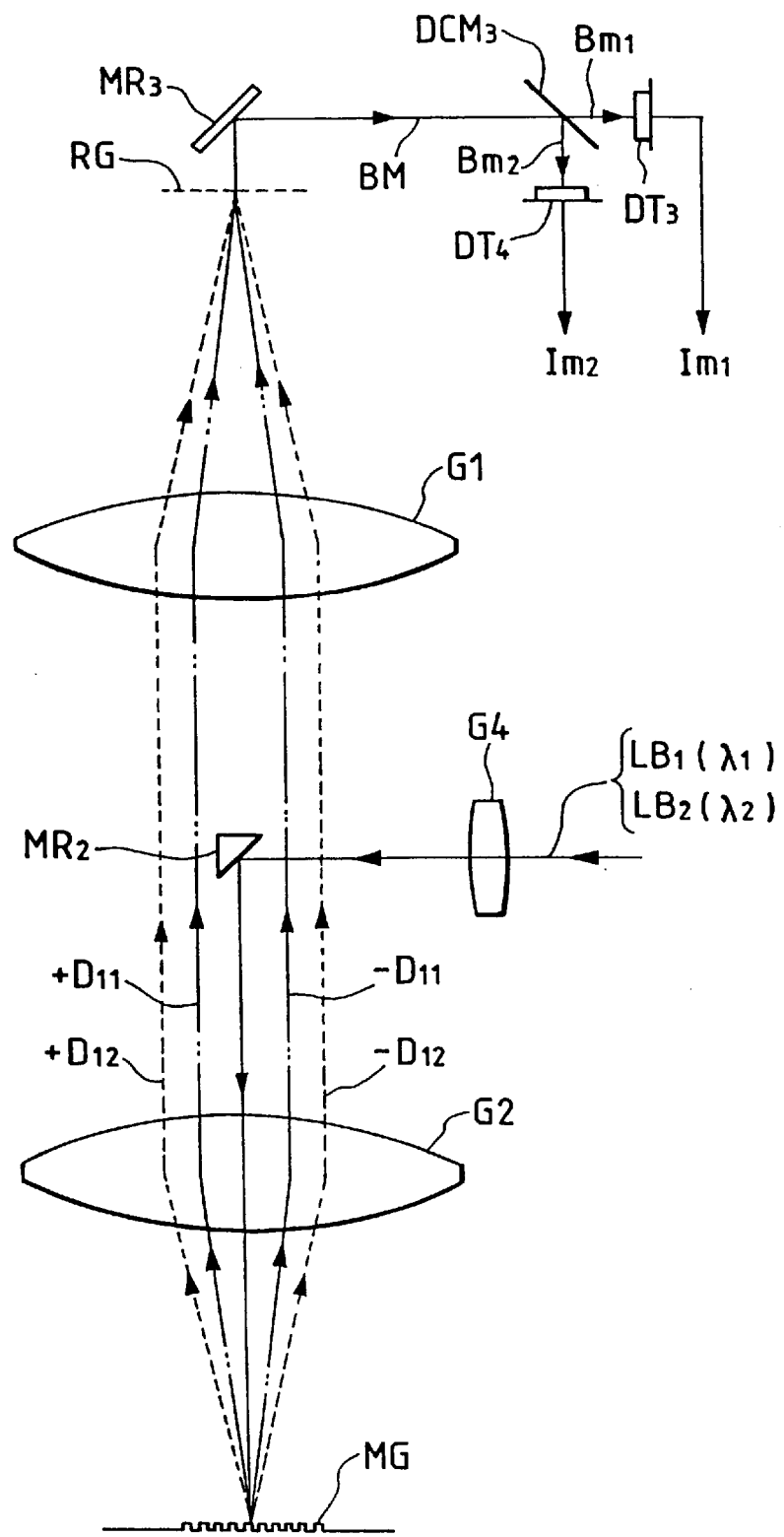
FIG. 23 is a view showing the arrangement of a position detection apparatus according to the ninth embodiment of the present invention.

FIG. 23 shows the schematic arrangement of the ninth embodiment. This arrangement is basically or identical to that of FIG. 14 but is different from FIG. 14 in the arrangement of a light reception system. The same reference numerals as in FIG. 14 denote the same members and beams in FIG. 21. In the ninth embodiment, two illumination beams $LB_1$ and $LB_2$ are incident on a mirror MR2 located at the center of the pupil plane of an imaging optical system (G1 and G2) through a lens system G4. The beams $LB_1$ and $LB_2$ deflected downward by the mirror MR2 are converted into parallel beams through the rear-group lens system G2 and vertically irradiated on a grating MG. First-order diffracted beams $\pm D_{11}$ of a wavelength $\lambda_1$ diffracted by the grating MG and 1st-order diffracted beams $\pm D_{12}$ of a wavelength $\lambda_2$ diffracted by the grating MG cross (imaging) on a grating RG through the lens system G1 and the lens group G2. Since the grating RG is of a transmission type, the $\pm$1st-order diffracted light components of the rediffracted light beams from the grating RG upon irradiation of the 1st-order diffracted beams $\pm D_{11}$ propagate in a direction opposite to the imaging optical system and perpendicular to the grating RG. The 1st-order diffracted light components become an interference beam $B_{m1}$ through a mirror MR3 and a dichroic mirror $DCM_3$, and the interference beam $B_{m1}$ is incident on a photoelectric element $DT_3$. The $\pm$1st-order rediffracted light components generated upon irradiation of the 1st-order diffracted beams $\pm D_{12}$ become an interference beam $B_{m2}$. The interference beam $B_{m2}$ passes through the same optical path as that of the interference beam $B_{m1}$, is selected by a dichroic mirror $DCM_3$, and reaches a photoelectric element $DT_4$. The remaining arrangement is the same as that of FIG. 21.

This embodiment has the relationship between beam incidence and beam reception which is opposite to that in FIG. 21. In the arrangement of this embodiment, the grating MG is formed on a semiconductor wafer, the grating RG is formed on a reticle (mask), and this arrangement can be applied the apparatus of reference (F) (Japanese Patent Application Laid-open No. 3-3224) in which lens systems G1 and G2 are reduction projection lenses for projection exposure. In the apparatus disclosed in reference (F), the small lens for slightly deflecting 1st-order diffracted beams on the pupil plane EP of the projection lens, thereby correcting the chromatic aberration generated by the projection lens. However, when the embodiment of FIG. 23 is applied, a small lens (e.g., flint glass having a large color dispersion) must be arranged to optimally correct 1st-order diffracted beams $\pm D_{11}$ and $\pm D_{12}$ having a small wavelength difference.

In the ninth embodiment, since the illumination beams $LB_1$ and $LB_2$ are directly incident on, e.g., the grating MG on the wafer, the intensities of the 1st-order diffracted beams $\pm D_{11}$ and $\pm D_{12}$ generated from the grating MG can be set higher than the diffracted beams (interference beams BM) generated from the grating MG in FIG. 21.

Figure 24:
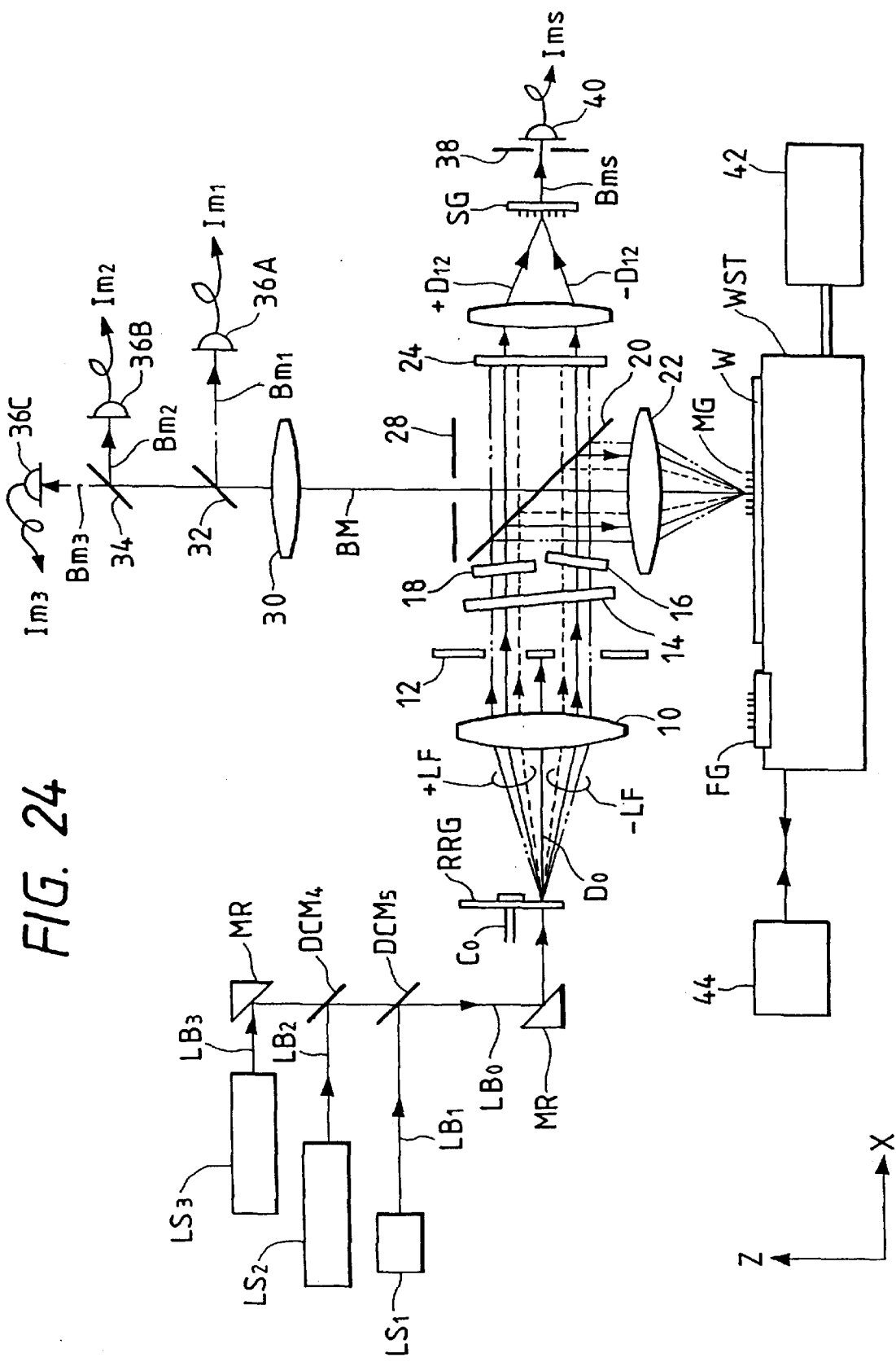
FIG. 24 is a view showing the arrangement of a position detection apparatus according to the 10th embodiment of the present invention.

The 10th embodiment of the present invention will be described with reference to FIGS. 24 and 25 and is basically the same as the apparatus of FIG. 6 except that the arrangement of a light reception system is slightly different. A heterodyne scheme is used in place of a homodyne scheme. Referring to FIG. 24, three laser light sources $LS_1$, $LS_2$, and $LS_3$ generate laser beams $LB_1$, $LB_2$, and $LB_3$ having different wavelengths and $\lambda_1$, $\lambda_2$, and $\lambda_3$, respectively. For example, the laser light source $LS_1$ is an He—Ne laser light source of $\lambda_1=0.633$ $\mu$m, the light source $LS_2$ is a semiconductor laser light source of $\lambda_2=0.690$ $\mu$m, and the light source $LS_3$ is a semiconductor laser light source of $\lambda_3=0.760$ $\mu$m. The wavelength relationship is given as $\lambda_1<\lambda_2<\lambda_3$.

These three beams $LB_1$, $LB_2$, and $LB_3$ are synthesized into one coaxial beam $LB_0$ through a mirror MR and dichroic mirrors $DCM_4$ and $DCM_5$. The beam $LB_0$ is reflected by the mirror MR and incident on a rotary radial grating plate RRG. As previously shown in FIG. 7, the grating plate RRG is rotated about a rotation axis $C_0$ at a high constant speed in one direction. The frequencies of the diffracted lights of respective orders diffracted by the grating plate RRG are changed by the grating plate RRG by an amount corresponding to the angular velocity.

In this embodiment, the heterodyne scheme is realized using the ±1st-order diffracted light components from the radial grating plate RRG, only ±1st-order diffracted beams ±LF from the grating plate RRG are illustrated in FIG. 24.

First-order diffracted beams ±$D_{11}$ generated from the beam $LB_1$ having the wavelength $\lambda_1$, 1st-order diffracted beams ±$D_{12}$ generated from the beam $LB_2$ having the wavelength $\lambda_2$, and 1st-order diffracted beams ±$D_{13}$ generated from the beam $LB_3$ having the wavelength $\lambda_3$ are generated from the grating RG of the rotary grating plate RRG in the same manner as shown in FIG. 21. A diffraction angle of the 1st-order diffracted beams for each wavelength is represented as follows:

$$\sin \theta_n = \lambda_n / Prg$$

where n is the number of wavelengths, and Prg is the pitch of the grating RG of the rotary grating plate RRG.

Each 1st-order diffracted beam is subjected to a predetermined frequency shift Δf regardless of the wavelengths. If a velocity at which the grating RG of the grating plate RRG crosses the beam $LB_0$ is defined as V, Δf=V/Prg is obtained. A +1st-order diffracted beam has a frequency higher than the frequency of the 0th-order diffracted light component by Δf, while a −1st-order diffracted beam has a frequency lower than the frequency of the 0th-order diffracted light component by Δf. Therefore, the rotary radial grating plate RRG serves as a frequency shifter.

Incident beams tLF consisting of the 1st-order diffracted beams ±$D_{1n}$ (n=1, 2, 3) having the three wavelength components and the 0th-order diffracted light component $D_0$ are converted by a collimator lens 10 such that their principal rays are parallel to each other, as shown in FIG. 24. These beams reach a beam selection member 12. The beam selection member 12 serves as a spatial filter located on the so-called Fourier transform plane. The beam selection member 12 shields the 0th-order diffracted light component $D_0$ and passes the incident beams ±LF derived from the 1st-order diffracted light components ±$D_1$.

The incident beams ±LF then reach a beam splitter (half mirror) 20 through adjustment optical systems 14, 16, and 18 constituted by plane-parallel glass members whose inclination amounts are variable. The adjustment optical system 14 has a function of deflecting the incident beams ±LF with respect to the optical axis of the lens 10 while the distance between the incident beams +LF and −LF in the Fourier space is kept unchanged. The adjustment optical systems 16 and 18 have functions of individually adjusting the incident beams +LF and −LF with respect to the optical axis.

The incident beams ±LF are split into two pair of beams by the beam splitter 20. One pair of beams is incident on an objective lens 22, while only the 1st-order diffracted beams having a specific wavelength in the splitted incident beams ±LF, i.e., only the 1st-order diffracted beams ±$D_{12}$ having the wavelength $\lambda_2$ of the other beam are selected and incident on a condenser lens (Fourier transform lens) 26.

The incident beams ±LF incident on the objective lens 22 are collimated into parallel beams which are then simultaneously irradiated on the grating MG on a wafer W at different angles. Interference fringes formed by the interference of the incident beams ±$D_{11}$ having the wavelength $\lambda_1$, interference fringes formed by the interference of the incident beams ±$D_{12}$ having the wavelength $\lambda_2$, and interference fringes formed by the interference of the incident beams ±$D_{13}$ having the wavelength $\lambda_3$ are superposed on each other and appear on the grating MG at the same pitch and the same phase. The interference fringes are observed as if they are moving on the grating MG at a constant speed in one direction because of the frequency difference 2Δf between the incident beams +LF and −LF. This moving speed is proportional to the velocity V of the grating RG of the rotary radial grating plate RRG. As can be apparent from FIG. 24, the surface (grating MG) of the wafer W and the radial grating plate RRG are located conjugate to each other (imaging relationship) by a composite system of the collimator lens 10 and the objective lens 22. For this reason, the images obtained by the ±1st-order diffracted light components on the grating RG of the radial grating plate RRG are formed on the grating MG of the wafer W. The images (interference intensity distribution) ½ the pitch of the grating RG are formed because the 0th-order diffracted light component $D_0$ is shielded. The pitch Pif of the interference fringes on the wafer W is ½ the pitch Pmg of the grating MG.

When the above relationship is satisfied, the 1st-order diffracted light components are generated vertically from the grating MG upon irradiation of the incident beams ±LF. More specifically, an interference beam BM is obtained by interfering the 1st-order diffracted light component generated upon irradiation of the incident beam +LF and the 1st-order diffracted light component vertically generated upon irradiation of the incident beam −LF. This interference beam BM is a beat light beam intensity-modulated with the frequency 2Δf. In this manner, to generate the ±1st-order diffracted light beams (interference beam BM) in the same direction, distances $DL_n$ of the incident beams ±LF of the respective wavelengths on the Fourier transform plane from the optical axis are defined as follows from the another viewpoint:

$$DL_n = F_0 \cdot \sin \theta_n = \pm F_0 \cdot \lambda_n / Pmg \ (n=1, 2, 3)$$

where $F_0$ is the focal length of the objective lens 22. The distance $DL_n$ for each wavelength can be adjusted by appropriately setting the pitch of the grating RG of the rotary radial grating plate RRG and the focal length of the collimator lens 10.

The interference fringes formed on the wafer W are imaged as a diffraction image of the grating RG of the radial grating plate RRG. In principle, if the pitch of the interference fringes obtained by one of the wavelength components having the three wavelengths $\lambda_1$, $\lambda_2$, and $\lambda_3$ is an integer multiple of the pitch of the grating mark MG, the pitches of the interference fringes for the remaining wavelength components have the same relationship. The interference fringes obtained in units of wavelength components perfectly coincide and are free from phase offsets and position offsets. In practice, however, the interference fringes obtained in units of wavelength components are subjected to position offsets, phase offsets, and pitch offsets in accordance with the degree of chromatic aberration of the optical systems such as the objective lens 22 and the collimator lens 10.

To correct these offsets, the adjustment optical systems 14, 16, and 18 in FIG. 24 are used. These optical system 14, 16, and 18 are constituted by plane-parallel glass members. When a material having a large color dispersion is used as the material of these optical systems, the position and phase offsets of the interference fringes formed on the wafer in units of wavelength components can be slightly changed. Alternatively, a plane-parallel glass member having a small color dispersion may be combined with a plane-parallel glass member having a large color dispersion to constitute the adjustment optical systems 14, 16, and 18. In this case, the inclination of the plane-parallel glass member having the large color dispersion is adjusted to correct the relationship between the interference fringes for each wavelength component. An error in the overall inclination of the incident beams ±LF on the wafer, which is caused by the above inclination adjustment can be corrected by inclination adjustment by the plane-parallel glass member having the small color dispersion.

The interference beam BM vertically generated by the interference fringes from the illuminated grating MG reaches a spatial filter 28 through the objective lens 22 and the beam splitter 20. This spatial filter 28 is located at or near the Fourier transform plane associated with the objective lens 22. In this embodiment, the spatial filter 28 has an aperture for passing only the interference beam MB (±1st-order diffracted light components). The interference beam MB passing through the spatial filter 28 is converted into a parallel beam by a lens system (inverse Fourier transform lens) 30. The wavelength of the parallel beam is selected by a first dichroic mirror 32 and a second dichroic mirror 34.

The dichroic mirror 32 reflects 90% or more of a beam $B_{m1}$ of the wavelength $\lambda_1$ in the interference beam BM, and the reflected beam is incident on a photoelectric element 36A. The dichroic mirror 34 reflects 90% or more of a beam $B_{m2}$ of the wavelength $\lambda_2$ passing through the dichroic mirror 32, and the transmitted beam is received by a photoelectric element 36B. A beam $B_{m3}$ of the wavelength $\lambda_3$ in the interference beam BM passes through the dichroic mirrors 32 and 34 and is received by a photoelectric element 36C. The photoelectric elements 36A, 36B, and 36C have the same functions as in the photoelectric elements $DT_3$ and $DT_4$ in FIG. 21 except that the interference beams $B_{m1}$, $B_{m2}$, and $B_{m3}$ to be received are intensity-modulated with the beat frequency 2Δf. The wavelength division of the dichroic mirrors 32 and 34 may be unsatisfactory depending on the intervals between the wavelengths $\lambda_1$, $\lambda_2$, and $\lambda_3$ to be used. For this reason, interference filters (narrow bandpass filters) may be respectively arranged just in front of the photoelectric elements 36A, 36B, and 36C. Note that the dichroic mirrors 32 and 34 are identical to dichroic mirrors $DCM_5$ and $DCM_4$ on the incident system, as a matter of course.

Photoelectric signals $I_{m1}$, $I_{m2}$, and $I_{m3}$ from the photoelectric elements 36A, 36B, and 36C have waveforms whose levels sinusoidally change at the same frequency as the beat frequency 2Δf in the presence of the interference beam BM from the grating mark MG.

The 1st-order diffracted beams $±D_{12}$ selected by the wavelength selection filter 24 and the condenser lens 26 are superposed on each other and irradiated on a transmission reference grating SG. In this case, the reference grating SG is located conjugate to the rotary radial grating plate RRG (frequency modulator) in association with the composite system of the collimator lens 10 and the condenser lens 26. Therefore, one-dimensional interference fringes caused by 2-beam interference of the 1st-order diffracted beams $±D_{12}$ are also formed on the reference grating SG and move at a speed corresponding to the beat frequency 2Δf.

When the pitch of the reference grating SG and the pitch of the interference fringes are appropriately determined, the ±1st-order diffracted light components generated from the reference grating SG propagate as an interference beam $B_{ms}$ in the same direction, pass through a spatial filter 38, and is received by a photoelectric element 40. A photoelectric signal $I_{ms}$ from the photoelectric element 40 has the waveform whose level sinusoidally changes at the same frequency as the beat frequency 2Δf. The signal $I_{ms}$ serves as the reference signal of the heterodyne scheme.

In the above arrangement, the reference grating SG is formed such that a chromium layer is deposited on a glass plate and etched to alternately form transparent and light-shielding lines. For this reason, an almost ideal grating, i.e., a grating having symmetrical amplitude transmittances, almost free from at least asymmetry as in the grating mark MG on the wafer W and the problem posed by the resist layer is formed. The pair of incident beams irradiated on the reference grating SG may be incident beams having one of the wavelengths $\lambda_1$, $\lambda_2$, and $\lambda_3$ so as to obtain a sufficiently high precision. All the three 1st-order diffracted beams $±D_{11}$, $±D_{12}$, and $±D_{13}$ included in the incident beams ±LF may be simultaneously incident on the reference grating SG, thereby forming multi-color interference fringes as in the grating mark MG on the wafer.

As described above, the multi-color interference fringes are formed on the reference grating SG, and the interference beam Bms generated from this interference grating SG is separated in units of wavelengths and photoelectrically detected. A reference signal corresponding to the wavelength $\lambda_1$, a reference signal corresponding to the wavelength $\lambda_2$, and a reference signal corresponding to the wavelength $\lambda_3$ can be individually obtained, so that position measurement of the grating mark MG can be performed in units of wavelengths. Even if the interference fringes formed on the wafer W by three wavelength components are offset (phase offset) by a predetermined amount, the offset amount can be measured in advance. This technique will be described in detail later.

The wafer W shown in FIG. 24 is placed on a wafer stage WST two-dimensionally moved within a plane (X-Y plane) perpendicular to the optical axis of the objective lens 22. The two-dimensional movement on the stage WST is performed by a drive source 42 including a drive motor. This driving may be based on a scheme for rotating a feed screw by a motor or a scheme for directly moving the stage itself by a linear motor. In addition, the coordinate position of the stage WST is sequentially measured by a laser interferometer 44. The measurement values of the laser interferometer 44 are used for feedback control for the drive source 42. A fiducial mark plate FG is formed on part of the wafer stage WST. A reflection intensity grating (the pitch is equal to that of the grating MG on the wafer) having a line-and-space pattern with a chromium layer on the surface of quartz is formed on the mark plate FG. For this reason, unlike the phase grating such as the grating mark MG formed by corrugations on the wafer W, the intensity grating is characterized in that no asymmetry is present and the diffraction efficiency does not depend on the wavelength of the illumination light beam (detection light beam), i.e., in that the amplitude reflectance does not have asymmetry. In addition, the reflectance of the chromium layer rarely changes in the wavelength band (generally 0.5 μm to 0.8 μm) of the position detection illumination light beam. For this reason, when the intensity grating on the fiducial mark plate FG is used, the changes in amplitudes and ratios between the amplitudes of the photoelectric signals $I_{m1}$, $I_{m2}$, and $I_{m3}$ obtained in units of wavelengths can be accurately obtained.

In the arrangement shown in FIG. 24, semiconductor lasers are used as the light sources. In this case, it is preferable that an astigmatism removal shaping optical system (i.e., a plurality of inclined plane-parallel glass members) be arranged between each semiconductor laser ($LS_2$ and $LS_3$) and each of the dichroic mirrors $DCM_4$ and $DCM_5$, and the diameters of the beam components of one synthesized beam $LB_0$ be equal to each other in units of wavelength components. In addition, it-is preferable that a beam shaping optical system for aligning the diameters of the wavelength components of the synthesized beam $LB_0$ be arranged.

For the sake of descriptive simplicity, the rotary radial grating plate RRG is used as the frequency shifter in FIG.

24. However, two acousto-optic modulators (AOMs) may be used, or a first Zeeman laser light source for oscillating a laser beam having a center frequency $\lambda_1$ and a second Zeeman laser source for oscillating a laser beam having a center frequency $\lambda_2$ may be used as light sources. In use of a Zeeman laser, it generally oscillates two laser beams whose polarization directions are complementary, and a frequency difference of several hundreds kHz to several MHz is given between these two laser beams. The beat frequency of an interference beam to be photoelectrically detected is increased to a degree corresponding to the frequency difference. The photoelectric elements 36A, 36B, 36C, and 40 must be constituted by PIN photodiodes or photomultipliers having a high responsibility.

Various dichroic mirrors shown in FIG. 24 may be replaced with dispersion elements such as prisms. In this case, one prism has the same function as the set of two dichroic mirrors $DCM_4$ and $DMC_5$ or two dichroic mirrors 32 and 34.

An arrangement of a position detection/control circuit suitable for the apparatus shown in FIG. 24 will be described with reference to FIG. 25. In the heterodyne scheme in FIG. 25, while the interference beam BM is generated from the grating mark MG on the wafer W or the fiducial mark plate FG, the signals $I_{m1}$, $I_{m2}$, $I_{m3}$, and $I_{ms}$ the photoelectric elements 36A, 36B, 36C, and 40 have sinusoidal AC waveforms shown in FIGS. 26A to 26D.

Figure 26A:
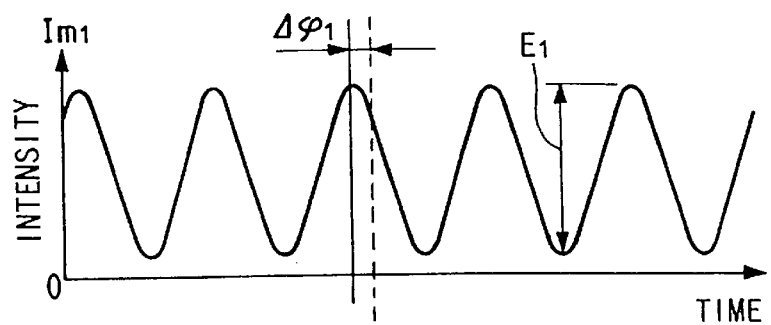
FIGS. 26A to 26D are charts showing the waveforms of signals received in the memory of the processing circuit shown in FIG. 25.
Figure 26B:
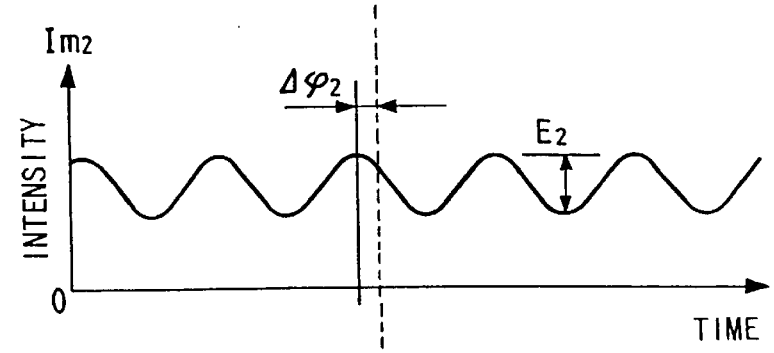
Figure 26C:
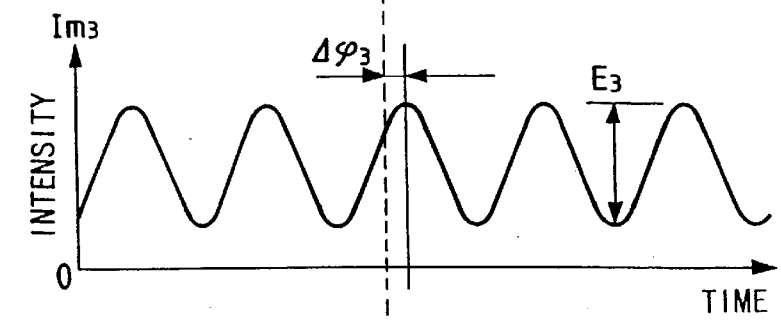
Figure 26D:
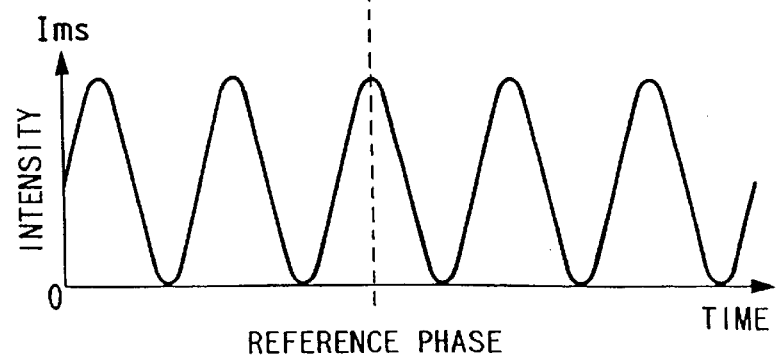

FIG. 26D shows a time change in intensity of the signal $I_{ms}$ serving as a reference signal, while FIGS. 26A, 26B, and 26C show time changes in intensity of the signals $I_{m1}$, $I_{m2}$, and $I_{m3}$ upon reception of the interference beam BM from the grating mark MG on the wafer W. Assuming the phase of the signal $I_{ms}$ as a reference, the phase of the signal $I_{m1}$ is offset from the signal $I_{ms}$ by $-\Delta\psi_1$, the phase of the signal $I_{m2}$ is offset from the signal $I_{ms}$ by $-\Delta\psi_2$, and the phase of the signal $I_{m3}$ is offset from the signal $I_{ms}$ by $-\Delta\psi_3$. Let $E_1$, $E_2$, and $E_3$ be the amplitudes (peak-to-peak values of the AC components) of the signals $I_{m1}$, $I_{m2}$, and $I_{m3}$, respectively.

Figure 25:
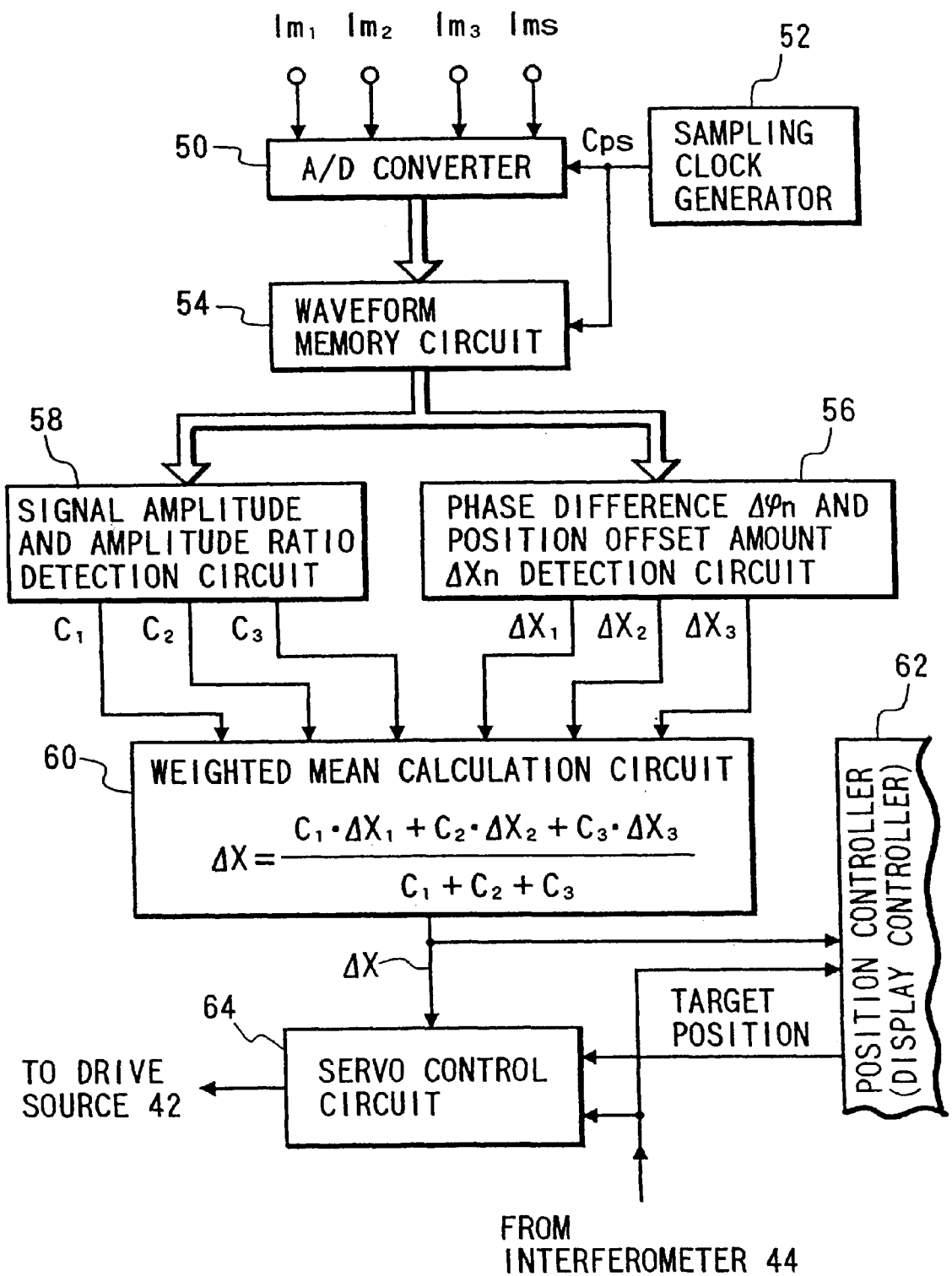
FIG. 25 is a block diagram showing a signal processing circuit applied to the apparatus of the 10th embodiment.

In the circuit block shown in FIG. 25, each of the signals $I_{m1}$, $I_{m2}$, $I_{m3}$, and $I_{ms}$ are input to an analog-to-digital conversion (A/D converter) circuit unit 50. The instantaneous intensity levels of the input signals are converted into digital values in response to a clock signal (pulse) $C_{ps}$ from a sampling clock generator 52. The frequency of the clock signal $C_{ps}$ is set much higher than the beat frequencies of the signals $I_{mn}$ (n=1, 2, 3) and $I_{ms}$. The clock signal $C_{ps}$ is also sent to a waveform memory circuit unit 54 and is used to update the memory address in storing the digital values (data) from the A/D converter 50. In the waveform memory circuit unit 54, the four waveform data shown in FIGS. 26A to 26D are digitally sampled for the predetermined periods (e.g., 10 periods) of the signals $I_{mn}$ and $I_{ms}$. At this time, since the four signals $I_{mn}$ and $I_{ms}$ are simultaneously sampled by the common clock signal $C_{ps}$, the waveform data in the waveform memory circuit unit 54 are not offset along the time axis. Note that when the rotary radial grating plate RRG is used, the clock signal has a frequency of about ten and several kHz because the several kHz are the upper limit of the beat frequency. As in reference (E) (Japanese Patent Application Laid-open No. 6-82215), when the frequency shifter constituted by the two AOMs arranged in tandem with each other is used, the beat frequency is determined by twice the difference between the frequencies of the high-frequency modulation signals applied to the respective AOMs and can be relatively freely determined.

The waveform data in the memory circuit unit 54 are loaded in a detection circuit 56 for phase differences $\Delta\psi_n$ (n=1, 2, 3) and position offsets $\Delta X_n$ (n=1, 2, 3), so that the phase difference $\Delta\psi_1$ ($\Delta\psi_2$ and $\Delta\psi_3$) shown in FIGS. 26A (26B and 26C) is calculated by a digital arithmetic operation (Fourier integration). If the pitch Pmg of the grating mark MG of the wafer W and the pitch Pif of the interference fringes formed thereon satisfy relation Pmg=2Pif, one period of each waveform in FIGS. 26A to 26D corresponds to Pmg/2. Phase measurement is generally performed within the range of ±180°. The calculation circuit 56 converts the calculated phase differences $\Delta\psi_1$, $\Delta\psi_2$, and $\Delta\psi_3$ into position offset amounts $\Delta X_1$, $\Delta X_2$, and $\Delta X_3$ within the range of ±Pmg/4 in accordance with equation (7). This offset amounts $\Delta Xn$ represent offsets of the grating mark with respect to the reference grating SG within the range of ±Pmg/4.

Assuming that the resolution of the phase difference measurement is given as about 0.2°, the resolution of the offset amount is about (0.2/180)Pmg/4. If the pitch Pmg is set to be 4 $\mu$m, a practical range of 0.002 $\mu$m (2 nm) is obtained.

A signal amplitude and amplitude ratio detection circuit or circuit unit 58 reads out the waveform data (FIGS. 26A to 26D) stored in the waveform memory circuit unit 54 to detect the amplitude values $E_1$, $E_2$, and $E_3$ for the respective waveforms. The detection circuit unit 58 prestores amplitude values $A_1$, $A_2$, and $A_3$ of the photoelectric signals $I_{m1}$, $I_{m2}$, and $I_{m3}$ obtained when the interference beam BM generated from the fiducial mark plate FG is received by the photoelectric elements 36A, 36B, and 36C in advance.

The grating mark of the fiducial mark plate FG is moved below the objective lens 22 prior to measurement of the grating mark on the wafer W, and signals shown in FIGS. 26A to 26C are generated from the photoelectric elements 36A, 36B, and 36C and stored in the waveform memory unit 54. The amplitude values $A_1$, $A_2$, and $A_3$ are detected by the amplitude detection circuit 58 and stored. At this time, the stop position of the stage WST which corresponds to detection of the fiducial mark plate FG is read by the laser interferometer 44, and position offset amounts $\Delta X_{b1}$, $\Delta X_{b2}$, and $\Delta X_{b3}$ of the respective wavelengths are obtained by the offset amount detection circuit unit 56. These values can be utilized as data for determining a baseline.

The baseline here means a small mutual error component when the position offset amounts $\Delta X_{b1}$, $\Delta X_{b2}$, and $\Delta X_{b3}$ of the grating mark on the mark plate FG, which are measured in units of wavelengths, are slightly different from each other. When the interference fringes of the respective wavelengths which are formed by the beams of the wavelengths $\lambda_1$, $\lambda_2$, and $\lambda_3$ on the fiducial mark plate FG strictly coincide with each other in the incident system shown in FIG. 24, and the electrical response characteristics and the distortion characteristics sufficiently match each other, the values of the position offset amounts $\Delta X_{b1}$, $\Delta X_{b2}$, and $\Delta X_{b3}$ of the mark plate FG must be perfectly equal to each other.

As a practical problem, however, when the resolution is about 2 nm, it is difficult to adjust the incident system and the detection system so as to match the position offset amounts $\Delta X_{b1}$, $\Delta X_{b2}$, and $\Delta X_{b3}$ in accordance with the degree of resolution. For this reason, the mutual differences between the position offset amounts $\Delta X_{b1}$, $\Delta X_{b2}$, and $\Delta X_{b3}$ measured by the mark plate FG are left as offsets (baseline errors) unique to the alignment system shown in FIG. 24.

The baseline errors are determined by detecting the grating mark MG on the wafer W and causing the position offset amounts $\Delta X_1$, $\Delta X_2$, and $\Delta X_3$ of the respective wavelengths obtained by the detection circuit 56 by the position offset amounts $\Delta X_{b1}$, $\Delta X_{b2}$, and $\Delta X_{b3}$ previously determined. As an example, since the interference beam $B_{ms}$ obtained from the reference grating SG in the apparatus shown in FIG. 24 is limited to the wavelength $\lambda_1$, $\Delta X_{b2}-\Delta X_{b1}=\Delta X_{b21}$ and $\Delta X_{b3}-\Delta X_{b1}=\Delta X_{b31}$ are calculated and stored with reference to the measured position offset amount $\Delta X_{b1}$ of the fiducial mark plate FG. The value of the amount $\Delta X_2$ is corrected and calculated so as to obtain $\Delta X_2-\Delta X_1=\Delta X_{b21}$ with respect to the position offset amounts $\Delta X_1$, $\Delta X_2$, and $\Delta X_3$ measured for the grating mark MG on the wafer W. Subsequently, the amount $\Delta X_3$ is corrected and calculated so as to obtain $\Delta X_3-\Delta X_1=\Delta X_{b31}$.

The interference beam $B_{ms}$ obtained from the reference grating SG is set to include the respective wavelengths $\lambda_1$, $\lambda_2$, and $\lambda_3$. When the interference beams of the respective wavelengths are to be individually photoelectrically detected to obtain reference signals, the position offset amounts $\Delta X_{b1}$, $\Delta X_{b2}$, and $\Delta X_{b3}$ of the fiducial mark plate FG are obtained in units of reference signals (wavelengths). The measured position offset amounts $\Delta X_1$, $\Delta X_2$, and $\Delta X_3$ of the grating mark MG on the wafer are corrected and calculated as $\Delta X_1-\Delta X_{b1}$, $\Delta X_2-\Delta X_{b2}$, and $\Delta X_3-\Delta X_{b3}$.

The amplitude ratio detection circuit unit 58 calculates ratios $C_1$, $C_2$, and $C_3$ of the amplitude values $E_1$, $E_2$, and $E_3$ obtained upon detection of the grating mark MG on the wafer W to the prestored amplitude values $A_1$, $A_2$, and $A_3$ as $C_1=E_1/A_1$, $C_2=E_2/A_2$, and $C_3=E_3/A_3$. The ratios $C_1$, $C_2$, and $C_3$ correspond to the weighting factors described in the embodiment shown in FIG. 21.

The data of the position offset amounts $\Delta X_1$, $\Delta X_2$, and $\Delta X_3$ and the ratios $C_1$, $C_2$, and $C_3$ are sent to a weighted means calculation circuit or circuit unit 60. The circuit unit 60 calculates a weighted offset value $\Delta X$ of the grating mark MG as follows:

$$\Delta X (C_1 \cdot \Delta X_1 + C_2 \cdot \Delta X_2 + C_3 \cdot \Delta X_3)/(C_1+C_2+C_3)$$

The resultant offset amount $\Delta X$ is an offset of the grating mark MG with respect to the reference grating SG in the pitch direction. This data is supplied to a position controller (display controller) 62 and to a servo control circuit unit 64 when the wafer W is aligned (positioned) in real time.

This servo control circuit unit 64 has two functions as described in FIG. 9. One function is to perform feedback control for the drive source 42 until the offset amount $\Delta X$ reaches a predetermined value (direct servo mode). To perform this function, the A/D converter 50, the memory circuit unit 54, the offset amount detection circuit unit 56, and the circuit unit 60 are repeatedly operated to calculate the offset amount $\Delta X$ every very short period of time (e.g, several msec.) Note that the calculations of the ratios $C_1$, $C_2$, and $C_3$ may be calculated once by the amplitude ratio detection circuit unit 58, or may be calculated every time the offset amount $\Delta X$ is calculated. When the ratios $C_1$, $C_2$, and $C_3$ are calculated every time, the values of the ratios $C_1$, $C_2$, and $C_3$ slightly change every time the circuit unit 60 calculates the offset amount $\Delta X$, as a matter of course. When the ratios $C_1$, $C_2$, and $C_3$ are to be calculated once or a plurality of the number of times, the calculated ratio values are used during subsequent detection of the same grating mark MG.

The other function of the servo control circuit unit 64 is a function of moving the wafer stage WST on the basis of a measurement value from the laser interferometer 44 (interferometer servo mode). This function is used to position the grating of the fiducial mark plate FG on the stage WST or the grating mark MG on the wafer W immediately below the objective lens 22, or positioning an arbitrary point on the wafer W immediately below the objective lens 22 with reference to the detected position of the grating mark MG. In the interferometer servo mode, target position information of the wafer stage WST is output from the position controller 62 to the servo control circuit unit 64. The control circuit unit 64 performs feedback control of the drive source 42 such that a difference between the target position and the current position of the stage WST which is read by the laser interferometer 44 falls within a predetermined allowable range (e.g., ±0.04 μm).

The direct servo mode can be set following the interferometer servo mode in the same manner as in FIG. 9.

The position controller (display controller) 62 also has a function of displaying the coordinate position of the grating mark MG and the obtained offset amount $\Delta X$ in addition to the function of designating switching between the servo modes described above. The position controller (display controller) 62 may often store and hold the values of the ratios $C_1$, $C_2$, and $C_3$ serving as the weighting factors upon detection of the grating mark MG. Assume that a large number of identical grating marks MG are formed on the wafer W, and that the positions of these marks MG are to be sequentially detected. In this case, when the ratios $C_1$, $C_2$, and $C_3$ are sequentially stored, a specific mark MG on the wafer W which causes asymmetry and nonuniformity of the resist layer can be checked. Portions on the wafer W where the weighting factor (ratios $C_1$, $C_2$, and $C_3$) greatly change may be graphically displayed. At this time, when the changes in weighting factors are obtained by mounting a wafer prior to coating of the resist layer after the chemical process such as diffusion and etching in the apparatus of FIG. 24, the influences of the chemical process on the wafer surface can also be indirectly checked. In addition, when the resist layer is formed on the wafer to measure changes in weighting factors, and these changes are compared with the changes in weighting factors prior to coating of the resist layer, the influence of the resist layer can also be indirectly checked.

In the 10th embodiment, the fiducial mark plate FG is placed on the stage WST and used to obtain the rates of changes in signal amplitudes of the respective wavelengths, i.e., the ratios $C_1$, $C_2$, and $C_3$. The photoelectric elements $DT_1$ and $DT_2$ for directly detecting the light intensities of the incident beams $LB_1$ and $LB_2$ as in the eighth embodiment (FIG. 21) need not be arranged. To the contrary, when the fiducial mark plate FG serving as the reference in the eighth (ninth) embodiment is arranged in tandem with the grating MG, the ratios $C_1$ and $C_2$ can be detected without arranging the photoelectric elements $DT_1$ and $DT_2$.

Figure 27:
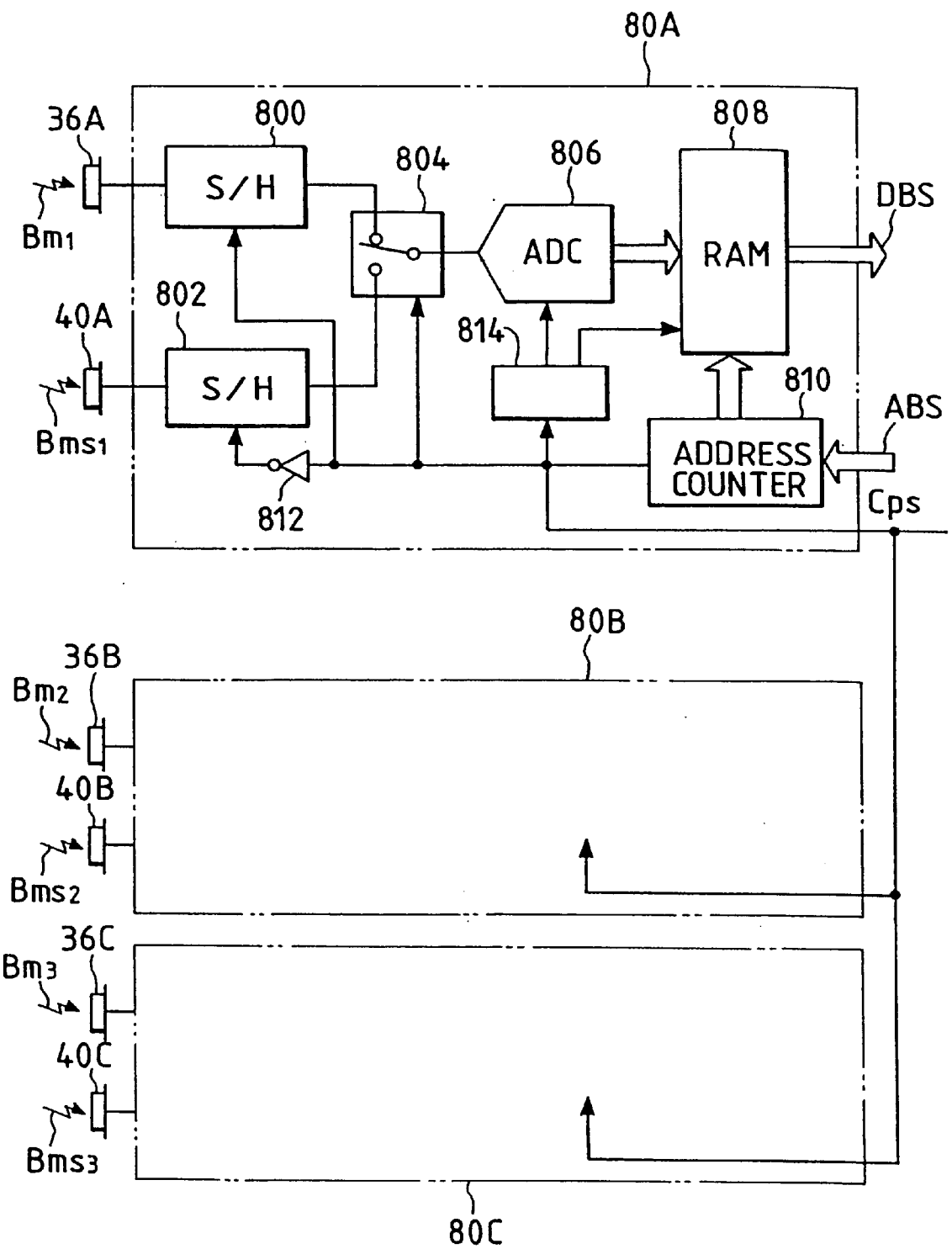
FIG. 27 is a block diagram showing a modification of the signal processing circuit applied to the apparatus shown in FIG. 24 as the 11th embodiment.

FIG. 27 shows the arrangement of a signal processing circuit of the 11th embodiment. In this embodiment, a wavelength selection filter 24 shown in FIG. 24 is omitted. An interference beam $B_{ms}$ from a reference grating SG is separated into beams $B_{ms1}$, $B_{ms2}$, and $B_{ms3}$ for respective wavelengths $\lambda_1$, $\lambda_2$, and $\lambda_3$ by a dichroic mirror and the like. The beams $B_{ms1}$, $B_{ms2}$, and $B_{ms3}$ are photoelectrically detected by three photoelectric elements 40A, 40B, and 40C, respectively. Phase differences between signals $I_{m1}$, $I_{m2}$, and $I_{m3}$ from photoelectric elements 36A, 36B, and 36C and reference signals $I_{ms1}$, $I_{ms2}$ and $I_{ms3}$ from the photoelectric elements 40A, 40B, and 40C are detected. More specifically, a phase difference $\Delta \psi_1$ between the measurement signal $I_{m1}$ and the reference signal $I_{ms1}$ is obtained to obtain a position offset ($\Delta X_1$) of the grating mark MG using an incident beam having the wavelength $\lambda_1$.

With this arrangement, the number of signals for receiving waveform data is large. As shown in FIG. 27, three waveform sampling circuits (each having the functions of an A/D converter 50, a clock generator 52, and a waveform memory circuit 54) 80A, 80B, and 80C are arranged in correspondence with the wavelengths. The internal arrangements of the circuits 80A, 80B, and 80C are identical to each other, and only the detailed internal arrangement of the circuit 80A is illustrated in FIG. 27. A detailed description of the remaining circuits 80B and 80C will be omitted.

In this embodiment, as shown in the circuit 80A, the signal $I_{m1}$ from the photoelectric element 36A which receives the measurement interference beam $B_{m1}$ and the signal $I_{ms1}$ from the photoelectric element 40A which receives the reference interference beam $B_{ms1}$ are input to sample/hold (S/H) circuits 800 and 802, respectively. The signal levels from the S/H circuits 800 and 802 are input to an analog-to-digital converter (ADC) 806 through an analog multiplexer 804.

The digital value output from the ADC 806 is written at an accessed address of a random access memory (RAM) 808. An address value for the RAM 808 is generated by an address counter 810, and the address value is incremented (decremented) in response to a clock signal $C_{ps}$. Note that the address counter 810 has a special function to supply the clock signal $C_{ps}$ as a flag to a specific one of the upper bits of the address counter. Therefore, the address space of the RAM 808 is divided into two pages. While the clock signal $C_{ps}$ is set at logic "0", the address space of the first page is accessed. While the clock signal $C_{ps}$ is set at logic "1", the address space of the second page is accessed.

The clock signal $C_{ps}$ is also supplied to the S/H circuit 802. The clock signal $C_{ps}$ is further supplied to a timing circuit 814 and used as a digital conversion timing signal and a write timing signal (pulse) for the data to be written in the RAM 808.

When the clock signal $C_{ps}$ is set at "1", the S/H circuit 802 is set in a hold state, and the level of the signal $I_{m1}$ from the photoelectric element 36A is supplied to the ADC 806 through the analog multiplexer 804. A digital value corresponding to this level is stored at one address position in the address space of the second page of the RAM 808. When the clock signal $C_{ps}$ is set at "0", the S/H circuit 802 is set at the hold state. The level of the signal $I_{ms1}$ from the photoelectric element 40 is supplied to the ADC 806 through the multiplexer 804. A digital value corresponding to this level is stored at one address position of the address space of the first page of the RAM 808.

The above operation is repeated a predetermined number of periods (e.g., 10 periods or more) of the signal $I_{m1}$ (or $I_{ms1}$) at high speed. The waveform data of the reference signal $I_{ms1}$ is stored in the first page of the RAM 808, while the waveform data of the measurement signal $I_{m1}$ is stored in the second page. The pair of waveform data thus stored in the RAM 808 are read out onto a data bus DBS of a microprocessor in response to address values set in the address counter 810. The microprocessor processes the waveform data in accordance with a program for achieving the same function as the detection circuits 56 and 58 in FIG. 6, thereby obtaining the position offset amounts $\Delta X_1$, $\Delta X_2$, and $\Delta X_3$.

The arrangement and operation of the sampling circuit 80A are the same as those of the sampling circuits 80B and 80C. The circuit 80B temporarily stores the waveform data between the measurement signal $I_{m2}$ and the reference signal $I_{ms2}$, and similarly the circuit 80C temporarily stores the waveform data between the measurement signal $I_{m3}$ and the reference signal $I_{ms3}$.

In the 11th embodiment, since the A/D converters are not arranged for both the measurement signal $I_{mn}$ and the reference signal $I_{msn}$, the operation for simultaneously sampling these signals on the microsecond order is difficult. However, in practice, when the beat frequency of the interference beam is several tens kHz or less, simultaneity on the microsecond order is not so required. It is more advantageous to half the number of A/D converters and the like so as to simplify the circuit arrangement, thereby reducing the hardware cost.

When a fiducial mark plate FG having a chromium surface having a known reflectance is fixed on a wafer stage WST, this mark plate FG can be used for measuring various baseline amounts and focus states, as previously described. The baseline amount basically means an actually measured value for determining the relative positional relationship between the projection point of the center of a mask (reticle) mounted in the projection exposure apparatus and the detection center point in each of the various alignment systems.

When the position detection apparatus shown in FIG. 24 is applied to each alignment system of the projection exposure apparatus shown in FIG. 15, detection center points $R_{f1}$, $R_{f2}$, $R_{f3}$, and $R_{f4}$ are defined by the reference grating SG. In a reticle alignment system RA, when a reticle alignment mark (grating pattern) RM in the peripheral portion of the reticle R and the corresponding grating mark on the fiducial mark plate FG are irradiated with an illumination light beam having the same wavelength as that of the illumination light beam for projecting and exposing the pattern PR, and the reticle stage RST is finely moved so that both the marks have a predetermined positional relationship, the detection center point $R_{f1}$ need not be used.

This also applies to an alignment system TTRA. When the corresponding mark on the fiducial mark plate FG or the mark on the wafer, and a die-by-die (D/D) alignment mark formed in the peripheral portion of the pattern PR of the reticle R are imaged, and a position offset between these two mark images is detected, the detection center point $R_{f2}$ need not be defined.

The baseline amounts indicate the X-Y positional relationship between the projection point (substantially coinciding with an optical axis AX) of a center CCr of a reticle R on the wafer and the projection points of the detection center points $R_{f1}$, $R_{f2}$, $R_{f3}$, and $R_{f4}$ on the wafer. This positional relationship can be obtained by causing the alignment systems RA and TTRA and alignment systems TTLA and OFA to detect the position offset amounts between the corresponding marks on the fiducial mark plate FG and the projection points of the detection center points $R_{f1}$ to $R_{f4}$, and at the same time causing a laser interferometer 44 (see FIG. 24) to detect the corresponding coordinate position of the wafer stage WST.

When the position detection apparatus of the heterodyne scheme shown in FIG. 24 is incorporated in each alignment system, the grating of the fiducial mark plate FG is detected during baseline measurement operation. For this reason, the amplitude levels $A_1$, $A_2$, and $A_3$ of the signals $I_{m1}$, $I_{m2}$, and $I_{m3}$ from the photoelectric elements 36A, 36B, and 36C in FIG. 24 can be stored in the circuit unit 58 in FIG. 25. Note that a pupil plane EP of a projection optical system PL shown in FIG. 15 is identical to a Fourier transform plane EP shown in FIG. 21. The optical axes of objective lenses arranged in the alignment systems RA, TTRA, and TTLA for detecting objects (the mark on the wafer W and the mark of the fiducial mark plate FG) on the wafer stage WST through the projection optical system PL are substantially parallel to the optical axis AX on the wafer stage WST side. When the reticle side of the projection optical system PL as well as its wafer side is set telecentric (FIG. 15), the optical axes of the objective lenses of the alignment systems are set parallel to the optical axis AX of the projection optical system PL. The extended lines of the optical axes of the objective lenses pass the center (a portion through which the optical axis XX passes) of the pupil plane EP-of the projection optical system PL.

The effective radius of the pupil plane EP corresponds to the numerical aperture (NA) which determines the resolving power (minimum resolution line width) of the projection lens PL. A projection lens having NA=about 0.5 to 0.7 is being developed at present.

Figure 28:
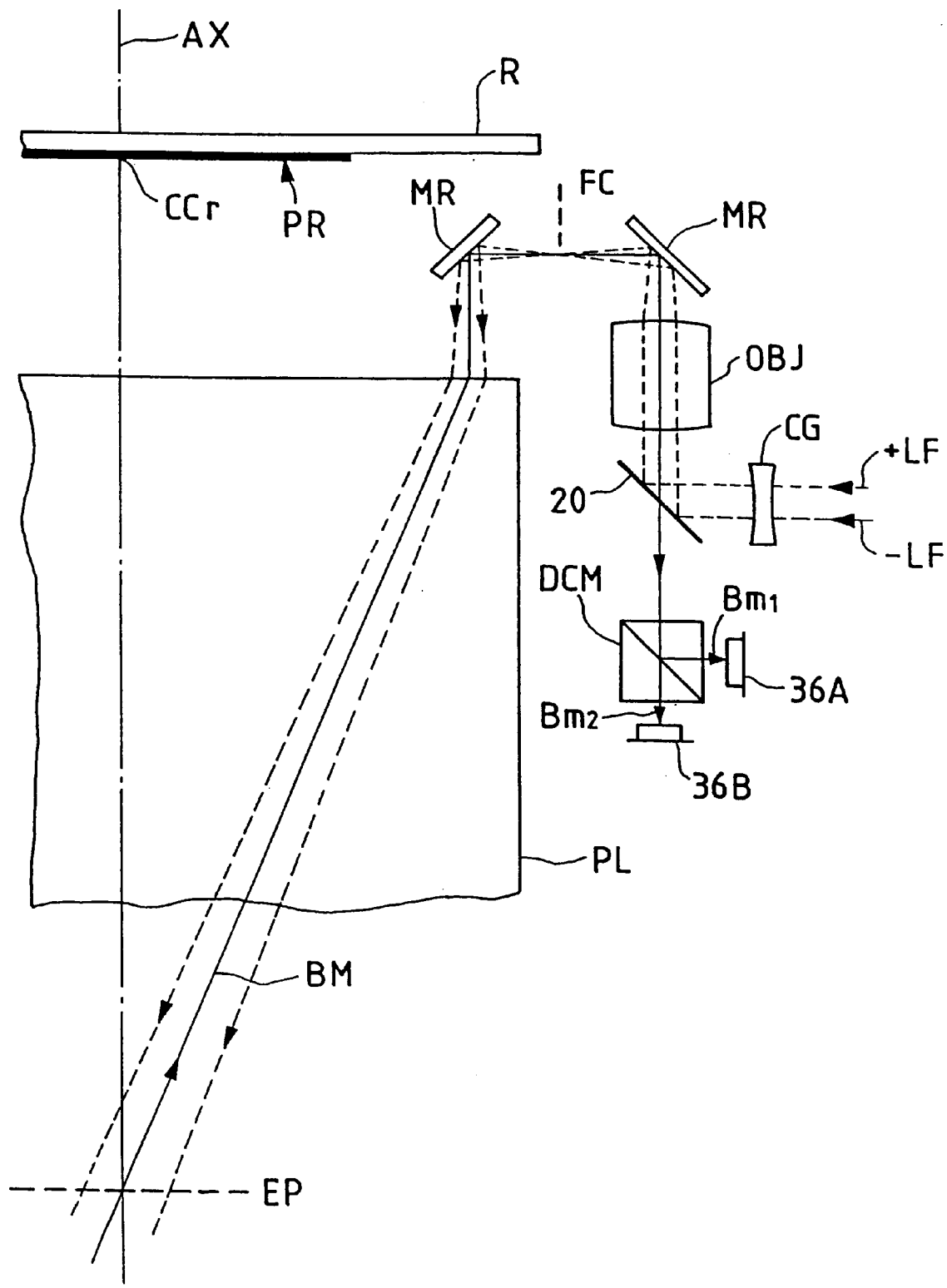
FIG. 28 is an enlarged view showing part of a TTL alignment of the apparatus shown in FIG. 15.

FIG. 28 shows the main part of the alignment system TTLA of all the alignment systems shown in FIG. 15. The pair of incident beams ±LF (corresponding to the beam +LF and the beam −LF in FIG. 24) for detecting the grating mark MG on the wafer or the fiducial mark plate FG are incident on the projection lens PL through a correction optical system CG, a polarizing beam splitter PBS (functionally corresponding to the half mirror 20 in FIG. 24), an objective lens OBJ (corresponding to the objective lens 22 in FIG. 24), and two mirrors MR. In this case, a plane FC conjugate to the surface of the wafer W is formed between the two mirrors MR. The pair of beams ±LF cross on this plane FC. The beams ±LF are relayed by the projection lens PL and also cross on the wafer, thereby irradiating the grating mark MG.

The interference beam BM from the grating mark MG passes almost the center of the pupil plane PE of the projection lens PL, is incident on a dichroic mirror DCM (corresponding to a dichroic mirror 32 in FIG. 24) through the mirrors MR, the objective lens OBJ, and the beam splitter 20, and then wavelength-divided. If the incident beams ±LF have the wavelengths $\lambda_1$ and $\lambda_2$, the dichroic mirror DCM guides the interference beam $B_{m1}$ having the wavelength $\lambda_1$ to the photoelectric element 36A and the interference beam $B_{m2}$ having the wavelength $\lambda_2$ to the photoelectric element 36B.

In this alignment system TTLA, when the incident bemas ±LF include a plurality of wavelength components (these components are separated from each other by about 30 nm to 40 nm), the crossing region of the beams ±LF irradiated on the wafer is shifted in the Z direction or the X and Y directions due to the influence of the chromatic aberration (on-axial magnification factor) or the influence of the chromatic aberration of the objective lens OBJ. The correction optical system CG for correcting the errors generated in accordance with the chromatic aberrations is arranged in the optical path of the incident beams ±LF. This correction optical system CG comprises a convex lens, a concave lens, a combination thereof, or a plane-parallel glass member. Alternatively, the correction optical system CG may be constituted by the adjustment optical systems 14, 16, and 18 shown in FIG. 24.

In the alignment system TTRA in FIG. 15, a D/D alignment mark DDM on the reticle R serves as a diffraction grating. When a relative position offset between the mark DDM and the corresponding grating mark MG on the wafer W is to be detected in accordance with the heterodyne scheme shown in FIG. 24, a transparent plane-parallel correction plate PGP is arranged on a pupil plane EP of a projection lens PL, as shown in FIGS. 17A and 17B. Phase diffraction gratings PG1, PG2, and PG3 are arranged at only positions where the incident beams (±LF) and the interference beam (BM) pass on the correction plate PGP, thereby reducing the influences of the chromatic aberration of on-axial and the chromatic aberration of magnification.

The 12th embodiment of the present invention will be described below. In this embodiment, using the arrangement shown in FIG. 24 as a base, an interference beam of 0th- and 2nd-order diffracted light components from a grating mark are detected in addition to the interference beam of the ±1st-order diffracted light components from the grating mark, as described in FIGS. 4, 5A, and 5B. In a system wherein the interference beam of the 0th- and 2nd-diffracted light components is photoelectrically converted by a single photoelectric element to detect a position offset of the grating mark using this photoelectric signal, when an interference beam (multi-wavelength beam) of the 0th- and 2nd-order diffracted light components upon obtaining a multi-wavelength incident beam for illuminating a grating mark is received by the single photoelectric element, it is difficult to properly detect the position offset. The main reason for this can be easily understood from FIGS. 29A to 29D, when the waveforms of photoelectric signals $IK02_1$, $IK02_2$, and $IK02_3$ obtained upon photoelectric detection of the interference beams of the 0th- and 2nd-order diffracted light components, e.g., three wavelength components $\lambda_1, \lambda_2,$ and $\lambda_3$ are observed. That is, as shown in FIGS. 29A to 29D, the phase differences between the three photoelectric signals $IK02_n$ (n=1, 2, 3) are larger than those between the photoelectric signals $I_{mn}$ (FIG. 7) of the interference beams of the ±1st-order diffracted light components. For this reason, when changes in intensities of the wavelengths having the large phase differences are received by the single photoelectric element, the amplitudes (AC amplitude components) of the photoelectric signals become very small by the canceling effect of the wavelength intensities. Note that the interference beams of the 0th- and 2nd-order diffracted light components are generated on the two sides of an interference beam BM of the 1st-order diffracted light components $±D_{1n}$ at symmetrical angles.

Figure 29A:
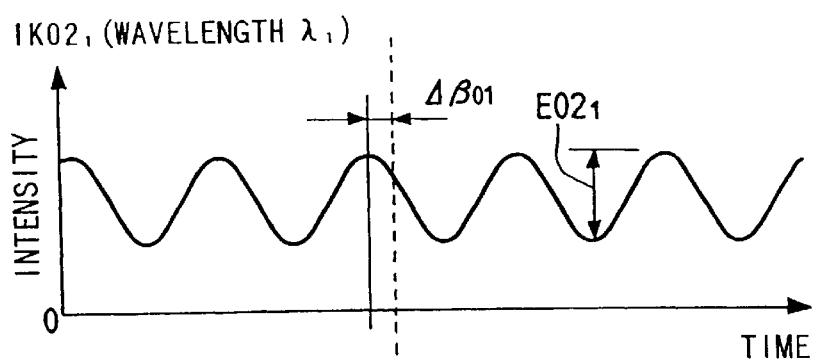
FIGS. 29A to 29D are charts showing the waveforms of photoelectric signals of the respective wavelengths obtained from the interference light beams of the 0th- and 2nd-order diffracted light components from a diffraction grating.
Figure 29B:
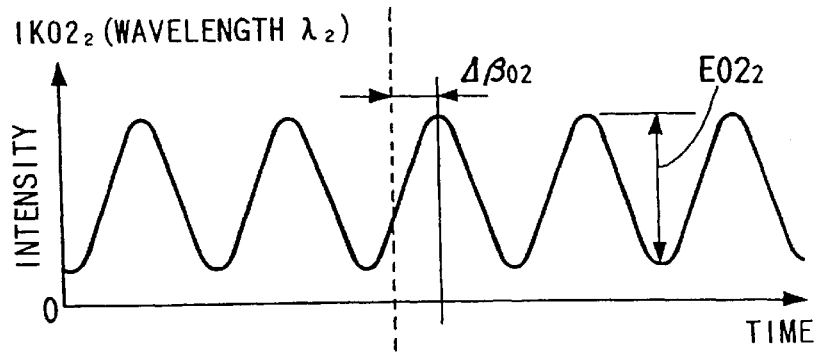
Figure 29C:
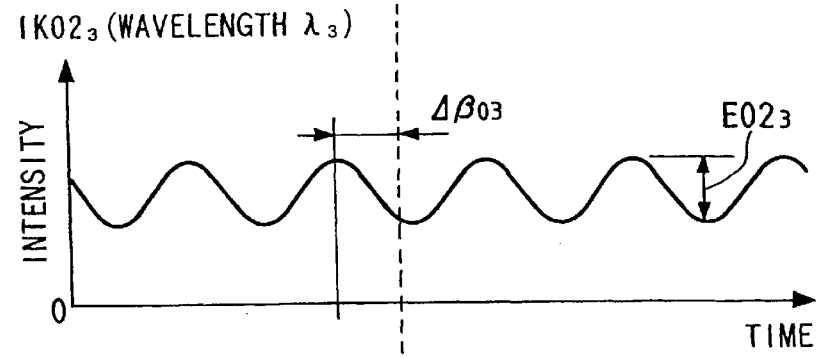
Figure 29D:
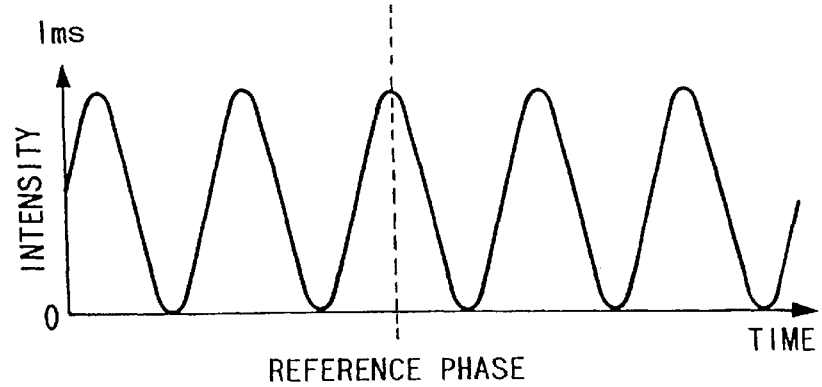

FIGS. 29A, 29B, and 29C show the heterodyne waveforms of the photoelectric signals $IK02_1$, $IK02_2$, and $IK02_3$ when the interference beam of all the interference beams of the 0th- and 2nd-order diffracted light components which appears on the left side of the interference beam BM of the ±1st-order diffracted light components is detected for the three wavelengths $\lambda_1, \lambda_2,$ and $\lambda_3$. FIG. 29D shows the waveform of a photoelectric signal $I_{ms}$ serving as the reference signal as in FIG. 26D.

Figure 30A:
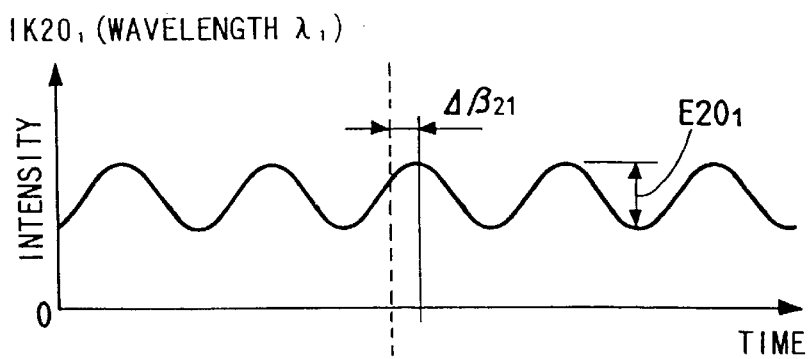
FIGS. 30A to 30D are charts showing the waveforms of photoelectric signals of the respective wavelengths obtained from the interference light beams of the 0th- and 2nd-order diffracted light components from a diffraction grating.
Figure 30B:
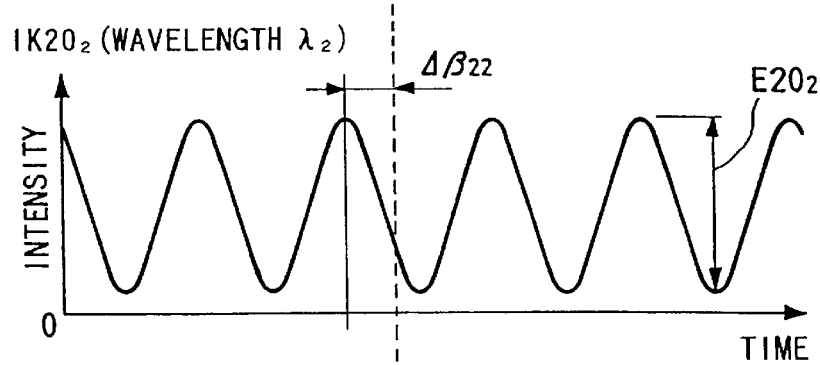
Figure 30C:
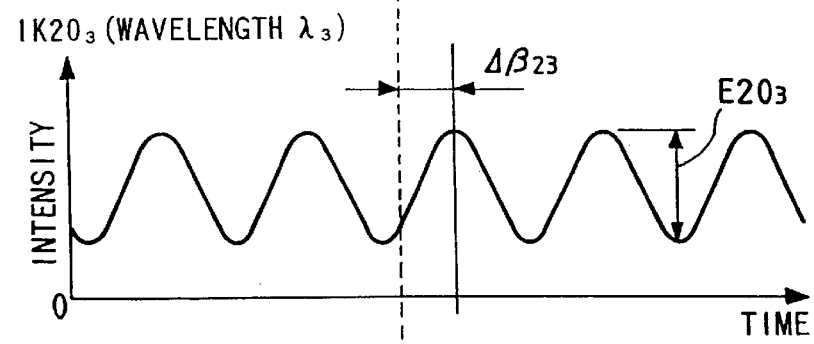
Figure 30D:
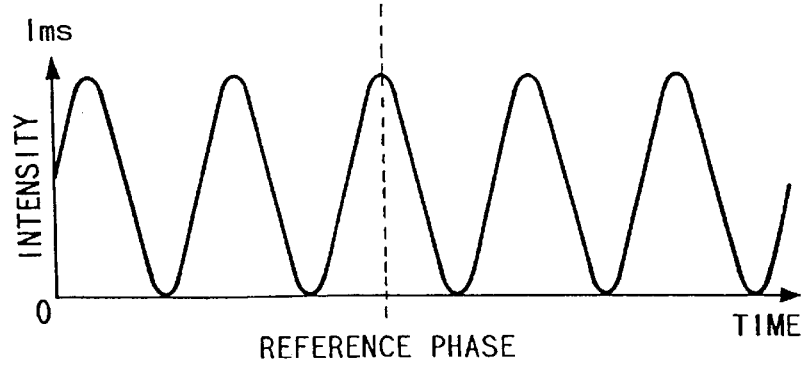

FIGS. 30A, 30B, and 30C show the heterodyne waveforms of photoelectric signals $IK20_1$, $IK20_2$, and $IK20_3$ when the interference beam of all the interference beams of the 0th- and 2nd-order diffracted light components which appears on the right side of the interference beam BM of the ±1st-order diffracted light components is detected for the three wavelengths $\lambda_1, \lambda_2,$ and $\lambda_3$. FIG. 30D shows the waveform of a photoelectric signal $I_{ms}$ serving as the reference signal as in FIG. 29D. As shown in FIGS. 29A, 29B, and 29C and FIGS. 30A, 30B, and 30C, phase offsets $\Delta\beta_{01}$, $\Delta\beta_{02}$, $\Delta\beta_{03}$, $\Delta\beta_{21}$, $\Delta\beta_{22}$, and $\Delta\beta_{23}$ of the signals $IK02_n$ and $IK20_n$ (n=1, 2, 3) have a strong wavelength dependence and greatly vary. At the same wavelength, the signals $IK02_n$ and $IK20_n$ tend to have components of opposite directions.

Figure 31:
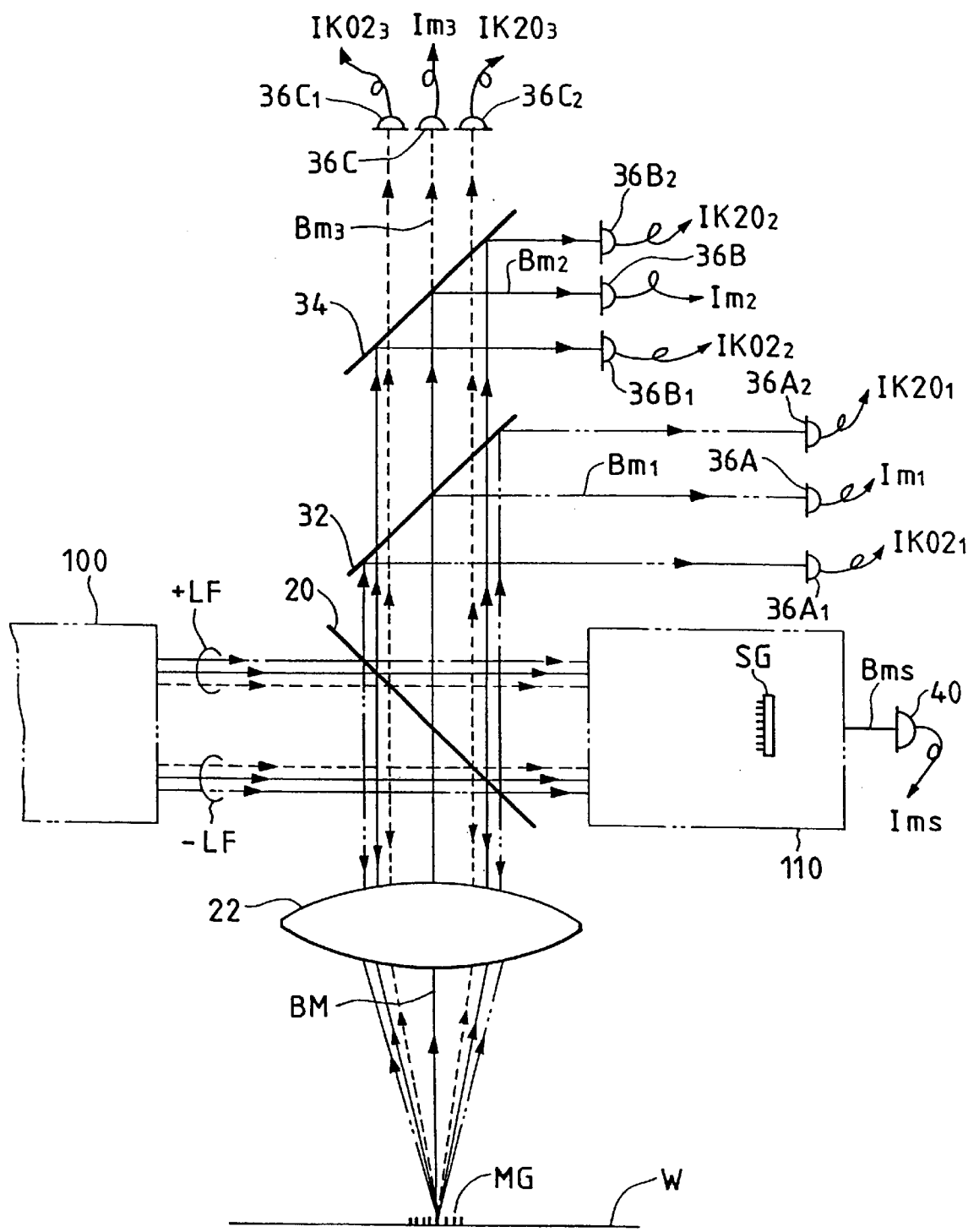
FIG. 31 is a view showing the arrangement of a position detection apparatus according to the 12th embodiment of the present invention.

The arrangement of this embodiment will be described with reference to FIG. 31. FIG. 31 shows part of the arrangement of FIG. 24 and is a modification of a photoelectric detection system for detecting various interference beams from a grating mark MG. The same reference numerals as in FIG. 24 denote the parts having the same functions in FIG. 31. Referring to FIG. 31, an incident system 100 includes light sources $LS_1$, $LS_2$, and $LS_3$, a mirror MR, dichroic mirrors $DCM_4$ and $DCM_5$, a radial grating plate RRG serving as a frequency shifter, a lens 10, a spatial filter 12, and adjacent optical systems 14, 16, and 18. The incident system 100 emits a pair of incident beams +LF and −LF. The incident beams ±LF including the wavelengths $\lambda_1$, $\lambda_2$, and $\lambda_3$ are partially reflected by a half mirror 20 and incident on an objective lens 22. The remaining part of the beams is incident on a reference light reception system 110. The reference light reception system 110 comprises a wavelength selection filter 24, a lens 26, a reference grating SG, and a spatial filter 38 in FIG. 24. The reference light reception system 110 guides a reference light beam $B_{ms}$ to a photoelectric element 40. When a grating MG on a wafer W is irradiated with the incident beams ±LF through the objective lens 22, an interference beam BM of the ±1st-order diffracted light components is vertically generated from the grating MG. At the same time, interference beams of the 0th- and 2nd-order diffracted light components are generated in a direction opposite to the traveling direction of each incident beam. The interference beam of the 0th- and 2nd-diffracted light components is directed to dichroic mirrors 32 and 34 through the objective lens 22 and the half mirror 20 and divided into wavelength components. The dichroic mirror 32 reflects most of the interference beams (two beams) of the 0th- and 2nd-order diffracted light components which have the wavelength $\lambda_1$, and the reflected beams are received by photoelectric elements $36A_1$ and $36A_2$. An interference beam $B_{m1}$ of the ±1st-order diffracted light components having the wavelength $\lambda_1$ is reflected by the dichroic mirror 32, and the reflected beam is received by a photoelectric element 36A.

Interference beams $B_{m2}$ and $B_{m3}$ of the 0th- and −2nd-order diffracted light components and of the ±1st-order diffracted light components, which respectively have the wavelengths $\lambda_2$ and $\lambda_3$ and have passed through the dichroic mirror 32, are separated into wavelength components by the dichroic mirror 34. The interference beams (two beams) of the 0th- and −2nd-order diffracted light components, which have the wavelength $\lambda_2$, are respectively received by photoelectric elements $36B_1$ and $36B_2$. The interference beam $B_{m2}$ of the ±1st-order diffracted light components is received by a photoelectric element 36B. The interference beams (two beams) of the 0th- and −2nd-order diffracted light components, which have the wavelength $\lambda_3$ and have passed through the dichroic mirror 34, are respectively received by photoelectric elements $36C_1$ and $36C_2$. The interference beam $B_{m3}$ of the ±1st-order diffracted light components is received by a photoelectric element 36C.

As can be apparent from the above arrangement, in this embodiment, a signal processing circuit is required to obtain the phase differences between the photoelectric signals from the photoelectric elements 36A, $36A_1$, $36A_2$, 36B, $36B_1$, $36B_2$, 36C, $36C_1$, and $36C_2$ using the photoelectric signal $I_{ms}$ as the reference signal from the photoelectric element 40. The simplest circuit arrangement of the signal processing circuit is shown in FIG. 32.

Figure 32:
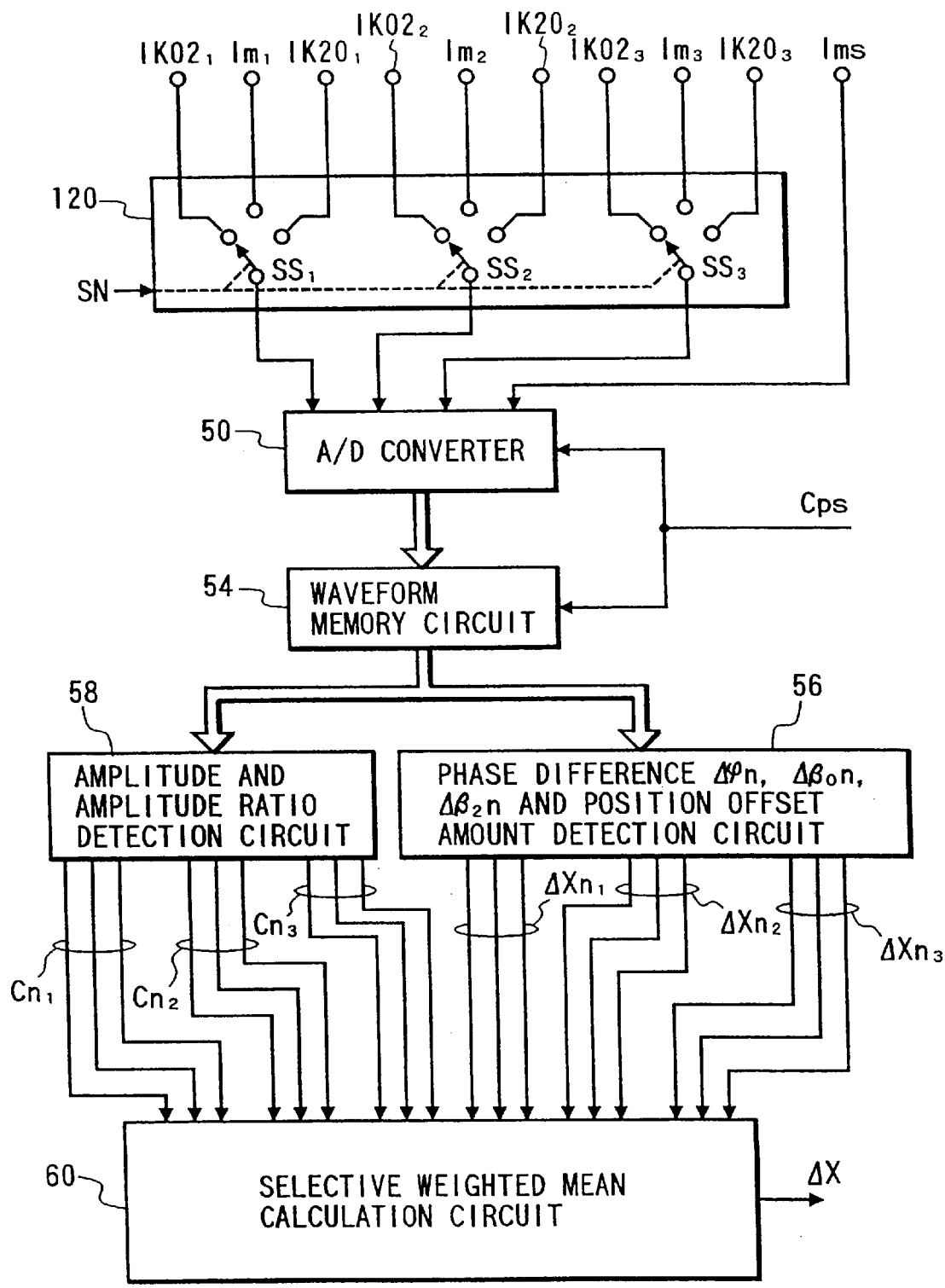
FIG. 32 is a block diagram showing the arrangement of a signal processing circuit applied to the apparatus shown in FIG. 31.

FIG. 32 is an improvement of part of the processing circuit shown in FIG. 25. The circuit shown in FIG. 32 is different from that in FIG. 25 in that an analog multiplexer 120 as a hardware element is added to time-serially select each photoelectric signal except for the reference signal $I_{ms}$ input to an A/D converter 50 in FIG. 25. The analog multiplexer 120 includes 3-input 1-output switches $SS_1$, $SS_2$, and $SS_3$. The switches $SS_1$, $SS_2$, and $SS_3$ are operated in response to an external switching signal SN.

The switch $SS_1$ selects one of the three photoelectric signals $I_{m1}$, $IK02_1$, and $IK20_1$ obtained upon reception of the interference beams of the wavelength $\lambda_1$. The switch $SS_2$ selects one of the three photoelectric signals $I_{m2}$, $IK02_2$, and $IK20_2$ obtained upon reception of the interference beams of the wavelength $\lambda_2$. The switch $SS_3$ selects one of the three photoelectric signals $I_{m3}$, $IK02_3$, and $IK20_3$ obtained upon reception of the interference beams of the wavelength $\lambda_3$. In this embodiment, since the switches $SS_1$ to $SS_3$ are interlocked, the three measurement signals (photoelectric signals) simultaneously input to the A/D converter 50 are given as signals detected in the same diffracted state. More specifically, when the switches $SS_1$ to $SS_3$ are switched to the intermediate positions, the same state as in FIG. 25 is set. The signals $I_{m1}$ to $I_{m3}$ obtained by photoelectrically detecting the interference beam of the ±1st-order diffracted light components are supplied to the A/D converter 50. When the three switches $SS_1$ to $SS_3$ are switched to the illustrated positions in FIG. 32, the signals $IK02_1$, $IK02_2$, and $IK02_3$ obtained by photoelectrically detecting, in units of wavelengths, the interference beam of the 0th- and −2nd-order diffracted light components, which appears on the left side of the interference beam BM of the ±1st-order diffracted light components, are supplied to the A/D converter 50. When the switches $SS_1$ to $SS_3$ are switched to the right positions, the photoelectric signals $IK20_1$, $IK20_2$, and $IK20_3$ are supplied to the A/D converter 50.

An amplitude detection and amplitude ratio detection circuit 58 shown in FIG. 25 is changed to output ratio data $C_{n1}$, $C_{n2}$, and $C_{n3}$ (n=1, 2, 3 corresponding to the wavelengths) grouped in units of interference beams having different diffracted states in FIG. 32. Of these ratio data, ratio data $C_{n1}$, (n=1, 2, 3) are identical to ratios $C_1$, $C_2$, and $C_3$ in FIG. 25. The ratio data $C_{n2}$ (n=1, 2, 3) are ratios obtained from the photoelectric signals $IK02_n$ (n=1, 2, 3) in units of wavelengths. The ratio data $C_{n3}$ (n=1, 2, 3) are ratios obtained from the photoelectric signals $IK20_n$ (n=1, 2, 3) in units of wavelengths.

A phase difference and position offset detection circuit 56 shown in FIG. 25 is modified to output offset amounts $\Delta X_{n1}$, $\Delta X_{n2}$, and $\Delta X_{n3}$ (n=1, 2, 3) grouped in units of interference beams having different diffracted states in FIG. 32. Of these offset amounts, the offset amounts $\Delta X_{n1}$ (n=1, 2, 3) are equal to offset amounts $\Delta X_1$, $\Delta X_2$, and $\Delta X_3$ in FIG. 6. The offset amounts $\Delta X_{n2}$ (n=1, 2, 3) are obtained from the photoelectric signals $IK02_n$ (n=1, 2, 3) in units of wavelengths. The offset amounts $\Delta X_{n3}$ (n=1, 2, 3) are obtained from the photoelectric signals $IK20_n$ (n=1, 2, 3) in units of wavelengths. Note that this detection circuit 56 calculates, as intermediate values, values corresponding to the phase differences $\Delta\beta_{0n}$ and $\Delta\beta_{2n}$ (n=1, 2, 3) described in FIGS. 29A to 29D and FIGS. 30A to 30D.

A weighted mean calculation circuit unit 60 is modified into a selective weighted mean calculation circuit in FIG. 32. This circuit has the first arithmetic mode for calculating a final position offset amount $\Delta X$ on the basis of the photoelectric detection results of the interference beam of the ±1st-order diffracted light components as in FIG. 25, the second arithmetic mode for calculating the final offset amount $\Delta X$ on the basis of the photoelectric detection results of the interference beams of the 0th- and −2nd-order diffracted light components, and the third arithmetic mode for calculating the final offset amount $\Delta X$ on the basis of the detection results of all the interference beams. These three arithmetic operation modes can be arbitrarily selected by the operator. When the third arithmetic mode is designated, a few additional arithmetic algorithms can be selected. Such mode designation and algorithm designation will be described in detail later on.

In this embodiment, a wafer stage WST is positioned to irradiate incident beams ±LF from the objective lens 22 onto the grating mark of a fiducial mark plate FG on the wafer stage WST. The switching signal SN is supplied to the analog multiplexer 120 to set the switches $SS_1$ to $SS_3$ to the positions illustrated in FIG. 32. The signals $IK02_n$ (n=1, 2, 3) of the photoelectric signals obtained upon photoelectric detection of the interference beams of the 0th- and −2n-order diffracted light components generated by the grating mark of the fiducial mark plate FG are digitally sampled by the A/D converter 50. The waveforms of the signals $IK02_n$ are temporarily stored in a waveform memory circuit 54.

An amplitude detection circuit 58 analyzes the waveform data stored in the memory circuit 54 and calculates and stores the amplitude values (peak-to-peak values) of the signals $IK02_n$ as values $J02_n$ (n=1, 2, 3).

Then the switches $SS_1$ to $SS_3$ are switched to the right positions in FIG. 32. The signal $IK20_n$ (n=1, 2, 3) of the photoelectric signals obtained upon photoelectric detection of the interference beams of the 0th- and −2nd-order diffracted light components generated from the grating mark of the fiducial mark plate FG are digitally sampled by the A/D converter 50. The waveforms of the signals $IK20_n$ are temporarily stored in the memory circuit 54. In this case, when the storage capacity of the memory circuit 54 is not so large, the previously stored waveform data of the signals $IK02_n$ are erased, and the waveform data of the signals $IK20_n$ are overwritten- The-waveform data in the memory circuit 54 are then analyzed by the amplitude detection circuit 58, and the amplitude values (peak-to-peak values) of the signals $IK20_n$ (n=1, 2, 3) are calculated and stored as values $J20_n$ (n=1, 2, 3).

Finally, the switches $SS_1$ to $SS_3$ are switched to the intermediate positions. Waveform data of the signals $I_{mn}$ (n=1, 2, 3) obtained by photoelectrically detecting the interference beam of the ±1st-order diffracted light components generated from the grating mark of the fiducial mark plate FG are similarly stored in the memory circuit 54. Amplitude values $J11_n$ (n=1, 2, 3) are calculated and stored by the amplitude detection circuit 58.

When the preliminary operation is thus completed, the wafer W to be actually positioned and aligned is placed on the stage WST. The stage WST is positioned to irradiate the incident beams ±LF from the objective lens 22 onto the grating mark MG on the wafer W.

In the same manner as in detection of the grating mark of the fiducial mark plate FG, the switches $SS_1$ to $SS_3$ of the multiplexer 120 are sequentially switched to store the waveform data of the respective signals in the memory circuit 54, and the amplitude values of the signals $I_{mn}$, $IK02_n$, and $IK20_n$ (n=1, 2, 3) obtained by photoelectrically detecting the interference beams generated from the grating mark MG on the wafer are calculated as $E_n$ (FIGS. 26A to 26D) and $E02_n$ and $E20_n$ (FIGS. 29A to 29D and FIGS. 30A to 30D).

At the time of switching the switches $SS_1$ to $SS_3$ to store one of the sets of signals $I_{mn}$, $IK02_n$, and $IK20_n$, the waveform of the reference signal $I_{ms}$ is stored in the memory circuit 54 along the same time axis. Prior to switching of the switches $SS_1$ to $SS_3$, the stored waveform data of all the waveform data of the signals $I_{mn}$, $IK02_n$, and $IK20_n$ are analyzed by the phase difference and phase offset amount detection circuit 56. The circuit 56 sequentially calculates a corresponding one of phases $\Delta\psi_n$, $\Delta\beta_{0n}$, and $\Delta\beta_{2n}$ and a corresponding one of the position offset amounts $\Delta X_{n1}$, $\Delta X_{n2}$, and $\Delta X_{n3}$ (n=1, 2, 3).

When the amplitude values and the position offset amounts of the respective wavelengths are obtained in units of detection light beams having different diffracted states (in units of interference beams), the amplitude ratio detection circuit 58 performs the following arithmetic operations:

$$\left.\begin{array}{l}C_{11} = E_1/J11_1 \\ C_{21} = E_2/J11_2 \\ C_{31} = E_3/J11_3\end{array}\right\} \quad (7)$$

$$\left.\begin{array}{l}C_{12} = E02_1/J02_1 \\ C_{22} = E02_2/J02_2 \\ C_{32} = E02_3/J02_3\end{array}\right\} \quad (8)$$

$$\left.\begin{array}{l}C_{13} = E20_1/J20_1 \\ C_{23} = E20_2/J20_2 \\ C_{33} = E20_3/J20_3\end{array}\right\} \quad (9)$$

The most probable offset amount (deviation) $\Delta X$ is calculated by the weighted mean calculation circuit 60. In the first arithmetic mode using only the interference beam BM of the ±1st-order diffracted light components, the offset amount $\Delta X$ is calculated as follows in the same manner as in FIG. 25:

$$\Delta X=(C_{11}\cdot\Delta X_{11}+C_{21}\cdot\Delta X_{21}+C_{31}\cdot\Delta X_{31})/(C_{11}+C_{21}+C_{31})$$

On the other hand, in the second arithmetic mode using only the interference beam of the 0th- and −2nd-order diffracted light components, an algorithm is employed to calculate the position offset amount of each wavelength in accordance with an average phase difference between phase differences $\Delta\beta_{0n}$, obtained upon detection of the interference beam of the 0th- and −2nd-order diffracted light components, which appears on the left side of the interference beam BM of the ±+1st-order diffracted light components and phase differences $\Delta\beta_{2n}$ obtained upon detection of the interference beam of the 0th- and −2nd-order diffracted light components, which appears on the right side of the interference beam BM of the ±1st-order diffracted light components. This phase difference average is not an average for reducing so-called random components to improve precision, but an average which must be obtained in principle in position detection using the interference beams of the 0th- and ±2nd-order diffracted light components.

Based on this algorithm of this embodiment, the weighted mean calculation circuit 60 calculates average values $\Delta XA_n$ (n=1, 2, 3) of the respective wavelengths between the position offset amounts $\Delta X_{n2}$ (n=1, 2, 3) obtained from the signals $IK02_n$ and the position offset amounts $\Delta X_{n3}$ (n=1, 2, 3) obtained from the signals $IK20_n$ (n=1, 2, 3) as follows:

$$\Delta XA_1=(\Delta X_{12}+\Delta X_{13})/2$$

$$\Delta XA_2=(\Delta X_{22}+\Delta X_{23})/2$$

$$\Delta XA_3=(\Delta X_{32}+\Delta X_{33})/2$$

The weighted mean calculation circuit 60 also calculates average values $CA_n$ (n=1, 2, 3) of the amplitude ratios $C_{n2}$ and $C_{n3}$ of the 0th- and −2nd-order diffracted light components of the respective wavelengths obtained in the amplitude ratio detection circuit 58 as follows:

$$CA_1=(C_{12}+C_{13})/2$$

$$CA_2=(C_{22}+C_{23})/2$$

$$CA_3=(C_{32}+C_{33})/2$$

The weighted mean calculation circuit 60 then calculates the weighted mean value of the average position offset amounts $\Delta XA_n$ using the average ratios $CA_n$ of the respective wavelength components as weighting factors, thereby calculating the most probable offset amount $\Delta X$ as follows:

$$\Delta X = (CA_1 \cdot \Delta XA_1 + CA_2 \cdot \Delta XA_2 + CA_3 \cdot \Delta XA_3)/(CA_1 + CA_2 + CA_3)$$

By the above calculation, position detection and position offset detection of the grating mark in the second arithmetic mode can be achieved.

In the third arithmetic mode, the operator can arbitrarily set one of the first algorithm for simply averaging the position offset amount calculated in the first arithmetic mode and the position offset amount calculated in the second arithmetic mode, and the second algorithm for calculating the weighted mean of these two position offset amounts. Let $\Delta XM_1$ be the position offset amount finally calculated in the first arithmetic mode (i.e., the mode using the detection results of the interference beam of the ±1st-order diffracted light components) and $\Delta XM_2$ be the position offset amount finally calculated in the second arithmetic mode. In this case, the position offset amount determined by the first algorithm is calculated as $(\Delta XM_1 + \Delta XM_2)/2$.

On the other hand, in the second algorithm, the weighted mean value of the offset amount $\Delta XM_1$ calculated in the first arithmetic mode and the offset amount $\Delta XM_2$ calculated in the second arithmetic mode are calculated with predetermined weighting factors $Q_1$ and $Q_2$. As an example, the weighting factor $Q_1$ is caused to correspond to the sum of the amplitude values $E_1$, $E_2$, and $E_3$ (see FIGS. 26A to 26D) of the signals Imn (n=1, 2, 3) obtained upon photoelectric detection of the interference beam BM of the ±1st-order diffracted light components, and the weighting factor $Q_2$ is caused to correspond to the sum of the average amplitude values $(E02_1 + E20_1)/2$, $(E02_2 + E20_2)/2$, and $(E02_3 + E20_3)/2$ of the signals $IK02_n$ and $IK20_n$ (n=1, 2, 3) obtained for photoelectrically detecting the interference beam of the 0th- and −2nd-order diffracted light components in units of wavelengths. Therefore, the offset amount $\Delta X$ of the grating mark MG is determined by the following calculation in the second algorithm:

$$\Delta X = (Q_1 \cdot \Delta XM_1 + Q_2 \cdot \Delta XM_2)/(Q_1 + Q_2)$$

In principle, diffracted light components of higher order have lower intensities. For this reason, the light intensity amplitudes (corresponding to $E_n$) of the interference beam BM of the ±1st-order diffracted light components are much larger than those (corresponding to $E02_n$ and $E20_n$) of the interference beam of the 0th- and −2nd-order diffracted light components. When the weighting factors $Q_1$ and $Q_2$ are simply determined by the sums of the amplitudes of the signals $I_{mn}$, $IK02_n$, and $IK20_n$, the weighting factor $Q_1$ is usually larger than the weighting factor $Q_2$. Therefore, the calculated value with respect to the weighting factor $Q_2$ is preferably corrected to increase by, e.g., a predetermined ratio (e.g., 10% to 30%).

The 13th embodiment of the present invention will be described with reference to FIG. 33. In this embodiment, the structure of a fiducial mark plate FG on a wafer stage WST shown in FIG. 24 is replaced with a transmission grating (i.e., a grating whose amplitude transmittance does not have asymmetry). An interference beam transmitted through this grating is photoelectrically detected to obtain a denominator (reference value) used in causing a detection circuit 58 to calculate the amplitude ratios of photoelectric signals $I_{mn}$, $IK02_n$, and $IK20_n$.

Figure 33:
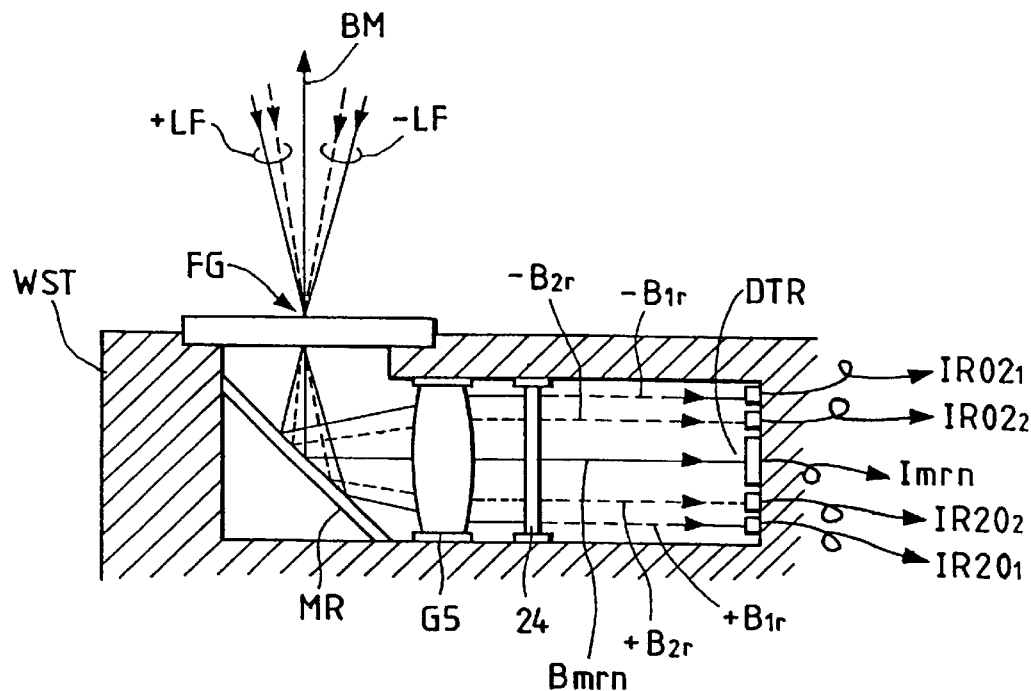
FIG. 33 is a sectional view showing part of an apparatus according to the 13th embodiment of the present invention.

FIG. 33 shows the partial section of the wafer stage WST. When incident beams tLF (in this case, the beams have two wavelengths $\lambda_1$ and $\lambda_2$) are irradiated on the grating of the fiducial mark plate FG, 0th-, ±1st- and ±2nd-order diffracted light components are generated from the grating toward the interior of the stage. These diffracted light components are deflected at a right angle by a mirror MR and incident on a lens system G5 having a Fourier transform function. One of the components of the wavelengths $\lambda_1$ and $\lambda_2$ is selected by a wavelength selection filter 24 having an automatic exchanging function, and result beams become interference beams $B_{mrn}$, $\pm B_{1r}$, and $\pm B_{2r}$ which are then incident on photoelectric elements DTR. The wavelength selection filter 24 is arranged such that a filter for transmitting the wavelength $\lambda_1$ and shielding the wavelength $\lambda_2$ and a filter having characteristics opposite to those of the above filter can be alternatively inserted into or retracted from the optical path. When the filter for selecting the wavelength $\lambda_1$ is used, the interference beams $\pm B_{2r}$ of the 0th- and −2nd-order diffracted light components having the wavelength $\lambda_1$ and the interference beam $B_{mr1}$ of the ±1st-ordered diffracted light components having the wavelength $\lambda_1$ reach the photoelectric elements DTR. When the filter for selecting the wavelength $\lambda_2$ is used, the interference beams $\pm B_{2r}$ of the 0th- and −2-order diffracted light components having the wavelength $\lambda_2$ and the interference beam $Bmr_2$ of the ±1st-order diffracted light components having the wavelengths $\lambda_2$ reach the photoelectric elements DTR. For this reason, in use of the filter for selecting the wavelength $\lambda_1$, the photoelectric signals $I_{mr1}$, $IR02_1$, and $IR20_1$ are obtained and in use of the filter for selecting the wavelength $\lambda_2$, the photoelectric signals $I_{mr2}$, $IR02_2$, $IR20_2$ are obtained.

In the heterodyne scheme, these photoelectric signals appear in the form of a sinusoidal waveform having the same frequency as the beat frequency. These photoelectric signals are connected to be selectively input to an A/D converter 50 by three switches $SS_1$ to $SS_3$ of an analog multiplexer 120 of the processing circuit shown in FIG. 32. More specifically, the switches $SS_1$ to $SS_3$ in FIG. 32 are replaced with 5-input 1-output switches. Two of the five inputs are used for input switching between the set of photoelectric signals $I_{mr1}$, $IR02_1$ and $IR20_1$ and the set of photoelectric signals $I_{mr2}$, $IR02_2$, and $IR20_2$ obtained upon detection of the fiducial mark plate FG.

The amplitude values of these photoelectric signals are obtained by the amplitude detection circuit 58 in FIG. 32 and stored. To obtain amplitude ratios, the following arithmetic operations are performed:

$$C_{11} = I_{m1}/I_{mr1}$$

$$C_{21} = I_{m2}/I_{mr2}$$

$$C_{12} = IK02_1/IR02_1$$

$$C_{22} = IK02_2/IR02_2$$

$$C_{13} = IK20_1/IR20_1$$

$$C_{23} = IK20_2/IR20_2$$

In this manner, the interference beams of the diffracted light components passing through the fiducial mark plate are photoelectrically detected by the photoelectric elements DTR in this embodiment. When the phase information of each photoelectric signal obtained from elements DTR is compared with that of a photoelectric signal $I_{ms}$ serving as the reference signal, the position offset of a fiducial mark plate FG, or its position can be measured. That is, part of the baseline measurement operation can also serve as the operation for measuring the position or position offset of the fiducial mark plate FG.

The 14th embodiment of the present invention will be described with reference to FIG. 34. In this embodiment, the polarization directions of a pair of incident beams +LF and −LF for irradiating a measurement (alignment) grating mark MG on a wafer W (or a fiducial mark plate FG) through an objective lens 22 are set complementary. More specifically, if the incident beams +LF and −LF are linearly polarized beams, their polarization directions are set to be perpendicular to each other. However, if the incident beams +LF and −LF are circularly polarized beams, they are set to be polarized beams having reverse rotational directions. For this reason, the two incident beams ±LF do not interfere with each other, and ±1st-order polarized light components MB of wavelengths $\lambda_1$, $\lambda_2$, and $\lambda_3$ vertically generated from the grating mark MG do not interfere with each other.

When the ±1st-order diffracted light components MB are to be photoelectrically detected through an objective lens 22 and a small mirror MR2, a polarizing beam splitter PBS serving as an analyzer is used. In this manner, the ±1st-order polarized components BM passing through the polarizing beam splitter PBS interfere with each other and serve as a first interference beam $B_{p1}$. The ±1st-order diffracted light components BM reflected by the polarizing beam splitter PBS interfere with each other and serve as a second interference beam $B_{p2}$. The polarization of these interference beams $B_{p1}$ and $B_{p2}$ are complementary. In the heterodyne scheme, the interference beams are sinusoidally intensity-modulated in accordance with the beat frequency. The intensity modulation phases of the interference beams $B_{p1}$ and $B_{p2}$ are different by accurately 180°.

Figure 34:
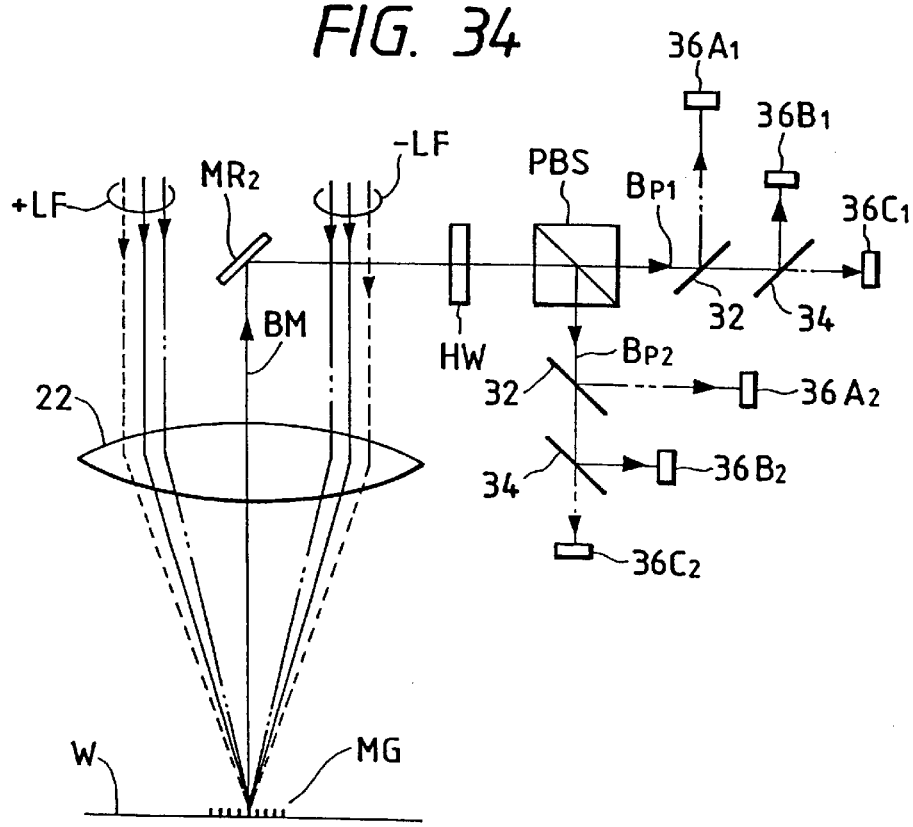
FIG. 34 is a view showing the arrangement of a position detection apparatus according to the 14th embodiment of the present invention.

When the linear polarization directions of the incident beams ±LF and the ±1st-order diffracted light component BM which are perpendicular to each other are different (rotated) from the polarization separation direction of the polarizing beam splitter PBS, a λ/2 plate HW shown in FIG. 34 is arranged to correct the linear polarization directions of the ±1st-order diffracted light beams BM. For this reason, when the linear polarization directions of the ±1st-order diffracted light components BM which are perpendicular to each other coincide with the polarization separation direction of the polarizing beam splitter PBS from the beginning, or when the incident beams +LF and −LF are circularly polarized beams having opposite rotational directions, the λ/2 plate HW need not be used.

In this embodiment, the interference beam $B_{p1}$ is discriminated in units of wavelengths by dichroic mirrors 32 and 34. The component having the wavelength $\lambda_1$ of the interference beam $B_{p1}$ is received by a photoelectric element $36A_1$, the component having the wavelength $\lambda_2$ is received by a photoelectric element $36B_1$, and the component having the wavelength $\lambda_3$ is received by a photoelectric element $36C_1$. Similarly, the wavelengths of the interference beam $B_{p2}$ are discriminated by other dichroic mirrors 32 and 34. The components having the wavelengths $\lambda_1$, $\lambda_2$, and $\lambda_3$ are respectively received by photoelectric elements $36A_2$, $36B_2$, and $36C_2$, respectively.

Output signals from the photoelectric elements 36A. and $36A_2$ are subtracted from each other by a differential amplifier, thereby obtaining a photoelectric signal $I_{m1}$. Output signals from the photoelectric elements $36B_1$ and $36B_2$ are subtracted from each other by a differential amplifier, thereby obtaining a photoelectric signal $I_{m2}$. Output signals from the photoelectric elements $36C_1$ and $36C_2$ are subtracted from each other by a differential amplifier, thereby obtaining a photoelectric signal $I_{m3}$.

The differential amplifiers are used as described above because, for example, the output signal from the photoelectric element $36A_1$ and the output signal from the photoelectric element $36A_2$ have opposite phases (i.e., a phase difference of 180°). The common-phase noise components included in these outputs are canceled each other to increase the substantial S/N ratio of the signal $I_{m1}$. At least the on-axial chromatic aberration of all the aberrations of objective lens 22 (FIG. 24, 31, or 34) which are generated in the wavelength range ($\lambda_1$ to $\lambda_3$) is preferably corrected to some extent. If the bandwidth of the wavelengths $\lambda_1$ to $\lambda_3$ is 100 nm or less, such an on-axial chromatic aberration can be corrected to some extent by selecting proper materials for a plurality of lens elements constituting the objective lens 22 or combining lens elements having different refractive indices and different dispersion ratios. This chromatic aberration need not be perfectly corrected in the objective lens 22. The chromatic aberration can be corrected by adjustment optical systems 14, 16, and 18 shown in FIG. 24.

Each embodiment has been described above. In detecting the grating mark MG on the wafer W or the fiducial mark plate FG in accordance with the homodyne scheme, the grating mark MG must be prescanned in the pitch direction to sample the changes in levels of the photoelectric signals. In this case, the simplest scheme is to change a signal waveform sampling clock signal $C_{ps}$ shown in FIG. 25 or 32 into a measurement pulse (e.g., one pulse every 0.02 μm) from an interferometer 44 for measuring the position of the stage WST. With this arrangement, waveform data of the respective photoelectric signals generated during prescanning by several pitches of the grating marks MG are stored in a memory-circuit 54 in correspondence with the positions of the grating marks MG.

In the scheme for irradiating the two incident beams ±LF onto the grating mark MG, the incident beams ±LF are preferably incident on the grating mark MG at symmetrical angles at least the pitch direction of the grating mark MG. In the scheme for projecting one incident beam on the grating mark MG, as shown in FIG. 23, the incident angle of the beam is preferable zero (vertical incidence) with respect to the pitch direction of the grating mark MG.

In projecting a multi-wavelength illumination light beam onto the measurement grating mark MG (or the fiducial mark), the plurality of laser beams of the respective wavelengths need not be coaxially synthesized, as shown in FIGS. 21, 23, and 24, but may be separated in the non-measurement direction perpendicular to the measurement direction (pitch direction) of the mark position and may be incident separately on the Fourier transform plane of the grating mark MG. That is, the incident angles of the plurality of illumination beams on the grating mark MG may be different in the non-measurement direction in units of wavelengths of the illumination beams.

Figure 35:
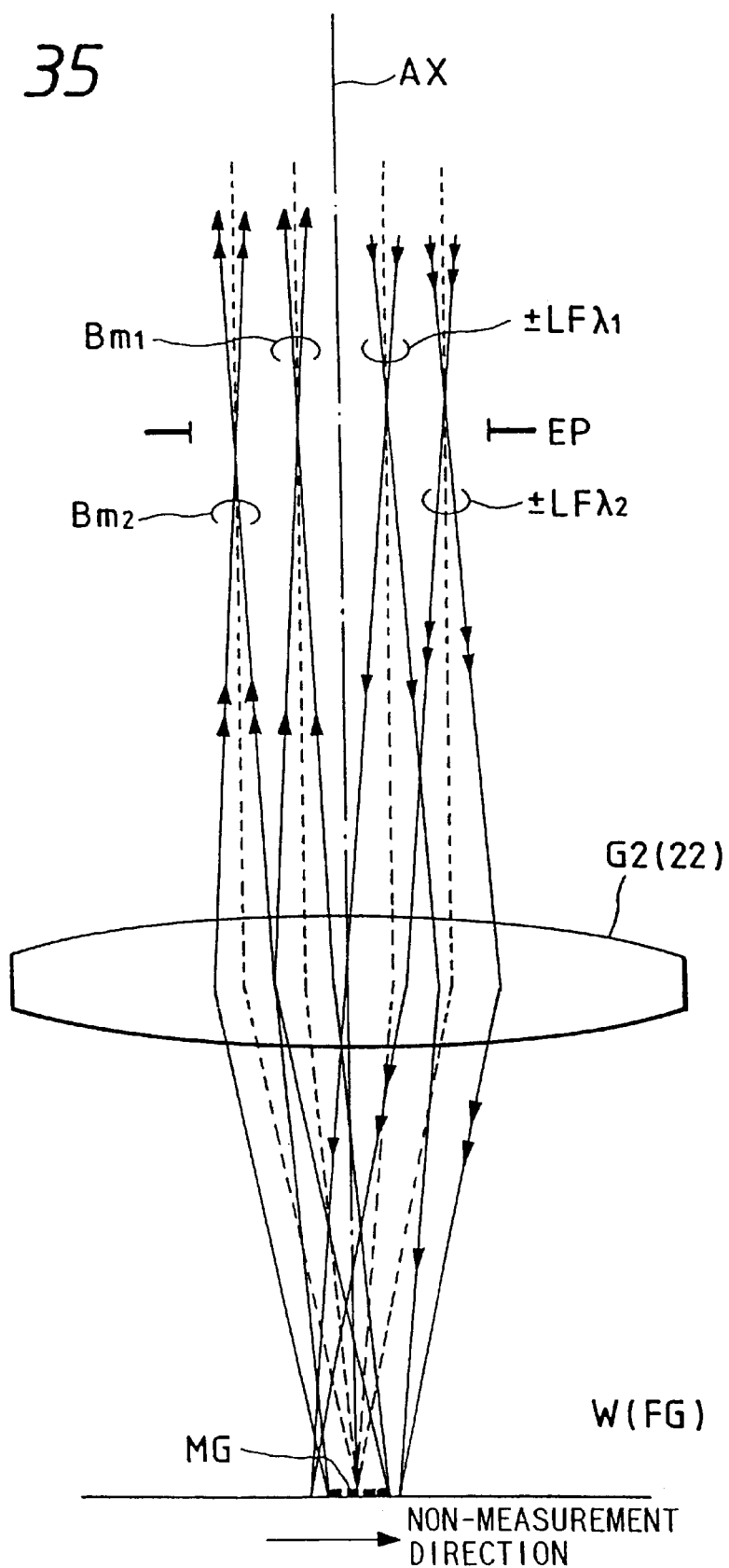
FIG. 35 is a view showing a modification of an illumination beam projection scheme shown in each embodiment of the present invention.

FIG. 35 shows a state of incidence of beams $\pm LF\lambda_1$ and $\pm LF\lambda_2$ on a rear-group lens system G2 of the projection lens or the objective lens 22. These beams $\pm LF\lambda_1$ and $\pm LF\lambda_2$ pass through positions decentered from an optical axis AX on a-Fourier transform plane (pupil plane) EP with respect to the grating mark MG. The beams $\pm FL\lambda_1$ or $\pm LF\lambda_2$ consist of two beams separated in a direction perpendicular to the drawing surface in FIG. 35. The pitch direction of the grating mark MG in FIG. 35 is perpendicular to the drawing surface. The beams $\pm LF\lambda_1$ having the wavelength $\lambda_1$ are offset from the beams $\pm LF\lambda_2$ having the wavelength $\lambda_2$ on the Fourier transform plane EP in the non-measurement direction (i.e., the horizontal direction on the drawing surface of FIG. 35).

With the above arrangement, interference beams $B_{m1}$ and $B_{m2}$ of the ±1st-order diffracted light components which are generated from the grating mark MG and return to the Fourier transform plane EP pass through positions separated in the non-measurement direction on the Fourier transform plane EP in units of wavelengths. The interference beam $B_{m1}$ is generated from the mark MG upon irradiation of the incident beams $\pm LF\lambda_1$. The interference beam $B_{m2}$ is generated from the mark MG upon irradiation of the incident beams $\pm LF\lambda_2$. The incident beams and the interference beams are distributed on the Fourier transform plane EP, as shown in FIG. 36.

Figure 36:
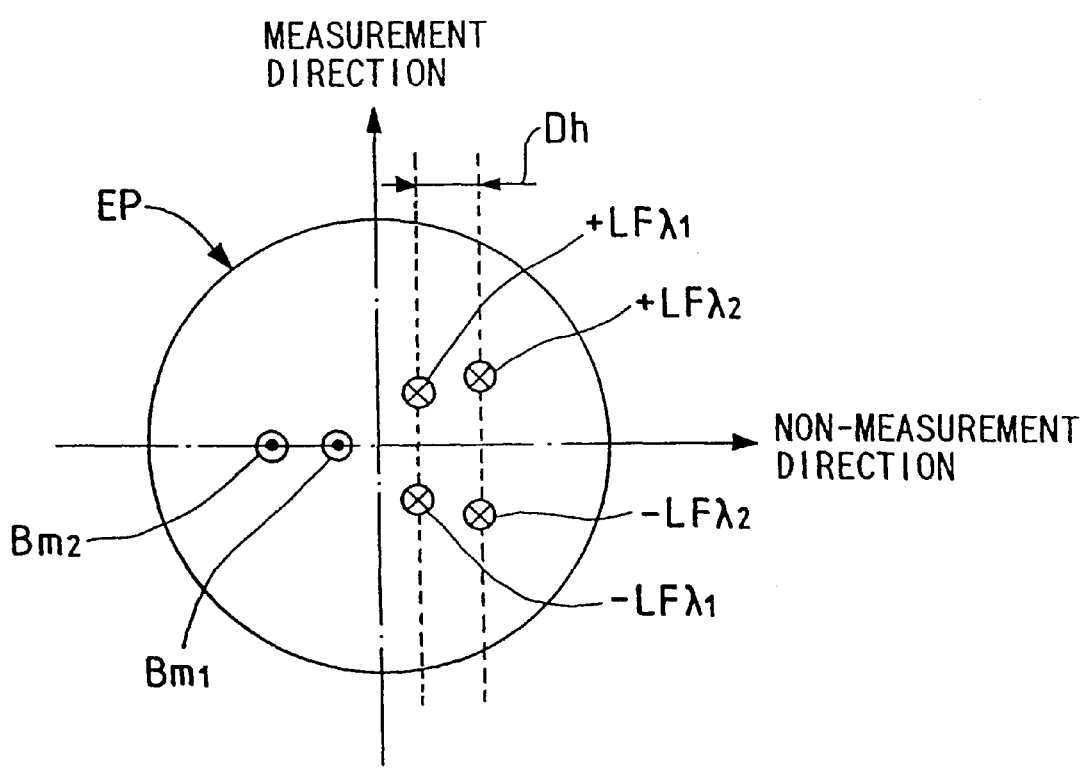
FIG. 36 is a view showing the arrangement of beams on a Fourier transform plane according to the illumination beam projection scheme in FIG. 35.

Referring to FIG. 36, when orthogonal axes (measurement and non-measurement axes) having the center of the Fourier transform plane EP as the origin are set, an offset amount Dh of the two sets of incident beams $\pm LF\lambda_1$ and $\pm LF\lambda_2$ in the non-measurement axis corresponds to the offset amount of the interference beams $B_{m1}$ and $B_{m2}$ of the 1st-order diffracted light components in the non-measurement direction. In this manner, when the beams for irradiating the grating mark MG are inclined in the non-measurement direction in units of wavelength components, the interference beams $B_{m1}$ and $B_{m2}$ are separated and distributed in the Fourier transform plane EP accordingly. Photoelectric detection can be performed only when the light-receiving surface of each photodetector is located on the Fourier transform plane EP or a plane conjugate to the Fourier transform plane EP.

More specifically, when a plurality of interference beams (interference of the ±1st-order diffracted light components and interference of the 0th- and −2nd-order diffracted light components) to be photoelectrically detected are separated on the Fourier transform plane EP in units of wavelengths, these can be individually photoelectrically detected without using any dichroic mirror used in the previous embodiments. Therefore, as a scheme for separating the interference beam to be detected into the respective wavelength components, use of a wavelength selection element such as a dichroic mirror or a bandpass filter is not indispensable.

To obtain a multi-wavelength incident beam, light from a halogen lamp or a high-luminance LED may be used in place of light from a laser light source. When light from a halogen lamp is used, a wavelength selection filter having a predetermined bandwidth is arranged, and light (broad-band light) having a wavelength width of about 20 nm to 100 nm selected by this filter is guided through an optical filter and used. In this case, an incident beam for irradiating the grating mark MG on the wafer has an intensity distribution continuous within the selected wavelength bandwidth. For this reason, it is desirable that an interference filter (bandwidth: 3 nm to 10 nm) for extracting only a specific wavelength component may be fixedly or replaceably arranged in front of each photoelectric element in the light reception system.

As described above, in each of the eighth to 14th embodiments associated with the second aspect of the present invention, a position detection multi-wavelength illumination light beam or a broad-band light beam is obtained, and diffracted light components generated from a position detection grating mark on a substrate are independently photoelectrically detected in units of wavelength components. Mark position information is detected for each resultant photoelectric signal, and the pieces of mark position information are averaged. High-precision position detection can be performed almost free from the influences of asymmetry of the marks and irregularities of the thickness of the resist layer. The photoelectric signals independent in units of wavelength components can be obtained in photoelectric detection of the diffracted light components from the mark.

For this reason, even if the intensities of the illumination light beams are different in units of wavelength components, the averaging effect using a multi-wavelength beam will not be advantageously impaired, unlike in the conventional case.

In each of the eighth to 14th embodiments described above, assume that diffracted light components to be photoelectrically detected are components of higher order. In this case, when these multi-wavelength components (e.g., an interference beam of the 0th- and 2nd-order diffracted beams) are simultaneously received by a single photoelectric element, a canceling phenomenon which has occurred in the conventional case can be eliminated. Therefore, higher-precision position detection and alignment than those of the conventional case can be achieved.

In the second aspect of the present invention, the attenuation ratios (amplitude ratios) of the intensity levels of the photoelectrically detected diffracted light components of the respective wavelengths are obtained. As for diffracted light components whose attenuation ratios are small and signal amplitudes are relatively large, position detection is performed using weighted mean calculation. Therefore, higher-precision position detection than that of simple averaging can be obtained.

In each embodiment described above, multi-wavelength incident beams are simultaneously irradiated on the grating mark MG. However, high-speed shutters may be arranged at the exit side of the light sources $LS_1$, $LS_2$, and $LS_3$ in FIG. 6 or 24, and one of the incident beams having the wavelengths $\lambda_1$, $\lambda_2$, and $\lambda_3$ may be time-serially switched and emitted. In this case, some photoelectric elements in the light reception system need not be prepared in advance in units of wavelengths, but may be commonly used. In this manner, when the incident beams are time-serially output in units of wavelength components, the high-speed shutter mechanism must be arranged in the apparatus. However, the number of photoelectric elements and the number of parts of the signal processing circuit (particularly, the number of A/D converters and the number of memory chips) can be greatly reduced. In addition, the wavelength selection filter 24 in the stage WST shown in FIG. 33 can be omitted.

Figure 37:
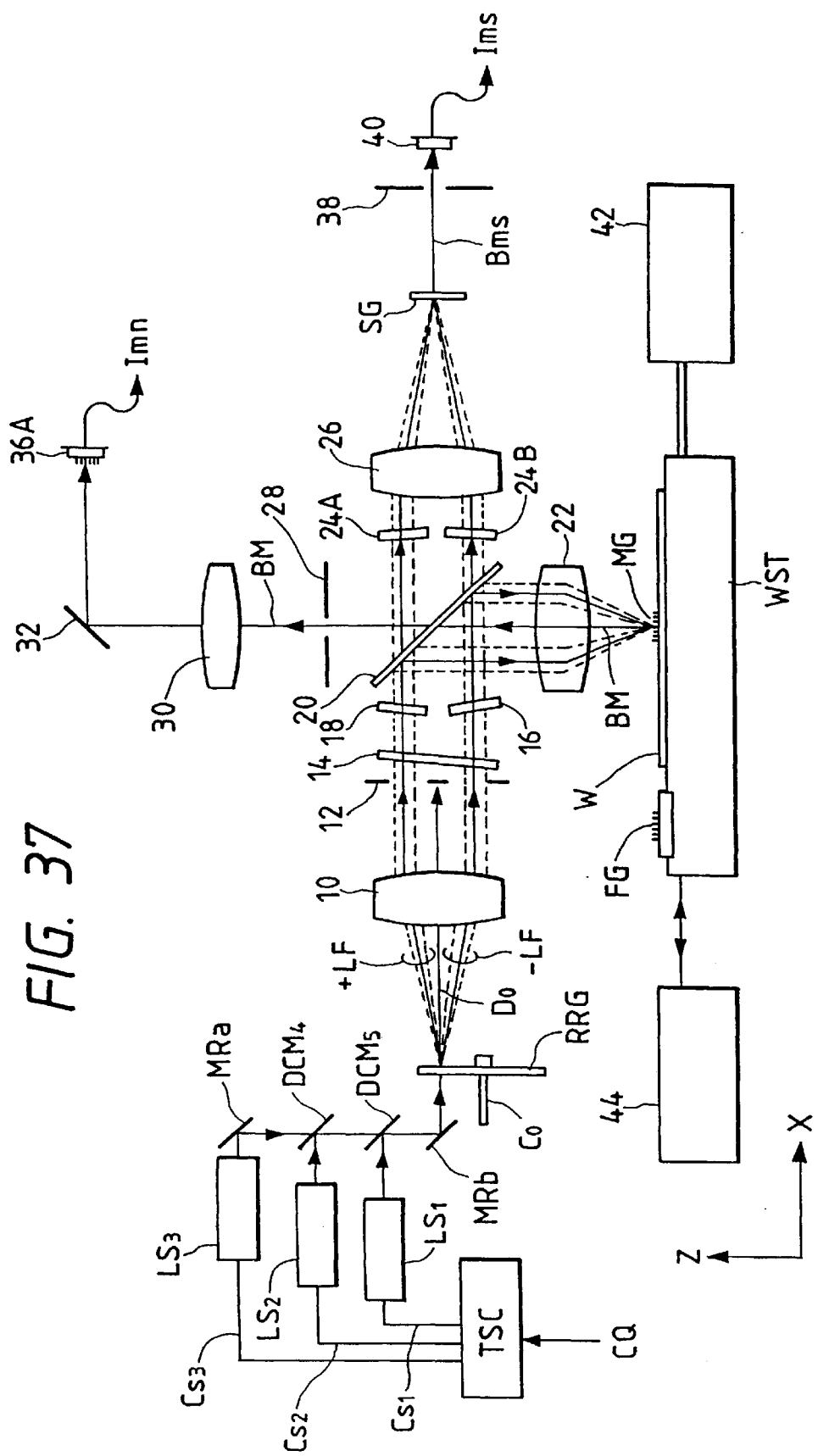
FIG. 37 is a view showing the arrangement of a position detection apparatus according to the 15th embodiment of the present invention.

Time-serial switching of incident beams in units of wavelength components will be described as the 15th embodiment with reference to FIG. 37. The arrangement in FIG. 37 is based on the arrangement in FIG. 6. The same reference numerals as in FIG. 6 denote the same or similar parts in FIG. 37.

Referring to FIG. 37, three laser light sources $LS_1$, $LS_2$, and $LS_3$ generate laser beams $LB_1$, $LB_2$, and $LB_3$ having different wavelengths $\lambda_1$, $\lambda_2$, and $\lambda_3$, respectively. For example, the laser light source $LS_1$ is a semiconductor laser light source of $\lambda_1=0.635$ $\mu$m, the light source $LS_2$ is a semiconductor laser light source of $\lambda_2=0.690$ $\mu$m, and the light source $LS_3$ is a semiconductor laser light source of $\lambda_3=0.760$ $\mu$m.

Laser power supply units each including a drive circuit for supplying a stabilized drive current, a compensation circuit for compensating for the influence caused by a change in temperature of a laser element, or a feedback control circuit for monitoring a variation in oscillation center frequency and controlling to feed back a drive current so as to stabilize the wavelength are arranged for the laser light sources $LS_1$, $LS_2$, and $LS_3$, respectively. These laser power supply units control to start or stop emitting laser beams from the laser light sources $LS_1$, $LS_2$, and $LS_3$ in response to sequential signals $C_{s1}$, $C_{s2}$, and $C_{s3}$ from a switching control circuit TSC.

In this embodiment, the switching control circuit TSC can be programmed in response to a command signal CQ from a controller 62 in FIG. 38 (to be described later) such that the laser beams emitted from the laser light sources $LS_1$, $LS_2$, and $LS_3$ can be sequentially switched for every predetermined irradiation time. For this reason, the number of light sources which currently emit laser beams at arbitrary time is limited to one of the three laser light sources $LS_1$, $LS_2$, and $LS_3$. Note that the switching control circuit TSC can change several beam oscillation timings of the light sources $LS_1$, $LS_2$, and $LS_3$ in accordance with the contents of the command signal CQ.

These three laser beams $LB_1$, $LB_2$, and $LB_3$ are aligned so as to pass through the coaxial optical path through dichroic mirrors $DCM_4$ and $DCM_5$. One of the three beams is reflected as a beam $LB_0$ by a mirror $M_{Rb}$ and vertically incident on a rotary radial grating plate RRG. This rotary grating plate RRG serves as a frequency shifter for changing the frequency of each diffracted light component of each order in accordance with an angular velocity in the same manner as in FIG. 7.

First-order diffracted beams $\pm D_{11}$ generated upon irradiation of the beam $LB_1$ having the wavelength $\lambda_1$, 1st-order diffracted beams $\pm D_{12}$ generated upon irradiation of the beam $LB_2$ having the wavelength $\lambda_2$, or 1st-order diffracted beams $\pm D_{13}$ generated upon irradiation of the beam $LB_3$ having the wavelength $\lambda_3$ are generated from the grating RG of the rotary grating plate RRG. A diffraction angle of the 1st-order diffracted beam for each wavelength is represented as follows:

$$\sin \theta_n = \lambda_n / Prg$$

where n is the number of wavelengths, and Prg is the pitch of the grating RG.

The 1st-order diffracted beams $\pm D_{1n}$ are subjected to a predetermined frequency shift $\Delta f$ regardless of the wavelengths. If a velocity at which the grating RG of the grating plate RRG crosses the beam $LB_0$ is defined as V, $\Delta f = V/Prg$ is obtained. The +1st-order diffracted beam $+D_{1n}$ has a frequency higher than the frequency of the 0th-order diffracted light component $D_0$ by $\Delta f$, while the −1st-order diffracted beam $−D_{1n}$ has a frequency lower than the frequency of the 0th-order diffracted light component $D_0$ by $\Delta f$. Therefore, the rotary radial grating plate RRG serves as a frequency shifter.

Incident beams ±LF consisting of one set of the 1st-order diffracted beams $+D_{1n}$ (n=1, 2, 3) having the three wavelength components and the 0th-order diffracted light component $D_0$ are converted by a collimator lens 10 such that their principal rays are parallel to each other, as shown in FIG. 37. These beams reach a beam selection member 12 serving as a spatial filter. The beam selection member 12 shields the 0th-order diffracted light component $D_0$ and passes the incident beams ±LF derived from the 1st-order diffracted light components $\pm D_{1n}$. The incident beams ±LF then reach a beam splitter (half mirror) 20 through adjustment optical systems 14, 16, and 18 constituted by plane-parallel glass members whose inclination amounts are variable. The adjustment optical system 14 has a function of deflecting the incident beams ±LF with respect to the optical axis of the lens 10 while the distance between the incident beams +LF and −LF in the Fourier space is kept unchanged. The adjustment optical systems 16 and 18 have functions of individually adjusting the incident beams +LF and −LF with respect to the optical axis.

The incident beams ±LF are split into two pairs of beams by the beam splitter 20. One pair of beams is incident on an objective lens 22, while the other pair of beams is incident on a condenser lens (Fourier transform lens) 26 through adjustment optical systems 24A and 24B constituted by plane-parallel glass members.

The incident beams ±LF incident on the objective lens are collimated into parallel beams which are then simultaneously irradiated on the grating MG on a wafer W at symmetrical angles. Interference fringes formed by the interference of the incident beams $\pm D_{11}$ having the wavelength $\lambda_1$, interference fringes formed by the interference of the incident beams $\pm D_{12}$ having the wavelength $\lambda_2$, or interference fringes formed by the interference of the incident beams $\pm D_{13}$ having the wavelength $\lambda_3$ appear on the grating MG. If the three beams $LB_1$, $LB_2$, and $LB_3$ are simultaneously irradiated on the rotary grating plate RRG, these three interference fringes appear at the same pitch and the same phase.

The interference fringes are observed as if they are moving on the grating MG at a constant speed in one direction because of the frequency difference $2\Delta f$ between the incident beams +LF and −LF. This moving speed is proportional to the velocity V of the grating RG of the rotary radial grating plate RRG. In association with the frequency difference $2\Delta f$, the ON time of each of the light sources $LS_1$, $LS_2$, and $LS_3$ controlled by the switching control circuit TSC is much longer than the period of the frequency difference $2\Delta f$ (beat frequency) and, for example, set to be 100 times or more. For example, if the frequency difference $2\Delta f$ is 10 kHz (period: 0.1 ms), the ON time of each of the three light sources $LS_1$, $LS_2$, and $LS_3$ is preferably 10 ms or more.

As can be apparent from FIG. 37, the surface (grating MG) of the wafer W and the radial grating plate RRG are located conjugate to each other (imaging relationship) by a composite optical system of the collimator lens 10 and the objective lens 22. For this reason, the images obtained by the ±1st-order diffracted light components on the grating RG of the radial grating plate RRG are formed on the grating MG of the wafer W. The images (interference intensity distribution) ½ the pitch of the grating RG are formed because the 0th-order diffracted light component $D_0$ is shielded. A pitch Pif of the interference fringes on the wafer W is ½ the pitch Pmg of the grating MG as in the previous embodiment.

When the above relationship is satisfied, the 1st-order diffracted light components vertically emerge from the grating MG upon irradiation of the incident beams ±LF. That is, an interference beam BM (one of interference beams $B_{m1}$, $B_{m2}$, and $B_{m3}$ having the wavelengths $\lambda_1$, $\lambda_2$, and $\lambda_3$) of the 1st-order diffracted light component vertically generated upon irradiation of the incident beam +LF and the 1st-order diffracted light component vertically generated upon irradiation of the incident beam −LF is generated. This interference beam BM is a beat light component intensity-modulated with the frequency $2\Delta f$.

From the another viewpoint, to generate the ±1st-order diffracted light components (interference beam BM) in the same direction, a distance $DL_n$ between the incident beams ±LF of the respective wavelengths from the optical axis on the Fourier transform plane can be set as follows:

$$DL_n = F_0 \cdot \sin \theta_n = \pm F_0 \cdot \lambda_n / Pmg \ (n=1, 2, 3)$$

where $F_0$ is the focal length of the objective lens 22. The distance $DL_n$ for each wavelength can be adjusted by appropriately setting the pitch of the grating RG of the rotary radial grating plate RRG and the focal length of the collimator lens 10.

The interference fringes formed on the wafer W are imaged as a diffraction image of the grating RG of the radial grating plate RRG. In principle, if the pitch of the interference fringes obtained by one of the wavelength components having the three wavelengths $\lambda_1$, $\lambda_2$, and $\lambda_3$ is an integer multiple of the pitch of the grating mark MG, the pitches of the interference fringes for the remaining wavelength components have the same relationship. The interference fringes obtained in units of wavelength components perfectly match and are free from phase offsets and position offsets.

In practice, however, the interference fringes obtained in units of wavelength components are subjected to position offsets, phase offsets, and pitch offsets in accordance with the degree of chromatic aberration of the optical systems such as the objective lens 22 and the collimator lens 10. To correct these offsets, the adjustment optical systems 14, 16, and 18 as in FIG. 6 or 24 are used.

The interference beam BM vertically generated from the grating MG upon irradiation of the above interference fringes passes through the objective lens 22 and the beam splitter 20 and reaches a spatial filter 28. This spatial filter 28 is located on or near the Fourier transform plane associated with the objective lens 22. In this embodiment, the spatial filter 28 has an aperture for transmitting only the interference beam BM (±1st-order diffracted components). The interference beam BM having passed through the spatial filter 28 is converted into a parallel beam, reflected by a mirror 32, and received by a photoelectric element 36A.

The photoelectric element 36A has the same function as a photoelectric element 36A in FIG. 6 except that the interference beams $B_{m1}$, $B_{m2}$, $B_{m3}$ to be received are intensity-modulated with the beat frequency $2\Delta f$. For this reason, the photoelectric signal $I_{mn}$ output from the photoelectric element 36A has a wavelength whose level sinusoidally changes at the same frequency as the beat frequency $2\Delta f$ during the presence of the interference beam BM from the grating mark MG, i.e., during irradiation of the beam from one of the three light sources $LS_1$, $LS_2$, and $LS_3$.

On the other hand, the incident beams ±LF (one set of the 1st-order diffracted beams $\pm D_{11}$, $\pm D_{12}$, and $\pm D_{13}$) incident on the condenser lens 26 through the beam splitter 20 and the adjustment optical systems 24A and 24B constituted by the plane-parallel glass members are superposed and irradiated on a transmission reference grating SG. In this case, the reference grating SG is located conjugate to the rotary radial grating plate RRG with respect to the composite system of the collimator lens 10 and the condenser lens 26. For this reason, one-dimensional interference fringes are formed on the reference grating SG by the two-beam interference of the incident beams ±LF. These interference fringes move at a speed corresponding to the beat frequency $2\Delta f$.

Note that the adjustment optical systems 24A and 24B compensate the interference fringes generated on the reference grating SG in units of wavelength components so as not to cause position offsets and pitch offsets caused by the chromatic aberration of the condenser lens 26.

When the pitch of the reference grating SG and the pitch of the interference fringes are appropriately determined, the ±1st-order diffracted light components generated from the reference grating SG propagate as an interference beam $B_{ms}$ in the same direction, pass through a spatial filter 38, and are received by a photoelectric element 40. A photoelectric signal $I_{ms}$ from the photoelectric element 40 has the wavelength whose level sinusoidally changes at the same frequency as the beat frequency $2\Delta f$. The signal $I_{ms}$ serves as the reference signal of the heterodyne scheme.

In the above arrangement, the reference grating SG is formed such that a chromium layer is deposited on a glass plate and etched to alternately form transparent and light-shielding lines. For this reason, an almost ideal grating, i.e., a grating having symmetrical amplitude transmittances, almost free from at least asymmetry as in the grating mark MG on the wafer W and the problem posed by the resist layer is formed.

The pair of incident beams irradiated on the reference grating SG may be incident beams having one of the wavelengths $\lambda_1$, $\lambda_2$, and $\lambda_3$ so as to obtain a sufficiently high precision. In this manner, when the interference fringes having the respective wavelengths are sequentially formed on the reference grating SG, and the interference beam $B_{ms}$ generated from the reference grating SG is photoelectrically detected in a time-divisional manner in units of wavelengths. In this case, the reference signal corresponding to the wavelength $\lambda_1$, the reference signal corresponding to the wavelength $\lambda_2$, and the reference signal corresponding to the wavelength $\lambda_3$ are individually obtained, so that the position of the grating mark MG can be measured in units of wavelengths. Even if the three interference fringes formed on the wafer W in units of wavelength components have a predetermined mutual position offset (phase offset), this offset can be measured as an offset amount in advance. This will be described in detail later.

The wafer W shown in FIG. 37 is placed on a wafer stage WST two-dimensionally moved within a plane (X-Y plane) perpendicular to the optical axis of the objective lens 22. The two-dimensional movement on the stage WST is performed by a drive source 42 including a drive motor. This driving may be based on a scheme for rotating a feed screw by a motor or a scheme for directly moving the stage itself by an electromagnetic force of a linear motor. In addition, the coordinate position of the stage WST is sequentially measured by a laser interferometer 44. The measurement values of the laser interferometer 44 are used for feedback control for the drive source 42.

A fiducial (reference) mark plate FG is formed on part of the wafer stage WST. A reflection intensity grating (the pitch is equal to that of the grating MG on the wafer) having a line-and-space pattern with a chromium layer on the surface of quartz glass is formed on the mark plate FG.

For this reason, unlike the phase grating such as the grating mark MG formed by corrugations on the wafer W, the intensity grating is characterized in that no asymmetry is present and the diffraction efficiency does not depend on the wavelength of the illumination light beam (detection light beam), i.e., in that the amplitude reflectance does not have asymmetry. In addition, the reflectance of the chromium layer rarely changes in the wavelength band (generally 0.5 $\mu$m to 0.8 $\mu$m) of the position detection illumination light beam. Therefore, when the intensity grating on the reference mark plate FG is used, the changes in amplitudes of the photoelectric signals $I_{m1}$, $I_{m2}$, and $I_{m3}$ from the photoelectric element 36A which are obtained in units of wavelengths and their amplitude ratios can be accurately obtained.

In the arrangement shown in FIG. 37, semiconductor lasers are used as the light sources. In this case, it is preferable that an astigmatism removal shaping optical system (i.e., a plurality of inclined plane-parallel glass members) be arranged between each of the semiconductor lasers $LS_1$, $LS_2$, and $LS_3$ and each of the dichroic mirrors $DCM_4$ and $DCM_5$, and the diameters of the beam components of one synthesized beam $LB_0$ be equal to each other in units of wavelength components. In addition, it is preferable that a beam shaping optical system for aligning the diameters of the wavelength components of the synthesized beam $LB_0$ be arranged.

For the sake of descriptive simplicity, the rotary radial grating plate RRG is used as the frequency shifter in FIG.

37. However, two acousto-optic modulators (AOMs) as shown in reference (E) (Japanese Patent Application Laid-open No. 6-82215) may be used, or a first Zeeman laser light source for oscillating a laser beam having a center frequency $\lambda_1$ and a second Zeeman laser source for oscillating a laser beam having a center frequency $\lambda_2$ may be used as light sources. In use of a Zeeman laser, it generally oscillates two laser beams whose polarization directions are complementary, and a frequency difference of several hundreds kHz to several MHz is given between these two laser beams. The beat frequency of an interference beam to be photoelectrically detected is increased to a degree corresponding to the frequency difference. The photoelectric elements 36A and 40 must be constituted by PIN photodiodes or photomultipliers having a high responsibility.

Various dichroic mirrors shown in FIG. 37 may be replaced with dispersion elements such as prisms. In this case, one prism has the same function as the set of two dichroic mirrors $DCM_4$ and $DCM_5$.

An arrangement of a position detection/control circuit suitable for the apparatus shown in FIG. 37 will be described with reference to FIG. 38. The arrangement in FIG. 38 is based on the arrangement of the control circuit in FIG. 25. The same reference numerals as in FIG. 25 denote circuit blocks having the same functions in FIG. 38.

In the heterodyne scheme shown in FIG. 37, while the interference beam BM is generated from the grating mark MG on the wafer W or the reference mark plate FG, the signals $I_{m1}$, $I_{m2}$, and $I_{m3}$ from the photoelectric element 36A and the signal $I_{ms}$ from the photoelectric element 40 have sinusoidal AC waveforms shown in FIGS. 39A to 39D.

Figure 39A:
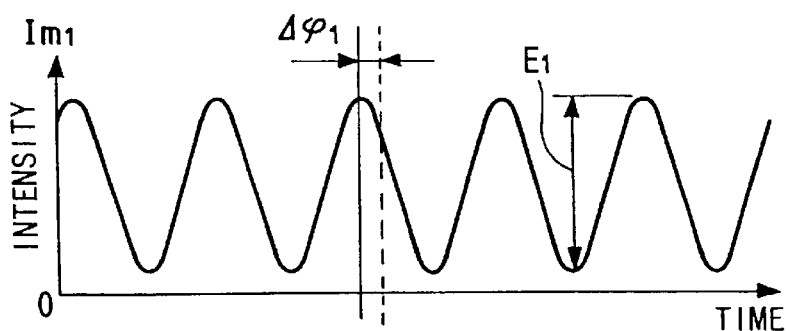
FIGS. 39A to 39D are charts showing the waveforms of signals received in a memory in the processing circuit shown in FIG. 38.
Figure 39B:
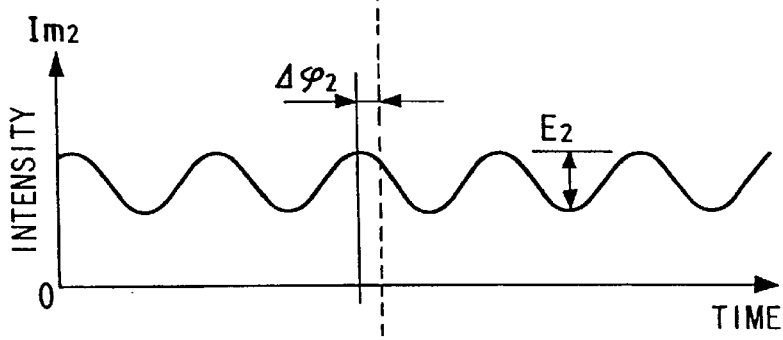
Figure 39C:
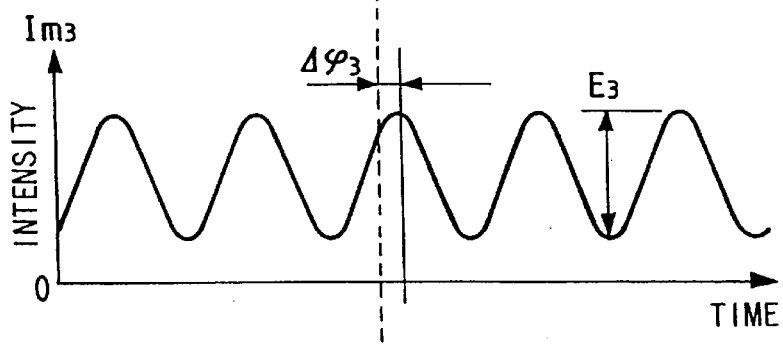

Note that the signals $I_{m1}$, $I_{m2}$, and $I_{m3}$ shown in FIGS. 39A to 39C are signals obtained when the laser light sources $LS_1$, $LS_2$, and $LS_3$ are kept on in response to the signals $C_{s1}$, $C_{s2}$, and $C_{s3}$ from the switching control circuit TSC in FIG. 37. The reference signals $I_{ms}$ are output separately (time-divisionally) in units of wavelengths in response to the ON operations of the laser light sources $LS_1$, $LS_2$, and $LS_3$. These reference signals are represented by one signal waveform in FIG. 39D.

Figure 39D:
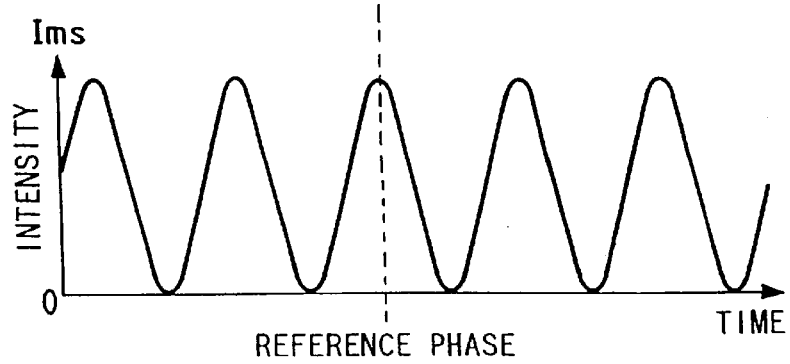

FIG. 39D shows time changes in intensity of the signal $I_{ms}$ serving as the reference signal. FIGS. 39A, 39B, and 39C show time changes in intensities of the signals $I_{m1}$, $I_{m2}$, and $I_{m3}$ upon time-divisional reception of the interference beam MG from the grating mark MG on the wafer W in units of wavelengths. Assume that the phase of the signal $I_{ms}$ serves as a reference phase. In this case, the phase of the signal $I_{m1}$, is offset $-\Delta\psi_1$ with respect to the signal $I_{ms}$, the phase of the signal $I_{m2}$ is offset $-\Delta\psi_2$ with respect to the signal $I_{ms}$, and the phase of the signal $I_{m3}$ is offset $+\Delta\psi_3$ with respect to the signal $I_{ms}$. The amplitudes (AC component peak-to-peak values) of the signals $I_{m1}$, $I_{m2}$, and $I_{m3}$ are defined as $E_1$, $E_2$, and $E_3$, respectively.

Figure 38:
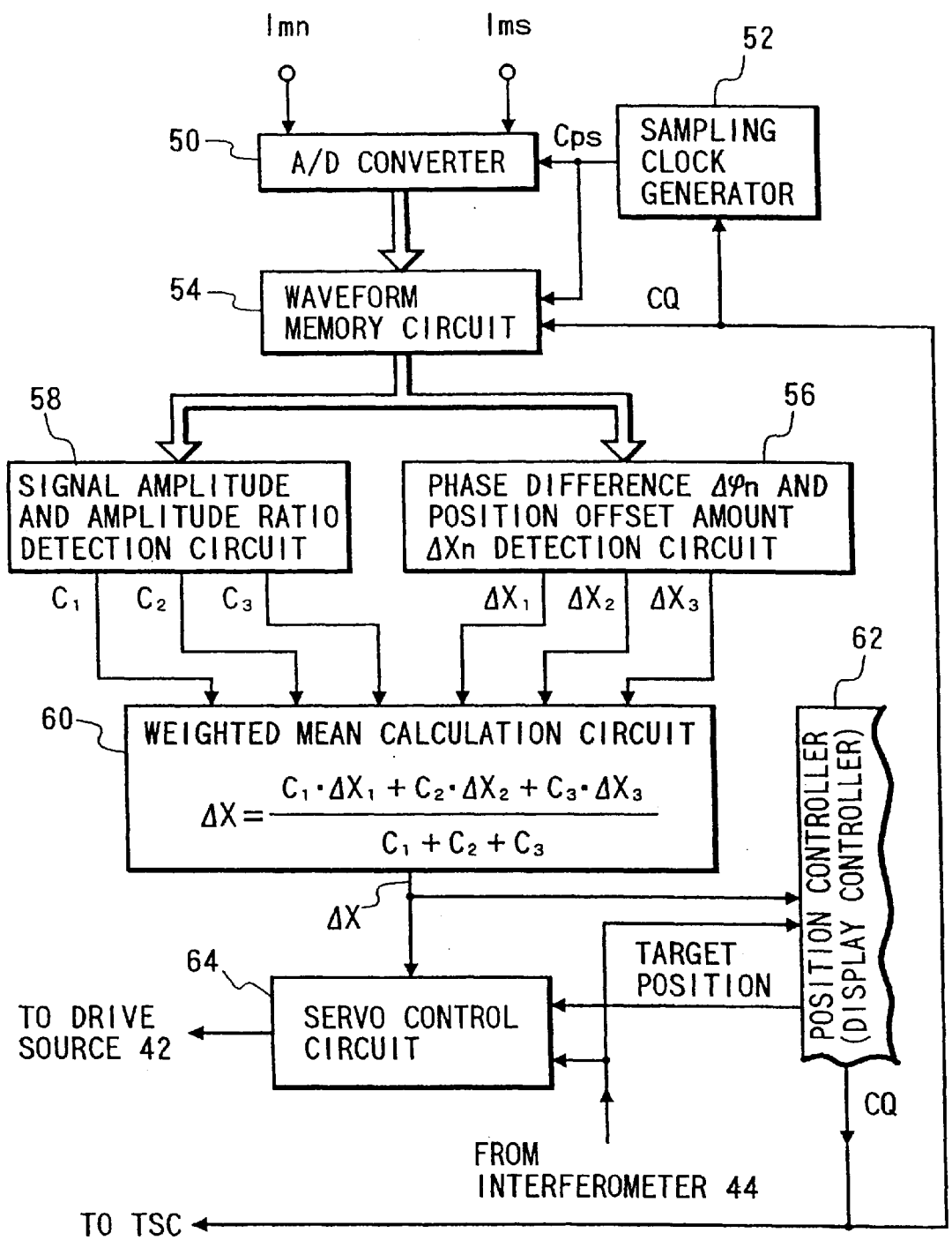
FIG. 38 is a block diagram showing a signal processing circuit applied to the apparatus shown in FIG. 37.

In the circuit blocks shown in FIG. 38, the photoelectric signal $I_{mn}$ from the photoelectric element 36A and the photoelectric signal $I_{ms}$ from the photoelectric element 40 are input to an analog-to-digital conversion (A/D converter) circuit unit 50. The instantaneous intensity level of each signal is converted into a digital signal in response to the clock signal (pulse) $C_{ps}$ from a sampling clock generator 52.

The clock generator 52 controls the output timing of the clock signal $C_{ps}$ in response to the command signal CQ transmitted from a position controller 62 (to be described later) to the switching control circuit TSC in FIG. 37. This timing is determined such that the clock signal $C_{ps}$ is always output during the ON state of any of the three light sources $LS_n$ (n=1, 2, 3) in response to a signal $C_{sn}$ (n=1, 2, 3) from the switching control circuit TSC.

The frequency of the clock signal $C_{ps}$ is determined to be much higher than the beat frequency ($2\Delta f$) of the signals $I_{mn}$ (n=1, 2, 3) and $I_{ms}$. The clock signal $C_{ps}$ is also sent to a waveform memory circuit unit 54 and is used to update the memory address in storing the digital values (data) from the A/D converter 50.

At this time, the memory circuit unit 54 switches the storage area (address area) of each digital waveform data of the photoelectric signals $I_{mn}$ and $I_{ms}$ in response to the command signal CQ in correspondence with the ON light source. For example, six 8-kbyte RAM areas M1A, M1B, M2A, M2B, M3A, and M3B are assured as the waveform data storage space in the memory circuit unit 54. The digital waveform data of the signal $I_{mn}$ ($I_{m1}$) output from the A/D converter 50 during the ON state of the light source $LS_1$ having the wavelength $\lambda_1$ is sequentially stored in the RAM area M1A in response to the clock signal $C_{ps}$. At the same time, the digital waveform data of the signal $I_{ms}$ output from the A/D converter 50 is sequentially stored in the RAM area M1B.

While the light source $LS_2$ is kept on in response to the command signal CQ, the digital waveform data of the signal $I_{mn}$ ($I_{m2}$) is sequentially stored in the RAM area M2A. At the same time, the digital waveform data of the signal $I_{ms}$ is sequentially stored in the RAM area M2B. When the light source $LS_3$ is kept on, the digital waveform data of the signal $I_{mn}$ ($I_{m3}$) is sequentially stored in the RAM area M3A. At the same time, the digital waveform data of the signal $I_{ms}$ is sequentially stored in the RAM area M3B. In this manner, the RAM areas are switched.

In the three RAM areas MnA (n=1, 2, 3) in the memory circuit unit 54, the waveform data of the signals $I_{mn}$ (n=1, 2, 3) shown in FIGS. 39A, 39B, and 39C are digitally sampled for predetermined periods (e.g., 10 periods or more). In the three RAM areas MnB (n=1, 2, 3) in the memory circuit unit 54, the waveform data of the signals $I_{ms}$ shown in FIG. 39D are digitally sampled for the same predetermined periods as those of the signals $I_{mn}$.

At this time, the waveform data of the three measurement signals Imn in the waveform memory circuit unit 54 have different timings along the time axis. Each of the three measurement signals $I_{mn}$ and the corresponding reference signal $I_{ms}$ are simultaneously sampled. When phase differences $\Delta\psi_1$, $\Delta\psi_2$, and $\Delta\psi_3$ of the waveform data of the three measurement signals $I_{mn}$ with reference to the waveform data of the reference signals $I_{ms}$, the position offset amounts of the grating mark MG at the wavelengths $\lambda_1$, $\lambda_2$, and $\lambda_3$ can be accurately obtained.

Note that when the rotary radial grating plate RRG is used, the clock signal $C_{ps}$ has a frequency of about ten several kHz because the several kHz are the upper limit of the beat frequency. As in reference (E) (Japanese Patent Application Laid-open No. 6-82215), when the frequency shifter constituted by the two AOMs arranged in tandem with each other is used, the beat frequency is determined by twice the difference between the frequencies of the high-frequency modulation signals applied to the respective AOMs and can be relatively freely determined.

The waveform data in the memory circuit unit 54 shown in FIG. 38 are input to a phase difference $\Delta\psi_n$, (n=1, 2, 3) and phase offset $\Delta X_n$ (n=1, 2, 3) detection circuit unit 56. The phase differences $\Delta\psi_1$, $\Delta\psi_2$, and $\Delta\psi_3$ shown in FIGS. 39A, 39B, and 39C are calculated by digital arithmetic operations (Fourier integration). As previously assumed, if the pitch Pmg of the grating mark MG of the wafer W and the pitch Pif of the interference fringes irradiated thereon satisfy condition Pmg=2Pif, one period of each of the waveforms shown in FIGS. 39A to 39C corresponds to Pmg/2.

Phase difference measurement is performed within the range of ±180°. The detection circuit 56 converts the calculated phase differences $\Delta\psi_1$, $\Delta\psi_2$, and $\Delta\psi_3$ into position offset amounts $\Delta X_1$, $\Delta X_2$, and $\Delta X_3$ within the range of ±Pmg/4 in accordance with equation (7). These offset amounts $\Delta X_n$ represent offsets of the grating mark MG within the range of ±Pmg/4 with respect to the reference grating SG.

Assuming that the resolution of the phase difference measurement is given as about 0.2°, the resolution of the offset amount is about (0.2/180)Pmg/4. If the pitch Pmg is set to be 4 μm, a practical range of 0.002 μm (2 nm) is obtained.

On the other hand, a signal amplitude and amplitude ratio detection circuit unit 58 reads out the waveform data (FIGS. 39A to 39C) stored in the three RAM areas MnA (n=1, 2, 3) in the waveform memory circuit unit 54 and detects amplitude values $E_1$, $E_2$, and $E_3$ of the respective signals Imn by digital arithmetic operations.

The detection unit 58 prestores amplitude values $A_1$, $A_2$, and $A_3$ of the photoelectric signals $I_{m1}$, $I_{m2}$, and $I_{m3}$ obtained when the interference beam BM generated from the fiducial mark plate FG is received by the photoelectric element 36A in advance.

The grating mark of the fiducial mark plate FG is moved below the objective lens 22 prior to measurement of the grating mark on the wafer W, and signals shown in FIGS. 39A, 39B, and 39C are generated by the photoelectric element 36A and stored in the waveform memory circuit unit 54. The amplitude detection circuit 58 then detects the amplitude values $A_1$, $A_2$, and $A_3$ and stores them.

At this time, the stop position of the stage WST which corresponds to detection of the mark plate FG is read by the laser interferometer 44, and position offset amounts $\Delta X_{b1}$, $\Delta X_{b2}$, and $\Delta X_{b3}$ of the respective wavelengths are obtained by the offset amount detection circuit unit 56. These values can be utilized as data for determining a baseline.

The baseline here means a small mutual error component when the position offset amounts $\Delta X_{b1}$, $\Delta X_{b2}$, and $\Delta X_{b3}$ of the grating mark on the mark plate FG, which are measured in units of wavelengths, are slightly different from each other. When the interference fringes of the respective wavelengths which are formed by the beams of the wavelengths $\lambda_1$, $\lambda_2$, and $\lambda_3$ on the fiducial mark plate FG strictly match each other in the incident system shown in FIG. 37, the values of the position offset amounts $\Delta X_{b1}$, $\Delta X_{b2}$, and $\Delta X_{b3}$ on the mark plate FG are perfectly equal to each other.

As a practical problem, however, when the resolution is about 2 nm, it is difficult to adjust the incident system and the detection system so as to match the position offset amounts $\Delta X_{b1}$, $\Delta X_{b2}$, and $\Delta X_{b3}$ in accordance with the degree of resolution. For this reason, the mutual differences between the position offset amounts $\Delta X_{b1}$, $\Delta X_{b2}$, and $\Delta X_{b3}$ measured by the mark plate FG are left as offsets (baseline errors) unique to the alignment system shown in FIG. 37.

The baseline errors are determined by detecting the grating mark MG on the wafer W and causing the position offset amounts $\Delta X_1$, $\Delta X_2$, and $\Delta X_3$ of the respective wavelengths obtained by the detection circuit 56 by the position offset amounts $\Delta X_{b1}$, $\Delta X_{b2}$, and $\Delta X_{b3}$ previously determined. As an example, since the interference beam $B_{ms}$ obtained from the reference grating SG in the apparatus shown in FIG. 37 is switched to one of the wavelengths $\lambda_1$, $\lambda_2$, and $\lambda_3$. For this reason, the values of $\Delta X_{b2}-\Delta X_{b1}=\Delta X_{b21}$ and $\Delta X_{b3}-\Delta X_{b1}=\Delta X_{b31}$ are calculated and stored with reference to, e.g., the position offset amount $\Delta X_{b1}$ of the fiducial mark plate FG, which is measured at any one wavelength, e.g., the wavelength $\lambda_1$.

The value of the amount $\Delta X_2$ is corrected and calculated so as to obtain $\Delta\lambda_2-\Delta X_1=\Delta X_{b21}$ with respect to the position offset amounts $\Delta X_1$, $\Delta X_2$, and $\Delta X_3$ measured for the grating mark MG on the wafer W. Subsequently, the amount $\Delta X_3$ is corrected and calculated so as to obtain $\Delta X_3-\Delta X_1=\Delta X_{b31}$.

Alternatively, as a simpler method, the position offset amounts $\Delta X_{b1}$, $\Delta X_{b2}$, and $\Delta X_{b3}$ of the fiducial mark plate FG which are obtained upon switching between the wavelengths of the interference beam $B_{ms}$ may be stored, and the measured position offset amounts $\Delta X_1$, $\Delta X_2$, and $\Delta X_3$ of the grating mark MG on the wafer may be corrected as $\Delta X_1 - \Delta X_{b1}$, $\Delta X_2 - \Delta X_{b2}$, and $\Delta X_3 - \Delta X_{b3}$.

The amplitude ratio detection circuit unit 58 calculate ratios $C_1$, $C_2$, and $C_3$ of the amplitude values $E_1$, $E_2$, and $E_3$ obtained upon detection of the grating mark MG on the wafer W to the prestored amplitude values $A_1$, $A_2$, and $A_3$ as $C_1=E_1/A_1$, $C_2=E_2/A_2$, and $C_3=E_3/A_3$. The ratios $C_1$, $C_2$, and $C_3$ correspond to the weighting factors described with reference to the embodiment shown in FIG. 25.

The calculated position offset amounts $\Delta X_1$, $\Delta X_2$, and $\Delta X_3$ and the ratios $C_1$, $C_2$, and $C_3$ are supplied to a weighted mean calculation circuit unit 60, thereby calculating the weighted offset amount $\Delta X$ of the grating mark MG as follows:

$$\Delta X=(C_1 \cdot \Delta X_1+C_2 \cdot \Delta X_2+C_3 \cdot \Delta X_3)/(C_1+C_2+C_3)$$

The resultant offset amount $\Delta X$ is an offset of the grating mark MG with respect to the reference grating SG in the pitch direction. This data is supplied to the position controller (display controller) 62 and to a servo control circuit unit 64 when the wafer W is aligned (positioned) in real time.

This servo control circuit unit 64 has two functions. One function is to perform feedback control for the drive source 42 until the offset amount $\Delta X$ reaches a predetermined value (direct servo mode). To perform this function, the A/D converter 50, the memory circuit unit 54, the offset amount detection circuit unit 56, and the circuit unit 60 are repeatedly operated to calculate the offset amount $\Delta X$ every very short period of time (e.g, several msec.). Note that the calculations of the ratios $C_1$, $C_2$, and $C_3$ may be calculated once by the amplitude ratio detection circuit unit 58, or may be calculated every time the offset amount $\Delta X$ is calculated. When the ratios $C_1$, $C_2$, and $C_3$ are calculated every time, the values of the ratios $C_1$, $C_2$, and $C_3$ slightly change every time the circuit unit 60 calculates the offset amount $\Delta X$, as a matter of course. When the ratios $C_1$, $C_2$, and $C_3$ are to be calculated once or a plurality of the number of times, the calculated ratio values are used during subsequent detection of the same grating mark MG.

The other function of the servo control circuit unit 64 is a function of moving the wafer stage WST on the basis of a measurement value from the laser interferometer 44 (interferometer servo mode). This function is used to position the grating of the fiducial mark plate FG on the stage WST or the grating mark MG on the wafer W immediately below the objective lens 22, or positioning an arbitrary point on the wafer W immediately below the objective lens 22 with reference to the detected position of the grating mark MG.

In addition to the servo mode switching instruction, the position controller 62 also has a function of displaying the coordinate position of the grating mark MG and the calculated offset amount $\Delta X$. In some case, the position controller (display controller) 62 stores and holds the ratios $C_1$, $C_2$, and $C_3$ serving as the weighting factors upon detection of the grating mark MG. Assume that a large number of identical grating marks MG are formed on the wafer W, and that the positions of these marks MG are to be sequentially detected. In this case, when the ratios $C_1$, $C_2$, and $C_3$ are sequentially stored, a specific mark MG on the wafer W which causes asymmetry and nonuniformity of the resist layer can be checked.

Portions on the wafer W where the weighting factor (ratios $C_1$, $C_2$, and $C_3$) greatly change may be graphically displayed. At this time, when the changes in weighting factors are obtained by mounting a wafer prior to coating of the resist layer after the chemical process such as diffusion and etching in the apparatus of FIG. 37, the influences of the chemical process on the wafer surface can also be indirectly checked. In addition, when the resist layer is formed on the wafer to measure changes in weighting factors, and these changes are compared with the changes in weighting factors prior to coating of the resist layer, the influence of the resist layer can also be indirectly checked.

In the 15th embodiment, the fiducial mark plate FG is placed on the stage WST and used to obtain the rates of changes in signal amplitudes of the respective wavelengths, i.e., the ratios $C_1$, $C_2$, and $C_3$. Therefore, as shown in FIG. 21, photoelectric elements for directly detecting the intensities of the beams Bri and $B_{r2}$ of the incident beams $LB_1$ and $LB_2$ need not be arranged.

As previously described, when the fiducial mark plate FG having the chromium surface having a known reflectance is fixed on the wafer stage WST, this is used for measurements of various baseline amounts of the mark plate FG and the focus states. Therefore, the position detection apparatus according to the 15th embodiment shown in FIG. 37 can equally be applied to, a projection exposure apparatus which requires baseline amount measurement as shown in FIGS. 15 and 16.

When the position detection apparatus of the heterodyne scheme shown in FIG. 37 is to be incorporated in an alignment system TTLA shown in FIG. 16, when the incident beams ±LF are switched between a plurality of wavelength components (these components are separated from each other by about 30 nm to 40 nm), the crossing region of the beams ±LF irradiated on the wafer is shifted in the Z direction or the X and Y directions due to the influence of the chromatic aberration (on-axial factor and magnification factor) or the influence of the chromatic aberration of an objective lens OBJ.

A correction optical system CG for correcting the errors generated in accordance with the chromatic aberrations is arranged in the optical path of the incident beams ±LF, as shown in FIGS. 17A and 17B.

Figure 40:
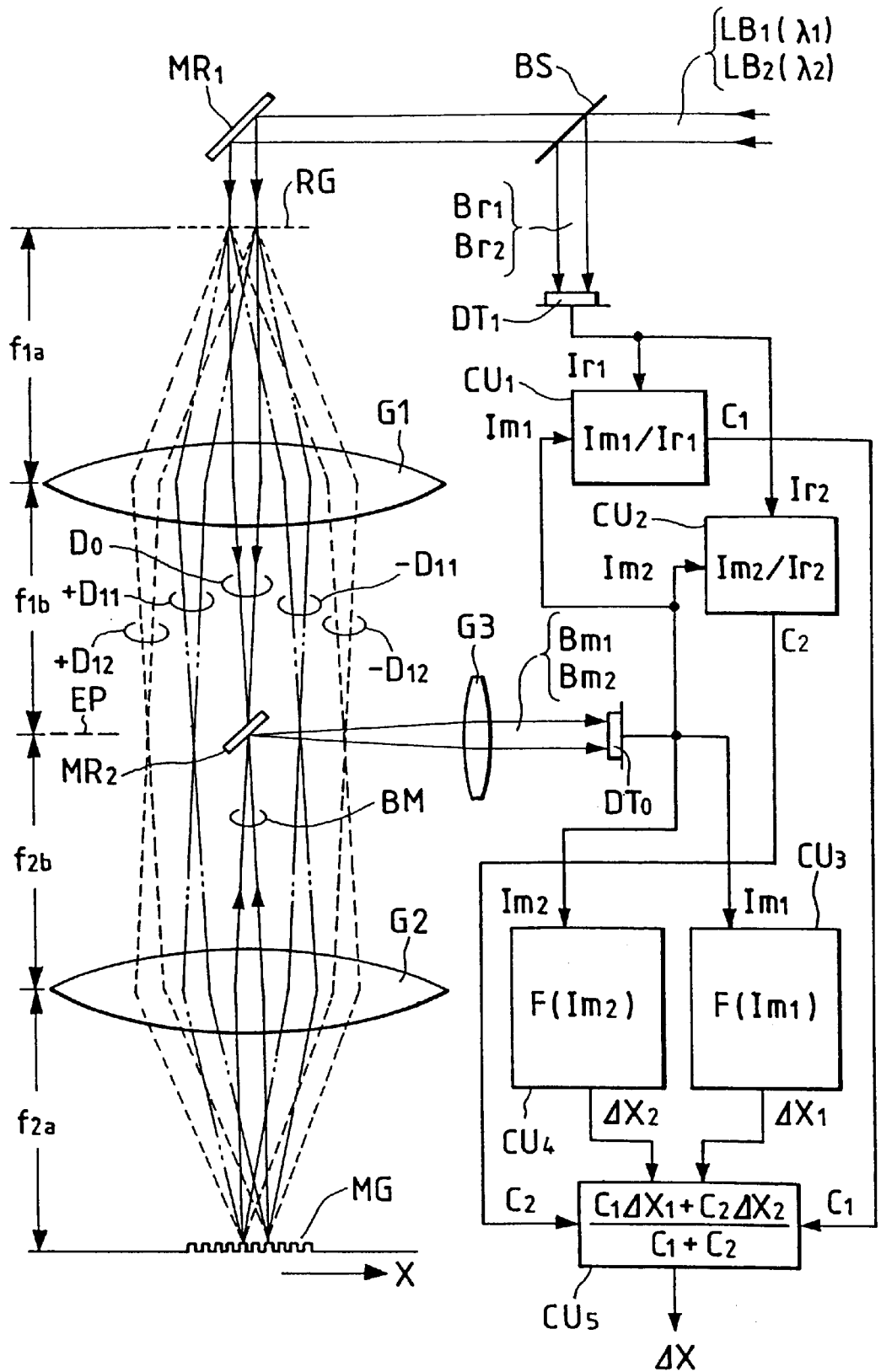
FIG. 40 is a view showing the arrangement of a position detection apparatus according to the 16th embodiment of the present invention.

FIG. 40 shows the arrangement of a position detection apparatus according to the 16th embodiment of the present invention to time-divisionally switch the illumination beams. The basic arrangement of the 16th embodiment is similar to that in FIG. 21. The same reference numerals as in FIG. 21 denote the members having the same functions in FIG. 40. In this case, a relative position offset amount between two diffraction grating marks RG and MG in the pitch direction (X direction) is measured by the homodyne scheme. Beams $LB_1$ and $LB_2$ as the illumination light beams having different wavelengths $\lambda_1$ and $\lambda_2$ synthesized coaxially as a parallel beam, and vertically irradiated on the grating mark RG through a beam splitter BS and a mirror MR1.

The beam splitter BS divides the amplitudes of some beams (about several %) $B_{r1}$ and $B_{r2}$ of the beams $LB_1$ and $LB_2$ and guides them to a photoelectric element $DT_1$. When the photoelectric element $DT_1$ receive the beam $B_{r1}$ of the wavelength $\lambda_1$ upon irradiation of the main illumination beams $LB_1$ and $LB_2$, the photoelectric element $DT_1$ outputs a photoelectric signal $I_{r1}$ representing its intensity value. When the photoelectric element $DT_1$ receives the beam $B_{r2}$ of the wavelength $\lambda_2$ upon irradiation of the main illumination beam $LB_2$, the photoelectric detector $DT_1$ outputs a photoelectric signal $I_{r2}$ representing its intensity value. A plurality of diffracted light components are generated from the grating RG as in FIG. 21 upon irradiation of the beams $LB_1$ and $LB_2$ (parallel light beams).

FIG. 40 illustrates 1st-order diffracted beams $+D_{11}$ and $-D_{11}$ generated from the beam $LB_1$ having the wavelength $\lambda_1$, 1st-order diffracted beams $+D_{12}$ and $-D_{12}$ generated from the beam $LB_2$ having the wavelength $\lambda_2$, and a 0th-order diffracted beam $D_0$. Diffracted light components of higher order can be generated for the beams $LB_1$ and $LB_2$ of the respective wavelengths. For the sake of descriptive simplicity, only the 1st-order diffracted beams are illustrated.

The diffracted beams are incident on an imaging optical system divided into a front-group lens system G1 and a rear-group lens system G2.

The 0th-order diffracted beam $D_0$ from the grating RG is shielded by a small mirror MR2 located at the center of a Fourier transform plane (pupil plane) EP and is prevented from being incident on the rear-group lens system G2. The 1st-order diffracted beams are parallel beams as in the beams $LB_1$ and $LB_2$ when they emerge from the grating RG, but are converged as a beam waist at the position of the Fourier transform plane EP by the behavior of the front-group lens system G1.

If the pitch of the grating RG is defined as Prg, the first-order diffracted beams $\pm D_{11}$ generated from the beam $LB_1$ having the wavelength $\lambda_1$ and the first-order diffracted beams $\pm D_{12}$ generated from the beam $-LB_2$ having the wavelength $\lambda_2$ are superposed as parallel beams, through the rear-group lens system G2, on a measurement reflection grating MG formed by corrugations on the object side. In this case, the pitch direction of the grating MG coincides with the X direction. One-dimensional interference fringes (the pitch direction is the X direction) of the wavelength $\lambda_1$ by two-beam interference of the 1st-order diffracted beams $\pm D_{11}$ or one-dimensional interference fringes (the pitch direction is the X direction) of the wavelength $\lambda_2$ by two-beam interference of the 1st-order diffracted beams $\pm D_{12}$ are formed on the grating MG.

Since the wavelengths $\lambda_1$ and $\lambda_2$ are different from each other, the ±1st-order diffracted beams $\pm D_{11}$ do not interfere with the ±1st-order diffracted beams $\pm D_{12}$ even upon simultaneous irradiation of the two main illumination beams $LB_1$ and $LB_2$. It is important that the interference fringes having the wavelengths $\lambda_1$ and $\lambda_2$ generated by the 1st-order diffracted beams $\pm D_{11}$ and $\pm D_{12}$ appear as one set of interference fringes having the same intensity distribution pitch.

An intensity distribution pitch Pif of the interference fringes is determined by a pitch Prg of the grating mark RG and a magnification factor M of the imaging optical system (G1 and G2) and is defined as Pif=M·Prg/2. For example, when the pitch Prg is set to be 4 $\mu$m, and the magnification factor M is ¼ (the pattern size of the grating RG is reduced into ¼ on the grating mark MG side), the pitch Pif of the interference fringes becomes 0.5 $\mu$m. If the pitch Pmg of the grating MG to be measured is given as Pmg=2Pif, i.e., Pmg=M·Prg, then rediffracted light components having the 1st-order diffracted beams $\pm D_{11}$ as the incident light beams are generated.

For example, one rediffracted light component generated by the grating mark MG upon irradiation of the 1st-order diffracted beam $+D_{11}$ as the incident beam is the $-1$st-order diffracted light component (wavelength $\lambda_1$) vertically propagating from the grating mark MG. One rediffracted light component generated from the grating mark MG upon irradiation of the 1st-order diffracted beam $-D_{11}$ as the incident beam is the $+1$st-order diffracted light component (wavelength $\lambda_1$) vertically propagating from the grating mark MG. The $\pm 1$st-order diffracted light components of the wavelength $\lambda_1$ vertically propagating from the grating mark MG have an interference intensity corresponding to the mutual phase states, serve as an interference beam BM ($B_{m1}$), and reach the mirror MR2.

Similarly, rediffracted light components are generated from the grating mark MG upon irradiation of the 1st-order diffracted beams $\pm D_{12}$ as the incident beams. The $-1$st-order diffracted light component (wavelength $\lambda_2$) generated from the grating mark MG upon irradiation of the 1st-order diffracted beam $+D_{12}$ propagates in a direction perpendicular to the grating mark. The $+1$st-order diffracted light component (wavelength $\lambda_2$) generated from the grating mark MG upon irradiation of the 1st-order diffracted beam $-D_{12}$ propagates in a direction perpendicular to the grating MG. The $\pm 1$st-order diffracted light components of the wavelength $\lambda_2$ propagating in the direction perpendicular to the grating mark MG also have an interference intensity corresponding to the mutual phase states, serve as an interference beam MB ($B_{m2}$), and reach the mirror MR2. That is, the interference beam BM becomes the interference beam $B_{m1}$ of the wavelength $\lambda_1$ or the interference beam $B_{m2}$ of the wavelength $\lambda_2$ in response to switching between the main illumination beams $LB_1$ and $LB_2$. The interference beam BM is reflected by the mirror MR2 and reaches the photoelectric element $DT_0$ through a lens system G3 constituting a photoelectric detection system.

The photoelectric element $DT_0$ outputs, to circuit units $CU_1$ and $CU_3$, the photoelectric signal output during irradiation of the main illumination beam $LB_1$ as the photoelectric signal $I_{m1}$ having a level corresponding to the intensity of the interference beam $B_{m1}$. The photoelectric element $DT_0$ outputs, to circuit units $CU_2$ and $CU_4$, the photoelectric signal output during irradiation of the main illumination beam $LB_2$ as the photoelectric signal $I_{m2}$ having a level corresponding to the intensity of the interference beam $B_{m2}$.

Note that, for the sake of descriptive convenience for explaining the functions of the signal processing circuit, the circuit units $CU_1$ and $CU_2$ are separately, illustrated and the circuit units $CU_3$ and $CU_4$ are separately illustrated. However, in the practical circuit arrangement, since the main illumination beams $LB_1$ and $LB_2$ are time-divisionally switched, one of the circuit units $CU_1$ and $CU_2$ and one of the circuit units $CU_3$ and $CU_4$ may be required.

The circuit unit $CU_1$ obtains the ratio $C_1$ of the amplitude value of the photoelectric signal $I_{m1}$ to the signal $I_{r1}$ from the photoelectric element $DT_1$ in accordance with the arithmetic operation of $I_{m1}/I_{r1}$. The circuit unit $CU_2$ obtains the ratio $C_2$ of the amplitude value of the photoelectric signal $I_{m2}$ to the signal $I_{r2}$ from the photoelectric element $DT_2$ in accordance with the arithmetic operation of $I_{m2}/I_{r2}$. These ratios $C_1$ and $C_2$ are output to the circuit unit $CU_5$ for calculating the weighted mean as in FIG. 21.

Since the homodyne scheme is employed in this embodiment, the intensities of the interference beams $B_{m1}$ and $B_{m2}$ change in accordance with relative changes in positions of the gratings RG and MG in the X direction. If the gratings RG and MG are kept stopped, the levels of the signals $I_{m1}$ and $I_{m2}$ keep predetermined values. The interference fringes generated by the grating RG on the grating MG and the grating MG are relatively scanned a predetermined amount (pitch Pif or more of the interference fringes) in the X direction, the peak and bottom values in the sinusoidal level changes of, the signals $I_{m1}$ and $I_{m2}$ during relative scanning are sampled, and difference values are used as amplitude values in the arithmetic operations of the circuit units $CU_1$ and $CU_2$.

The level change of the signal $I_{m1}$ (this also applies to the signal $I_{m2}$) which corresponds to the change in positional relationship between the interference fringes and the grating MG is the same as described with reference to FIGS. 22A to 22D, and a detailed description thereof will be omitted.

The circuit units $CU_3$ and $CU_4$ calculate X-direction position offset amounts $\Delta X_1$ and $\Delta X_2$ between the interference fringes and the grating MG on the basis of the amplitude values of the signal $I_{m1}$ and $I_{m2}$ and preset functions or conversion formulas $F(I_{m1})$ and $F(I_{m2})$. The position offset values $\Delta X_1$ and $\Delta X_2$ are obtained as values falling within the range of $\pm Pmg/4$ using the peak or bottom points of the signals $I_{m1}$ and $I_{m2}$ as references (origins).

In this embodiment, the main illumination beams $LB_1$ and $LB_2$ are time-divisionally switched and irradiated, the X-direction fine movement start position of the grating mark MG (wafer) at the time of detection of a change in level of the photoelectric signal $I_{m1}$ upon irradiation of the main illumination beam $LB_1$ is set to coincide the X-direction fine movement start position of the grating mark MG (wafer) at the time of detection of a change in level of the photoelectric signal $I_{m2}$ upon irradiation of the main illumination beam $LB_2$.

In the practical apparatus arrangement, the coordinate position of the movable stage for moving the grating mark MG is sequentially measured by a measuring unit (e.g., an interferometer) having a resolution much higher than the grating pitch Pmg, and the movable stage is servo-controlled on the basis of the measurement values of the measuring unit, thereby reproducing the fine movement start position. As a more preferable arrangement, changes in levels of the photoelectric signal $I_{m1}$ and $I_{m2}$ are A/D-converted in response to the position measurement position pulses (e.g., one pulse for every 0.02-$\mu$m movement), and a waveform storage means is arranged to sequentially store the digital values of the converted levels in a waveform memory circuit (e.g., a RAM) in which the addresses correspond to the movement positions.

With the above arrangement, only when the stored waveform data is read out, the amplitude values of the signal $I_{m1}$ and $I_{m2}$ and the bottom or peak coordinate values serving as the reference points on the signal waveforms can be immediately obtained. The functions or conversion formulas $F(I_{m1})$ and $F(I_{m2})$ are sine or cosine functions because the signals $I_{m1}$ and $I_{m2}$ are sinusoidal. As an example, a radian $\psi_p$ is obtained when a level $e_1$ of the signal $I_{m1}$ at a position to be detected is defined as follows:

$$(E_{p1}+E_{b1})/2+\{(E_{p1}-E_{b1})\sin\psi_1\}/2=e_1$$

where $E_{p1}$ is the peak level of the signal $I_{m1}$, $E_{b1}$ is the bottom level of the signal $I_{m1}$. The substitution of the radian $\psi_1$ into the following conversion formula using the value of the pitch Pmg yields the offset amount $\Delta X_1$ from the reference point.

$$\Delta X_1 = Pmg \cdot \psi_1/4\pi$$

Similarly, the offset amount $\Delta X_2$ from the reference point using the signal $I_{m2}$ is calculated. The offset amounts $\Delta X_1$ and $\Delta X_2$ are supplied to the circuit unit $CU_5$ for calculating the weighted mean. The following arithmetic operation is performed using the ratios $C_1$ and $C_2$ as the weighting factors:

$$\Delta X = (C_1 \cdot X_1 + C_2 \cdot \Delta X_2)/(C_1 + C_2)$$

The offset amount $\Delta X$ obtained in the above arithmetic operation is the final position offset amount of the grating MG with respect to the grating RG.

As can be apparent from the above calculation formula, the offset amount $\Delta X$ is determined such that the measurement result of the position offset amount obtained using an interference beam having a wavelength of a higher intensity in the interference beam BM is weighted with a larger weighting factor. As described above, according to this embodiment, the beams $LB_1$ and $LB_2$ having two different wavelength components are used to irradiate the gratings RG and MG, and the respective wavelength components of the interference beam BM to be received are photoelectrically detected, and the weighted mean value is obtained in accordance with the amplitudes of the received wavelength components. Therefore, a higher-reliability position detection result can be obtained.

In the optical arrangement shown in FIG. 40, assume that the grating RG serves as a grating mark on the mask, that the grating MG serves as a mark on the wafer, and that the imaging systems G1 and G2 are projection lenses for projecting the mask pattern on the wafer. In this case, an alignment device in the projection exposure apparatus can be realized.

Figure 41:
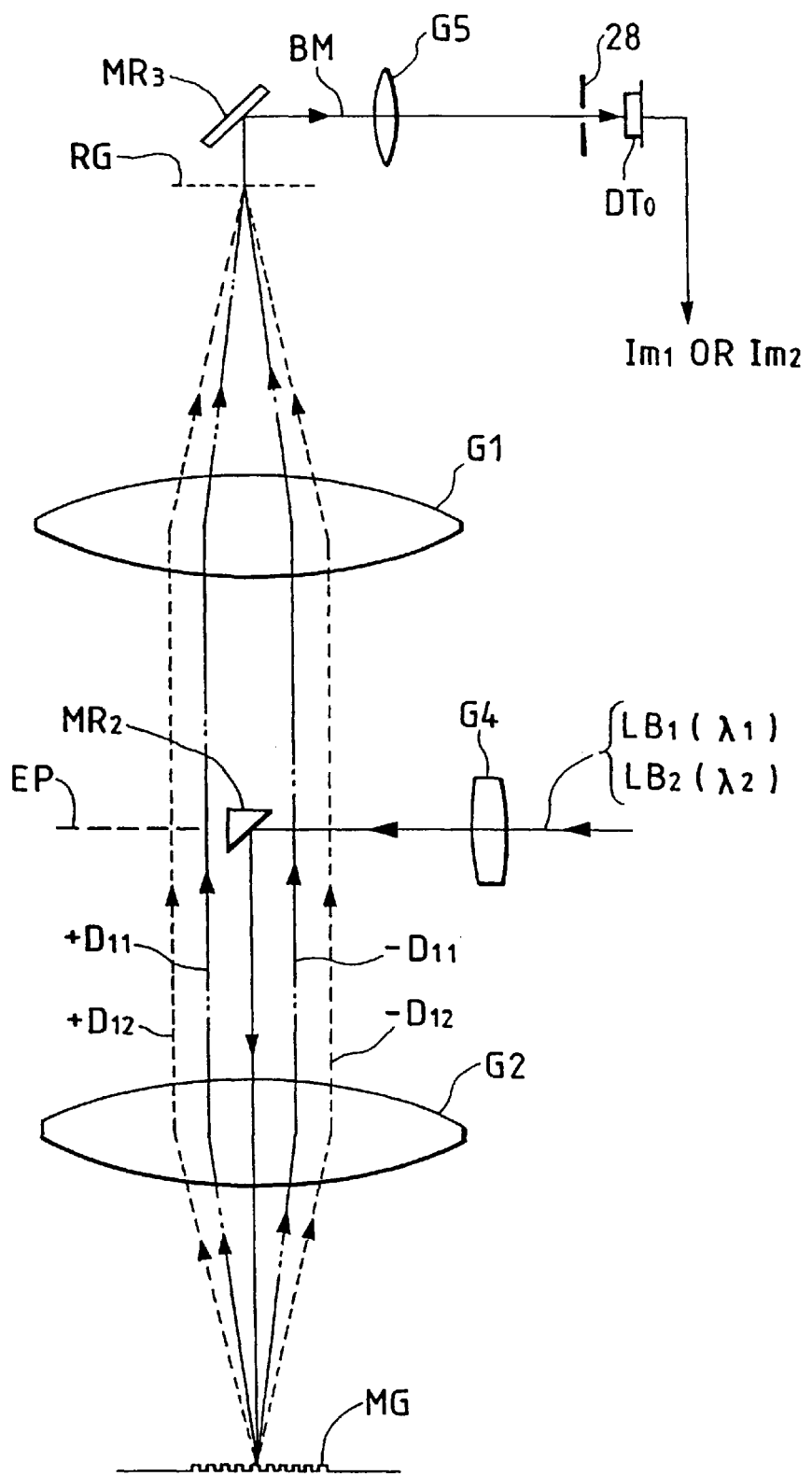
FIG. 41 is a view showing the arrangement of a position detection apparatus according to the 17th embodiment of the present invention.

FIG. 41 shows the schematic arrangement of the 17th embodiment. The basic arrangement of the 17th embodiment is the same as that of FIG. 23, and the same reference numerals as in FIG. 23 denote the same parts in FIG. 41. In the 17th embodiment, two illumination beams $LB_1$ and $LB_2$ are incident on a mirror MR2 located at the center of the pupil plane of an imaging optical system (G1 and G2) through a lens system G4. The beams $LB_1$ and $LB_2$ deflected downward by the mirror MR2 are time-divisionally switched and converted into a parallel beam through a rear-group lens system G2 and vertically irradiated on a grating MG. First-order diffracted beams $\pm D_{11}$ of a wavelength $\lambda_1$ diffracted by the grating MG or 1st-order diffracted beams $\pm D_{12}$ of a wavelength $\lambda_2$ diffracted by the grating MG cross (imaging) on the grating RG through the lens systems G1 and G2. Since the grating RG is of a transmission type, the $\pm 1$st-order diffracted light components of the rediffracted light beams from the grating RG upon irradiation of the 1st-order diffracted beams $\pm D_{11}$ or $\pm D_{12}$ propagate in a direction opposite to the imaging optical system and perpendicular to the grating RG. The 1st-order diffracted light components become an interference beam BM (one of an interference beam $B_{m1}$ having the wavelength $\lambda_1$ and an interference beam $B_{m2}$ having the wavelength $\lambda_2$) through a mirror MR3, an alignment objective lens G5, and a spatial filter 28, and the interference beam BM is incident on a photoelectric element $DT_0$. The remaining arrangement (i.e., the photoelectric element $DT_1$ and the circuit units $CU_1$, $CU_2$, $CU_3$, $CU_4$, and $CU_5$) is the same as in FIG. 40.

The photoelectric element $DT_0$ outputs one of the photoelectric signals $I_{m1}$ and $I_{m2}$ in accordance with time-divisional switching of the main illumination beams $LB_1$ and $LB_2$.

This embodiment has the relationship between beam incidence and beam reception which is opposite to that in FIG. 40. In the arrangement of this embodiment, a grating MG is formed on a semiconductor wafer, a grating RG is formed on a reticle (mask), and this arrangement can be applied the apparatus of reference (F) (Japanese Patent Application Laid-open No. 3-3224) in which lens systems G1 and G2 are reduction projection lenses for projection exposure. In the apparatus disclosed in reference (F), the small lens for slightly deflecting 1st-order diffracted beams on the pupil plane EP of the projection lens, thereby correcting the chromatic aberration generated by the projection lens. However, when the embodiment of FIG. 41 is applied, a small lens (e.g., flint glass having a large color dispersion or an aspherical lens) must be arranged to optimally correct 1st-order diffracted beams $\pm D_{11}$ and $\pm D_{12}$ having a small wavelength difference.

In the 17th embodiment, since the illumination beams $LB_1$ and $LB_2$ are directly incident on, e.g., the grating MG on the wafer, the intensities of the 1st-order diffracted beams $\pm D_{11}$ and $\pm D_{12}$ generated from the grating MG can be set higher than the diffracted beams (interference beams BM) generated from the grating MG in FIG. 40.

The 18th embodiment of the present invention will be described below. In this embodiment, using the arrangement shown in FIG. 37 as a base, an interference beam of 0th- and 2nd-order diffracted light components from a grating mark are detected in addition to the interference beam of the $\pm 1$st-order diffracted light components from the grating mark, as described above. In a system wherein the interference beam of the 0th- and 2nd-diffracted light components is photoelectrically converted by a single photoelectric element to detect a position offset of the grating mark using this photoelectric signal, when an interference beam (multi-wavelength beam) of the 0th- and 2nd-order diffracted light components upon obtaining a multi-wavelength incident beam for illuminating a grating mark is received by the single photoelectric element, it is difficult to properly detect the position offset.

The main reason for this can be easily understood, as described with reference to FIGS. 29A to 29D and 30A to 30D. The phase differences between three photoelectric signals $IK02_n$ (n=1, 2, 3) are larger than those between the photoelectric signals $I_{mn}$ (FIGS. 39A to 39C) of the interference beams of the $\pm 1$st-order diffracted light components.

For this reason, when changes in intensities of the wavelengths having the large phase differences are received by the single photoelectric element, the amplitudes (AC amplitude components) of the photoelectric signals become very small by the canceling effect of the wavelength intensities.

Figure 42:
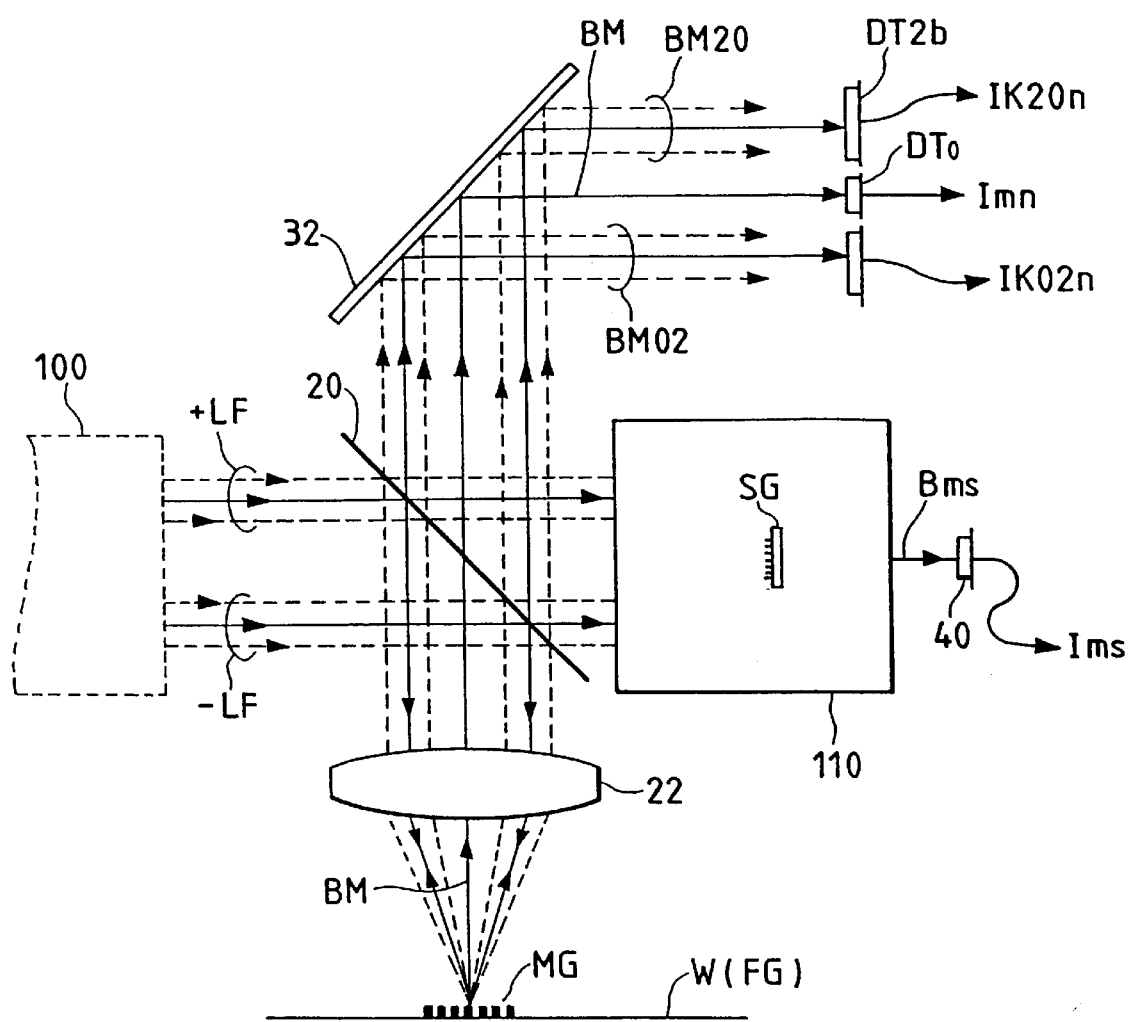
FIG. 42 is a view showing the arrangement of a position detection apparatus according to the 18th embodiment of the present invention.

The arrangement of this embodiment will be described with reference to FIG. 42. FIG. 42 shows part of the arrangement of FIG. 37 and is a modification of a photoelectric detection system for detecting various interference beams from a grating mark MG. The same reference numerals as in FIG. 37 denote the parts having the same functions in FIG. 42. Referring to FIG. 42, an incident system 100 includes light sources $LS_1$, $LS_2$, and $LS_3$, a mirror MR, dichroic mirror $DCM_4$ and $DCM_5$, a radial grating plate RRG serving as a frequency shifter, a lens 10, a spatial filter 12, and adjustment optical systems 14, 16, and 18. The incident system 100 emits a pair of incident beams +LF and −LF.

The incident beams $\pm LF$ sequentially switched to one of the wavelengths $\lambda_1$, $\lambda_2$, and $\lambda_3$ are partially reflected by a half mirror 20 and incident on an objective lens 22. The remaining part of the beams is incident on a reference light reception system 110. The reference light reception system 110 comprises adjustment optical systems 24A and 24B, a lens 26, a reference grating SG, and a spatial filter 38 in FIG. 37. The reference light reception system 110 guides a reference light beam $B_{ms}$ to a photoelectric element 40. When a grating MG on a wafer W is irradiated with the incident beams ±LF through the objective lens 22, an interference beam BM of the ±1st-order diffracted light components is vertically generated from the grating MG. At the same time, interference beams BM02 and BM20 of the 0th- and 2nd-order diffracted light components are generated in a direction opposite to the traveling direction of each incident beam. The interference beam MB of the ±1st-order diffracted light components and the interference beams BM02 and BM20 of the 0th- and 2nd-diffracted light components are reflected by a mirror 32 through the objective lens 22 and the half mirror 20. The interference beam BM is received by the photoelectric element $DT_0$, and the interference beams BM02 and BM20 are received by photoelectric elements $DT_{2a}$ and $DT_{2b}$, respectively.

As previously described, in response to switching to one of the wavelength components of the incident beams ±LF, the interference beam MB becomes one of the interference beam $B_{m1}$ having the wavelength $\lambda_1$, the interference beam $B_{m2}$ having the wavelength $\lambda_2$, and the interference beam $B_{m3}$ having the wavelength $\lambda_3$. Similarly, the interference beams BM02 and MB20 are set to one wavelength component having one of the three wavelengths $\lambda_1$, $\lambda_2$, and $\lambda_3$ in response to switching to one wavelength of the incident beams ±LF.

When the photoelectric elements $DT_0$, $DT_{2a}$, and $DT_{2b}$ are located on or near the Fourier transform plane of the objective lens 22, the interference beams BM02 and BM20 of the 0th- and −2nd-order diffracted light components are laterally shifted on the photoelectric elements $DT_{2a}$ and $DT_{2b}$ in units of wavelengths. The light-receiving surfaces of the photoelectric elements $DT_{2a}$ and $DT_{2b}$ have a size to cover such the lateral shift. When spatial filters are respectively arranged in front of the photoelectric elements $DT_0$, $DT_{2a}$, and $DT_{2b}$ to select each interference beam, the size of the beam selection opening must be determined in consideration of this lateral shift. Alternatively, prisms (or plane-paralell glass) made of a glass material having a large color dispersion may be arranged in front of the photoelectric elements $DT_{2a}$ and $DT_{2b}$ to reduce the lateral shifts caused by the respective wavelengths on the light-receiving surfaces.

As can be apparent from the above arrangement, a signal processing circuit for obtaining the phase differences of the photoelectric signals $I_{mn}$, $IK02_n$, and $IK20_n$ (n=1, 2, 3) from the photoelectric elements $DT_0$, $DT_{2a}$, and $DT_{2b}$ using the photoelectric signal $I_{ms}$ from the photoelectric element 40 as a reference signal is required in this embodiment. The simplest circuit arrangement is shown in FIG. 43.

Figure 43:
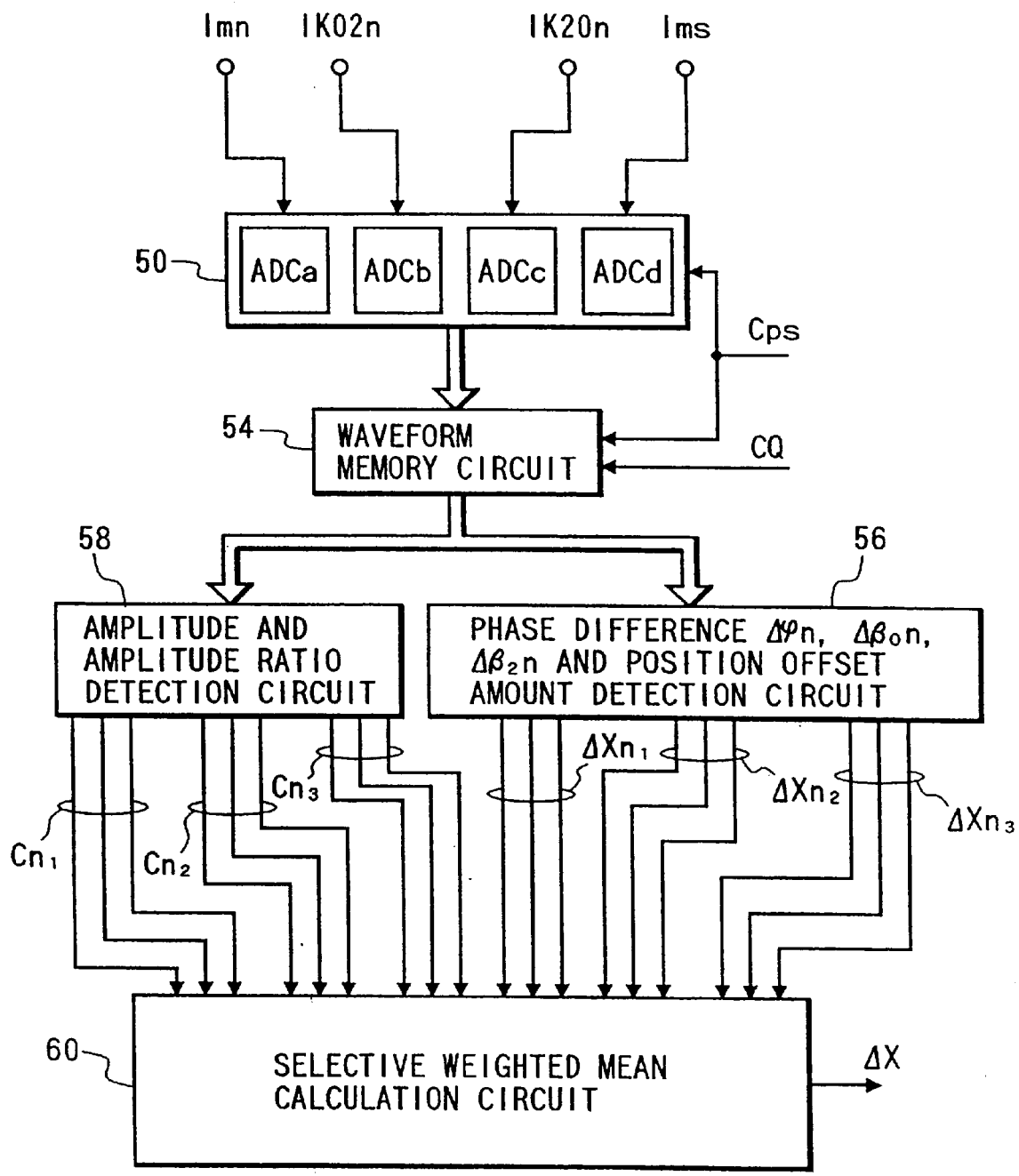
FIG. 43 is a block diagram showing the arrangement of a signal processing circuit applied to the apparatus shown in FIG. 42.

FIG. 43 is an improvement of part of the processing circuit shown in FIG. 38. In the hardware arrangement, an A/D converter 50 in FIG. 38 is constituted by four channel A/D conversion IC circuits ADCa, ADCb, ADCc, and ADCd. The reference signal $I_{ms}$ and the measurement signals $I_{mn}$, $IK02_n$, and $IK20_n$ are respective applied to these four channels. The four signals can be almost simultaneously digitally sampled in response to a pulse signal $C_{ps}$ from a sampling clock generator 52 in FIG. 38.

Figure 44:
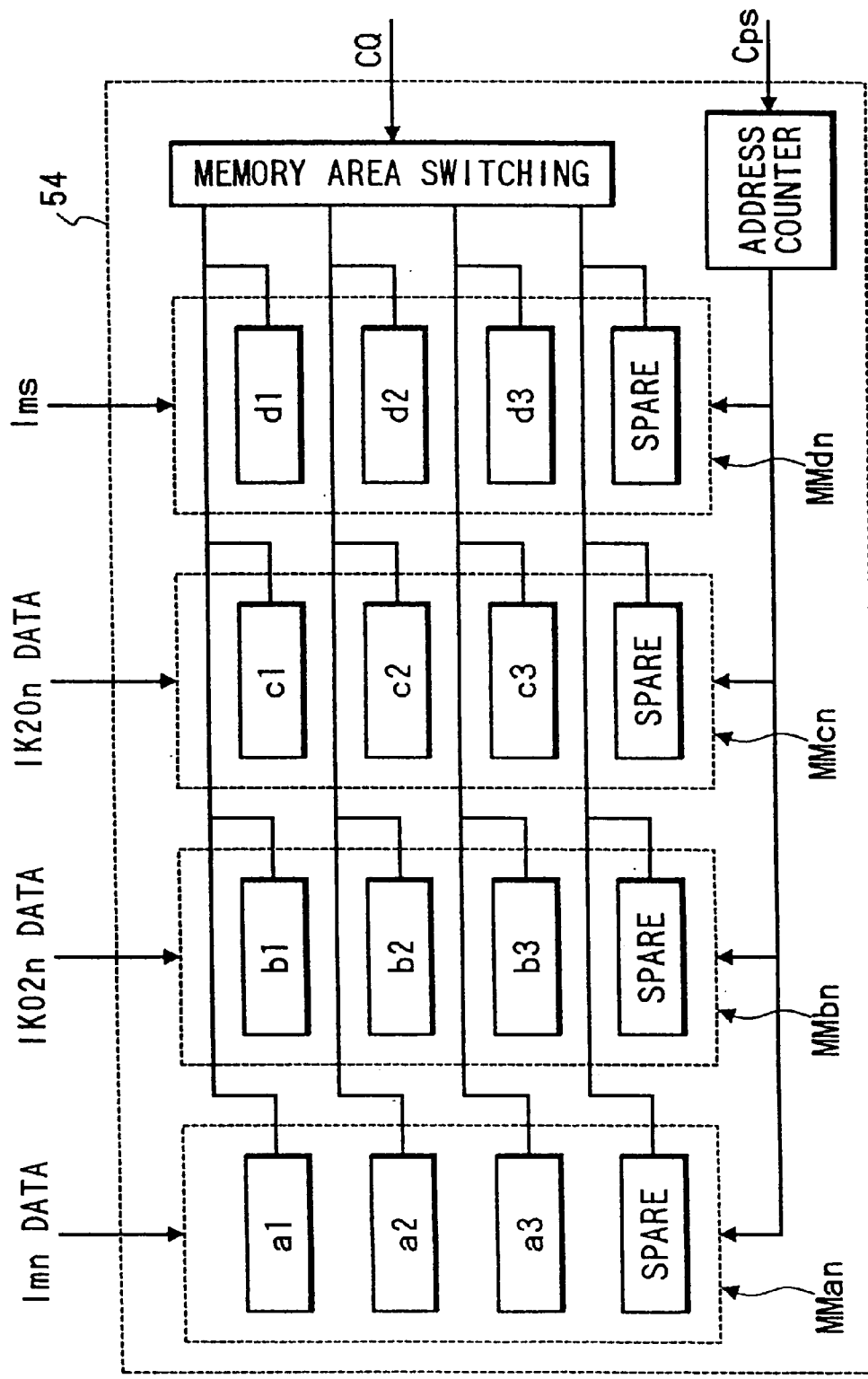
FIG. 44 is a view for explaining a memory bank arrangement in a waveform memory circuit unit in FIG. 43.

A waveform memory circuit unit 54 has four channel memory banks $MM_{an}$, $MM_{b1}$, $MM_{cn}$, and $MM_{dn}$ for simultaneously storing the signal waveform data from the A/D conversion IC circuits ADCa, ADCb, ADCc, and ADCd as shown in FIG. 44. The respective banks have memory areas a1 to a3, b1 to b3, c1 to c3, and d1 to d3 corresponding to the number of wavelengths (in this case, three wavelengths).

The waveform memory circuit unit 54 sequentially switches writable memory areas of the memory banks $MM_{an}$, $MM_{bn}$, $MM_{cn}$, and $MM_{dn}$ so as to synchronize with wavelength switching of the incident beams ±LF in response to a command signal CQ from a position controller 62. The address counters for the 12 memory areas a1 to a3, b1 to b3, c1 to c3, and d1 to d3 are commonly updated in response to the pulse signal $C_{ps}$. However, the number of memory areas simultaneously write-accessed in response to the command signal CQ is four.

More specifically, when the incident beams ±LF is set at the wavelength $\lambda_1$, the digital waveform data of the signal $I_{mn}$, the signal $IK02_n$, the signal $IK20_n$, and the reference signal $I_{ms}(\lambda_1)$ are stored in the memory areas a1, b1, c1, and d1, respectively.

Similarly, when the incident beams ±LF is set at the wavelength $\lambda_2$, the digital waveform data of the signal $I_{mn}$, the signal $IK02_n$, the signal $IK20_n$, and the reference signal $I_{ms}(\lambda_2)$ are stored in the memory areas a2, b2, c2, and d2, respectively. When the incident beams ±LF is set at the wavelength $\lambda_3$, the digital waveform data of the signal $I_{mn}$, the signal $IK02_n$, the signal $IK20_n$, and the reference signal $I_{ms}(\lambda_3)$ are back stored in the memory areas a3, b3, c3, and d3, respectively.

An amplitude detection and amplitude ratio detection circuit 58 shown in FIG. 38 is changed to output ratio data $C_{n1}$, $C_{n2}$, and $C_{n3}$ (n=1, 2, 3 corresponding to the wavelengths) grouped in units of interference beams having different diffracted states in FIG. 43. Of these ratio data, ratio data $C_{n1}$ (n=1, 2, 3) are identical to ratios $C_1$, $C_2$, and $C_3$ in FIG. 38. The ratio data $Cn_2$ (n=1, 2, 3) are ratios obtained from the photoelectric signals $IK02_n$ (n=1, 2, 3) in units of wavelengths. The ratio data $C_{n3}$ (n=1, 2, 3) are ratios obtained from the photoelectric signals $IK20_n$ (n=1, 2, 3) in units of wavelengths.

A phase difference and position offset detection circuit 56 shown in FIG. 38 is modified to output offset amounts $\Delta X_{n1}$, $\Delta X_{n2}$, and $\Delta X_{n3}$ (n=1, 2, 3) grouped in units of interference beams having different diffracted states in FIG. 43. Of these offset amounts, the offset amounts $\Delta X_{n1}$ (n=1, 2, 3) are equal to offset amounts $\Delta X_1$, $\Delta X_2$, and $\Delta X_3$ in FIG. 38. The offset amounts $\Delta X_{n2}$ (n=1, 2, 3) are obtained from the photoelectric signals $IK02_n$ (n=1, 2, 3) in units of wavelengths. The offset amounts $\Delta X_{n3}$ (n=1, 2, 3) are obtained from the photoelectric signals $IK20_n$ (n=1, 2, 3) in units of wavelengths. Note that this detection circuit 56 calculates, as intermediate values, values corresponding to the phase differences $\Delta \beta_{0n}$ and $\Delta \beta_{2n}$ (n=1, 2, 3) described in FIGS. 29A to 29D and FIGS. 30A to 30D.

A weighted mean calculation circuit unit 60 in FIG. 38 is modified into a selective weighted mean calculation circuit in FIG. 43. This circuit has the first arithmetic mode for calculating a final position offset amount $\Delta X$ on the basis of the photoelectric detection results of the interference beam of the ±1st-order diffracted light components as in FIG. 38, the second arithmetic mode for calculating the final offset amount $\Delta X$ on the basis of the photoelectric detection results of the interference beams of the 0th- and −2nd-order diffracted light components, and the third arithmetic mode for calculating the final offset amount $\Delta X$ on the basis of the detection results of all the interference beams. These three arithmetic operation modes can be arbitrarily selected by the operator. When the third arithmetic mode is designated, a few additional arithmetic algorithms can be selected. Such mode designation and algorithm designation will be described in detail later on.

In this embodiment, a wafer stage WST is positioned to irradiate incident beams ±LF from the objective lens 22 onto the grating mark of a fiducial mark plate FG on the wafer stage WST.

The three light sources $LS_1$, $LS_2$, and $LS_3$ are sequentially switched every predetermined period of time (e.g., about 100 times the period of the beat frequency $2\Delta f$) in response to the command signal CQ from the position controller 62 (FIG. 38). The grating mark of the fiducial mark plate FG is irradiated with the incident beams $\pm LF$ whose wavelength is sequentially switched. For example, if the three light sources $LS_1$, $LS_2$, and $LS_3$ are switched and turned on from the shorter wavelength side, the digital waveform data of the signal $I_{mn}$ (n=1) output from the photoelectric element $DT_0$ during the ON state of the light source $LS_1$ (wavelength $\lambda_1$) is stored in the memory area a1 in FIG. 44 in response to the sampling pulse signal $C_{ps}$.

Simultaneously, the digital waveform data of the signal $IK02_n$ (n=1) from the photoelectric element $DT_{2a}$ is stored in the memory area b1 in response to the pulse signal $C_{ps}$. The digital waveform data of the signal $IK20_n$ (n=1) from the photoelectric element $DT_{2b}$ is stored in the memory area c1 in response to the pulse signal $C_{ps}$. The digital waveform data of the signal $I_{ms}$ (wavelength $\lambda_1$) from the photoelectric element 40 is stored in the memory area d1 in response to the pulse signal $C_{ps}$.

Similarly, the signals $I_{ms}$, $IK02_n$ (n=2, 3), and $I_{ms}$ from the corresponding photoelectric elements during the ON states of the light sources $LS_2$ and $LS_3$ are stored in the corresponding memory areas $a_n$, $b_n$, $c_n$, and $d_n$ (n=2, 3).

The respective waveform data in the memory bank MMb in the memory circuit unit 54 are analyzed by the amplitude detection circuit 58, and the amplitude values (peak-to-peak values) of the signal $IK02_n$ of the respective wavelengths are calculated as values $J02_n$ (n=1, 2, 3). The respectively waveform data in the memory bank $MM_{cn}$ in the memory circuit unit 54 are analyzed by the amplitude detection circuit 58, and the amplitude values (peak-to-peak values) of the signal $IK20_n$ of the respective wavelengths are calculated as values $J20_n$ (n=1, 2, 3). The respective waveform data in the memory bank $MM_{an}$ are analyzed to obtain and store amplitude values $J11_n$ (n=1, 2, 3) of the signals $I_{mn}$ of the respective wavelengths.

When the preliminary operation is thus completed, the wafer W to be actually positioned and aligned is placed on the stage WST. The stage WST is positioned to irradiate the incident beams $\pm LF$ from the objective lens 22 onto the grating mark MG on the wafer W.

In the same manner as in detection of the grating mark of the fiducial mark plate FG, the three light sources $LS_1$, $LS_2$, and $LS_3$ are sequentially switched and turned on to simultaneously store the waveform data of the photoelectric signals $I_{mn}$, $IK02_n$, $IK20_n$ (n=1, 2, 3), and $I_{ms}$ in the memory circuit unit 54. The amplitude values of the signals $I_{mn}$, $IK02_n$, and $IK20_n$ (n=1, 2, 3) stored in the memory areas $a_n$, $b_n$, and $c_n$ of the memory circuit unit 54 are calculated as $E_n$ (see FIGS. 39A to 39D), and $E02_n$ and $E20_n$ (see FIGS. 29A to 29D and 30A to 30D) by the detection circuit 58.

The phase offset detection circuit unit 56 reads out the signal $I_{mn}$, $IK02_n$, and $IK20_n$ (n=1, 2, 3) from the memory areas $a_n$, $b_n$, and $c_n$ of the memory circuit unit 54 in units of wavelengths to sequentially calculate phases $\Delta\psi_n$, $\Delta\beta_{0n}$, $\Delta\beta_{2n}$ (n=1, 2, 3) and position offset amounts $\Delta X_{n1}$, $\Delta X_{n2}$, and $\Delta X_{n3}$ (n=1, 2, 3) of the signals $I_{mn}$, $IK02_n$, and $IK20_n$ with respect to the reference signal $I_{ms}$.

When the amplitude values and the position offset amounts of the respective wavelengths are obtained in units of detection light beams having different diffracted states (in units of interference beams), the amplitude ratio detection circuit 58 performs the following arithmetic operations:

$$C_{11}=E_1/J11_1 \tag{A1}$$

$$C_{21}=E_2/J11_2 \tag{A2}$$

$$C_{31}=E_3/J11_3 \tag{A3}$$

$$C_{12}=E02_1/J02_1 \tag{B1}$$

$$C_{22}=E02_2/J02_2 \tag{B2}$$

$$C_{32}=E02_3/J02_3 \tag{B3}$$

$$C_{13}=E20_1/J20_1 \tag{C1}$$

$$C_{23}=E20_2/J20_2 \tag{C2}$$

$$C_{33}=E20_3/J20_3 \tag{C3}$$

The most probable offset amount $\Delta X$ is calculated by the weighted mean calculation circuit 60. In the first arithmetic mode using only the interference beam BM of the $\pm$1st-order diffracted light components, the offset amount $\Delta X$ is calculated as follows in the same manner as in FIG. 38:

$$\Delta X=(C_{11}\cdot\Delta X_{11}+C_{21}\cdot\Delta X_{21}+C_{31}\cdot\Delta X_{31})/(C_{11}+C_{21}+C_{31})$$

On the other hand, in the second arithmetic mode using only the interference beam of the 0th- and −2nd-order diffracted light components, an algorithm is employed to calculate the position offset amount of each wavelength in accordance with an average phase difference between phase differences $\Delta\beta_{0n}$ obtained upon detection of the interference beam of the 0th- and −2nd-order diffracted light components, which appears on the left side of the interference beam BM of the $\pm$1st-order diffracted light components and phase differences $\Delta\beta_{2n}$ obtained upon detection of the interference beam of the 0th- and −2nd-order diffracted light components, which appears on the right side of the interference beam BM of the $\pm$+1st-order diffracted light components. This phase difference average is not an average for reducing so-called random components to improve precision, but an average which must be obtained in principle in position detection using the interference beams of the 0th- and $\pm$2nd-order diffracted light components.

Based on this algorithm of this embodiment, the weighted mean calculation circuit 60 calculates average values $\Delta XA_n$ (n=1, 2, 3) of the respective wavelengths between the position offset amounts $\Delta X_{n2}$ (n=1, 2, 3) obtained from the signals $IK02_n$ and the position offset amounts $\Delta X_{n3}$ (n=1, 2, 3) obtained from the signals $IK20_n$ (n=1, 2, 3) as follows:

$$\Delta XA_1=(\Delta X_{12}+\Delta X_{13})/2$$

$$\Delta XA_2=(\Delta X_{22}+\Delta X_{23})/2$$

$$\Delta XA_3=(\Delta X_{32}+\Delta X_{33})/2$$

The weighted mean calculation circuit 60 also calculates average values $CA_n$ (n=1, 2, 3) of the amplitude ratios $C_{n2}$ and $C_{n3}$ of the 0th- and −2nd-order diffracted light components of the respective wavelengths obtained in the amplitude ratio detection circuit 58 as follows:

$$CA_1=(C_{12}+C_{13})/2$$

$$CA_2=(C_{22}+C_{23})/2$$

$$CA_3=(C_{32}+C_{33})/2$$

The weighted mean calculation circuit 60 then calculates the weighted mean value of the average position offset amounts $\Delta XA_n$ using the average ratios $CA_n$ of the respective wavelength components as weighting factors, thereby calculating the most probable offset amount $\Delta X$ as follows:

$$\Delta X = (CA_1 \cdot \Delta XA_1 + CA_2 \cdot \Delta XA_2 + CA_3 \cdot \Delta XA_3)/(CA_1 + CA_2 + CA_3)$$

By the above calculation, position detection and position offset detection of the grating mark in the second arithmetic mode can be achieved.

In the third arithmetic mode, the operator can arbitrarily set one of the first algorithm for simply averaging the position offset amount calculated in the first arithmetic mode and the position offset amount calculated in the second arithmetic mode, and the second algorithm for calculating the weighted mean of these two position offset amounts. Let $\Delta XM_1$ be the position offset amount finally calculated in the first arithmetic mode (i.e., the mode using the detection results of the interference beam of the +1st-order diffracted light components) and $\Delta XM_2$ be the position offset amount finally calculated in the second arithmetic mode. In this case, the position offset amount determined by the first algorithm is calculated as $(\Delta XM_1 + \Delta XM_2)/2$.

On the other hand, in the second algorithm, the weighted mean value of the offset amount $\Delta XM_1$ calculated in the first arithmetic mode and the offset amount $\Delta XM_2$ calculated in the second arithmetic mode are calculated with predetermined weighting factors $Q_1$ and $Q_2$. As an example, the weighting factor $Q_1$ is caused to correspond to the sum of the amplitude values $E_1$, $E_2$, and $E_3$ (see FIGS. 39A to 39D) of the signals $I_{mn}$ (n=1, 2, 3) obtained upon photoelectric detection of the interference beam BM of the ±1st-order diffracted light components, and the weighting factor $Q_2$ is caused to correspond to the sum of the average amplitude values $(E02_1 + E20_1)/2$, $(E02_2 + E20_2)/2$, and $(E02_3 + E20_3)/2$ of the signals $IK02_n$ and $IK20_n$ (n=1, 2, 3) obtained for photoelectrically detecting the interference beam of the 0th- and −2nd-order diffracted light components in units of wavelengths. Therefore, the offset amount $\Delta X$ of the grating mark MG is determined by the following calculation in the second algorithm:

$$\Delta X = (Q_1 \cdot \Delta XM_1 + Q_2 \cdot \Delta XM_2)/(Q_1 + Q_2)$$

In principle, diffracted light components of higher order have lower intensities. For this reason, the light intensity amplitudes (corresponding to $E_n$) of the interference beam BM of the +1st-order diffracted light components are much larger than those (corresponding to $E02_n$ and $E20_n$) of the interference beam of the 0th- and −2nd-order diffracted light components. When the weighting factors $Q_1$ and $Q_2$ are simply determined by the sums of the amplitudes of the signals $I_{mn}$, $IK02_n$, and $IK20_n$, the weighting factor $Q_1$ is usually larger than the weighting factor $Q_2$. Therefore, the calculated value with respect to the weighting factor $Q_2$ is preferably corrected to increase by, e.g., a predetermined ratio (e.g., 10% to 30%).

The 19th embodiment of the present invention will be described with reference to FIG. 45. This embodiment is basically the same as that of FIG. 33. In the 19th-embodiment, the structure of a fiducial mark plate FG on a wafer stage WST shown in FIG. 37 is replaced with a transmission grating (i.e., a grating whose amplitude transmittance does not have asymmetry). An interference beam transmitted through this grating is photoelectrically detected to obtain a denominator (reference value) used in causing a detection circuit 58 to calculate the amplitude ratios of photoelectric signals $I_{mn}$, $IK02_n$, and $IK20_n$. Therefore, the same reference numerals as in FIG. 33 denote the same parts in FIG. 45.

Figure 45:
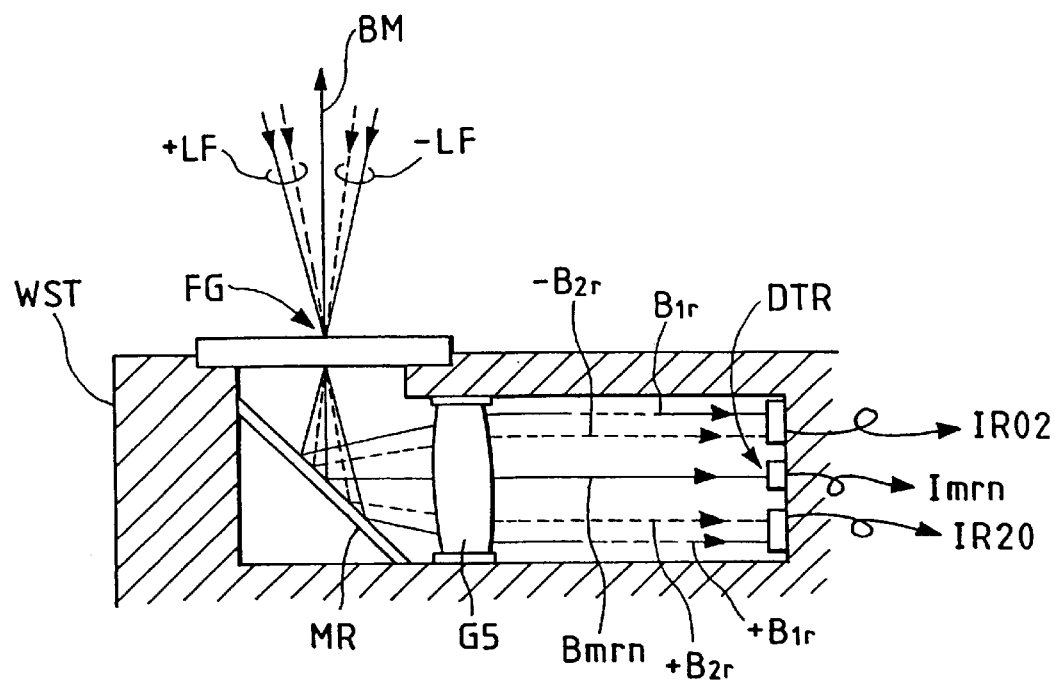
FIG. 45 is a sectional view showing part of an apparatus according to the 19th embodiment of the present invention.

FIG. 45 shows the partial section of the wafer stage WST. When incident beams ±LF (in this case, the beams have two wavelengths $\lambda_1$ and $\lambda_2$) are irradiated on the grating of the fiducial mark plate FG, 0th-, ±1st- and ±2nd-order diffracted light components are generated from the grating toward the interior of the stage.

These diffracted light components are deflected at a right angle by a mirror MR and incident on a lens system G5 having a Fourier transform function. These beams become interference beams $B_{mrn}$ (n=1, 2) of the ±1ar-order diffracted light components and interference beams $\pm B_{1r}$ (wavelength $\lambda_1$) and $\pm B_{2r}$ (wavelength $\lambda_2$) which are then incident on photoelectric elements DTR.

The photoelectric elements DTR comprise a central light-receiving portion for receiving the interference beam $B_{mrn}$ and outputting AC photoelectric signals $I_{mrn}$ corresponding to the beat frequency, a light-receiving portion for commonly receiving the interference beams $+B_{1r}$ (wavelength $\lambda_1$) and $-B_{2r}$ (wavelength $\lambda_2$) and outputting AC photoelectric signal $IR20_n$ (wavelength $\lambda_2$) corresponding to the beat frequency, and a light receiving portion for commonly receiving the interference beams $-B_{1r}$ (wavelength $\lambda_1$) and $-B_{2r}$ (wavelength $\lambda_2$) and outputting AC photoelectric signal $IR02_n$ corresponding to the beat frequency.

When the incident beams ±LF are set at the wavelength $\lambda_1$, the interference beams $\pm B_{1r}$ of the 0th- and −2nd-order diffracted light components having the wavelength $\lambda_1$ and the interference beam $B_{mr1}$ of the ±1st-ordered diffracted light components having the wavelength $\lambda_1$ reach the photoelectric elements DTR. When the incident beams ±LF are set at the wavelength $\lambda_2$, the interference beams $\pm B_{2r}$ of the 0th- and −2-order diffracted light components having the wavelength $\lambda_2$ and the interference beam $B_{mr2}$ of the +1st-order diffracted light components having the wavelengths $\lambda_2$ reach the photoelectric elements DTR. For this reason, in use of the incident beams ±LF having the wavelength $\lambda_1$, the photoelectric signals $I_{mr1}$, $IR02_1$, and $IR20_1$ are obtained. In use of the incident beams ±LF having the wavelength $\lambda_2$, the photoelectric signals $I_{mr2}$, $IR02_2$, and $IR20_2$ are obtained.

In the heterodyne scheme, these photoelectric signals appear in the form of a sinusoidal waveform having the same frequency as the beat frequency. These photoelectric signals are switched and input to the A/D converter 50 shown in FIG. 43 in response to the input signal $I_{mn}$, $IK02_n$, and $IK20_n$.

More specifically, a switch for switching between the signals $I_{mrn}$ and $I_{mn}$ and supplying the selected signal to the A/D converter 50, a switch for switching between the signals $IR02_n$ and $IK02_n$ and supplying the selected signal to the A/D converter 50, and a switch for switching between the signals $IR20_n$ and $IK20_n$ and supplying the selected signal to the A/D converter 50 are added in the circuit shown in FIG. 43. These three switches are synchronously operated in response to a command signal from the position controller 62 (FIG. 38).

The photoelectric signals from these photoelectric elements DTR are temporarily stored in the waveform memory circuit unit 54, and the amplitude values of these photoelectric signals are obtained and stored by the amplitude detection circuit unit 58 in FIG. 43. To obtain their amplitude ratios, the following operations are performed:

$$C_{11} = I_{m1}/I_{mr1}$$

$$C_{21} = I_{m2}/I_{mr2}$$

$$C_{12} = IK02_1/IR02_2$$

$$C_{22} = IK02_2/IR02_2$$

$C_{13} = IK20_1/IR20_1$ $C_{23} = IK20_2/IR20_2$

In this manner, the interference beams of the diffracted light components passing through the fiducial mark plate are photoelectrically detected by the photoelectric elements DTR in this embodiment. When the phase information of each photoelectric signal obtained from the elements DTR is compared with that of the photoelectric signal $I_{ms}$ serving as the reference signal, the position offset of the fiducial mark plate FG, or its position can be measured. That is, part off the baseline measurement operation can also serve as the operation for measuring the position or position offset of the fiducial mark plate FG.

The 20th embodiment of the present invention will be described with reference to FIG. 46. This embodiment is basically the same as that of FIG. 18. In the 20th embodiment, the polarization directions of a pair of incident beams +LF and −LF for irradiating a measurement (alignment) grating mark MG on a wafer W (or a fiducial mark plate FG) through an objective lens 22 are set complementary. More specifically, if the incident beams +LF and −LF are linearly polarized beams, their polarization directions are set to be perpendicular to each other. However, if the incident beams +LF and −LF are circularly polarized beams, they are set to be polarized beams having reverse rotational directions. For this reason, the two incident beams ±LF do not interfere with each other, and '1st-order polarized light components MB of wavelengths $\lambda_1$, $\lambda_2$, and $\lambda_3$ vertically generated from the grating mark MG do not interfere with each other.

When the ±1st-order diffracted light components MB are to be photoelectrically detected through an objective lens 22 and a small mirror MR2, a polarizing beam splitter PBS serving as an analyzer is used. In this manner, the ±1st-order polarized components BM passing through the polarizing beam splitter PBS interfere with each other and serve as a first interference beam $B_{p1}$. The ±1st-order diffracted light components BM reflected by the polarizing beam splitter PBS interfere with each other and serve as a second interference beam $B_{p2}$.

These interference beams $B_{p1}$ and $B_{p2}$ are complementary. In the heterodyne scheme, the interference beams are sinusoidally intensity-modulated in accordance with the beat frequency. The intensity modulation phases of the interference beams $B_{p1}$ and $B_{p2}$ are different by accurately 180°.

Figure 46:
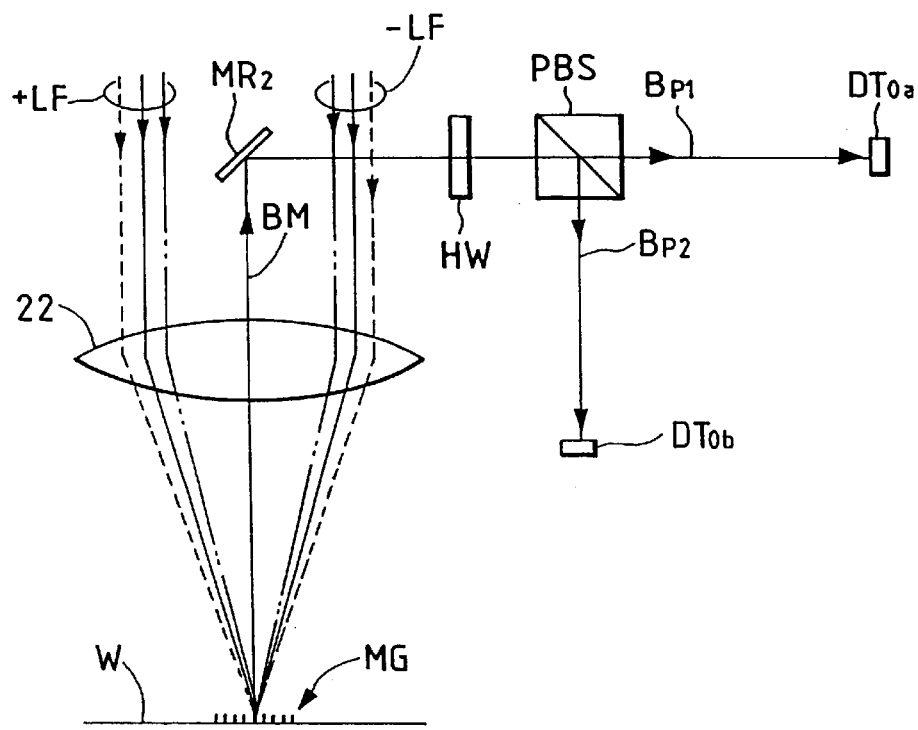
FIG. 46 is a view showing a position detection apparatus according to the 20th embodiment of the present invention.

When the linear polarization directions of the incident beams ±LF and the ±1st-order diffracted light component BM which are perpendicular to each other are different (rotated) from the polarization separation direction of the polarizing beam splitter PBS, a $\lambda/2$ plate HW shown in FIG. 46 is arranged to correct the linear polarization directions of the ±1st-order diffracted light beams BM. For this reason, when the linear polarization directions of the ±1st-order diffracted light components BM which are perpendicular to each other coincide with the polarization separation direction of the polarizing beam splitter PBS from the beginning, or when the incident beams +LF and −LF are circularly polarized beams having opposite rotational directions, the $\lambda/2$ plate HW need not be used.

In this embodiment, the interference beam $B_{p1}$ is received by a photoelectric element $DT_{0a}$ (36A$_1$ in FIG. 18), and the interference beam $B_{p2}$ is received by a photoelectric element $DT_{0b}$ (36A$_2$ in FIG. 18). The photoelectric signals from the photoelectric elements $DT_{0a}$ and $DT_{0b}$ are subtracted by a differential amplifier, thereby obtaining the photoelectric signal $I_{mn}$. The use of the differential amplifier results from the fact that the photoelectric signals from the photoelectric elements $DT_{0a}$ and $DT_{0b}$ have opposite phases (i.e., a phase difference of 180°). The common-phase noise components included in these photoelectric signals are canceled by the above subtraction operation. Therefore, the substantial S/N ratio of the signal $I_{mn}$ can be increased.

It is preferable that at least on-axial chromatic aberrations of the various chromatic aberrations be corrected for the objective lens 22 shown in FIG. 37, 42, or 46 to some extent. If the bandwidth of wavelengths $\lambda_1$, $\lambda_2$, and $\lambda_3$ to be used is 100 nm or less, such an on-axial chromatic aberration can be corrected to some extent by selecting proper materials for a plurality of lens elements constituting the objective lens 22 or combining lens elements having different refractive indices and different dispersion ratios. This chromatic aberration need not be perfectly corrected in the objective lens 22. The chromatic aberration can be corrected by the adjustment optical systems 14, 16, and 18 shown in FIG. 37.

The 15th to 20th embodiments have been described above. In detecting the grating mark MG on the wafer W or the fiducial mark plate FG in accordance with the homodyne scheme, the grating mark MG must be prescanned in the pitch direction to sample the changes in levels of the photoelectric signals. In this case, the simplest scheme is to change a signal waveform sampling clock signal $C_{ps}$ shown in FIG. 38 or 43 into a measurement pulse (e.g., one pulse every 0.02 $\mu$m) from an interferometer 44 for measuring the position of the stage WST.

With this arrangement, waveform data of the respective photoelectric signals generated during prescanning by several pitches of the grating marks MG are stored in a memory circuit 54 in correspondence with the positions of the grating marks MG. Note that prescanning of the stage WST must be repeated a predetermined number of times corresponding to the switching of the incident beams ±LF in units of wavelengths.

In the scheme for irradiating the two incident beams ±LF onto the grating mark MG, the incident beams ±LF are preferably incident on the grating mark MG at symmetrical angles in at least the pitch direction of the grating mark MG. In the scheme for projecting one incident beam on the grating mark MG, as shown in FIG. 41, the incident angle of the beam is preferable zero (vertical incidence) with respect to the pitch direction of the grating mark MG. That is, this indicates that the incident beams may be inclined in a direction (non-measurement direction) perpendicular to the pitch direction of the grating mark MG.

In projecting illumination light beams switched in units of wavelengths onto the measurement grating mark MG (or the fiducial mark), the plurality of laser beams of the respective wavelengths need not be coaxially synthesized, as shown in FIGS. 40, 41, and 37, but may be separated in the non-measurement direction perpendicular to the measurement direction (pitch direction) of the mark position and may be incident separately on the Fourier transform plane of the grating mark MG. That is, the incident angles of the plurality of illumination beams on the grating mark MG may be different in the non-measurement direction in units of wavelengths of the illumination beams. The arrangement for this is the same as that of FIGS. 35 and 36.

To obtain an incident beam, light from a halogen lamp or a high-luminance LED may be used in place of light from a laser light source. When light from a halogen lamp is used, a plurality of wavelength selection filters (or interference filters) having a narrow bandwidth in different wavelength portions are. interchangeably arranged, and light selected by time-divisionally switching these filters is guided through an optical fiber or the like and used. In this case, an incident beam for irradiating the grating mark MG on the wafer has a spectral intensity distribution continuous within the selected wavelength bandwidth. For this reason, an interference filter (bandwidth: 3 nm to 10 nm) for extracting only a specific wavelength component may be fixedly or replaceably arranged in front of each photoelectric element in the light reception system.

As described above, in each of the 15th to 20th embodiments, a position detection illumination beam is switched in units of a plurality of wavelengths, and diffracted light components generated from a position detection grating mark on a substrate are independently photoelectrically detected in units of wavelength components. Mark position information is detected for each resultant photoelectric signal, and the pieces of mark position information are averaged. High-precision position detection can be performed almost free from the influences of asymmetry of the marks and irregularities of the thickness of the resist layer. The photoelectric signals independent in units of wavelength components can be obtained in photoelectric detection of the diffracted light components from the mark. For this reason, even if the intensities of the illumination light beams are different in units of wavelength components, the averaging effect using a multi-wavelength beam will not be advantageously impaired.

In each of the 15th to 20th embodiments described above, assume that diffracted light components to be photoelectrically detected are components of higher order. In this case, when these multi-wavelength components (e.g., an interference beam of the 0th- and 2nd-order diffracted beams) are simultaneously received by a single photoelectric element, a canceling phenomenon can be eliminated. Therefore, higher-precision position detection and alignment can be achieved.

In addition, the attenuation ratios (amplitude ratios) of the intensity levels of the photoelectrically detected diffracted light components of the respective wavelengths are obtained. As for diffracted light components whose attenuation ratios are small and signal amplitudes are relatively large, position detection is performed using weighted mean calculation. Therefore, higher-precision position detection than that of simple averaging can be obtained.

A twenty-first embodiment of the present invention will now be described.

Generally a mark for alignment and position measurement formed on the surface of a wafer or the like is made with a minute step difference on the surface thereof, and has more or less asymmetry due to the wafer process such as etching and sputtering in the semiconductor working steps, or the application irregularity of a photoresist layer, and it results in reduced accuracy during mark position detection.

In an interference type alignment method of photoelectrically detecting the mutual interference light of two diffracted lights created from a grating mark, and utilizing the photoelectric signal, the asymmetry of the grating mark becomes the asymmetry of the amplitude reflectance of the mark itself and acts to deteriorate position detection accuracy. That is, when the depth or the like of the groove bottom portions of lines constituting the grating mark has a difference in the grating pitch direction or there is a partial difference in the thickness of the resist layer, the absolute value and phase of the amplitude reflectance of the mark itself become asymmetrical in conformity with a variation in the depth of the groove bottom portions and the thickness of the resist layer.

As a result, the diffracted lights created from the grating mark become different in intensity and phase, for example, between positive order created in the rightward direction relative to 0-order light and negative order created in the leftward direction. Of these differences, the difference in intensity scarcely contributes to the deterioration of position detection accuracy, while a variation in phase greatly affects position detection accuracy.

So, the result of the simulation of position detection accuracy which poses a problem in the heterodyne system using illuminating light of a single wavelength will first be described with reference to FIGS. 1 and 2. This simulation is such that supposing a case where coherent illuminating beams having a predetermined frequency difference therebetween are applied from symmetrical two directions to a grating mark on a wafer covered with a resist layer, the states (amplitude, phase, etc.) of the mutual interference light, i.e., interference beat light, of 1st-order diffracted lights vertically created from the grating mark have been found with the wavelength thereof varied.

Figure 2:
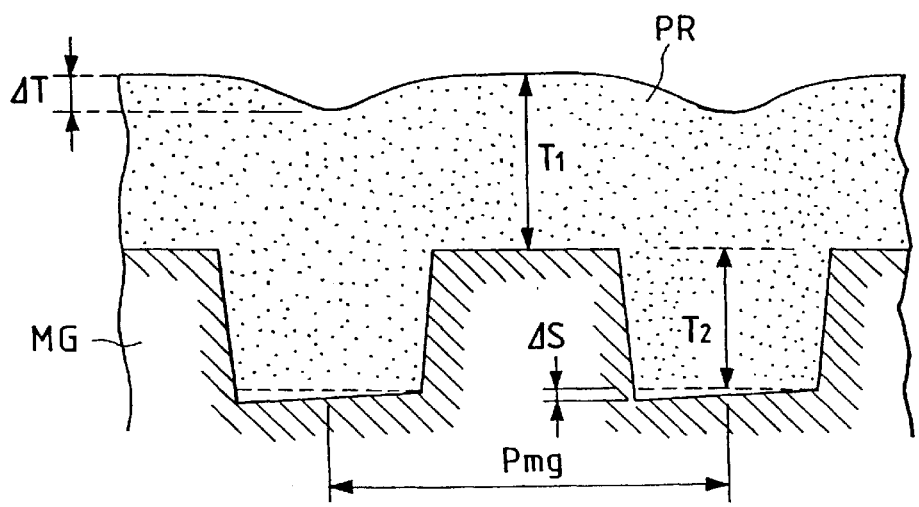
FIG. 2 is a partial sectional view showing the sectional shape of a grating mark used as a simulation model in FIG. 1.

FIG. 2 schematically represents a fragmentary enlarged cross-section of a one-dimensional grating MG such as the wafer supposed in the simulation and a resist layer PR applied to the surface thereof. Here, the pitch Pmg of the grating MG is set to 8 $\mu$m, the duty thereof is set to 50% (1:1), the level difference (or depth) of the groove is set to 0.7 $\mu$m, and in the bottom portion of the grating MG, asymmetry of 0.1% is set as the taper (inclination) $\Delta S$ in the pitch direction.

The resist layer PR covering such a grating MG is assumed such that the thickness T1 of the-top portion of the grating MG from the surface thereof is 0.9 $\mu$m and the depression amount $\Delta T$ in the surface of the resist layer which corresponds to the position of each bottom portion of the grating MG is $\Delta T=0.3T2$ (0.21 $\mu$m). Such grating structure of FIG. 2 is called a grating of which the amplitude reflectance is asymmetrical.

Now, FIG. 1 is a graph in which the wavelength $\lambda$ ($\mu$m) of illuminating light or the interference light of +1st-order diffracted lights is plotted as the axis of abscissa and the relative amplitude of the change (AC component) of a signal conforming to the variation in the quantity of the interference light and the error amount ($\mu$m) of position detection are plotted as the axis of ordinates. In the result of the simulation of FIG. 1, the conditions of the grating mark structure and resist layer of FIG. 2 have been set so that the wavelength $\lambda$ in which the AC component of a photoelectric signal conforming to the interference light received by the heterodyne system becomes just zero, i.e., a DC component alone, may be adjusted to the wavelength 0.663 $\mu$m of an He—Ne laser.

As is apparent from this, when a laser beam of wavelength 0.663 $\mu$m is used, it is seen that the detection error of the mark position becomes very great in the vicinity (about ±20 nm) of that wavelength. This is a matter of course in the heterodyne system, and is because phase difference measurement itself will become impossible if an AC component conforming to a beat frequency is not included at all in the photoelectric signal of which the phase difference is to be measured. This also holds quite true when position detection is effected by the homodyne system under a grating mark structure and resist layer of the same conditions.

So, it becomes effective not to detect only the interference light of two 1st-order diffracted lights travelling in a particular direction as in the simulation of FIGS. 1 and 2, but to photoelectrically detect the interference light of 0-order light and −2nd-order diffracted light travelling in discrete directions, and take the mark position determined on the basis of the signal also into account.

Figure 47:
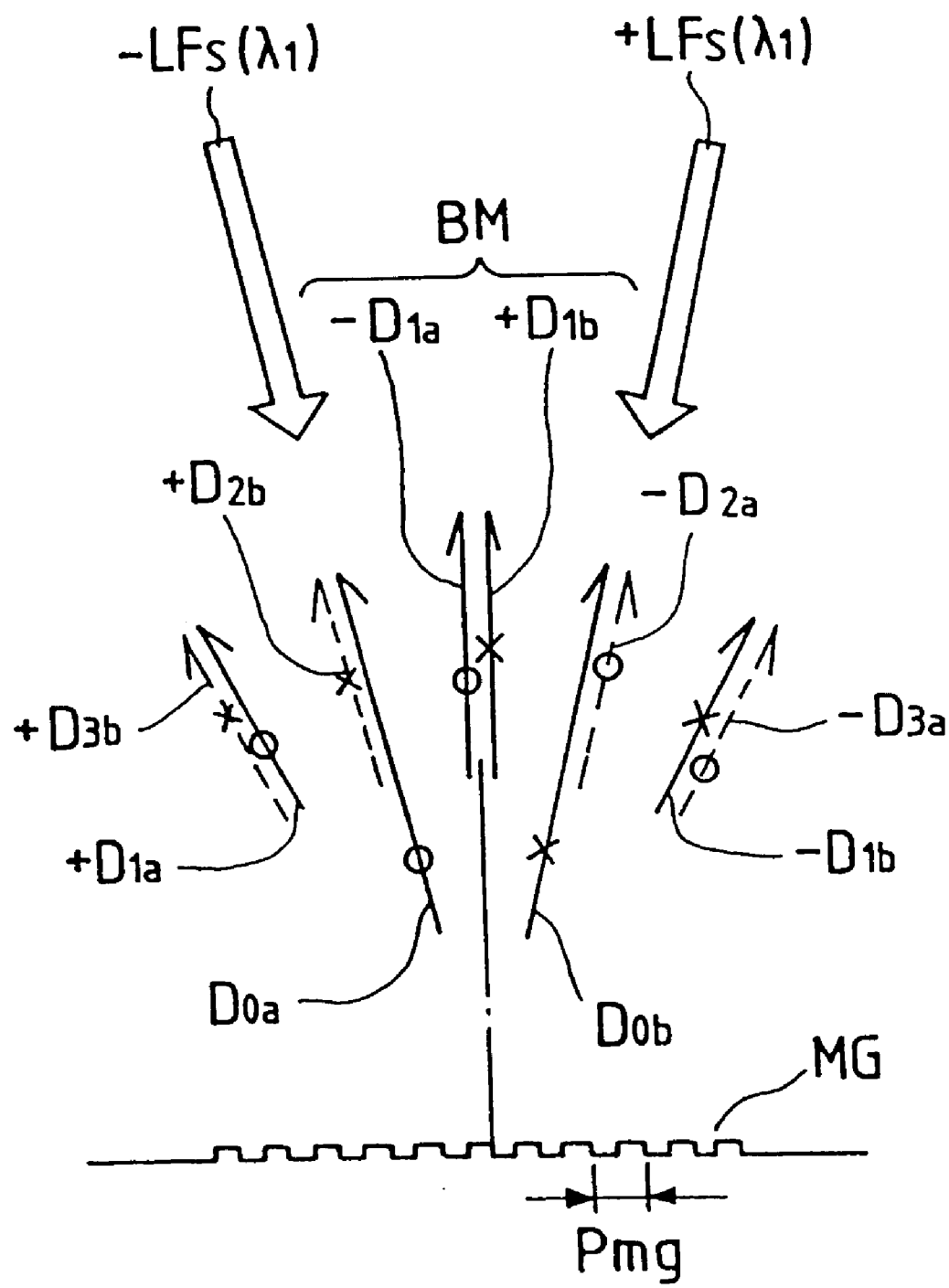
FIG. 47 schematically shows the state of diffracted light of each order created from a grating mark when coherent illuminating beams are projected from two symmetrical directions to the grating mark.

FIG. 47 shows the creation of 0-order light, +1st-order, ±2nd-order and ±3rd-order diffracted beams when two irradiating beams ±LFs of wavelength λ1 are applied to a diffraction grating mark MG at symmetrical angles of incidence to thereby provide a beam incidence condition under which interference fringes having an intensity distribution of pitch Pif are produced and in addition, the pitch Pmg of the grating mark MG is brought into the relation that Pmg=2Pif. When this pitch relation is satisfied, there is created the interference beam BM of two 1st-order diffracted beams +D1b and −D1a travelling vertically from the grating mark MG, as shown in FIG. 47.

In the diffracted beams ±Dna and ±Dnb shown in FIG. 47, the first suffixes 0, 1, 2 and 3 represents diffraction orders, the second suffix a means the diffracted beam created from the grating mark MG by the application of the illuminating beam +LFs, and the suffix b means the diffracted beam created from the grating mark MG by the application of the illuminating beam −LFs. Also, as regards the positive and negative signs of the 1st-order and higher order diffracted beams in FIG. 47, the diffraoted beams turning clockwisely relative to the 0-order diffracted beams D0a and D0b are negative, and the diffracted beams turning counter-clockwisely are positive.

Now, the 2nd-order diffracted beam D2a created by the application of the irradiating beam +LFs travels in a direction going back in the optical path of the irradiating beam +LFs, and interferes with the 0-order diffracted beam (regularly-reflected light) D0b of the irradiating beam −LFs. Likewise, the 2nd-order diffracted beam +D2b created by the application of the irradiating beam −LFs travels in a direction going back in the optical path of the irradiating beam −LFs, and interferes with the 0-order diffracted beam (regularly reflected light) D0a of the irradiating beam +LFs. The interference beam of these 0-order light and 2nd-order light, like the interference beam BM of ±1st-order diffracted lights, varies in intensity in conformity with the relative displacement of the grating mark MG and the interference fringes.

So, for example, the interference beam BM of 1st-order components (1st-order lights +D1b, −D1a) is photoelectrically detected to thereby find the position (or the position offset) of the mark and also, the interference lights of two sets of 2nd-order components (the pair of 0-order light D0b and 2nd-order light −D2a, and the pair of 0-order light D0a and 2nd-order light +D2b) are photoelectrically detected, and the average value of mark positions individually found by the use of the signals of the two sets of 2nd-order components is found as the position of the mark. It becomes effective to weight-average (weighted mean) the mark position detected by the use of the 1st-order components and the mark position detected by the use of the 2nd-order components, in conformity with the magnitude relation between the amplitude value of the signal of the 1st-order components and the average value of the amplitudes of the signals of the 2nd-order components.

The reason why the orders of the diffracted lights used for the detection of the mark are thus changed is that the directions of the diffracted lights created from the grating MG differ in conformity with the orders and therefore, even when the amplitude of the change in the intensity of the interference light of an order component travelling in a certain direction becomes small and detection accuracy is aggravated, the amplitude of the change in the intensity of the interference light of an order component travelling in another direction does not become so small and detection accuracy is sometimes not aggravated.

Figure 48A:
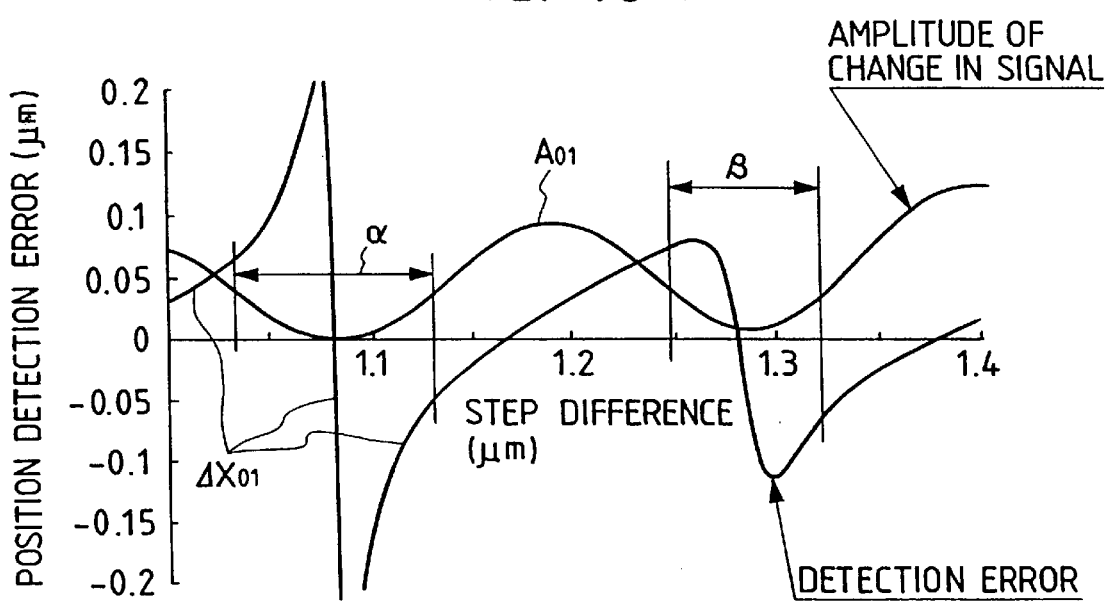
FIGS. 48A and 48B are graphs showing the result of the simulation of the relation between a position detection error using 1st-order diffracted lights from the grating mark and the step difference of the mark, and the relation between a position detection error using 2nd-order diffracted lights from the grating mark and the step difference of the mark.
Figure 48B:
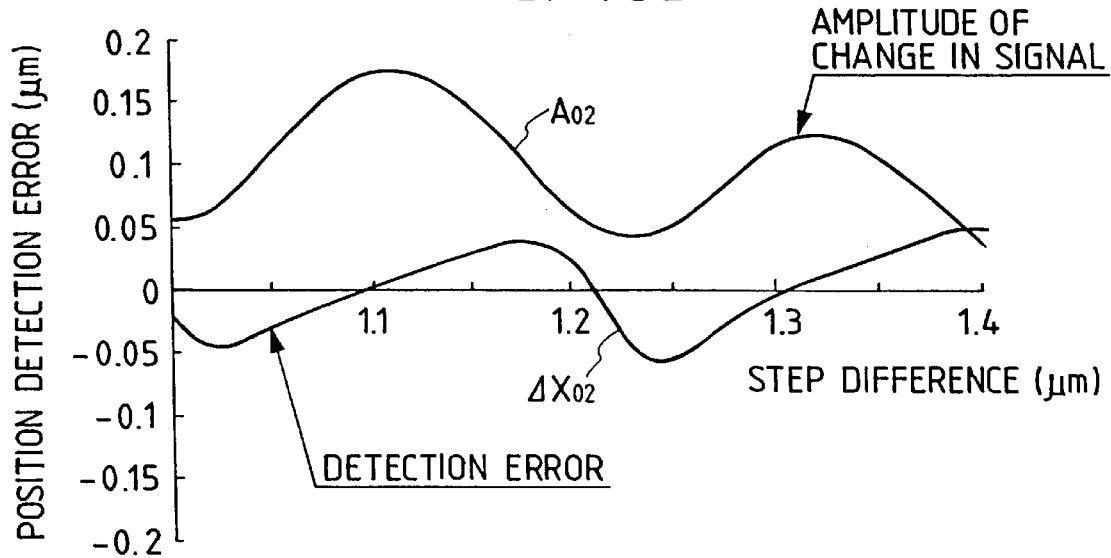

This is ascertained from the result of a simulation shown in FIGS. 48A and 48B. FIGS. 48A and 48B are graphs in which an He—Ne laser of wavelength 0.633 μm is an irradiating beam and the relation between the amplitude of a change (AC component) of a signal with the step difference T2 of the grating MG in FIG. 2 as a parameter and the position detection error is simulated. (Here, the pitch Pmg=8 μm, the duty is 1:1, the taper amount ΔS=0.1% is unchanged, and the thickness T1 of the resist layer PR on the top surface of the grating is 1.15 μm.)

FIG. 48A shows the simulation in the case of the interference beam BM of 1st-order components (1st-order lights $\pm D_{11}$), and FIG. 48B shows the simulation in the case of the interference light of 2nd-order components (0-order lights ±D01 and 2nd-order diffracted lights ±D21).

As will be seen from FIGS. 48A and 48B, the amplitude components of signals obtained by photoelectrically detecting the interference lights of 1st-order components and 2nd-order components change greatly in conformity with a delicate change in the step difference (T2) of the grating mark. For example, when in FIG. 48A, the step difference T2 of the grating mark is in the range α of about 1.03–1.13 μm and in the range β of about 1.25–1.32 μm, the amplitude A01 of the change in the intensity of the interference light of 1st-order components generally becomes small and as a result, the position detection error ΔX01 becomes extremely great or exhibits a considerably unstable change tendency.

However, when portions in FIG. 48B in which the step difference T2 of the mark corresponds to the ranges α and β of FIG. 48A are examined, it is seen that the amplitude A02 of the change in the intensity of the interference light of 2nd-order components is relatively great and the deterioration of the position detection error ΔX02 is little. While the amplitudes of the changes in the signals in FIGS. 48A and 48B are both represented as relative values, the scales thereof are combined together in FIGS. 48A and 48B.

In the conventional alignment system of the two-beam interference type disclosed, for example, in the publication (H), from the tendency as described above, the position offset measurement by the interference light of 2nd-order components has been merely selected when the intensity amplitude of the interference light of 1st-order components is small.

Now, the influence of the asymmetry of the optical amplitude reflectance of the grating mark including the resist layer remarkably appears in each discrete order component of the basic period (1st-order diffracted light) component, double period (2nd-order diffracted light) component, triple period (3rd-order diffracted light) component, . . . , of the detected light. So, examining the actual grating mark, it has been the reality that no strong correlation is seen among the influences (particularly phase transition, etc.) of the asymmetry included in each detected light of each discrete order component.

When for example, there is predetermined asymmetry in the amplitude reflectance of the grating mark to be detected and the measurement of the mark position is effected on the basis of the photoelectric detection of the interference light of mth-order components (e.g. ±1st-order diffracted lights), if the measured position includes a positive (+) position error relative to a true measured value, and if the measurement of the mark position is effected on the basis of the photoelectric detection of the interference light of nth-order components (e.g. 0-order and 2nd-order), the measured value may include a positive (+) position error or may include a negative (−) position error.

Thus, there is little or no correlativity between the irregularity of the error included in the position measurement (mth-order component measured value) based on the interference light of mth-order components and the irregularity of the error included in the position measurement (nth-order component measured value) based on the interference light of nth-order components. However, statistically examining, it has been found that as compared with the irregularity of the error of only the mth-order component measured value and the irregularity of the error of only the nth-order component measured value, the irregularity of the error of the average value of the mth-order component measured value and the nth-order component measured value becomes smaller corresponding to the averaging effect.

Further, if in the averaging of the mth-order component measured value and the nth-order component measured value, use is made of not a simple average, but weighted mean using a weight coefficient conforming to each of the amplitude information of a photoelectric signal obtained by photoelectrically detecting the interference light of mth-order components (e.g. the ratio between an ideal signal amplitude value obtained by the grating or the like of a fiducial plate and a signal amplitude value obtained from a grating which may include asymmetry on a wafer) and the amplitude information of a photoelectric signal obtained by photoelectrically detecting the interference light of nth-order components (e.g. the ratio between the ideal signal amplitude value and a signal amplitude value obtained from the actual grating), it becomes possible to reduce the bad influence when the amplitude of the photoelectric signal of a certain order component has become extremely small.

Also, the diffracted light of each order becomes smaller in intensity in terms of principle as the order becomes higher and therefore, the amplitude of the photoelectric signal of the interference light by each order component also becomes smaller in conformity with the highness of the order. So, theoretical weighting conforming to the order is further added to provide a weighted mean, whereby more highly accurate position detection becomes possible.

Figure 49:
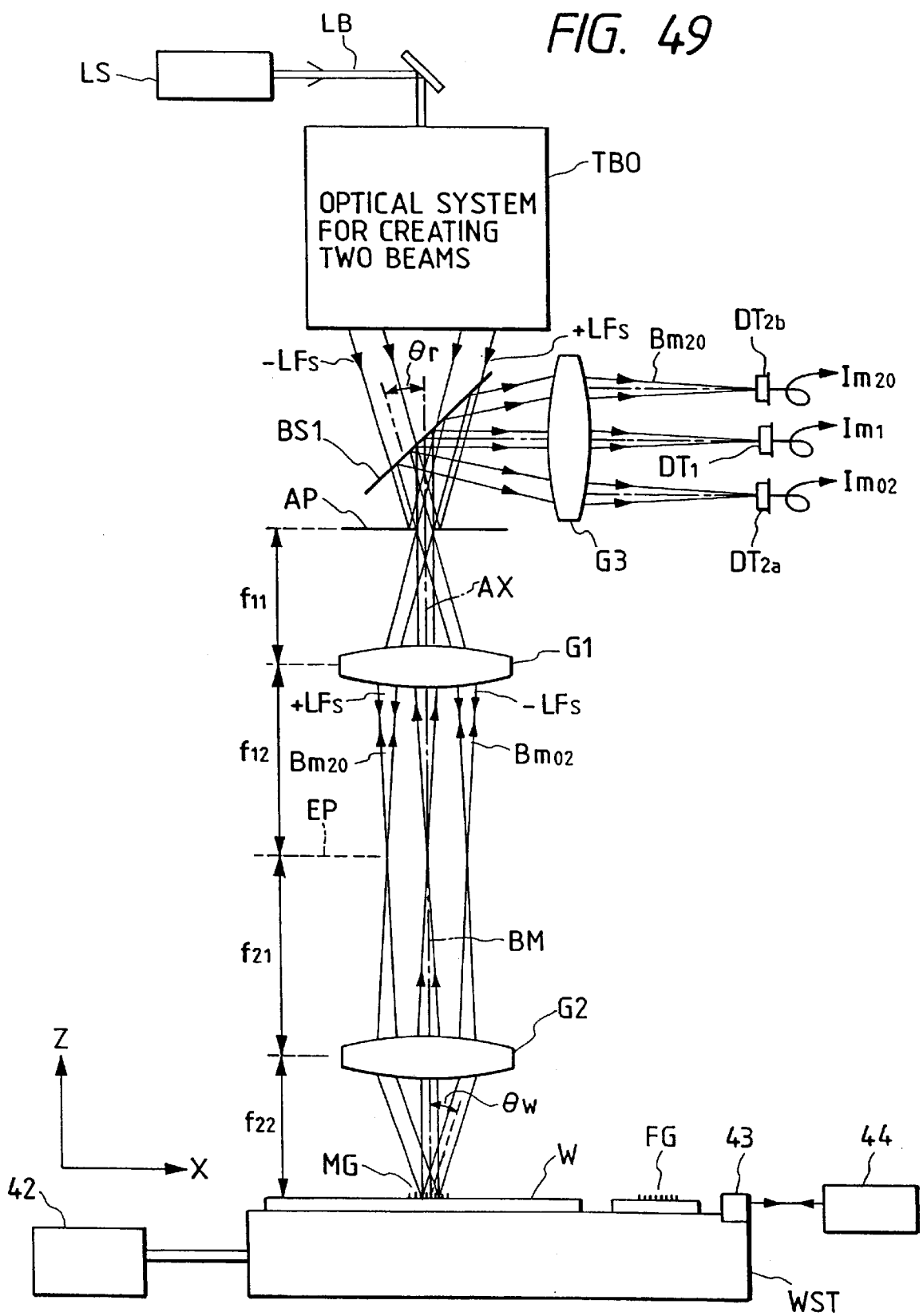
FIG. 49 schematically shows the construction of a position detecting apparatus according to a twenty-first embodiment of the present invention.

So, each embodiment of the present invention constructed in accordance with the above-described principle will hereinafter be described with reference to the drawings. First, FIG. 49 shows the construction of a position detecting apparatus according to a twenty-first embodiment of the present invention, and it is to be understood here that the position detection of a semiconductor wafer W having a diffraction grating mark MG formed unevenly on the surface thereof by etching is effected. Further, the present embodiment adopts an alignment method of the heterodyne type which applies two coherent beams having a predetermined frequency difference therebetween from two symmetrical directions to the grating mark on the wafer to thereby produce on the grating mark a one-dimensional interference fringe (moving at a speed conforming to the beat frequency) by the interference between the two beams.

Now, an irradiating beam LB (of one wavelength $\lambda$ within a range of the order of wavelength band 500–1000 nm) from a light source LS such am an He—Ne laser or a semiconductor laser as a coherent light source is converted into two illuminating beams +LFs and −LFs intersecting each other at a predetermined angle by an optical system TBO for creating two beams. This optical system TBO for creating two beams, as will be described later in detail, provides a predetermined frequency difference (beat frequency) between the two illuminating beams +LFs and −LFs and is also provided with a system for producing a reference signal for the heterodyne type.

Both of the illuminating beams ±LFs are parallel light beam and are transmitted through a beam splitter BS1 and thereafter, arrives at an illumination field aperture plate AP. This illumination field aperture plate AP has a rectangular opening for prescribing an illuminating area to the grating mark MG on the wafer W, and is disposed on the surface of intersection between the two illuminating beams ±LFs. This aperture plate AP is constructed by depositing vaporization low-reflection chromium as a light intercepting layer on a transparent glass plate, and forming a rectangular transparent window (opening) in a portion of the chromium layer by etching.

The two illuminating beams ±LFs prescribed by the opening in this stop plate AP enters a first lens system (a fore unit lens system) G1 acting as a Fourier transform lens. These two illuminating beams ±LFs are converged by the first lens system (fore unit lens system) G1 so as to become beam waist on a Fourier transform plate EP, and thereafter diverge and enter a second lens-system (a rear unit lens system) G2. Thereafter, the two illuminating beams +LFs are converted into two parallel light beams intersecting each other on the wafer by the second lens system G2, and one-dimensional interference fringes are formed on the wafer W.

Here, the plate of the rectangular opening in the aperture plate AP is disposed at the front side focal length f11 of the first lens system G1, the Fourier transform plane EP is produced at the rear side focal length f12 of the first lens system G1, the front side focal length f21 of the second lens system G2 is disposed so as to coincide with the Fourier transform plate EP, and the surface (grating mark MG) of the wafer W is disposed so as to lie at the rear side focal length f22 of the second lens system G2.

Accordingly, if the first lens system G1 and the second lens system G2 are arranged along one and the same optical axis AX and the center of the rectangular opening in the aperture plate AP is disposed on the optical axis AP, the principal rays of the two illuminating beams ±LFs become parallel to each other with the optical axis AX interposed therebetween in the space near the first lens system G1 and the second lens system G2.

Now, the pitch Pif of the interference fringes produced on the wafer W by the two illuminating beams 'LFs is represented by Pif=$\lambda$/2 sin $\theta$w when the angles of incidence of the illuminating beams ±LFs onto the wafer are defined as ±$\theta$w and the wavelength of the illuminating beams is defined as $\lambda$. Here., the imaging optical system by the first lens system G1 and the second lens system G2 makes the aperture plate AP and the wafer W conjugate with each other and therefore, when the angle of incidence of each of the two illuminating beams ±LFs irradiating the aperture plate AP is defined as $\theta$r and the imaging magnification (the ratio of the image size when the aperture plate AP side is seen from the wafer W side) of the imaging optical system by the first lens system G1 and the second lens system G2 is defined as MP, there is the relation that pM·sin $\theta$w=sin $\theta$w.

Figure 5A:
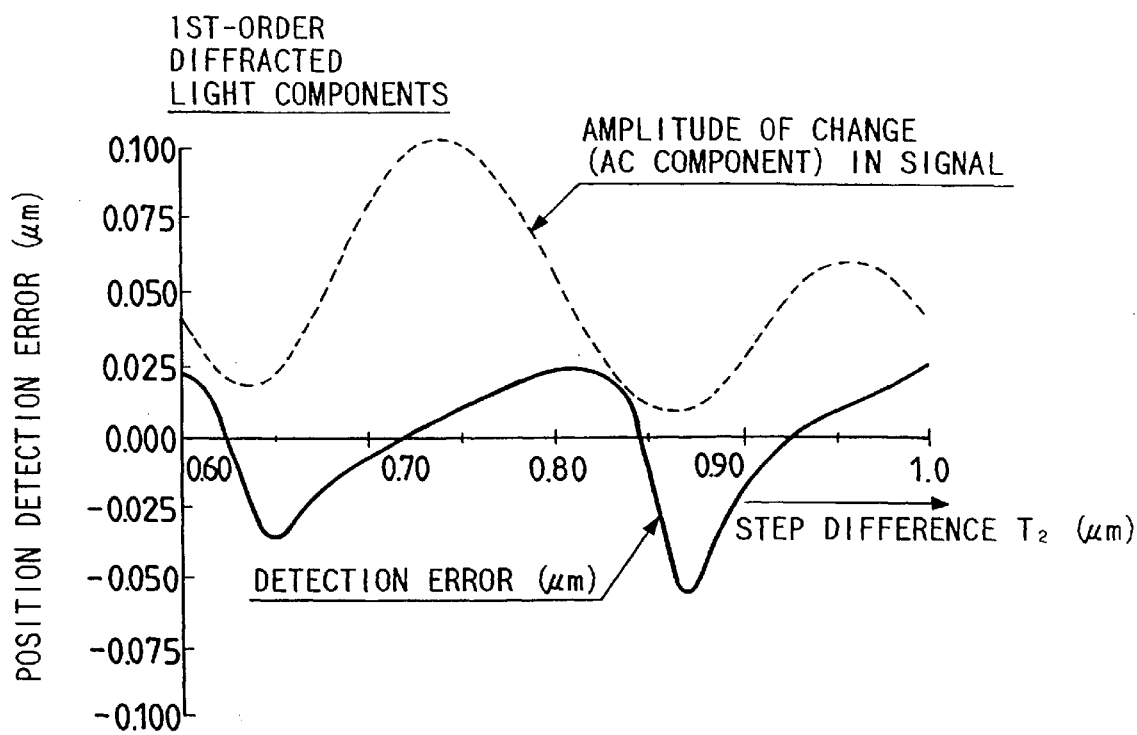
FIGS. 5A and 5B are graphs showing the simulations of the detection errors caused upon detection of a mark having the structure shown in FIG. 2 using the 1st-order diffracted light components and the detection errors caused upon detection of the mark using the 0th- and 2nd-order diffracted light components.
Figure 5B:
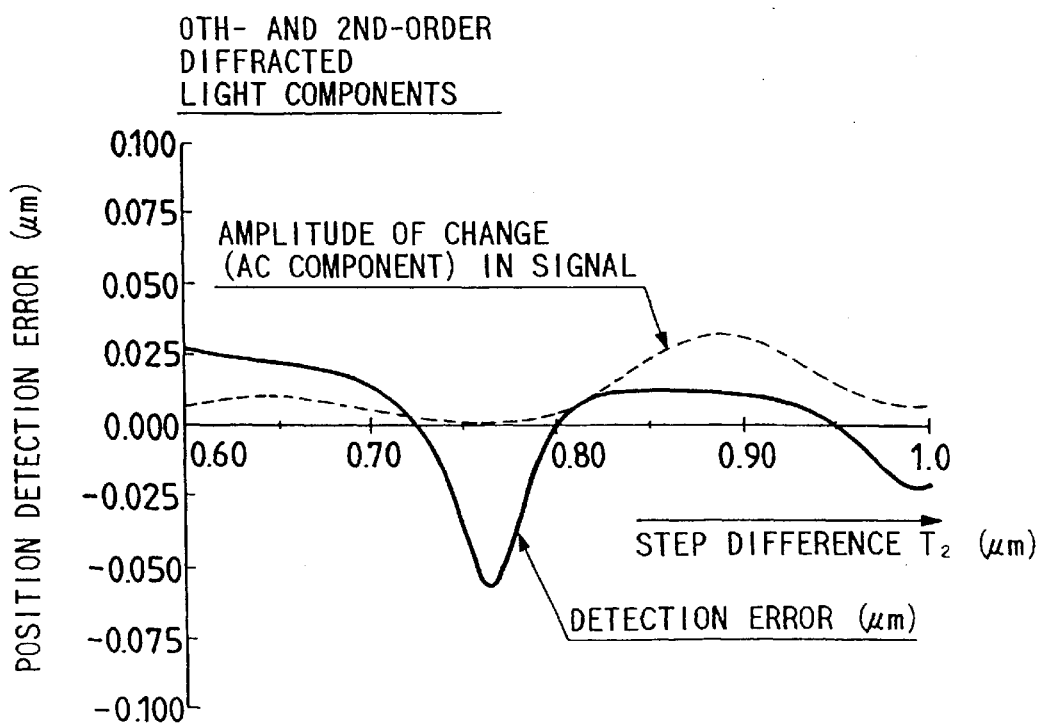

The periodicity direction of the grating mark MG is made coincident with the X-axis direction (the left to right direction in the plane of the drawing sheet of FIGS. 5A and 5B) of the coordinates system XY, and the periodicity direction of the interference fringes produced by symmetrically inclining the principal rays of the two illuminating beams ±LFs arriving at the wafer W in a plane prescribed by the X-axis and the optical axis AX (the Z axis) is made coincident with the X-axis direction. Further, the angle of incidence $\theta$w (or $\theta$r) of the illuminating beams ±LFs is set so that the pitch Pif of the interference fringes and the pitch Pmg of the grating mark MG may assume the relation that 2Pif=Pmg.

When such conditions are provided two 1st-order diffracted lights +D1b and −D1a travelling in a vertical direction (Z-direction) from the grating mark MG as previously described are coaxially created and these 1st-order diffracted lights +D1b and −D1a become an interference beam BM resulting from the interference therebetween, and this interference beam BM passes through the second lens system G2, the first lens system G1 and the opening in the aperture plate AP to a beam splitter BS1, where it is reflected substantially at a right angle and is condensed on a photoelectric element DT1 disposed substantially conjugately with the Fourier transform plane EP, by a lens system G3. This photoelectric element DT1 outputs a photoelectric signal Im1 conforming to a variation in the light intensity of the interference beam BM as long as the grating mark MG is situated in the irradiation area of the illuminating beams ±LFs, and outputs a predetermined level of almost zero when the grating mark MG is not present in the irradiation area.

When the relative positional relation regarding the sine wave-like intensity distribution of the interference fringes produced by the illuminating beams +LFs and the pitch direction (X-direction) of the grating mark MG uniformly changes with time, the photoelectric signal Im1 level-changes into a sine wave-like form, and if the relative positional relation between the intensity distribution of the interference fringes and the grating mark MG is stationary, the level of the photoelectric signal Im1 will be maintained at a certain predetermined level in the sine wave-like level change. In order to cause the photoelectric signal Im1 to thus level-change into a sine wave-like form, in the homodyne system, the moving stage WST for holding and positioning the wafer W is scanned and moved in X-direction.

The present embodiment, however, adopts the heterodyne system in which a predetermined frequency difference is provided between the two illuminating beams ±LPs and therefore, even in a positional relation wherein the irradiation area by the illuminating beams ±LFs and the grating mark MG are stationary, the photoelectric signal $I_{m1}$ becomes an AC waveform which level-change into a sine wave-like form at a beat frequency.

On the other hand, as described in connection with FIG. 47, the interference beam Bm02 of the regularly reflected light (0-order light) and the −2nd-order diffracted light of the illuminating beam +LFs created from the grating mark MG of the wafer W goes back along the optical path of the illuminating beam −LFs and enters the second lens system G2, whereafter it arrives at the Fourier transform plane EP and further passes through the first lens system G1 and the opening in the aperture plate AP to the beam splitter BS1. Likewise, the interference beam Bm20 of the regularly reflected light (0-order light) and the +2nd-order diffracted light of the illuminating beam +LFs created from the grating mark MG goes back along the optical path of the illuminating beam +LFs and passes through the second lens system G2, the first lens system G1 and the opening in the aperture plate AP to the beam splitter BS1.

The interference beams BmO2 and Bm20 reflected by the beam splitter BS1 become parallel light beams of different angles and enter the lens system G3, and arrive at photoelectric elements DT2a and DT2b having light receiving surfaces disposed substantially conjugately with the Fourier transform plane EP. The photoelectric signals Im02 and Im20 of these photoelectric elements DT2a and DT2b, respectively, like the photoelectric signal Im1 obtained from the interference beam BM, level-change in conformity with a change in the relative position of the intensity distribution of the interference fringes and the grating mark MG.

However, the signals Im02 and Im20 as 2nd-order components, unlike the signal Im1 as a 1st-order component, assume a DC level conforming to the simple reflectance of the surface of the wafer because the 0-order lights of the illuminating beams ±LFs are present even when the grating mark MG is not present in the irradiation area of the illuminating beams ±LFs.

Now, the stage WST holding the wafer W thereon is two-dimensionally moved in X-direction or Y-direction by a driving system 42 comprising a combination of a motor and a feed screw or a combination of a linear motor and an air guide. Further, the two-dimensional moved position (coordinates position) and the amount of movement of the stage WST are sequentially measured by a laser interferometer 44 for projecting a laser beam onto a reflecting mirror 43 fixed to a portion of the stage WST. By the cooperation of the driving system 42 and the laser interferometer 44, the stage WST is position-controlled with the accuracy of the order of the resolving power of the interferometer 44 to thereby effect the prealignment (within ±¼ of the pitch Pmg of the grating mark MG) of the grating mark MG into the irradiation area of the illuminating beams ±LFs, the scanning movement of the grating mark MG relative to the irradiation area of the illuminating beams ±LFs, or the positioning of a desired portion (such as a shot area) on the wafer W relative to a reference point.

Further, a fiducial mark plate FG formed with a fiducial grating mark of a pitch similar to that of the grating mark MG on the wafer W is provided on a portion of the stage WST. On this mark plate FG, a strength grating of the reflection type in which line and space are patterned with a chromium layer on the surface of quarty glass is formed as a fiducial grating mark. This strength grating, unlike a phase grating such as the grating mark MG unevenly formed on the wafer W, has the feature that it has not asymmetry and its diffraction efficiency does not depend on the wavelength of the illuminating light (or detecting light), that is, its amplitude reflectance is free of asymmetry. Further, the reflectance of the chromium layer hardly changes in the wavelength band (generally 0.5–0.8 μm) of the illuminating light used for position detection.

Figure 50:
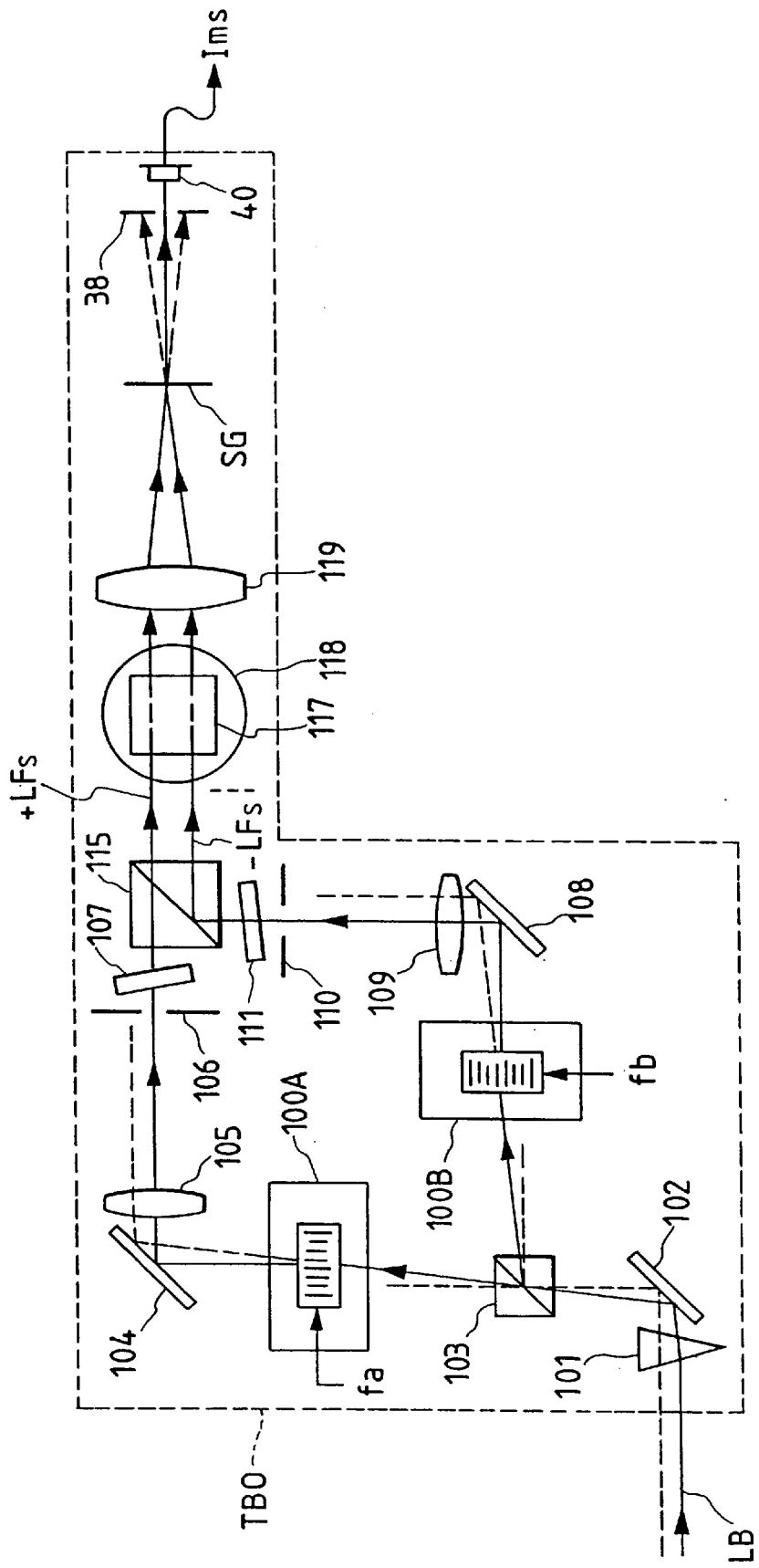
FIG. 50 is a plan view showing an example of the construction of an optical system TBO for creating two beams in the apparatus of FIG. 49; FIG.

In the construction of the optical system as described above, an example of the construction of the optical system TBO for creating two beams for detecting the position or the position offset error of the grating mark (or the fiducial grating mark of the fiducial mark plate FG) will now be described with reference to FIGS. 50 and 51. FIG. 50 shows the plan disposition of the optical system for creating two beams, and it is to be understood here that it uses two acousto-optical modulators (AOMs) 100A and 100B.

A beam LB from a laser beam source LS passes through a prism 101 for minutely deflecting a beam optical path, whereafter it is reflected by a mirror 102 and is divided into two beams by a beam splitter 103. The beam transmitted through this beam splitter 103 enters the AOM 100A at a predetermined angle, and the beam reflected by the beam splitter 103 enters the AOM 100B at a predetermined angle. These two AOMs 100A and 100B are driven by frequencies fa and fb, respectively, of a high frequency band (50–100 MHz), and the frequency fa is set to e.g. 80.050 MHz and the frequency fb is set to e.g. 80.000 MHz. The difference frequency (fa−fb=50 KHz) between these two frequencies fa and fb becomes the beat frequency in the heterodyne system. While the two AOMs 100A and 100B are provided in parallel here, the two AOMs may be disposed in tandem (in series), and a beam may be caused to enter the first-stage AOM under the diffraction condition of Raman-Nath, and two 1st-order diffracted beams produced there may be caused to enter the second-stage AOM under the condition of Bragg diffraction to thereby create two beams of a desired frequency difference.

Now, a diffracted beam and 0-order beam diffracted by a diffraction grating in the AOM 100A are reflected by a mirror 104 and enter a lens 105, whereafter the 0-order beam is intercepted by a stop 106 and the diffracted beam alone passes through plane parallel glass 107 and arrives at a composite beam splitter 115. Likewise, a diffracted beam and 0-order beam diffracted by a diffraction grating in the AOM 100B are reflected by a mirror 108 and enter a lens 109, whereafter the 0-order beam is intercepted by a stop 110 and the diffracted beam alone passes through plane parallel glass 111 and arrives at the composite beam splitter 115.

This composite beam splitter 115 transmits therethrough the diffracted beam from the AOM 100A as an illuminating beam ±LFs and totally reflects the diffracted beam from the AOM 100B as an illuminating beam −LFs. These two illuminating beams ±LFs are combined so as to become parallel to each other with a predetermined spacing therebetween as shown after they have passed through the composite beam splitter 115, and the spacing is adjusted by changing the angles of inclination of the plane parallel glass 107, 111.

Figure 51:
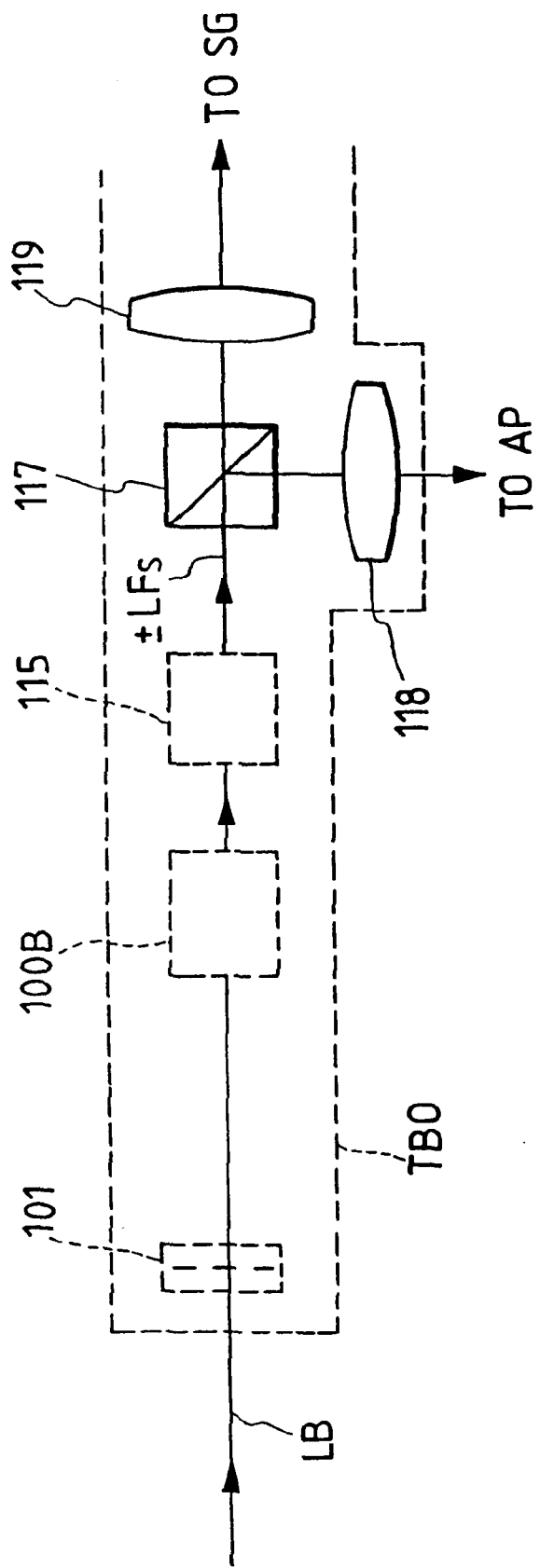
FIG. 51 is a view of the construction of the optical system TBO for creating two beams in FIG. 50 as it is seen from sideways thereof.

Now, the two illuminating beams ±LFs having emerged from the composite beam splitter 115 enter a beam splitter 117 of usual amplitude division as shown in FIG. 51 which is a view of the optical construction of FIG. 50 as it is seen from sideways thereof, and are divided into two pairs of beams thereby. Each of a pair of beams reflected by the beam splitter 117 is converted into parallel light beams intersecting each other at a predetermined angle by a lens 118, and becomes a pair of illuminating beams ±LFs, which travel toward the aperture plate AP in FIG. 49.

On the other hand, each of a pair of beams transmitted through the beam splitter 117 is converted into parallel light beams intersecting each other at a predetermined angle on a reference grating plate SG by the action of a lens 119, as shown in FIG. 50. This reference grating plate SG is formed with an amplitude grating of the transmission type, and the pitch of the reference grating thereof is set to double the pitch of the intensity distribution of interference fringes formed by the intersection between the two beams projected from the lens 119. Therefore, +1st-order diffracted beam and −1st-order diffracted beam are coaxially created in a vertical direction from the reference grating plate SG, and they become interference beams interfering with each other and arrive at a space filter 38.

This space filter 38 has an opening window for intercepting two 0-order lights (broken lines in FIG. 50) travelling obliquely from the reference grating plate SG and transmitting therethrough the interference beam of +1st-order diffracted beams travelling perpendicularly from the reference grating plate SG, and the interference beam is received by a photoelectric element 40 provided to output a reference signal Ims in the heterodyne system.

In the above-described construction, the condensing point (beam waist) of each beam condensed by the lenses 105 and 109 is set on a particular plane near the composite beam splitter 115, and the particular plane is determined substantially conjugately with the Fourier transform plane EP in FIG. 49. Accordingly, by adjusting the angles of inclination of the plane parallel glass 107, 111 in FIG. 50, it is possible to adjust the angle of intersection and the angles of incidence θr and θw of the two illuminating beams ±LFs arriving at the aperture plate AP or the wafer W (the fiducial plate FG) in FIG. 49, or the telecentricity of the illuminating beams.

Also, the position and position offset amount of the grating mark MG on the wafer W (the fiducial plate FG) can be found by measuring the phase differences among the signals Im1, Im02 and Im20 from the photoelectric elements DT1, DT2a and DT2b with the phase of the signal Ims from the photoelectric element 40 in FIG. 50. At that time, in the present embodiment, a weight coefficient is given to the position offset amount (or the phase difference) measured from each of 1st-order component and 2nd-order component in conformity with the amplitude (peak to peak) values of the photoelectric signals Im1, Im02 and Im20 obtained particularly from the grating mark MG on the wafer W to thereby effect weighted mean, thus determining the position offset amount of the grating mark MG on the wafer W.

So, an example of the signal processing circuit and position control circuit of the present embodiment will now be described with reference to FIG. 52. In the case of the heterodyne system shown in FIGS. 49, 50 and 51, the signals Im1, Im02, Im20 and Ims from the photoelectric elements DT1, DT2a, DT2b and 40 assume a sine wave-like AC waveform as shown in FIGS. 53A–53D as long as interference beams BM, Bm02 and Bm20 are created from the grating mark MG on the wafer W or the fiducial mark plate FG. The axes of abscissas of FIGS. 53A–53D represent time, and the axes of ordinates represent the intensity level of each signal.

Figure 53A:
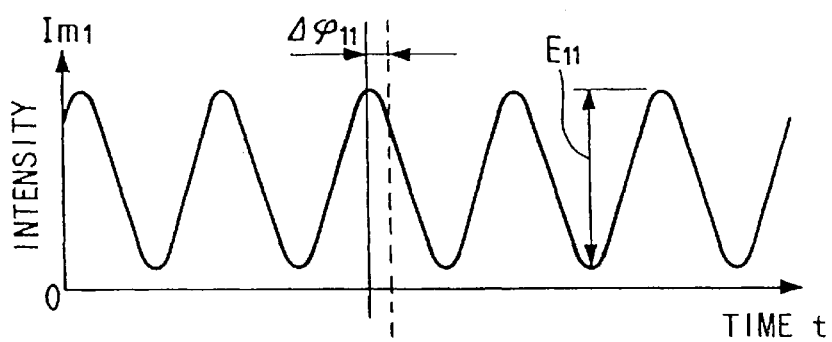
FIGS. 53A to 53D are graphs showing the states of the waveforms of respective signals processed by the signal processing system of FIG. 52.
Figure 53B:
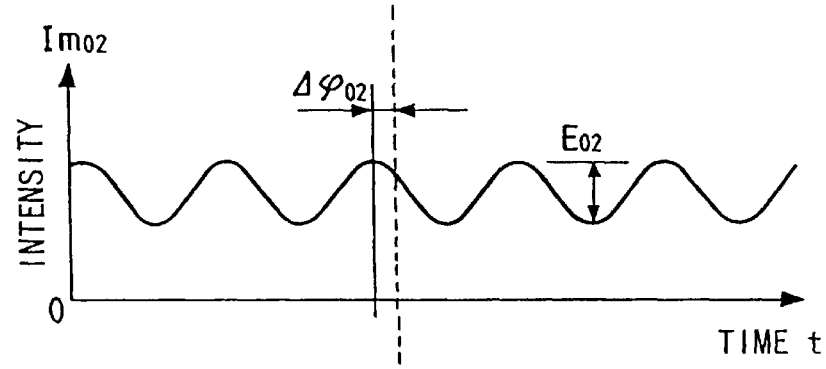
Figure 53C:
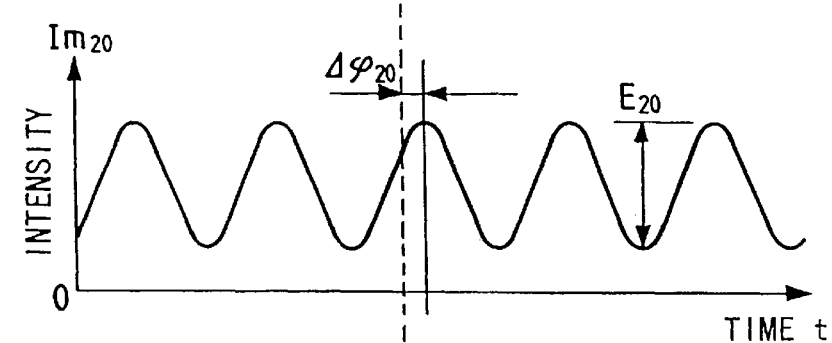
Figure 53D:
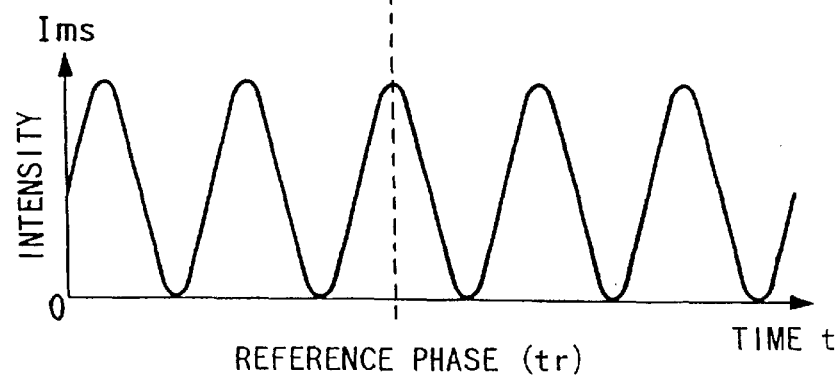

FIG. 53D represents a change with time in the intensity of the signal Ims which is a reference signal, and FIGS. 53A to 53C show an example of the changes with time in the intensity of the signals Im1, Im02 and Im20 when the interference beams BM, Bm02 and Bm20 from the grating mark MG on the wafer W are received. It is to be understood here that when the phase of the signal Ims is taken as the reference, the phase of the signal ImI shifts by $-\Delta\psi 11$ relative to the reference phase point (time tr) of the signal Ims, the phase of the signal Im02 shifts by $-\Delta\psi 02$ relative to the signal Ims, and the signal Im20 shifts by $+\Delta\psi 20$ relative to the signal Ims. Also, it is to be understood that at the time, the amplitude (peak to peak of the AC component) of the signal Im1 is E11, the amplitude of the signal Im02 is E02 and the amplitude of the signal Im20 is E20.

Now, the absolute values of the phase shift amounts $-\Delta\psi 02$ and $+\Delta\psi 20$ of the photoelectric signals Im02 and Im20 obtained by photoelectrically detecting the interference beams Bm02 and Bm20 of 0-order light and 2nd-order light are generally great as compared with the absolute value of the phase shift amount $-\Delta\psi 11$ of the photoelectric signal Im1 in the case of the interference beam BM of ±1st-order diffracted lights. The interference beams Bm02 and Bm20 of 0-order light and 2nd-order light are created at a symmetrical angle on the opposite sides of the interference beam BM of 1st-order diffracted lights −D1a and +D1b, as described in connection with FIG. 47, and therefore, the phase shift amounts $-\Delta\psi 02$ and $+\Delta\psi 20$ thereof generally have the tendency of the substantially opposite direction relative to the reference phase (time tr).

Figure 52:
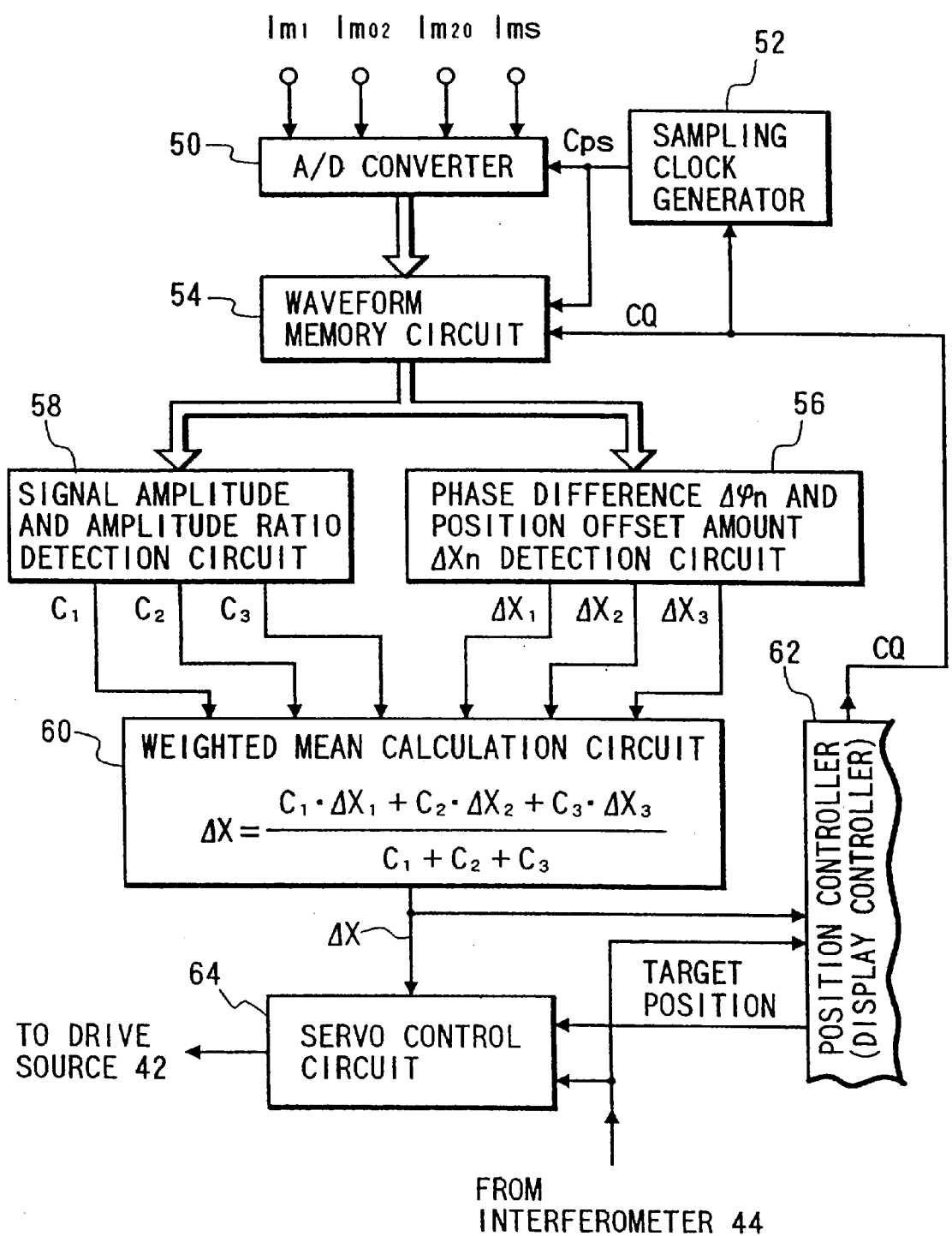
FIG. 52 is a block diagram showing the circuit construction of the signal processing system of the apparatus shown in FIGS. 49 and 50.

Now, in the circuit blocks shown in FIG. 52, the signals Im1, Im02, Im20 and Ims are inputted to an analog-digital converting (A/D converter) circuit unit 50, in which the intensity level of each signal at that moment is converted into a digital value is response to a clock signal (pulse) Cps from a sampling clock generating circuit 52.

The frequency of the clock signal Cps is determined sufficiently higher than the beat frequencies (e.g. 50 KHz) of the signals Im and Ims, and the clock signal Cps is also sent to a waveform memory circuit unit 54 and is used for the renewal of a memory address when the digital value (data) from the A/D converter 50 is stored.

Accordingly, in the waveform memory circuit unit 54, four waveform data shown in FIGS. 53A to 53D are digital-sampled over predetermined periods (e.g. ten or more periods) of the signals Im1, Im02, Im20 and Ims. At this time, the four signals are sampled at a time by the common clock signal Cps and therefore, it is to be understood that each waveform data in the waveform memory circuit unit 54 has no shift on the time axis.

Now, the waveform data in the memory circuit unit 54 are read into a phase difference and position offset detection circuit unit 56, in which phase differences $\Delta\psi 11$, $\Delta\psi 02$ and $\Delta\psi 20$ as shown in FIGS. 53A to 53D are calculated by digital calculation (Fourier integral method). If as previously assumed, the pitch Pmg of the grating mark MG on the wafer W and the pitch Pif of the interference fringes applied thereonto are set to Pmg=2Pif, a period of each waveform shown in FIGS. 53A to 53D corresponds to Pmg/2.

Also, generally the measurement of phase difference is effected within a range of ±180 degrees and therefore, the detection circuit 56 calculates the position offset amounts $\Delta X11$, $\Delta X02$ and $\Delta X20$ within a range of ±Pmg/4 on the basis of the calculated phase differences $\Delta\psi 11$, $\Delta\psi 02$ and $\Delta\psi 20$, in accordance with $$\Delta X11 = Pmg \cdot \Delta\psi 11/4\pi$$

$$\Delta X02 = Pmg \cdot \Delta\psi 02/4\pi$$

$$\Delta X20 = Pmg \cdot \Delta\psi 20/4\pi.$$

These offset amounts $\Delta X11$, $\Delta X02$ and $\Delta X20$ each represent the position offset of each order component of the grating mark MG relative to the reference grating SG.

Assuming here that about 0.2° is obtained as the resolving power of phase difference measurement, the resolving power of the offset amount is nearly $(0.2/180) \cdot Pmg/4$, and when the pitch Pmg is 4 $\mu$m, about 0.002 $\mu$m (2 nm) is obtained as a practical range.

On the other hand, a signal amplitude and amplitude ratio detection circuit unit 58 reads out the waveform data of FIGS. 53A to 53D stored in the waveform memory circuit unit 54, and detects the amplitude values E11, E02 and E20 of the respective waveforms by digital calculation.

In this detection circuit unit 58, there are stored in advance the amplitude values A11, A02 and A20 of the photoelectric signals Im1, Im02 and Im20 obtained when the interference beams created from the reference grating mark on the fiducial mark plate FG are received by the photoelectric elements DT1, DT2$a$ and DT2$b$. That is, before the grating mark MG on the wafer W is measured, the fiducial grating mark on the fiducial mark plate FG is moved to under the irradiation area of the illuminating beams ±LFs to thereby generate the signals as shown in FIGS. 53A to 53D from the photoelectric elements DT1, DT2$a$ and DT2$b$, and these signals are stored in the waveform memory circuit unit 54, whereafter amplitude values A11, A02 and A20 are detected by the amplitude detection circuit 58 and are stored.

If at this time, the static position of the stage WST in which the fiducial mark plate FG is detected is read from the laser interferometer 44 and is stored and also the position offset amounts $\Delta Xb11$, $\Delta Xb02$ and $\Delta Xb20$ of every order are found by the offset amount detection circuit unit 56, they can be utilized as the data during the base line determination.

The base line referred to herein means a minute error amount occurring between the position offset amount $\Delta Xb11$ found from the interference beam of 1st-order components for the grating mark on the optically stable fiducial plate FG and the average value $\Delta Xb22=(\Delta Xb02+\Delta Xb20)/2$ of the two position offset amounts $\Delta Xb02$ and $\Delta Xb20$ found from the interference beam of 2nd-order components.

Originally, in the apparatus construction shown in FIG. 49, if the pitch Pif of the interference fringes produced on the fiducial plate FG by the illuminating beam of a single wavelength strictly coincides with the pitch Pmg of the fiducial grating mark and the electrical responsiveness and strain characteristic of each photoelectric elements are sufficiently uniform, the values of the position offset amounts $\Delta Xb11$ and $\Delta Xb22$ regarding the mark plate FG ought to completely coincide with each other.

As a realistic problem, however, if the resolving power is as great as the order of 2 nm, it is difficult to adjust the light sending system and the detection system so that the position offset amounts $\Delta Xb11$ and $\Delta Xb22$ may be uniform to the degree of the resolving power. Thus, the difference between the position offset amounts $\Delta Xb11$ and $\Delta Xb22$ measured by the mark plate FG remains as the offset (base line error) inherent to the alignment system shown in FIG. 49.

The base line error is indirectly corrected by correcting and calculating the mark position offset amount determined by the position offset amounts $\Delta X11$, $\Delta X02$ and $\Delta X20$ found by the detection circuit 56 by detecting the grating mark MG on the wafer W, by the minute error amount of the position offset amounts $\Delta Xb11$ and $\Delta Xb22$ previously found by the fiducial plate FG.

So, turning back to FIG. 52, the amplitude ratio =detection circuit unit 58 has also the function of calculating the ratios K11, K02 and K20 between the amplitude values A11, A02, A20 stored in advance by detecting the fiducial plate FG in the above-described manner and the amplitude values E11, E02, E20 obtained when the grating mark MG on the wafer W is detected, as K11=E11/A11, K02=E02/A02 and K20=E3/A3. It is for the ratios K11, K02 and K20 to be used as the weight coefficient during the weighted mean of the position offset amount determined by each of 1st-order component and 2nd-order component.

However, it is also desired to prepare a calculation mode in which simple weight coefficients conforming to the amplitude values E11, E02 and E20 can be used in the calculation of the weighted means. Which set of weight coefficients should preferably adopted in terms of accuracy depends greatly on the asymmetry of the amplitude reflectance of the grating mark MG on the wafer and therefore, it is desirable that design be made such that any set of weight coefficients can be suitably selected. So, whichever of the set of simple weight coefficients conforming to the amplitude values E11, E02 and E20 and the set of weight coefficients conforming to the ratios K11, K02 and K20 found by the use of the fiducial mark plate FG is to be selected, those two sets of weight coefficients are typically represented by C11, C02 and C20, respectively.

Now, the data of the position offset amounts $\Delta X11$, $\Delta X02$, $\Delta X20$ and the weight coefficients C11, C02, C20 found in the above-described manner are sent to a weighted mean calculation circuit unit 60, in which the offset amount $\Delta X$ of the grating mark MG having the weight added thereto is calculated. However, as regards the position offset amounts $\Delta X02$ and $\Delta X20$ found from the interference beams Bm02 and Bm20 of 2nd-order components, it is necessary in principle to effect weighted mean to thereby find a position offset amount $\Delta X22$ of the grating mark MG detected by the 2nd-order components alone.

So, the weighted mean calculation circuit unit 60 first calculates the position offset amount $\Delta X22$ determined by the 2nd-order components alone, on the basis of the following expression:

$$\Delta X22=(\Delta X02+\Delta X20)/2$$

Likewise, the weight coefficients C02 and C20 conforming to the amplitude values E02 and E20 of the interference beams Bm02 and Bm2O of 2nd-order components (or the ratios K02 and K20 found by the use of the fiducial mark plate FG) are averaged, and a weight coefficient C22 regarding the position offset amount ΔX22 determined by 2nd-order components alone is calculated on the basis of the following expression:

$$C22=(C02+C20)/2$$

Thus, the position offset amounts ΔX11, ΔX22 and the weight coefficients C11, C22 by the 1st-order component and the 2nd-order component, respectively, are determined and therefore, the weighted means calculation circuit unit 60 calculates the final position offset amount ΔX of the grating mark MG by the following calculation:

$$\Delta X=(C11\cdot\Delta X11+C22\cdot\Delta X22)/(C11+C22)$$

Thereby, the position detection error included in the offset amount ΔX11 determined on the basis of 1st-order component alone and the position detection error included in the offset amount ΔX22 determined on the basis of 2nd-order component alone are averaged and the irregularity of the errors can be made small by the averaging effect.

Also, when one of the degree of modulation of the interference beam Bm of 1st-order components (the amplitude value of the signal Im1) and the degrees of modulation of the interference beams Bm02 and Bm20 of 2nd-order components (the amplitude values of Im02 and Im20) becomes extremely small, the position detection accuracy by the order components may sometimes be extremely aggravated. In the present embodiment, however, the weight coefficients C11, C02 and C20 obtained from the signals Im1, Im02 and Im20, respectively, are utilized for making weighted means and therefore, the weight scarcely acts on the result of the position offset detection by the order component reduced in amplitude, and the bad influence (accuracy deterioration) on the position offset amount ΔX finally found is reduced.

Now, the weight coefficients C11 and C22 utilized when the above-described position offset amount ΔX is found are ones depending simply on the amplitude values of the signals Im1, Im02 and Im20, but second weight coefficients conforming to the order components to be photoelectrically detected may be added to thereby calculate the final position offset amount ΔX. Specifically, a second weight coefficient to the signal Im1 of 1st-order component is defined as B11 and a second weight coefficient to the signals Im02 and Im20 of 2nd-order components is defined as B22, and the position offset amount ΔX is calculated by the following expression:

$$\Delta X=(C11\cdot B11\cdot\Delta X11+C22\cdot B22\cdot\Delta X22)/(C11\cdot B11+C22\cdot B22)$$

Accordingly to the weighted mean having these second weight coefficients added thereto, any reduction in the position detection accuracy by the theoretical difference between the degrees of modulation (the amplitudes of the signals) of the interference beams BM, Bm02 and Bm20 due to the difference between the orders of the diffracted beams created from the grating mark MG can be prevented and more highly accurate position detection becomes possible. This is attributable to the phenomenon that ±1st-order diffracted lights are greater in intensity than ±2nd-order diffracted lights.

As regards the numerical value examples of the second weight coefficients B11 and B22, according to the result of the experiment, the best accuracy has been obtained when they are in a range of the order of B22/B11=1–0.25. However, when B22/B11=1, the second weight coefficients substantially do not work, and when B22/B11=0.25, the weight to the result of position detection (the position offset amount ΔX22) by 2nd-order component is most emphasized. This ratio B22/B11 of the second weight coefficients may be stepwise changed over and set in conformity with the processes (such as etching, evaporation and diffusion) applied to the wafer as an example.

The offset amount ΔX found in the above-described manner is the offset of the grating mark MG in the pitch direction relative to the reference grating SG, and the data thereof is sent to a position control and display 62 shown in FIG. 52 and is also sent to a servo control circuit unit 64 when the wafer is aligned on real time.

This servo control circuit unit 64 has two functions, one of which is the function of feedback-controlling the driving system 42 until the offset amount ΔX reaches a predetermined value (direct servo mode). In the case of this function, the operations of the A/D converter circuit 50, the memory circuit unit 54, the offset amount detection circuit unit 56 and the average calculation circuit unit 60 are successively repeated, whereby the value of the offset amount ΔX is calculated within each very short time (e.g. several msec.).

In that case, the calculation of the weight coefficients C11, C02 and C20 by the amplitude ratio detection unit 58 may be effected only the first one time or may be effected each time the calculation of the offset amount ΔX is effected. Of course, when the calculation of the coefficients C11, C02 and C20 is effected each time, the values of the coefficients C11, C02 and C20 may somewhat change each time the offset amount ΔX is calculated by the weighted mean circuit unit 60. Also, when the calculation of the coefficients C11, C02 and C20 is effected at the first one time or a plurality of times, the same values of the coefficients are used as long as the same grating mark MG is detected thereafter.

On the other hand, the other function of the servo control circuit unit 64 is the function of moving the wafer stage WST on the basis of the measured value by the laser interferometer 44 (interferometer servo mode). This function is used when for example, the grating of the fiducial mark plate FG on the stage WST or the grating mark MG on the wafer W is positioned in the irradiation area of the illuminating beams ±LFs or when with the detected position of the grating mark MG as the reference, any point (for example, other grating mark) on the wafer W is positioned just beneath the second lens system G (the irradiation area of the illuminating beams LFs).

In the case of this interferometer servo mode, the target position information of the wafer stage WST is outputted from the position controller 62 to the servo control circuit unit 64, which thus feedback-controls the driving system 42 so that the difference between the current position data of the stage WST read from the counter in the laser interferometer 44 at every several tens of ps and the target position data may fall within a predetermined allowable range (e.g. +0.04 μm).

When the direct servo mode is to be executed in subsequence to the interferometer servo mode, the possible range by the direct mode is ±Pmg/4 relative to the pitch Pmg of the grating mark MG. This is because if the offset is greater than that, the positioning will be done while the offset corresponding to a half of one pitch of the grating mark MG remains created.

So, instead of the allowable range of the positioning of the stage WST during the interferometer servo mode being steadily limited to ±0.04 μm, the allowable range may be changed over to ±((Pmg/4)−α) only when the grating mark MG (or the fiducial mark plate FG) is detected. Here, α is α<(Pmg/4).

When for example, the pitch Pmg is 4 μm, if the allowable range is of the order of ±0.5 μm (α=0.5 μm), positioning servo is possible with accuracy much looser than the ordinary allowable range (±0.04 μm) and thus, the run-in time is shortened. When the loose allowable range (±0.5 μm) has been entered, the mode is immediately changed over to the direct servo mode, whereby high-speed and highly accurate positioning (alignment) becomes possible.

Now, the position control and display 62 has, besides the above-described instruction of the changeover of the servo mode, the function of displaying the coordinates position and found offset amount ΔX of the grating mark MG. Also, in some cases, it stores and preserves the values of the ratios C11, C02 and C20 which are the weight coefficients when the grating mark MG has been detected. In this case, when grating marks MG of the same shape are formed at a number of locations on the wafer W and the positions of those marks MG are to be successively detected, if the coefficients C11, C02 and C20 are also memorized, it will become possible to verify in which mark MG on the wafer W there has been a problem attributable to the asymmetry or the irregularity of the resist layer.

Design may also be made such that any portion on the wafer W in which the weight coefficients (C11, C02, C20) have greatly changed is graphically displayed. In this case, if the wafer before a resist layer is applied thereto via chemical processes such as the diffusing step and the etching step is mounted on the apparatus of FIG. 49 and the change in the weight coefficients is found, the influence of the chemical processes on the surface of the wafer can also be indirectly examined. Further, if a resist layer is applied to the wafer and likewise any change in the weight coefficients is found and is compared with the change in the weight coefficients before the application of the resist layer, the influence of the resist layer can also be indirectly examined.

In the above-described twenty-first embodiment, the fiducial mark plate FG is provided on the stage WST and provision is made of the function of finding the rates of change of the signal amplitude of each order obtained from the grating mark free of asymmetry and the signal amplitude of each order obtained from the grating mark having asymmetry, i.e., weight coefficients K11, K02 and K20, by the use of the fiducial mark plate FG, and therefore, position detection higher in reliability and reproducibility than in a case where the weight coefficients are simply determined by only the magnitudes of the amplitudes of the photoelectric signals obtained by the photoelectric detection of the interference beam of each order component becomes possible.

The construction of a position detecting apparatus according to a twenty-second embodiment of the present invention will now be described with reference to FIGS. 54 and 55. In this embodiment, unlike the heterodyne system in the previous twenty-first embodiment, a position detecting system of the homodyne type is applied, and this is applied as a system for photoelectrically detecting the interference light of ±1st-order diffracted lights created from a diffraction grating pattern formed on a substrate to be position detected, and the interference light of ±2nd-order diffracted lights created from the diffraction grating pattern on the substrate.

Figure 54:
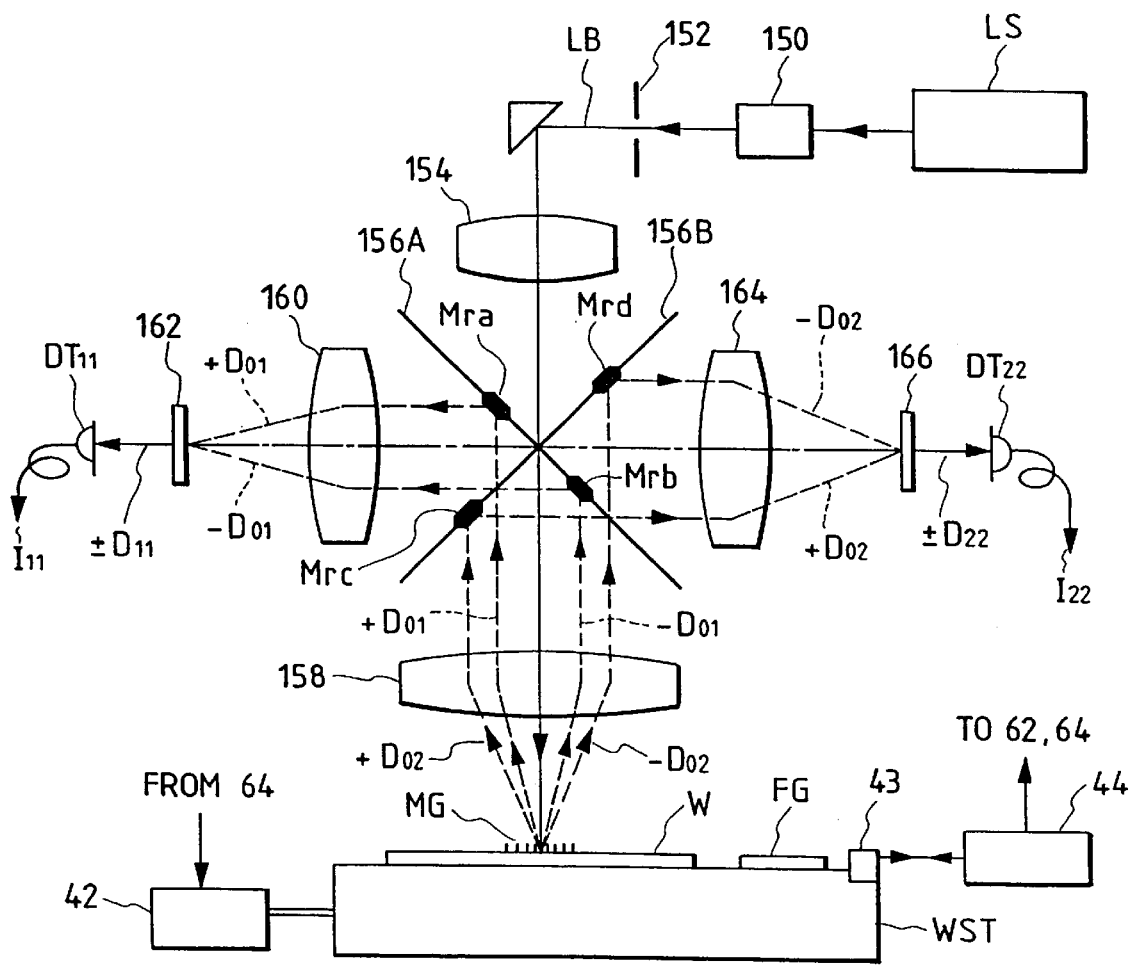
FIG. 54 schematically shows the construction of a position detecting apparatus according to a twenty-second embodiment of the present invention.

In FIG. 54, a substantially monochromatic light beam emitted from a light source LS such as an He—Ne an laser, a semiconductor laser or a bright line lamp enters beam splitter systems 156A and 156B through a beam shaping device 150 for adjusting the diameter of the beam to a predetermined size, an aperture 152 for shaping the cross-sectional shape of the beam into a shape substantially similar to the general shape of a diffraction grating mark MG on a wafer W, and a lens system 154. Further, the irradiating beam LB transmitted through the beam splitter systems is transmitted through a lens system 158 equal to the lens system G2 in FIG. 49 and arrives at the grating mark MG formed on the wafer W on a stage WST.

The aperture 152 and the surface of the wafer W (or a fiducial mark plate FG) are set conjugately with each other with respect to the composite system of the lens system 154 and an objective lens system 158. Accordingly, the irradiating beam LB transmitted through the aperture 152 is set to a parallel light beam, whereby the light beam LB arriving at the wafer W also becomes a parallel light beam. Also, in the case of FIG. 54, it is to be understood that the irradiating light beam LB enters the surface of the wafer (the surface of the fiducial mark plate) perpendicularly thereto.

In FIG. 54, the coordinates position of the stage WST moved with the wafer W, the fiducial mark plate FG and a movable mirror 43 placed thereon is measured by a laser interferometer 44 as in FIG. 49, and the movement of the stage WST is effected by a driving system 42, which is controlled basically by a servo control system 64 as in FIG. 52.

Now, diffracted lights of respective orders such as ±1st-order diffracted beams ±D01 and ±2nd-order diffracted beams ±D02 are created from the grating mark MG (the grating on the fiducial mark plate FG) irradiated with the irradiating light beam LB. Of these, the 1st-order diffracted beams ±D01 are transmitted through the objective lens system 158, are reflected by reflecting surfaces Mra and Mrb formed on portions of the beam splitter system 156A and enter the lens system 160, whereafter they are converted into parallel light beams by this lens system 160 and intersect each other at a predetermined angle on a reference grating plate 162.

Thereby, one-dimensional interference fringes by the interference between the two 1st-order diffracted beams ±D01 (the intensity distribution of the diffracted images of the grating mark MG by the 1st-order diffracted lights) are produced on the reference grating plate 162. The pitch Pf1 of the light and shade of the interference fringes is Pf1=Mm1 (Pmg/2) when it is represented by the relation between the image magnification Mm1 of an imaging optical system comprised of the objective lens system 158 and the lens system 160 (the magnification when the reference grating plate 162 is seen from the wafer W side) and the pitch Pmg of the grating mark MG, and when the image magnification Mm1 is one time, the pitch Pf1 of the light and shape of the interference fringes becomes just a half of the pitch Pmg of the grating mark MG.

When a diffraction grating (duty 50%) of the transmission type having a pitch equal to the pitch of the light and shade of the interference fringes is formed on the reference grating plate 162, such transmitted beams ±D11 of which the quantity of light becomes maximum when the transmitting line portions of the diffraction grating and the light line portions of the interference fringes coincide with each other and the quantity of light becomes minimum when the transmitting line portions of the diffraction grating and the dark line portions of the interference fringes coincide with each other are received by a photoelectric element DT11.

Thus, when the grating mark MG on the wafer W (i.e., the stage WST) is minutely moved in the pitch direction relative to the irradiating beam LB, the interference fringes produced on the reference grating plate 162 also minutely move in the pitch direction, and the waveform of a photoelectric signal I11 outputted from the photoelectric element DT11 during that movement changes as shown in FIG. 56A. In FIG. 56A, the axis of ordinates represents the level of the photoelectric signal I11 and the axis of abscissas represents the moved position of the grating mark MG on the wafer W in the pitch direction (here, X-direction).

FIG. 56A shows changes in the level of the signal I11 obtained particularly when the grating mark MG and the irradiating beam LB are moving at equal speed in X-direction relative to each other, and the signal I11 assumes a substantially sine wave-like waveform of which one period is the amount of movement of ½ of the pitch Pmg of the grating mark MG. Also, it is to be understood that the amplitude (peak/peak) value of the signal I11 is E11.

On the other hand, in FIG. 54, 2nd-order diffracted beams ±D02 created from the grating mark MG by the application of the irradiating beam LB enter the objective lens system 158, and thereafter are reflected by the partial reflecting surfaces Mrc and Mrd of the beam splitter system 156B and arrive at the lens system 164. The two 2nd-order diffracted beams ±D02 are converted into parallel light beams by the lens system 164 and are deflected so as to intersect each other on the reference grating plate 166. Thereby, one-dimensional interference fringes by the interference between the two 2nd-order diffracted beams ±D02 (the intensity distribution of the diffracted images of the grating mark MG by the 2nd-order diffracted lights) are produced on the reference grating plate 166. The pitch Pf2 of the light and shade of these interference fringes is Pf2=Mm2 (Pmg/4) when it is represented by the relation between the image magnification Mm2 of an imaging optical system comprised of the objective lens system 158 and the lens system 164 (the magnification when the reference grating plate 166 is seen from the wafer W side) and the pitch Pmg of the grating mark MG, and when the image magnification Mm2 is one time, the pitch Pf2 of the light and shade of the interference fringes becomes just ¼ of the pitch Pmg of the grating mark MG.

When a diffraction grating (duty 50%) of the transmission type having a pitch equal to the pitch Pf2 of the light and shade of the interference fringes is formed on the reference grating plate 166, such transmitted beams ±D22 of which the quantity of light becomes maximum when the transmitting line portions of the diffraction grating and the light line portions of the interference fringes coincide with each other and the quantity of light becomes minimum when the transmitting line portions of the diffraction grating and the dark line portions of the interference fringes coincide with each other are received by a photoelectric element DT22. Thus, when the grating mark MG on the wafer W (i.e., the stage WST) is minutely move in the pitch direction relative to the irradiating beam LB, the interference fringes produced on the reference grating plate 166 also minutely move in the pitch direction.

The waveform of a photoelectric signal I22 outputted from the photoelectric element DT22 during that movement changes as shown in FIG. 56B. In FIG. 56B, the axis of ordinates represent the level of the photoelectric signal I22 and the axis of abscissas represents the moved position of the grating mark MG on the wafer W in the pitch direction (here, X-direction). FIG. 56B shows changes in the level of the signal I22 obtained particularly when the grating mark MG and the irradiating beam LB are moving at equal speed in X-direction relative to each other, and the signal I22 assumes a substantially sine wave-like waveform of which one period is the amount of movement of ¼ of the pitch Pmg of the grating mark MG. Also, it is to be understood that the amplitude (peak/peak) value of the signal I22 is E22.

Now, assuming that in the waveforms of the signals shown in FIGS. 56A and 56B, the grating mark to be position-detected, like the diffraction grating on the fiducial mark plate FG, is free of any change in the amplitude reflectance for each of 1st-order diffraction and 2nd-order diffraction and the reference grating plates 162 and 166 are ideally disposed without any error in the relative positional relation therebetween, each of the peak point position and the bottom point position on the signal I11 accurately coincides with each peak point position on the signal I22. So, by measuring particular peak point positions X11 and X22 on the signals I11 and I22 on the basis of the relation between each change in the levels of the signals I11 and I22. and the moved position of the stage WST, the position of the grating mark MG is detected.

Figure 55:
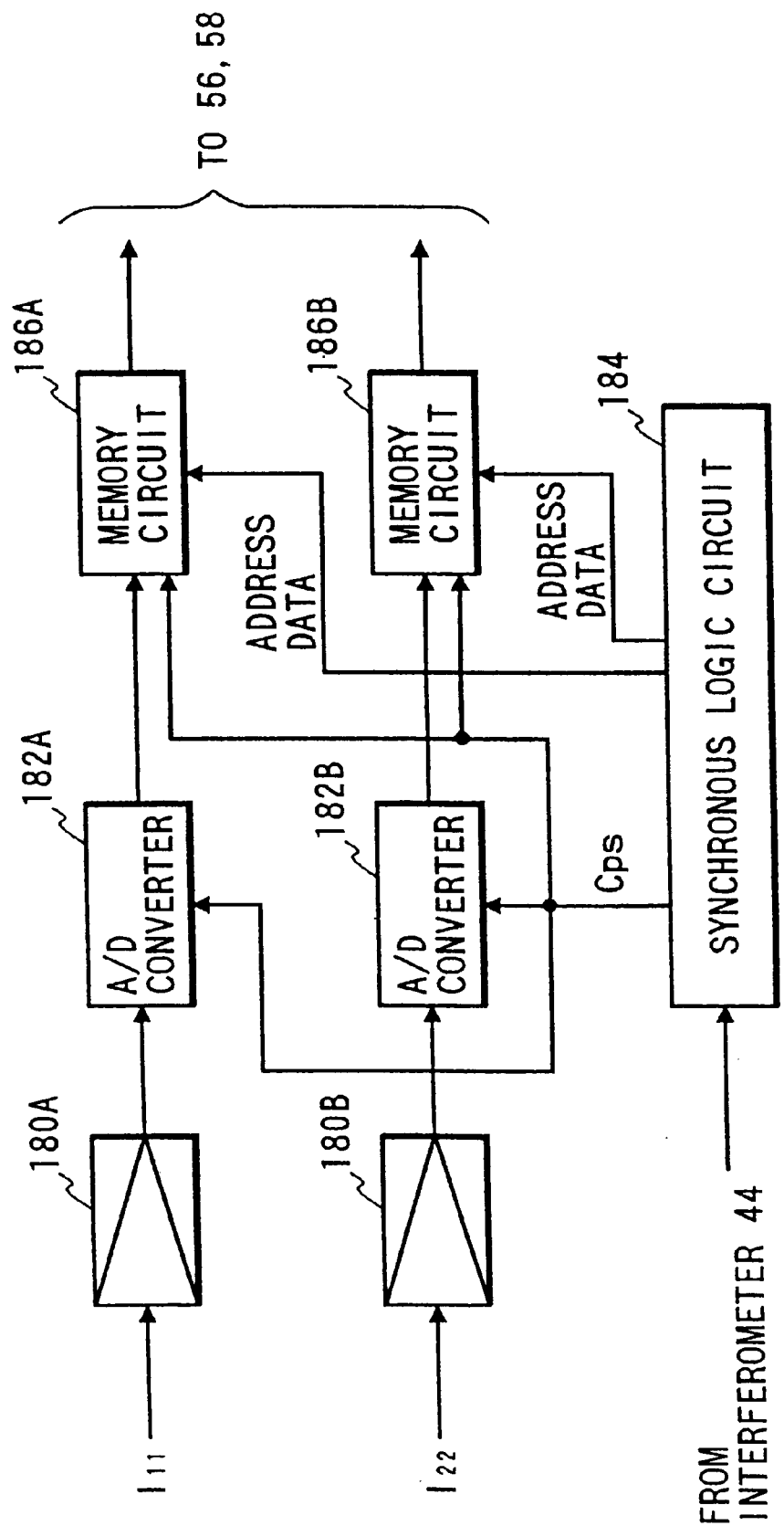
FIG. 55 is a block diagram showing the circuit construction of the signal processing system of the apparatus shown in FIG. 54.

As a portion of a signal processing circuit therefor, provision is made of a signal waveform sampling circuit as shown in FIG. 55. In FIG. 55, the signals I11 and I22 are amplified by a predetermined amount by amplifiers 180A and 180B, respectively, and thereafter are sampled by A/D converter circuit 182A and 182B, respectively. A clock signal Cps for determining the timing of the sampling is made from the count pulse of the interferometer 44 through a synchronous logic circuit 184. The values of the levels of the signals I11 and I22 sampled by the A/D converter circuits 182A and 182B, respectively, are stored in memory circuits 186A and 186B in the order of addresses. In that case, the address data of the memory circuits 186A and 186B during writing are produced from the synchronous logic circuit 184 on the basis of the count pulse of the interferometer.

Thus, the waveform data of the signals I11 and I22 are stored in the memory circuits 186A and 186B while the stage WST is being moved over a predetermined scanning range, and the respective waveform data become similar to ones in which in FIGS. 56A and 56B, the axes of abscissas are made to primarily correspond to the address values of the memory circuits. In that case, assuming that the minimum count of the interferometer 44 corresponds to 0.02 μm of the movement of the stage, an address change of the memory circuits 186A and 186B corresponds to 0.02 μm. The waveform data stored in the memory circuits 186A and 186B are then read into a processing circuit equal to the position offset amount detection circuit 56 or the amplitude ratio detection circuit 58 shown in FIG. 52, and the detection of the position of the grating mark MG is effected.

In that case, the position offset amount detection circuit 56 reads out the waveform data of the signal I11 stored in the memory circuit 186A (the addresses thereof and the coordinates position of the stage WST in X-direction correspond to each other at one to one) and determines the particular peak point position X11 shown in FIG. 56A by calculation, and also reads out the waveform data of the signal I22 stored in the memory circuit 186B (the addresses thereof and the coordinates position of the stage WST in X-direction correspond to each other at one to one) and determines the particular peak point position X22 shown in FIG. 56B by calculation. In the case of the grating mark MG on the wafer W, those positions X11 and X22 may become different depending on the asymmetry of the amplitude reflectance of the grating mark MG including the resist layer.

Also, the amplituderatio detection circuit 58 reads out the waveforms of the signals stored in the memory circuits 186A and 186B and finds the amplitude values E11 and E22 as shown in FIGS. 56A and 56B. Then the final position X0 of the grating mark MG is found by a calculation circuit (CPU) equal to the weighted mean circuit 60 in the processing circuit shown in FIG. 52 on the basis of the following weighted mean having the amplitude of each signal as weight.

$$X0=(E11\cdot X11+E22\cdot X22)/(E11+E22)$$

In the case of this arithmetic expression, the weight coefficients are the amplitude values themselves of the signals I11 and I22, but as described with respect to the previous twenty-first embodiment, the amplitude values K11 and K22 of the signals I11 and I22 obtained when an ideal grating (the grating mark of the fiducial mark plate FG) having no asymmetry in its amplitude reflectance is detected may be found in advance, and the ratios C11 and C22 between the amplitude values E11, E22 of the signals when the grating mark MG of the wafer is detected and the amplitude values K11 and K22 may be made into $$C11=E11\cdot K11/(K11+K22)$$

$$C22=E22\cdot K22/(K11+K22)$$

whereafter the final position X0' of the grating mark may be calculated by $$X0'=(C11\cdot X11+C22\cdot X22)/(C11+C22)$$

However, the expression for finding this position X0' can be calculated by the following expression without the ratios C11 and C22 being especially calculated.

$$X0'=(E11\cdot K11\cdot X11+E22\cdot K22\cdot X22)/(E11\cdot K11+E22\cdot K22)$$

The amplitude values K11 and K22 found here also correspond to the theoretical intensity ratio between 1st-order diffracted light and 2nd-order diffracted light, and assuming that the theoretical intensity of 2nd-order diffracted light when the intensity of 1st-order diffracted light is 1 is β (β<1), the position X0' having added thereto the theoretical weight by the order is determined by the following expression:

$$X0'=(E11\cdot X11+E22\cdot\beta\cdot X22)/(E11+E22\cdot\beta)$$

Now, in the present embodiment, in order to effect the detection of the position of the mark by the homodyne system, it is simplest in signal processing to find out particular peak point positions (or bottom point positions) of the signal waveforms as shown in FIGS. 56A and 56B. However, to find the peak points on the signal waveforms, a calculating process such as making a differentiated waveform obtained by differentiating original signal waveform data through a numerical value filter, and find the position of the zero point on the differentiated waveform is necessary. Therefore, it is also necessary to remove in advance a weak noise component superposed on the original signal waveform, by some technique. However, even in the homodyne system, it is also possible to apply signal processing in which the noise characteristic is improved by phase difference measurement utilizing a Fourier integral process similar to that in the heterodyne system.

So, a method when the phase difference calculating process is applied in the homodyne system will now be described with reference to FIGS. 57A and 57B. First, the waveform data of the signals I11 and I22 shown in FIGS. 56A and 56B are stored in the memory circuits 186A and 186B over suitable periods (e.g. 10 periods or more). Thereafter, the integrated values Vrs and Vrc of each of reference sine wave data R1 (sin) and reference cosine wave data R1 (cos) in which a common position on the waveform of the signal I11, e.g. a position X00 shown in FIGS. 57A and 57B, is assumed as a reference phase point, and the waveform data of the signal I11 are found, and a phase angle θ11 satisfying tan θ11=Vrs/Vrc is calculated from the two integrated values Vrs and Vrc.

Figures 57A, 57B:
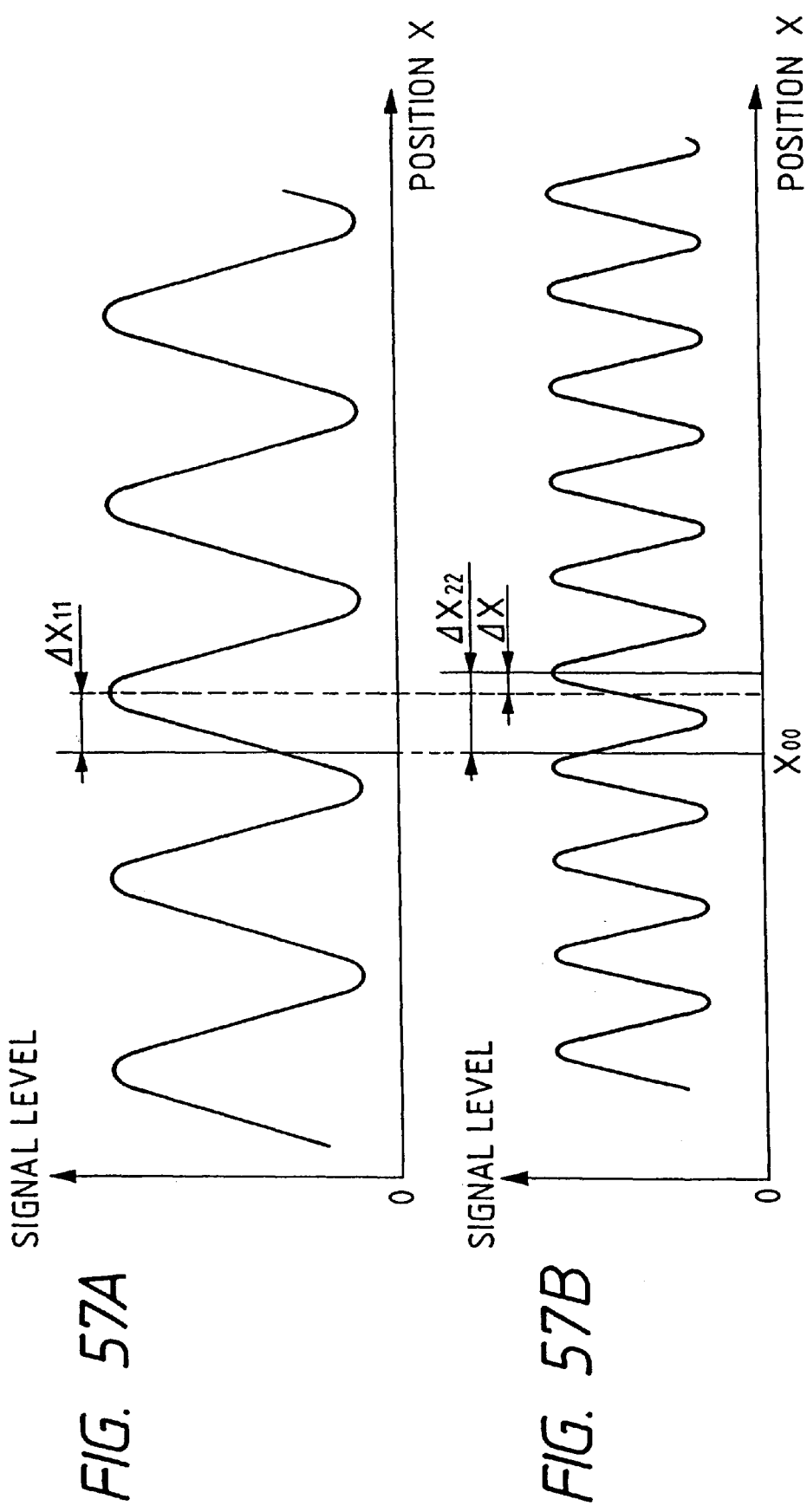
FIGS. 57A and 57B are waveform graphs illustrating a case where each signal is processed by phase difference measurement when the apparatus of FIG. 54 is used in a homodyne system.

Since one period of the signal I11 corresponds to ½ of the pitch Pmg of the grating mark MG, the phase angle θ11 is converted into a position offset amount ΔX11 relative to the reference position X00 found from the waveform data of the signal I11 as shown in FIG. 57A.

The reference sine wave data R1 (sin) and the reference cosine wave data R1 (cos) should desirably be stored in advance as a data table on the memory of the CPU. The data table is stored with a sine wave function having ½ of the design pitch Pmg of the grating mark MG as a period being produced by the same resolving power as that of the waveform data in the memory circuits 186A and 186B (a datum on the function coincides with the sampling unit by the interferometer). Also, the reference cosine wave data R1 (cos) is made by shifting the read-out reference data position (address) of the reference sine wave data R1 (sin) by π/2 (Pmg/8).

Likewise, the integrated values Vrs and Vrc of each of reference sine wave data R2 (sin) and reference cosine wave data R2 (cos) in which a common position X00 on the waveform of the signal I22 is assumed as the reference phase point and the waveform data of the signal I22 are found, and a phase angle θ22 satisfying tan θ22=Vrs/Vrc is calculated from the two integrated values Vrs and Vrc. Since one period of the signal I22 corresponds to ¼ of the pitch Pmg of the grating mark MG, the phase angle θ22 is converted into a position offset amount ΔX22 relative to the reference position X00 found from the waveform data of the signal I22 as shown in FIG. 57B.

Also, the data table of the reference sine wave data R2 (sin) and reference cosine wave data R2 (cos) is stored with a sine wave function having ¼ of the design pitch Pmg of the grating mark MG as a period being produced by the same resolving power as that of the waveform data in the memory circuits 186A and 186B, and the reference cosine wave data R2 (cos) is made by shifting the read-out data position (address) of the reference sine wave data R2 (sin) by π/2 (Pmg/16).

The position offset amounts ΔX11 and ΔX22 calculated in the above-described manner assume the same value in an ideal case (such as the fiducial mark) where the grating mark MG is free of the asymmetry of the amplitude reflectance, but depending on the degree of the asymmetry, as described above, the position of the grating mark detected on the basis of 1st-order diffracted light alone and the position of the grating mark detected on the basis of 2nd-order diffracted light alone differ from each other. So, the calculated position offset amounts ΔX11 and ΔX22 are weighted on the basis of the amplitudes E11 and E22 of the signals I11 and I22 and the theoretical intensity ratio between 1st-order diffraction and 2nd-order diffraction to thereby provide weighted mean, whereby the position offset amount ΔX00 from the apparently most certain reference position X00 of the grating mark is determined.

In this case, the reference position X00 is stored in the servo control system 64 (or the CPU or the like) in FIG. 52 as the target coordinates position when the stage WST is positioned for wafer alignment. So, when the stage WST is to be positioned by the servo control system 64, the driving system 42 can be servo-controlled so that the coordinates position in X-direction measured by the interferometer 44 may be (X00+ΔX00 or X00−ΔX00).

However, when alignment is to be done relative to a point discrete from the grating mark MG on the wafer W, for example, the central point on the shot area of a mask exposed by a circuit device pattern, it is not always necessary to move the stage WST so that the grating mark MG may be aligned with the reference grating plates 162 and 166 in FIG. 54 and therefore, the calculated position offset amount ΔX00 can be stored in the CPU and the value thereof can be utilized for the position control of the stage WST for the alignment (positioning) during the exposure of the shot area on the wafer.

Specifically, the reference position X00 is set as the target coordinates position (deviated by 1 μm or less relative to the true position) of the grating mark MG determined by the result of the prealignment or global alignment of the wafer W, whereafter the position offset amount ΔX00 of the. grating mark MG is detected. Thereafter, in order to make the central point of the shot area coincident with the exposure center (the central point of a mask pattern), the target coordinates position of the stage WST determined by the result of the prealignment or global alignment is corrected and calculated by the calculated position offset amount X00, whereby the stage WST can be servo-controlled relative to a calculated new target coordinates position.

As the system in which the grating mark MG on the wafer W is thus detected to thereby effect alignment, there are a system in which the wafer is moved so as to precisely align the grating mark MG with the reference of the position detecting apparatus, and a system in which the relative position offset amount of the grating mark MG and the reference of the position detecting apparatus is measured, whereafter the wafer is moved in conformity with the position offset amount without the grating mark MG being precisely aligned with the reference of the position detecting apparatus.

In the above-described embodiment, it has been to be understood that the relative position between the reference grating plates 162 and 166 in FIG. 54 in the pitch direction is precisely uniform, but in reality, the adjustment of the order of submicron is difficult even if the adjustment in the manufacture of the apparatus is done elaborately. If a relative position error ΔXe remains between the reference grating plates 162 and 166, this position error ΔXe will be included as the error amount when the position coordinates or the position offset amount of the grating mark MG is found.

So, the position of the fiducial mark found by the photoelectric detection of ±1st-order diffracted beams ±D01 and the position of the fiducial mark found by the photoelectric detection of ±2nd-order diffracted beams ±D02 are measured by the utilization of the grating mark of the fiducial mark plate FG in FIG. 54, and the difference between those positions is calculated as the position error ΔXe and is stored as an offset value (broadly, a base line error) in the CPU when the grating mark MG on the wafer W is to be actually detected, the value of one of the position X11 (FIGS. 56A and 56B) of the grating mark MG found from ±1st-order diffracted beams and the position X22 (FIGS. 56A and 56B) of the grating mark MG found from ±2nd-order diffracted beams can be corrected by an amount corresponding to the stored position error ΔXe, and then can be calculation-processed so as to provide weighted mean.

Also, when as in FIGS. 57A and 57B, the position of the grating mark MG is to be detected from the position offset amount by phase measurement, an offset corresponding to the position error ΔXe is included between the position offset amount ΔX11 determined on the basis of ±1st-order diffracted lights and the position offset amount ΔX22 determined on the basis of ±2nd-order diffracted lights and therefore, for example, a value found by subtracting the position error ΔXe from the apparently most certain position offset amount ΔX00 calculated by weighted mean calculation in the CPU can be used as a position offset amount.

Alternatively, inclinable plane parallel plate glass may be disposed forwardly of at least one of the reference grating plates 162 and 166, and provision may be provided such a mechanism as will minutely displace the positions of ±1st-order diffracted beams ±D01 and ±2nd-order diffracted beams ±D02 incident on the reference grating plate 162 or 166 in the pitch direction. In that case, the positions X11, X22 and the position offset amounts ΔX11, ΔX22 of the grating mark of the fiducial mark plate FG in FIG. 54 are found by the detection of each of ±1st-order diffracted lights and ±2nd-order diffracted lights, whereafter the inclination of the plane parallel plate glass can be automatically adjusted so that those values may be X11=X22 or ΔX11=ΔX22.

Further, when the inclinable plane parallel plate glass is provided, the inclination of the plane parallel plate glass may be adjusted so as to roughly correct the position error ΔXe, whereafter any residual error amount may be stored as an offset in the CPU.

A twenty-third embodiment in which the position detecting apparatus described in each of the twenty-first and twenty-second embodiments is applied as various alignment detection systems in a projection exposure apparatus will now be described with reference to FIGS. 15, 58, 17A and 17B. Again in this embodiment, there is applied the schematic disposition of the alignment system of a projection exposure apparatus as shown in FIG. 15 which requires the measurement of a base line amount for determining the relative positional relation between the central projection point of a mask (reticle) mounted on the projection exposure apparatus and the detection center points of the various alignment systems.

When the position detecting apparatus described in each of the twenty-first and twenty-second embodiments is applied to various alignment systems, their detection center points are prescribed by the reference grating plate SG (FIG. 50) for producing a reference beat signal when a mark position detecting apparatus of the heterodyne type, and are prescribed by the reference grating plates 162 and 166 (FIG. 54) for receiving ±1st-order diffracted beams and ±2nd-order diffracted beams from the grating mark MG on the wafer when a mark position detecting apparatus of the homodyne type is applied.

The construction of the projection exposure apparatus of FIG. 15 has already been described and therefore, the details thereof need not be described.

However, when a reticle alignment system RA is of a construction in which a mark (grating pattern) RM for reticle alignment around a reticle R and a corresponding grating mark on the fiducial mark plate FG are irradiated with illuminating light of the same wavelength as illuminating light for the projection exposure of a circuit pattern PR and a reticle stage RST is finely moved so that the two marks may assume a predetermined positional relation, a detection center point Rf1 is not required. This also holds true of an alignment system TTRA, and when the relative positional relation between the grating mark on the fiducial mark plate FG or the grating mark MG on the wafer W and a grating mark for die-by-die (D/D) alignment formed on the portion around the circuit pattern PR of the reticle R is to be directly detected, it is unnecessary to especially use a detection center point Rf2 (reference grating plate).

Figure 58:
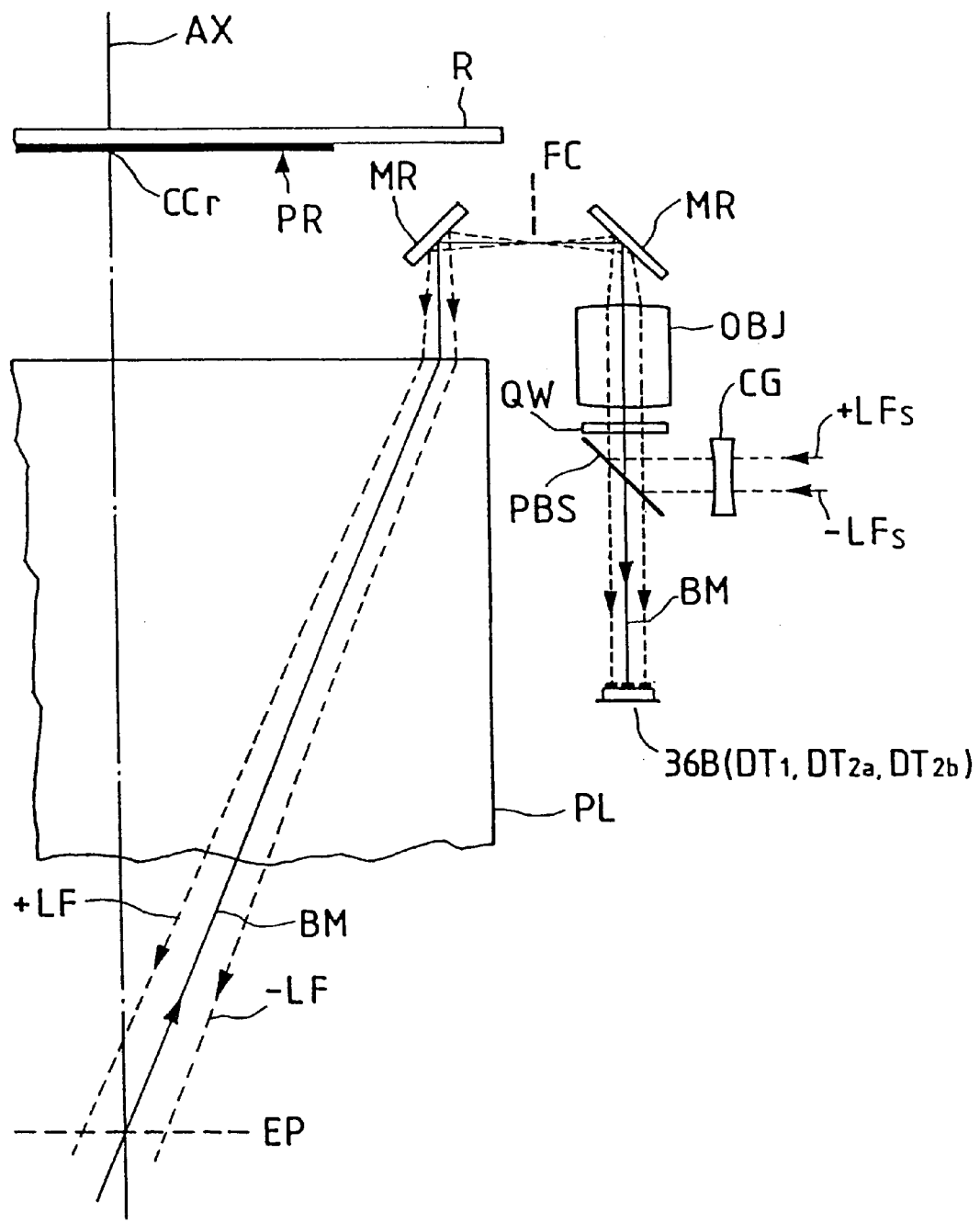
FIG. 58 shows the construction of a TTL alignment system in a twenty-third embodiment in which the position detecting apparatus of the present invention is applied to the various alignment systems of a projection exposure apparatus.

FIG. 58 shows an example of the essential portion of an alignment system TTLA of the alignment systems shown in FIG. 15, and a pair of light sending beams ±LFs (corresponding to the beam ±LFs and beam −LFs in FIG. 49) for detecting the grating mark MG on the wafer W or the fiducial mark plate FG by the heterodyne system shown in FIGS. 49 and 50 enter a projection lens PL via a correction optical system CG, a polarizing beam splitter PBS (functionally corresponding to the half mirror BS1 in FIG. 49), a ¼ wavelength plate QW, an objective lens OBJ (corresponding to the objective lens G2 in FIG. 49) and two mirrors MR. At this time, a plane FC conjugate with the surface of the wafer W is formed between the two mirrors MR, and the pair of beams ±LFs intersect each other in this plane FC. The beams ±LFs are relayed by the projection lens PL, and intersect each other also on the wafer W and irradiate the grating mark MG.

In the present embodiment, the beams ±LFs entering the polarizing beam splitter PBS are linearly polarized light, and the light sending beams efficiently reflected by the polarizing beam splitter PBS are converted into circularly polarized light rotating in one direction when they are transmitted through the ¼ wavelength plate QW and pass through the projection lens PL and irradiate the grating mark MG on the wafer W. An interference beam BM created vertically thereby from the grating mark MG passes through substantially the center of the pupil plane EP of the projection lens PL, and arrives at the polarizing beam splitter PBS via the two mirrors MR, the objective lens OBJ and the ¼ wavelength plate QW. At this time, the interference beam BM of ±1st-order diffracted beams and the interference beam of 0-order beam and ±2nd-order beam are linearly polarized lights orthogonal to the direction of polarization and are therefore efficiently transmitted through the polarizing beam splitter PBS, and arrive at a photoelectric converter 36B provided with photoelectric elements DT1, DT2a and DT2b similar to those in FIG. 49.

In such an alignment system TTLA, the wavelength of the light sending beams ±LFs (e.g. 633 nm of an He—Ne laser) is defined so as to be considerably longer than the wavelength of the illuminating light for exposure and thus, is subjected to the influence of the chromatic aberration (on the axis and magnification) of the projection lens PL and the influence of the chromatic aberration of the objective lens OBJ. So, as shown in FIG. 58, a correction optical system CG for correcting an optical error occurring in conformity with the chromatic aberration is provided in the optical path of the light sending beams ±LFs. This correction optical system CG is comprised of a convex lens, a concave lens or a combination thereof, or plane parallel plate glass or the like.

Also, in the case of the alignment system TTRA in FIG. 15, when a mark DDM for D/D alignment on the reticle R is a diffraction grating and the relative position offset thereof with respect to the grating mark MG on the wafer W corresponding to the mark DDM is to be detected by the heterodyne system as shown in FIGS. 49 and 50, a transparent plane parallel plate-like correction plate PGD can be provided on the pupil plane EP of the projection lens PL as is disclosed in (G) Japanese Patent Application Laid-Open No. 6-302504 (File No. 198,077, Feb. 17, 1994), and a transmission type phase grating (one in which uneven lines are etched at a predetermined pitch on the surface of the correction plate PGP) can be formed only at a position on the correction plate PGP through which the light sending beams (±LFs) and the interference beam (BM) pass to thereby reduce the influences of on-axis chromatic aberrations and chromatic difference of magnification.

FIGS. 59A–59D show the construction of a projection exposure apparatus according to a twenty-forth embodiment which incorporates such a correction plate PGP in a portion of the alignment system TTRA, FIG. 59A being a view in which the optical paths of the light sending beams ±LFs and interference beam BM during the detection of the grating mark MG having a pitch in X-direction (measurement direction) are seen in X-Z plane, and FIG. 59B being a view in which the optical paths of FIG. 59A are seen in Y-Z plane orthogonal thereto.

A pair of light sending beams ±LFs emerge from the objective lens OBJ (corresponding to the objective lens G2 in FIG. 49) of the alignment system TTRA while being slightly eccentric from an optical axis AXa, are reflected by a mirror MR and enter the projection lens PL through the window RW around the pattern area of the reticle R. The pair of light sending beams ±LFs, when seen in X-Z plane, are transmitted through the window RW with a symmetrical inclination as shown in FIG. 59A, and when seen in Y-Z plane, are transmitted through the window RW while being inclined with respect to the optical axis AXa of the objective lens OBJ, as shown in FIG. 59B.

The pair of light sending beams ±LFs pass through two phase type diffraction gratings (hereinafter referred to as the phase gratings) PG1S and PG2S, respectively, on the correction plate PGP disposed on the pupil plane EP of the projection lens PL. At this time, by the action of the phase gratings PG1S and PG2S, the respective light sending beams ±LFs have their inclinations changed by a predetermined amount in a predetermined direction from a broken line in the figure as indicated by a solid line and emerge from the projection lens PL. The light sending beams ±LFs, when seen in X-Z plane, irradiate the grating mark MG on the wafer W at symmetrical angles, and when seen in Y-Z plane, enter the grating mark MG while begin somewhat inclined., in Y-direction with respect thereto.

The interference beam BM created thereby from the grating mark MG again enters the projection lens PL and on the pupil plane EP, it passes through a position differing from the phase gratings PG1S and PG2S. At that position, there is formed a phase grating PG3S for inclining the interference beam BM by a predetermined amount in a predetermined direction from a broken line in FIG. 59B as indicated by a solid line, whereby the optical path of the interference beam BM is corrected so as to be transmitted through the projection lens PL and toward the window RW of the reticle R. The interference beam BM passed through the window RW travels toward a light receiving system (G1, AP, BS1, G3, DT1, DT2) as shown in FIG. 49 via the mirror MR and the objective lens OBJ. At this time, the interference beam BM is transmitted through the window RW of the reticle R while being slightly inclined in the non-measurement direction with respect to the optical axis AXa of the objective lens OBJ.

The use of such a correction plate PGP is of course possible also for the alignment system TTLA shown in FIG. 58. For example, in the case of an exposure apparatus using a projection lens (or a combination of a reflecting mirror and a dioptric lens) of which the lens glass material is quarts or fluorite and which uses ultraviolet rays of a wavelength of 180–300 nm (such as an excimer laser beam) as exposure light, chromatic aberration for the wavelength of a beam from an He—Ne laser or a semiconductor laser becomes very great and the conjugate surface FC of the wafer shown in FIG. 58 becomes separate by several tens of cm from the projection lens. So, by the use of the correction plate PGP, the conjugate surface FC of the wafer on which the light sending beams ±LFs intersect each other is corrected so as become close to the projection lens.

Also, it is possible to bring the optical paths of the light sending beams LFs and the detecting beam BM shown in FIGS. 59A and 59B into an entirely opposite relation, and design is made such that a light sending beam of a single wavelength is projected from the objective lens OBJ along the optical path of the detecting beam BM and irradiates the grating mark MG on the wafer W through a phase grating PG3 in the projection lens PL. Thereby, ±1st-order diffracted beams travelling back along the same optical path as the light sending beams ±LFs in FIGS. 59A and 59B are created from the grating mark MG, and these beams arrive at the window RW of the reticle R through a phase grating PG1 in the projection lens PL, and are transmitted therethrough and return to the objective lens OBJ.

Further, ±2nd-order diffracted beams are also created from the grating mark MG at an angle of diffraction greater than that of ±1st-order diffracted beams. The ±2nd-order diffracted beams pass through positions on the pupil plane EP (correction plate PGP) of the projection lens PL separated in the pitch direction of the grating mark MG relative to the passage positions of ±1st-order diffracted beams. So, besides the phase grating PG3S passing a single light sending beam therethrough and the phase gratings PG1S and PG2S passing therethrough the ±1st-order diffracted beams from the grating mark MG, a correction plate PGP formed with phase gratings PG4S and PG5S passing therethrough the ±2nd-order diffracted beams from the grating mark MG is disposed on the pupil plane EP.

If this is done, ±1st-order diffracted beams and ±2nd-order diffracted beams created from the grating mark MG can all be returned to the objective lens OBJ through the window RW of the reticle R, and the alignment system of the homodyne type shown in FIG. 54 becomes utilizable.

Figure 60:
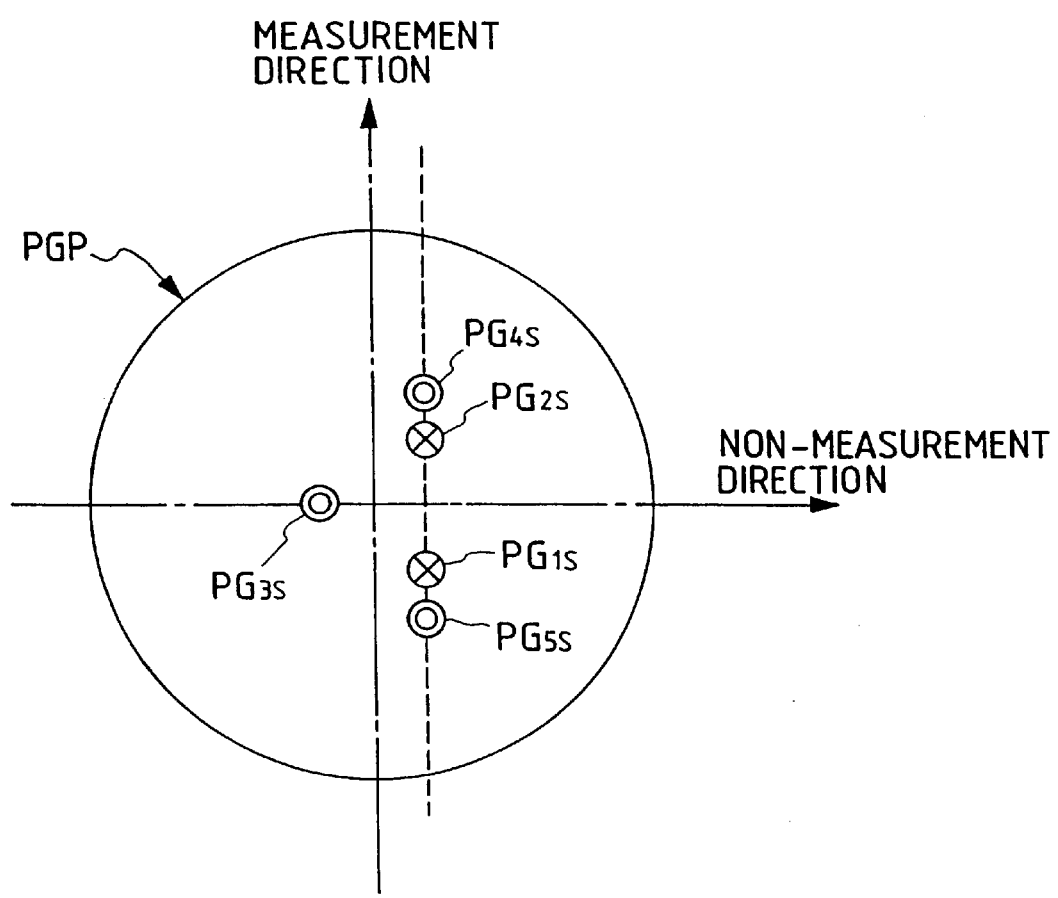
FIG. 60 is a plan view showing a modification of a correction plate PGP in FIGS. 59A and 59B.

Further, when the light sending beam is made single and the alignment system of the homodyne type is assembled by the use of the correction plate PGP as shown in FIGS. 59A, 59B and 60, an interference image (diffracted image) reflecting the position offset of the grating mark MG can be produced in a plane on which the diffracted beam of each order from the grating mark MG on the wafer W is imaged and therefore, design may be made such that the interference image is picked up by a one-dimensional or two-dimensional CCD camera or the like and the image signal thereof is analyzed to thereby detect the position of the grating mark MG relative to a reference position (for example, a particular pixel position in the image pickup field of the CCD camera or an index mark disposed in an alignment optical path).

In this case, it is premised that the wafer stage is stationary while at least the image signal is introduced into a signal processing circuit, but also is also a case where under outside influence, the stage WST is vibrating when observed in the order of nanometer. So, it is desirable to prepare two CCD cameras so that the interference image produced by ±1st-order diffracted beams from the grating mark MG and the interference image produced by ±2nd-order diffracted beams may be read into a signal processing circuit (particularly a waveform memory) individually by the respective CCD cameras and at the same timing. Alternatively, provision is made of a prism or the like for minutely inclining the ±1st-order diffracted beams and ±2nd-order diffracted beams from the grating mark MG in a direction orthogonal to the pitch of the grating mark near the Fourier transform plane in the alignment system so that the interference image of ±1st-order diffracted beams and the interference image of ±2nd-order diffracted beams produced on the image pickup surface of two-dimensional CCD cameras may be shifted in a direction orthogonal to the pitch of the grating mark MG and the interference images may be picked up at a time by a single CCD camera.

Again in a case where the position or the position offset amount of the grating mark MG is found by such image detection, the interference image by the ±1st-order diffracted beams from the grating mark MG and the interference image by the ±2nd-order diffracted beams can be picked up discretely from each other and the position offset amount or the like can be individually found and then, as in the above-described embodiments, the apparently most certain mark position offset amount (or mark position) can be determined by means calculation having added thereto weight conforming to the amplitude value or the like of each interference image. Of course, again in this case, the phase difference measurement by the Fourier integral method described with reference to FIGS. 57A and 57B can be applied.

As described above, in each embodiment of the present invention, the diffracted lights photoelectrically detected are ±1st-order diffracted beams and ±2nd-order diffracted beams from the grating mark MG, whereas the orders of the diffracted lights detected are not limited thereto, but any combination such as a combination of ±1st-order diffracted beams and ±3rd-order diffracted beams or a combination of ±2nd-order diffracted beams and ±5th-order diffracted beams can be chosen. Further, the combination of the diffracted beams of different orders used for position detection or position offset detection is not limited to two sets as in each embodiment, but diffracted beams of three or more sets of different orders (e.g. ±1st-order, ±2nd-order and ±3rd-order diffracted beams) may be photoelectrically detected, and the mark position or the position offset amount found for each order is subjected to weighted mean as in each previous embodiment to thereby determine the apparently most certain mark position and position offset amount.

As described above, according to the twenty-first to twenty-fourth embodiments, diffracted lights of different orders created corresponding to the plurality of spatial frequency components of a mark for position detection having periodic structure are photoelectrically detected, and on the basis of the photoelectric signals, a mark position (position offset) corresponding to each spatial frequency component is individually found and further, weight accompanying an amplitude change corresponding to the change in the intensity of the diffracted light of each order is applied to thereby average and therefore, there is the effect that the irregularity of an error occurring with the mark position detection for each spatial frequency component becomes small due to the averaging effect.

Further, the amplitude (the change in the intensity of the diffracted light of each order) of the photoelectric signal obtained for each spatial frequency component is used as the weight during weighted means and therefore, there is also the advantage that when the change in the intensity (amplitude) of the diffracted light of an order corresponding to a certain spatial frequency component becomes extremely small, there is little or no weight in the result of the detection of the mark position (position offset) based on the diffracted light of that order and the bad influence there of on the final result of the detection is small.

Also, since the orders of the diffracted lights to be detected differ from each other, design is made such that the theoretical intensity ratios conforming to those orders are added to weighted mean and therefore, the influence of the intensity difference occurring in principle can also be corrected and more highly accurate position detection becomes possible.

What is claimed is:

1. An exposure apparatus which exposes a substrate with a pattern formed on a mask, comprising:
   a projection optical system which projects the pattern formed on the mask onto the substrate; and
   a position detecting system which detects a mark formed on the substrate not through the projection optical system,
   wherein the position detecting system includes:
   a beam illuminating system which is arranged at a predetermined side with respect to said substrate, and which irradiates an illumination beam perpendicularly onto said mark;
   a first detecting system which is arranged at the same side as said predetermined side with respect to said substrate, the first detecting system including a first optical element which causes ±nth-order (n is a natural number) diffracted beams generated from said mark irradiated with said illumination beam to respectively incline at a predetermined angle on a first reference grating and a first photoelectric element which detects a beam from the first reference grating irradiated with the ±nth-order diffracted beams; and
   a second detecting system which is arranged at the same side as said predetermined side with respect to the substrate, the second detecting system including a second optical element which causes ±mth-order (m is a natural number other than n) diffracted beams generated from said mark irradiated with said illumination beam to respectively incline at a predetermined angle on a second reference grating and a second photoelectric element which detects a beam from the second reference grating irradiated with the ±nth-order diffracted beams.

2. The exposure apparatus according to claim 1, further comprising:
   a calculator which is electrically connected to said first and second photoelectric elements and calculates positional information of said mark based on results of detection by said photoelectric elements.

3. The exposure apparatus according to claim 1, wherein said first and second reference gratings include a transmission type grating.

4. The exposure apparatus according to claim 1, wherein the number m is a natural number greater than the number n.

5. The exposure apparatus according to claim 4, wherein a pitch of said first reference grating is different from a pitch of said second reference grating.

6. The exposure apparatus according to claim 5, wherein the pitch of said first reference grating is greater than the pitch of said second reference grating.

7. The exposure apparatus according to claim 4, wherein the number n is 1 and the number m is 2.

8. A position detecting device which detects positional information of a mark formed on a substrate, comprising:
   a beam illuminating system which is arranged at a predetermined side with respect to the substrate, and which irradiates an illumination beam perpendicularly onto said mark;
   a first detecting system which is arranged at the same side as said predetermined side with respect to said substrate, the first detecting system including a first optical element which causes ±nth-order (n is a natural number) diffracted beams generated from said mark irradiated with said illumination beam to respectively incline at a predetermined angle on a first reference grating and a first photoelectric element which detects a beam from the first reference grating irradiated with the ±nth-order diffracted beams;
   a second detecting system which is arranged at the same side as said predetermined side with respect to said substrate, the second detecting system including a second optical element which causes ±mth-order (m is a natural number other than n) diffracted beams generated from said mark irradiated with said illumination beam to respectively incline at a predetermined angle on a second reference grating and a second photoelectric element which detects a beam from the second reference grating irradiated with the ±mth-order diffracted beams; and
   a calculator which is electrically connected to said first and second photoelectric elements and calculates said positional information of said mark based on results of detection by said photoelectric elements.

9. The device according to claim 8, wherein the number m is a natural number greater than the number n, and said first reference grating has a first pitch, and said second reference grating has a second pitch that is smaller than the first pitch.

10. The exposure apparatus according to claim 9, wherein said first and second reference gratings include a transmission type grating.

11. A position detecting method for detecting positional information of a mark formed on a substrate, comprising:
    irradiating an illumination beam perpendicularly onto said mark;
    causing ±nth-order (n is a natural number) diffracted beams generated from said mark irradiated with said illumination beam to respectively incline at a predetermined angle on a first reference grating, and detecting by a first photoelectric element a beam from the first reference grating irradiated with the ±nth-order diffracted beams; and
    causing ±mth-order (m is a natural number other than n) diffracted beams generated from said mark irradiated with said illumination beam to respectively incline at a predetermined angle on a second reference grating, and detecting by a second photoelectric element different from said first photoelectric element a beam from the second reference grating irradiated with the ±nth-order diffracted beam.

12. The method according to claim 11, further comprising, calculating said positional information of said mark based on results of detection by said photoelectric elements.

13. The method according to claim 11, wherein the number m is a natural number greater than the number n, and said first reference grating has a first pitch, and said second reference grating has a second pitch that is smaller than the first pitch.

14. An exposure method comprising:
    aligning the substrate based on positional information which is detected using a position detecting method according to claim 12; and
    projection exposing said aligned substrate with a pattern formed on a mask.

15. A device manufacturing method comprising:
  exposing the substrate with a device pattern formed on the mask using an exposure method according to claim 14.

16. A position detecting device which detects positional information of a mark formed on a substrate, comprising:
  a beam illuminating system which is arranged at a predetermined side with respect to the substrate, and which irradiates a first illumination beam having a first wavelength and a second illumination beam having a second wavelength different from the first wavelength perpendicularly onto said mark;
  a detecting system which is arranged at the same side as said predetermined side with respect to said substrate, the detecting system including an optical element which causes diffracted beams generated from said mark irradiated with said first illumination beam or said second illumination beam to respectively incline at a predetermined angle on a first reference grating and a photoelectric element which detects a beam from the reference grating irradiated with the diffracted beams; and
  a calculator which is electrically connected to said photoelectric element and calculates said positional information of said mark based on results of detection by said photoelectric element.

17. The device according to claim 16, wherein said photoelectric element includes a first photoelectric element which detects the diffracted beams generated from said mark irradiated with said first illumination beam and a second photoelectric element which is different from the first photoelectric element and detects the diffracted beams generated from said mark irradiated with said second illumination beam.

18. The device according to claim 17, wherein said detecting system includes an optical member which leads the diffracted beams generated from the mark with the first illumination beam to the first photoelectric element and leads the diffracted beams generated from the mark with the second illumination beam to the second photoelectric element.

19. The device according to claim 18, wherein said optical member has a function of wavelength selection.

20. The device according to claim 17, wherein said beam illuminating system irradiates said first and second illumination beams simultaneously.

21. A position detecting method for detecting positional information of a mark formed on a substrate, comprising:
  irradiating a first illumination beam having a first wavelength and a second illumination beam having a second wavelength different from the first wavelength perpendicularly onto said mark with respect to a periodic direction of said mark;
  causing diffracted beams generated from said mark irradiated with said first illumination beam or said second illumination beam to respectively incline at a predetermined angle on a reference grating; and
  detecting by a photoelectric element a beam from the reference grating irradiated with the diffracted beams, and calculating said positional information of said mark based on the detection by the photoelectric element.

22. A position detecting method for detecting positional information of a mark formed on a substrate, comprising:
  irradiating a first illumination beam having a first wavelength and a second illumination beam having a second wavelength different from the first wavelength perpendicularly onto said mark;
  causing diffracted beams generated from said mark irradiated with said first illumination beam or said second illumination beam to respectively incline at a predetermined angle on a reference grating; and
  detecting by a photoelectric element a beam from the reference grating irradiated with the diffracted bemas, and calculating said positional information of said mark based on the results of detection by the photoelectric element.

23. The method according to claim 22, wherein said photoelectric element includes a first photoelectric element which detects the diffracted beams generated from said mark irradiated with said first illumination beam and a second photoelectric element which is different from the first photoelectric element and detects the diffracted beams generated from said mark irradiated with said second illumination beam.

24. The method according to claim 23, wherein said first and second illumination beams are irradiated simultaneously.

25. An exposure method comprising:
  aligning the substrate based on positional information which is detected by using a position detecting method according to claim 23; and
  projection exposing said aligned substrate with a pattern formed on a mask.

26. A device manufacturing method comprising:
  exposing the substrate with a device pattern formed on the mask using an exposure method according to claim 25.

27. An apparatus according to claim 1, further comprising:
  a stage on which said substrate is provided to move said mark relative to said illumination beam in said periodic direction in order to detect positional information of said mark.

28. A method according to claim 13, wherein said ±nth-order and ±mth-order diffracted beams are generated from said mark moved relative to said illumination beam in said periodic direction.

29. An exposure method comprising:
  exposing with an exposure beam irradiated on a mask the substrate moved based on the positional information of said mark detected by using a position detecting method according to claim 11; and
  said mark is moved relative to said illumination beam in said periodic direction to enable detecting the positional information.

30. An exposure apparatus comprising:
  a position detecting device according to claim 16;
  a projection optical system arranged at the same side as the position detecting device with respect to the substrate to project a pattern of a mask onto the substrate; and
  a stage on which said substrate is provided to enable detecting the positional information by movement of said mark relative to said first and second illumination beams in said periodic direction and to enable transfer of the projected pattern onto the substrate by moving the stage based on the detected positional information.

31. An apparatus according to claim 30, wherein said second illumination beam has the second wavelength greater than 650 nm.

32. An apparatus according to claim 31, wherein said second illumination beam has the second wavelength greater than 700 nm.

33. An apparatus according to claim 32, wherein said second illumination beam has the second wavelength greater than 750 nm.

34. An exposure method comprising:
exposing with an exposure beam irradiated on a mask the substrate moved based on the positional information of said mark detected by using a position detecting method according to claim 22; and
said mark is moved relative to said first and second illumination beams in said periodic direction to enable detecting the positional information.

35. A method according to claim 34, wherein said second illumination beam has the second wavelength greater than 650 nm.

36. The device according to claim 16, wherein said reference grating includes a transmission type grating.

* * * * *

UNITED STATES PATENT AND TRADEMARK OFFICE
CERTIFICATE OF CORRECTION

PATENT NO. : 6,677,601 B2
DATED : January 13, 2004
INVENTOR(S) : Naomasa Shiraishi It is certified that error appears in the above-identified patent and that said Letters Patent is hereby corrected as shown below:

Column 111,
Line 20, should read:
-- onto said mark with respect to a periodic direction of said mark; --.
Line 67, should read:
-- onto said mark with respect to a periodic direction of said mark; --.

Column 112,
Line 25, should read:
-- positional information of said mark based on the --.
Line 37, should read:
-- said mark with respect to a periodic direction of said mark; --.
Line 53, should read:
-- diffracted beams. --.

Column 113,
Line 11, should read:
-- perpendicularly onto said mark with respect to a periodic direction of said mark; --.
Line 18, should read:
-- predetermined angle on a reference grating and a --.
Line 25, should read:
-- mation of said mark based on the detection by --.
After Claim 20, insert the following claim:
21. An exposure apparatus comprising:
    a position detecting device according to claim 17; and
    a projection optical system which projects a pattern formed on a mask onto the substrate aligned based on the positional information detected by said position detecting device.

UNITED STATES PATENT AND TRADEMARK OFFICE
CERTIFICATE OF CORRECTION

PATENT NO. : 6,677,601 B2
DATED : January 13, 2004
INVENTOR(S) : Naomasa Shiraishi It is certified that error appears in the above-identified patent and that said Letters Patent is hereby corrected as shown below:

<u>Column 113,</u>
Line 46, claim 21 should be designated as -- 22 --.
Line 62, claim 22 should be deleted.

Signed and Sealed this

Tenth Day of August, 2004

JON W. DUDAS
*Acting Director of the United States Patent and Trademark Office*